(12) United States Patent  (10) Patent No.: US 12,191,275 B2
Otsuka et al.                (45) Date of Patent:      Jan. 7, 2025

(54) POWER SEMICONDUCTOR APPARATUS AND FABRICATION METHOD FOR THE SAME

(71) Applicant: ROHM CO., LTD., Kyoto (JP)

(72) Inventors: Takukazu Otsuka, Kyoto (JP); Seita Iwahashi, Kyoto (JP); Maiko Hatano, Kyoto (JP); Ryuta Watanabe, Kyoto (JP); Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/496,093

(22) Filed: Oct. 27, 2023

(65) Prior Publication Data

US 2024/0063164 A1   Feb. 22, 2024

Related U.S. Application Data

(63) Continuation of application No. 17/685,057, filed on Mar. 2, 2022, now Pat. No. 11,848,295, which is a
(Continued)

(30) Foreign Application Priority Data

May 10, 2017 (JP) .................. 2017-093941
May 30, 2017 (JP) .................. 2017-106445
Jun. 7, 2017  (JP) .................. 2017-112433

(51) Int. Cl.
*H01L 23/00*   (2006.01)
*H01L 23/495*  (2006.01)

(52) U.S. Cl.
CPC ........ *H01L 24/29* (2013.01); *H01L 23/49513* (2013.01); *H01L 24/05* (2013.01);
(Continued)

(58) Field of Classification Search
CPC ................. H01L 24/29; H01L 25/07
See application file for complete search history.

(56) References Cited

U.S. PATENT DOCUMENTS 10,211,144 B2 *  2/2019  Kohda ............... H01L 24/37
2002/0113302 A1  8/2002  Shinohara
(Continued)

FOREIGN PATENT DOCUMENTS

DE   10 2015 102 866 A1   9/2016
DE   11 2015 002 815 T5    3/2017
(Continued)

OTHER PUBLICATIONS

Hajime Koto et al., "Studies on OFHC Copper (3rd Report). On Recrystallization Diagram and Grain Growth", Journal of the Japan Institute of Metals, vol. 22, No. 10, Oct. 1958, pp. 493-497, with extracted translation.
(Continued)

*Primary Examiner* — Yu-Hsi D Sun
(74) *Attorney, Agent, or Firm* — HSML P.C.

(57) ABSTRACT

The power semiconductor apparatus includes: a semiconductor device 401; a bonding layer on chip 416 disposed on an upper surface of the semiconductor device; and a metal lead 419 disposed on the upper surface of the semiconductor device and bonded to the bonding layer on chip, wherein the metal lead 420 has a three-laminated structure including: a second metal layer 420b having a CTE equal to or less than $5 \times 10^{-6}/°$ C., for example; and a first metal layer 420a and a third metal layer 420c sandwiching the second metal layer and having a CTE equal to or greater than the CTE of the second metal layer. Provided is a power semiconductor apparatus capable of improving reliability thereof by reducing a thermal stress to a bonding layer between a semicon-
(Continued)

ductor power device and a metal lead positioned on an upper surface thereof, and reducing a resistance of the metal lead.

29 Claims, 70 Drawing Sheets

Related U.S. Application Data continuation of application No. 16/676,011, filed on Nov. 6, 2019, now Pat. No. 11,302,665, which is a continuation of application No. PCT/JP2018/018053, filed on May 10, 2018.

(52) U.S. Cl.
CPC .............. *H01L 24/37* (2013.01); *H01L 24/45* (2013.01); *H01L 24/73* (2013.01); *H01L 24/84* (2013.01); *H01L 24/85* (2013.01); *H01L 2224/32225* (2013.01); *H01L 2224/73221* (2013.01); *H01L 2224/73263* (2013.01); *H01L 2224/73265* (2013.01); *H01L 2924/30101* (2013.01); *H01L 2924/351* (2013.01)

(56) References Cited

U.S. PATENT DOCUMENTS

| | | | |
|---|---|---|---|
| 2007/0125449 | A1 | 6/2007 | Kajiwara et al. |
| 2016/0211195 | A1 | 7/2016 | Sunauchi et al. |
| 2017/0092596 | A1 | 3/2017 | Yoshihara |
| 2017/0338190 | A1* | 11/2017 | Fujino ................... H01L 23/562 |

FOREIGN PATENT DOCUMENTS

| | | |
|---|---|---|
| DE | 11 2015 006 049 T5 | 10/2017 |
| JP | 2000-100849 | 4/2000 |
| JP | 2002-246515 | 8/2002 |
| JP | 2003-168769 | 6/2003 |
| JP | 2005-019694 A | 1/2005 |
| JP | 2007-043098 | 2/2007 |
| JP | 2007-152385 | 6/2007 |
| JP | 2007-165690 | 6/2007 |
| JP | 2008-210942 | 9/2008 |
| JP | 2009-004544 | 1/2009 |
| JP | 2009-105266 | 5/2009 |
| JP | 2014-053406 | 3/2014 |
| JP | 2015-023183 | 2/2015 |
| JP | 2015-149326 | 8/2015 |
| JP | 2016-004796 | 1/2016 |
| JP | 2016-134540 A | 7/2016 |
| JP | 2016-167527 A | 9/2016 |
| JP | 2016-197677 A | 11/2016 |
| JP | 2016-219681 A | 12/2016 |
| WO | 2016/121159 A1 | 8/2016 |
| WO | 2017/002793 | 1/2017 |

OTHER PUBLICATIONS

International Search Report and Written Opinion issued in PCT/JP2018/018053, dated Jul. 24, 2018, 11 pages including English translation of International Search Report.
Office Action issued for German Patent Application No. 112018002384.2, Sep. 20, 2022, 18 pages including machine translation.
Office Action issued for Chinese Patent Application No. 201880031217.5, Oct. 8, 2022, 11 pages including machine translation.
Office Action issued for Japanese Patent Application No. 2019-517682, Oct. 18, 2022, 6 pages including machine translation.
Japanese Office Action issued in corresponding Japanese Patent Application No. 2023-003967, dated Mar. 19, 2024, 11 pages, English machine translation provided.
Japanese Office Action issued in corresponding Japanese Patent Application No. 2023-003967, dated May 21, 2024, 6 pages, English machine translation provided.

* cited by examiner

FIG. 46A
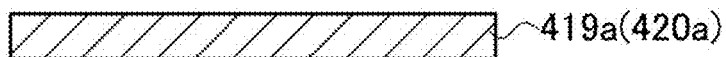
FIG. 46B
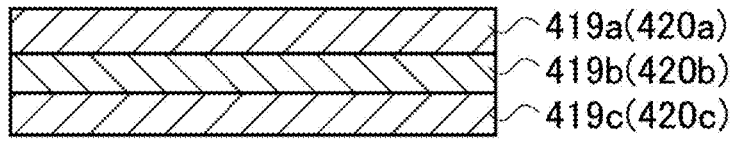
FIG. 46C
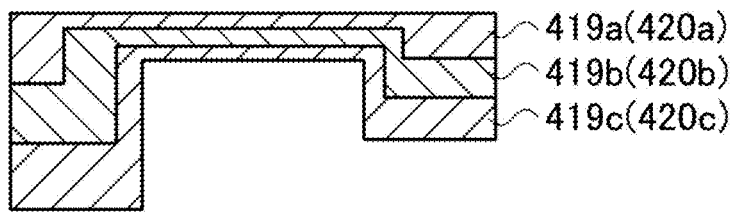
FIG. 46D
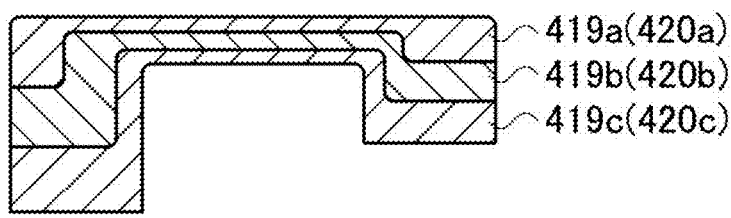

POWER SEMICONDUCTOR APPARATUS AND FABRICATION METHOD FOR THE SAME

CROSS REFERENCE TO RELATED APPLICATIONS

This is a continuation application (CA) of PCT Application No. PCT/JP2018/018053, filed on May 10, 2018, which claims priority to Japan Patent Application Nos. P2017-093941 filed on May 10, 2017, P2017-106445 filed on May 30, 2017, and P2017-112433 filed on Jun. 7, 2017 and is based upon and claims the benefit of priority from prior Japanese Patent Application Nos. P2017-093941 filed on May 10, 2017, P2017-106445 filed on May 30, 2017, P2017-112433 filed on Jun. 7, 2017 and PCT Application No. PCT/JP2018/018053, filed on May 10, 2018, the entire contents of each of which are incorporated herein by reference.

FIELD

The embodiments described herein relate a power semiconductor apparatus and a fabrication method for such a power semiconductor apparatus.

BACKGROUND

Many research institutions have been currently conducting research to develop Silicon Carbide (SiC) devices. Advantages of SiC power devices over Si power devices include low on resistance, high switching speed, high temperature operation characteristics, etc.

SiC semiconductor power modules can conduct a large electric current, and can be easily operated under high temperature conditions operation, since an electric power in Si power devices is relatively smaller. However, semiconductor power module design has been required for achieving such SiC semiconductor power modules.

Conventionally, as one of the semiconductor power modules, there have been known semiconductor power modules in which a perimeter of semiconductor power module(s) including a power element(s) (chip(s)) such as Insulated Gate Bipolar Transistor (IGBT) is molded with resin.

In the operating state, it is general to make the heat radiators, e.g. the heat sink and the fin, arrange and radiate the heat to the back surface side of the substrate, and to cool the semiconductor power device to the semiconductor power device generates heat.

Particularly, in recent years, making such a substrate portion as a thick copper substrate has progressed in order to reduce a thermal resistance.

With increasing junction temperature Tj of semiconductor power modules, power cycle capabilities have been insufficient under conventional technologies (aluminum wires). Recently, accordingly, in order to prolong lifetime, copper wires may be used instead of the aluminum wires. Alternatively, upper wirings, e.g. lead materials or electrode pillars, may be used instead of the wires.

In conventional semiconductor power modules, there is also disclosed an example of applying a laser welding technology without using bonding materials for bonding between a stress buffering layer and a leadframe in a connecting structure between a heat spreader and a metallic plate, or a connecting structure of electrode wirings.

SUMMARY

There are listed thick copper substrates under chip as a trend of current semiconductor power modules for reducing thermal resistance of the semiconductor power modules. Such thick copper substrates are suitable for reducing the thermal resistance, but on the other hand, an undue stress is given to a bonded portion of an Ag fired material or Cu fired material of a bonding material. Accordingly, if such thick copper substrates are used, the bonded portion is degraded and there is a concern about reliability of the bonding.

However, a power of ultrasonic waves becomes extremely larger than that of the aluminum wires when bonding the copper wires onto semiconductor power devices, and thereby devices may be broken.

On the other hand, when using the upper wirings, e.g. lead materials or electrode pillars, Pb-free solder has been used as bonding materials. However, in the case of such Pb-free solder is used, since a melting point becomes up to approximately the junction temperature Tj (=200° C.) in devices, e.g. silicon carbide (SiC), having a thermal resistance of 200° C. or more, and a ΔTj-power cycle also becomes large, the power cycle capability (power cycle lifetime) will be decreased.

With increasing junction temperature Tj of semiconductor power modules, power cycle capabilities have been insufficient under conventional technologies (aluminum wires). Recently, accordingly, in order to prolong lifetime, copper wires may be used instead of the aluminum wires. Alternatively, upper wirings, e.g. lead materials or electrode pillars, may be used instead of the wires.

However, a power of ultrasonic waves becomes extremely larger than that of the aluminum wires when bonding the copper wires onto semiconductor chips, and thereby devices may be broken.

On the other hand, when using the upper wirings, e.g. lead materials or electrode pillars, Pb-free solder has been used as bonding materials. However, in the case of such Pb-free solder is used, since a melting point becomes up to approximately the junction temperature Tj (=200° C.) in devices, e.g. silicon carbide (SiC), having a thermal resistance of 200° C. or more, and a ΔTj-power cycle also becomes large, the power cycle capability (power cycle lifetime) will be decreased.

The embodiments provide a power semiconductor apparatus capable of having improved bonding reliability without increasing a thermal resistance, and a fabrication method for such a power semiconductor apparatus.

The embodiments also provide a power semiconductor apparatus capable of improving reliability thereof by reducing a thermal stress to a bonding layer between a semiconductor power device and a metal lead positioned on an upper surface thereof, and reducing a resistance of the metal lead.

The embodiments provide a power semiconductor apparatus capable of improving bonding reliability between a semiconductor power device and a metal lead positioned on an upper surface thereof with respect to a stress due to an environment of repeating cooling and heating, and easily controlling a melting depth made by a laser light According to one aspect of the embodiments, there is provided a power semiconductor apparatus comprising: a plate-shaped thick copper substrate; a conductive bonding layer partially disposed on the thick copper substrate; a semiconductor power device disposed on the bonding layer; and an external connection terminal electrically connected to an electrode of the semiconductor power device, wherein a Vickers hardness of the thick copper substrate is equal to or less than 50.

According to another aspect of the embodiments, there is provided a power semiconductor apparatus comprising: a plate-shaped first thick copper layer; an insulating sheet layer or a first thermal compound layer disposed on the first thick copper layer; a pattern-formed second thick copper layer disposed on the insulating sheet layer; a conductive bonding layer disposed on the second thick copper layer; a semiconductor power device disposed on the bonding layer; and a plurality of external connection terminals electrically connected to each electrode of the semiconductor power device, wherein a Vickers hardness of the second thick copper layer is smaller than a Vickers hardness of the first thick copper layer or the external connection terminals, and is equal to or less than 50.

According to still another aspect of the embodiments, there is provided a fabrication method for a power semiconductor apparatus, the fabrication method comprising: forming a second thick copper layer subjected to an annealing process at equal to or greater than 400° C.; forming a conductive bonding layer on the second thick copper layer; disposing the second thick copper layer on a first thick copper layer via an insulating sheet layer or a first thermal compound layer; disposing a semiconductor power device on the bonding layer and bonding the semiconductor power device to the bonding layer by means of a heating and pressurizing process for heating and pressurizing the semiconductor power device; and connecting an electrode of the semiconductor power device to an external connection terminal, wherein a Vickers hardness of the second thick copper layer subjected to the annealing process is smaller than a Vickers hardness of the first thick copper layer and/or the external connection terminals, and is equal to or less than 50.

According to one aspect of the embodiments, there is provided a power semiconductor apparatus comprising: a semiconductor device; a bonding layer on chip disposed on an upper surface of the semiconductor device; and a metal lead disposed on the upper surface of the semiconductor device, the metal lead being bonded to the bonding layer on chip, wherein the metal lead has a metallic laminated structure.

According to another aspect of the embodiments, there is provided a power semiconductor apparatus comprising: a substrate; a first electrode pattern, a second electrode pattern, a first signal electrode pattern, and a second signal electrode pattern respectively disposed on the substrate; a bonding layer under chip disposed on the first electrode pattern; a semiconductor device disposed on the bonding layer under chip, the semiconductor device comprising a first pad electrode and a second pad electrode on a front surface side thereof; a bonding layer on chip disposed on the first pad electrode; a bonding layer on source electrode disposed on the second electrode pattern; and a first metal lead bonded to the bonding layer on source electrode and the bonding layer on chip, wherein the first metal lead has a metallic laminated structure.

According to one aspect of the embodiments, there is provided a power semiconductor apparatus comprising: a semiconductor power device comprising a pad electrode formed on a front side surface thereof; a conductive bonding layer on chip disposed on the pad electrode and bonded to the pad electrode, the bonding layer on chip thicker than the pad electrode; and a metal lead disposed on an upper surface of the bonding layer on chip, the metal lead being bonded to the bonding layer on chip, wherein a melted resolidified portion formed by laser welding is provided between the metal lead and the bonding layer on chip.

According to another aspect of the embodiments, there is provided a power semiconductor apparatus comprising: a substrate; a first electrode pattern, a second electrode pattern, a first signal electrode pattern, a second signal electrode pattern disposed on the substrate; a bonding layer under chip disposed on the first electrode pattern; a semiconductor power device disposed on the bonding layer under chip, the semiconductor power device comprising a first pad electrode and a second pad electrode disposed on a front surface side thereof; a conductive bonding layer on chip disposed on the first pad electrode and connected to the first pad electrode; and a metal lead bonded to the second electrode pattern and the bonding layer on chip, wherein a melted resolidified portion formed by laser welding is provided between the metal lead and the bonding layer on chip and between the metal lead and the second electrode pattern.

According to still another aspect of the embodiments, there is provided a power semiconductor apparatus comprising: a semiconductor power device comprising a pad electrode formed on a front side surface thereof; a conductive bonding layer on chip disposed on the pad electrode and bonded to the pad electrode; a metallic plate disposed on the bonding layer on chip and bonded to the bonding layer on chip, the metallic plate being thicker than the bonding layer on chip; and a metal lead disposed on an upper surface of the metallic plate, the metal lead being bonded to the metallic plate, wherein a melted resolidified portion formed by laser welding is provided between the metal lead and the metallic plate.

According to yet another aspect of the embodiments, there is provided a power semiconductor apparatus comprising: a semiconductor power device comprising a pad electrode formed on a front side surface thereof; a plating layer disposed on the pad electrode, the plating layer being formed thicker than the pad electrode; a metal lead disposed on an upper surface of the plating layer, the metal lead being bonded to the plating layer, wherein a melted resolidified portion formed by laser welding between the metal lead and the plating layer.

According to the embodiments, there can be provided the power semiconductor apparatus capable of having improved bonding reliability without increasing the thermal resistance, and the fabrication method for such a power semiconductor apparatus.

According to the embodiments, there can be provided the power semiconductor apparatus capable of improving reliability thereof by reducing the thermal stress to the bonding layer between the semiconductor power device and the metal lead positioned on the upper surface thereof, and reducing the resistance of the metal lead.

According to the embodiments, there can be provided the power semiconductor apparatus capable of improving bonding reliability between the semiconductor power device and the metal lead positioned on the upper surface thereof with respect to the stress due to the environment of repeating cooling and heating, and easily controlling the melting depth made by the laser light.

BRIEF DESCRIPTION OF DRAWINGS

FIG. 46A is a process chart of preparing a metal layer, in a fabrication method of a metal lead to be applied to the power semiconductor apparatus according to one embodiment to which the present technology is applied.

FIG. 46B is a process chart of laminating and rolling the metal layer, in the fabrication method of the metal lead to be applied to the power semiconductor apparatus according to one embodiment to which the present technology is applied.

FIG. 46C is a process chart of forming a desired rectangular shape as a result of rolling the laminated metal layer, in the fabrication method of the metal lead to be applied to the power semiconductor apparatus according to one embodiment to which the present technology is applied.

FIG. 46D is a process chart of forming a desired round rectangular shape as a result of rolling the laminated metal layer, in the fabrication method of the metal lead to be applied to the power semiconductor apparatus according to one embodiment to which the present technology is applied.

FIG. 74 is a schematic explanatory diagram in the case of irradiating a Cu/CuMo cladding with the laser light, in the power semiconductor apparatus according to the comparative example.

FIG. 75 is a relational chart between a reflectance R of laser light and a wavelength A of laser light with which metallic materials are irradiated.

FIG. 76 is a schematic planar pattern configuration diagram before forming a mold resin layer in a 2-in-1 module (module with a built-in half-bridge), in the power semiconductor apparatus according to one embodiment to which the present technology is applied.

FIG. 77 is a side view diagram observed from the direction XIIIA-XIIIA of FIG. 76.

FIG. 78 is a side view diagram observed from the direction XIIIA-XIIIA in FIG. 76, in a power module according to the power semiconductor apparatus according to one embodiment to which the present technology is applied.

FIG. 79 is an enlarged drawing of the portion A shown in FIG. 78.

FIG. 80 is a schematic bird's-eye view configuration diagram before forming the mold resin layer in the 2-in-1 module (module with a built-in half-bridge), in the power semiconductor apparatus according to one embodiment to which the present technology is applied.

FIG. 81 is a schematic bird's-eye view configuration diagram before forming the mold resin layer in the 2-in-1 module (module with a built-in half-bridge), in the power semiconductor apparatus according to a modified example of one embodiment to which the present technology is applied.

DESCRIPTION OF EMBODIMENTS

Next, the embodiments will be described with reference to drawings. In the description of the following drawings, the identical or similar reference sign is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

Embodiments

Figure 1:
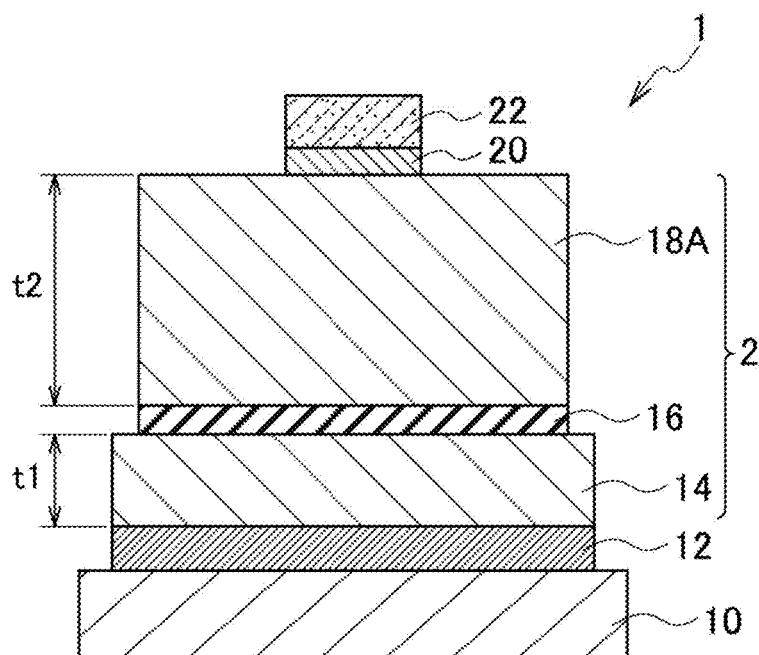
FIG. 1 is a schematic cross-sectional structure diagram showing a power semiconductor apparatus according to one embodiment to which the present technology is applied.
Figure 22:
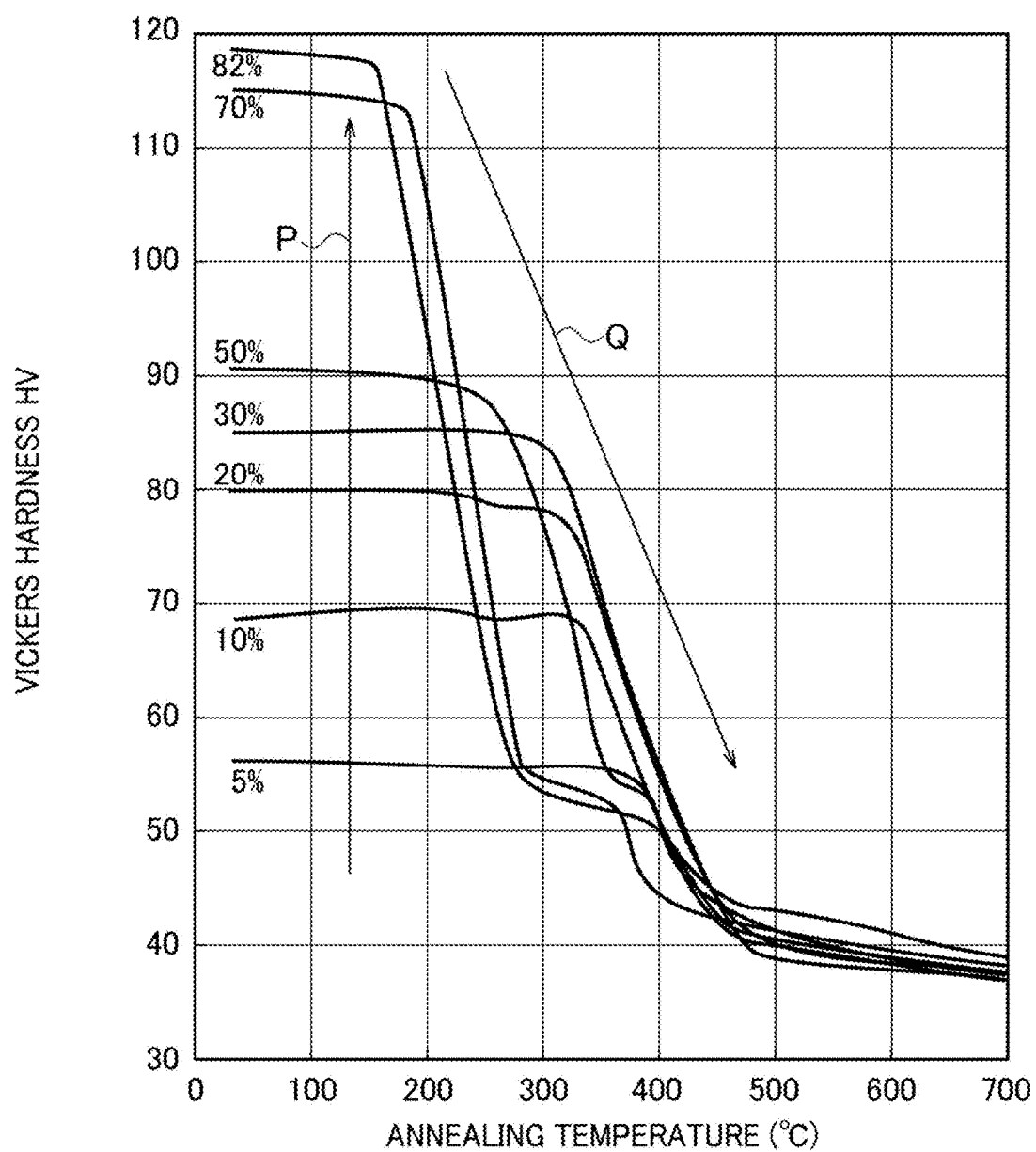
FIG. 22 shows a relationship between a Vickers hardness HV and an annealing temperature, using an oxygen content as a parameter, in oxygen free copper.
Figure 23:
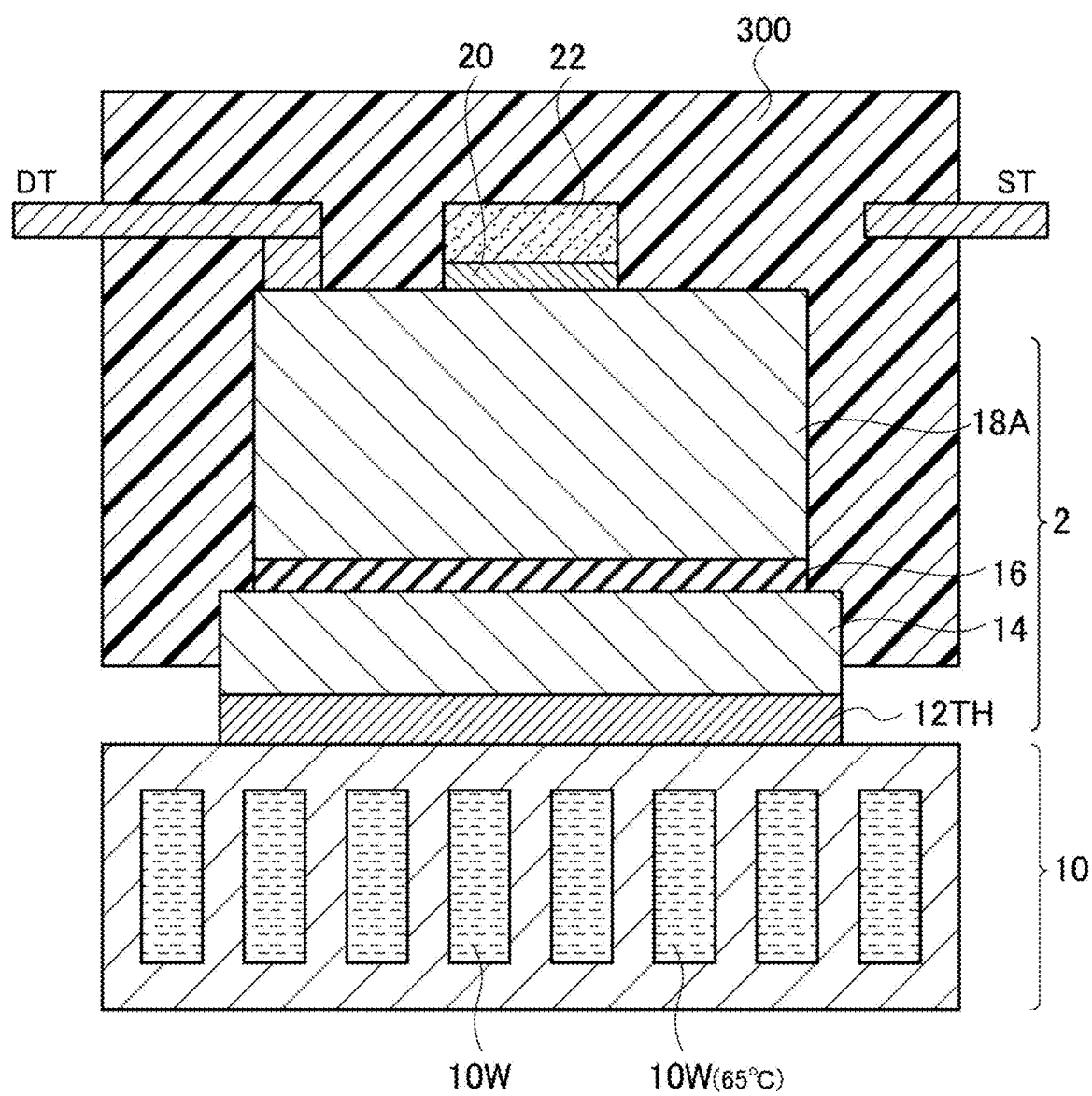
FIG. 23 is a schematic cross-sectional structure diagram (configuration example 1) of a power semiconductor apparatus according to one embodiment to which the present technology is applied, which can be mounted on a cooling apparatus.

As shown in FIG. 1, a principal portion of a power semiconductor apparatus 1 according to one embodiment to which the present technology is applied includes: a plate-shaped thick copper substrate 2; a conductive bonding layer 20 partially disposed on the thick copper substrate 2; and a semiconductor power device 22 disposed on the bonding layer 20, wherein the power semiconductor apparatus 1 further includes an external connection terminal electrically connected to an electrode formed on a front side surface or a back side surface of the semiconductor power device 22, as mentioned below in FIG. 23. The bonding layer 20 includes an Ag fired layer, a Cu fired layer, an Au fired layer, or a Ni fired layer, and is bonded to the semiconductor power device 22. A Vickers hardness of the thick copper substrate 2 is equal to or less than 50. The "Vickers hardness" is known as an evaluation method of the hardness of oxygen free copper. The Vickers hardness is mentioned below (FIG. 22).

Furthermore, the thick copper substrate 2 includes a first thick copper layer 14 and a second thick copper layer 18A disposed on the first thick copper layer 14, as shown in FIG. 1. In this case, the bonding layer 20 is partially disposed on the second thick copper layer 18A. Annealed copper or the like which are annealed is applied to the second thick copper layer 18A. The thickness of the second thick copper layer 18A is approximately equal to or greater than 1 mm, for example.

The Vickers hardness of the second thick copper layer 18A is smaller than the Vickers hardness of the first thick copper layer 14, and is equal to or less than 50.

Moreover, as shown in FIG. 1, an insulating sheet layer 16 having the size equal to or greater than that of the second thick copper layer 18A is disposed on the first thick copper layer 14. The second thick copper layer 18A is disposed on the insulating sheet layer 16.

The semiconductor power device 22 is connected to the second thick copper layer 18A via the bonding layer 20.

Moreover, the semiconductor power device 22 can be bonded to the bonding layer 20 by pressurized and heated by means of a heating and pressurizing process.

As the insulation layer 16, a semi-cured material sheet layer including an epoxy based resin, polyimide based resin, or the like, as a base resin, can be applied, for example. The coefficient of thermal conductivity (CTE) of the insulating sheet layer 16 is equal to or greater than 5 W/mK and the thickness thereof is approximately 0.1 mm to approximately 0.3 mm, for example. The reason for using the insulating sheet layer 16 is to reduce a cost as compared with the ceramic substrate.

The power semiconductor apparatus 1 according to one embodiment to which the present technology is applied may further include a cooling apparatus 10 as shown in FIG. 1, and the first thick copper layer 14 may be disposed via a soldering layer 12 on the cooling apparatus 10. As a material of the soldering layer 12, Sn based soldering layer can be applied. Alternatively, an Ag fired layer or a Cu fired layer may be applied thereas. Alternatively, a thermal compound is composed of silicone may be applied as the so-called heat radiating grease. The thickness of the thermal compound is approximately 0.05 mm to approximately 0.2 mm, for example. Moreover, the cooling apparatus 10 is water-cooling type or air-cooling type, in power semiconductor apparatus 1 according to one embodiment to which the present technology is applied. Although a size of the Ag fired layer 20 has the same size as the semiconductor power device 22 in FIG. 1, the size of the Ag fired layer 20 may be larger than that of the semiconductor power device 22.

The bonding layer 20 includes a metallic particle bonding layer, for example. In this case, the metallic particle bonding layer is formed by annealing a paste layer containing conductive particles, the conductive particles are metallic fine particles, and the paste for forming the paste layer is composed by dispersing metallic fine particles into a pre-determined solvent at a required concentration. The metallic fine particle may be any one of a silver particle, a copper particle, a gold particle, a nickel particle, or the like. Accordingly, the bonding layer 20 includes an Ag fired layer, a Cu fired layer, an Au fired layer, an Ni fired layer, or the like.

The predetermined solvent may be any one of terpineol, tetradecane, terpineol, kerosene, or a composition mixture thereof. Moreover, as the composition mixture, a combination of at least terpineol, tetradecane, terpineol, or kerosene can be applied. Moreover, a mixture of $\alpha$-terpineol, $\beta$-terpineol, or $\gamma$-terpineol may be applied as terpineol.

For example, an Ag particulate paste as a kind of the paste containing the conductive particles is obtained by diffusing Ag particulates having a particle diameter of approximately 1 μm to approximately 50 μm into a predetermined solvent. As such a solvent, a polar solvents, such as terpineol, a hydrocarbon-based solvent, such as tetradecane, an aqueous solvent, a ketone-based solvent, or the like is applied, for example.

The Ag particulate has the configuration which covered the front side surface of the Ag particulate as a core by the shell (organic shell) which composes the organic compound or the like. Consequently, the dispersibility in the solvent can be improved and oxidization of the Ag particulate can be prevented. Moreover, the density of the Ag particulates can be increased and the densification of the metallic particle bonding layer as a sintered body can be improved by pressurizing or heating the paste layer comprised of the Ag particulate paste and breaking the shell, in a previous process before performing the annealing treatment.

Moreover, an Ag particulate paste of which the concentration of the Ag particulates is equal to or less than approximately 81 weight (%) is used, for example, in one embodiments to which the present technology is applied. This is because the metallic silver deposited by firing is made dense to ensure high conductivity and satisfactory bondability.

Moreover, a firing temperature of the paste layer composed of the Ag particulate paste is approximately 200° C. to approximately 400° C., for example. Moreover, a firing time of the paste layer is equal to or greater than approximately 5 minutes, for example.

By the annealing treatment, metallic silver having high melting point (melting point is approximately 960° C.) is deposited to form the bonding layer 20.

In addition, since the bonding layer 20 exhibits characteristics equivalent to that of metallic silver (Ag), the bonding layer 20 has electrically low resistivity (approximately $2.08 \times 10^{-8}$ [$\Omega$m] at 100° C.) and excellent CTE (approximately 429 W/mK at 300K), and has high thermal resistivity with a melting point of approximately 960° C. The thickness when the bonding layer 20 is formed of the Ag fired layer is approximately 0.02 mm to approximately 0.15 mm, for example.

Accordingly, even if an SiC device is driven at a high temperature, e.g., approximately 400° C., a bonded portion thereof cannot be melted and thereby it can improve reliability of the device property, and reliability at the time of mounting. In addition, the thermal resistance can be reduced by 50% compared with the already-existing Pb-based solder, and reliability equal to or higher than that of the solder can be ensured.

(Pressing Process)

A pressing process of the power semiconductor apparatus according to one embodiment to which the present technology is applied will now be explained.

(A) The semiconductor power device 22 is firstly mounted on the thick copper substrate 2 via the Ag fired layer 20, as a chip mounting process.

(B) Next, the above-mentioned structure is disposed on a heating apparatus (not illustrated), e.g. a heater, and the heating and pressurizing process is performed using a pressing plate. A heating processing temperature is approximately 200° C. to approximately 350° C., for example, and an applied pressure PA is approximately 10 MPa to pressure 80 MPa, for example.

(Relationship Between Yield Stress YS and Annealing Temperature)

Figure 2:
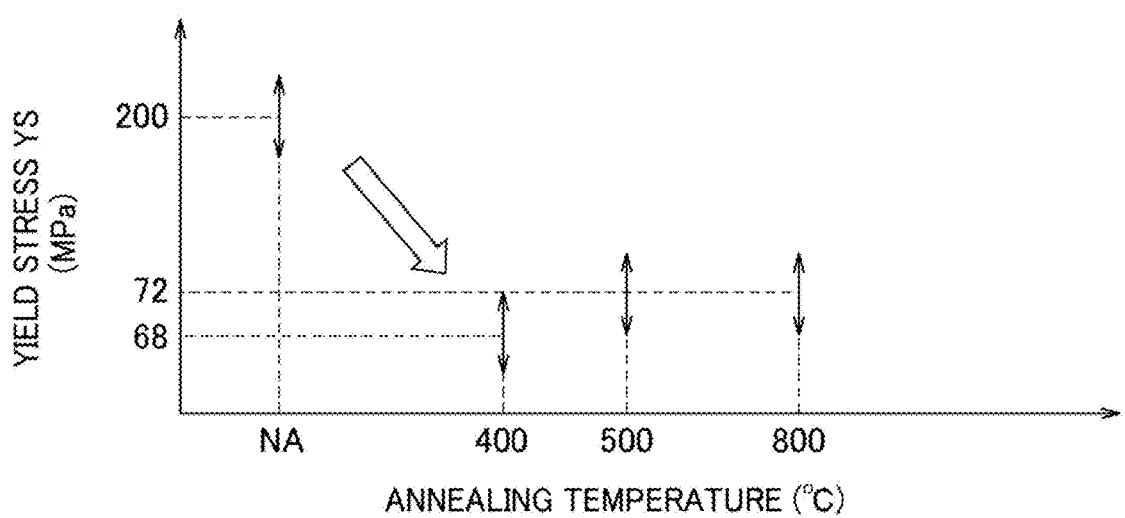
FIG. 2 shows a relationship between a yield stress and an annealing temperature due to copper annealing.

FIG. 2 shows a relationship between a Yield Stress (YS) (MPa) and annealing temperature (° C.) due to the copper annealing. As shown in FIG. 2, a copper yield stress YS is decreased by annealing copper at approximately 400° C. to approximately 800° C. The yield stress YS of copper before the annealing (NA) is approximately 200 MPa to approximately 300 MPa. On the other hand, the yield stress YS of the copper after the annealing is approximately 68 MPa at the annealing temperature of 400° C., and is approximately 72 MPa at the annealing temperature of 500° C. As shown in FIG. 2, a copper yield stress YS is decreased by annealing copper at approximately 400° C. to approximately 800° C. That is, copper itself becomes soft. A deterioration mode of the Ag fired layer can be changed utilizing such an effect.

In the power semiconductor apparatus 1 according to one embodiment to which the present technology is applied, in order to give the annealing effect in advance to the second thick copper layer 18A which is a substrate material under a chip of the semiconductor power device 22, the annealing process is performed to soften the material(s), thereby reducing the stress applied to the bonded portion (20) and suppressing degradation of the bonded portion (20).

The power semiconductor apparatus 1 according to one embodiment to which the present technology is applied has a bonding degradation structure of not a crack that progresses from an edge but a crack that progresses to vertically or a deterioration mode which is partially broken at random, when the bonding layer 20 is deteriorated.

According to the power semiconductor apparatus 1 according to one embodiment to which the present technology is applied, there can be provided the power semiconductor apparatus structure using the thick copper substrate for annealing process for designing degradation of the Ag fired layer 20.

Note that, in FIG. 2, the example of the annealing temperature of 800° C. corresponds to an example of applying the annealing temperature of 800° C. when forming an insulating substrate (Direct Bonding Copper (DBC) substrate) including a laminated structure (stacked structure) of Cu/SiN/Cu. The thickness of the laminated structure of Cu/SiN/Cu is approximately 0.4 mm/0.32 mm/0.4 mm, for example, and is thinner than the thickness of the second thick copper layer 18A (equal to or greater than approximately 1 mm) in the power semiconductor apparatus 1.

(Internal Observation by Means of Scanning Acoustic Tomography)

Figure 3A:
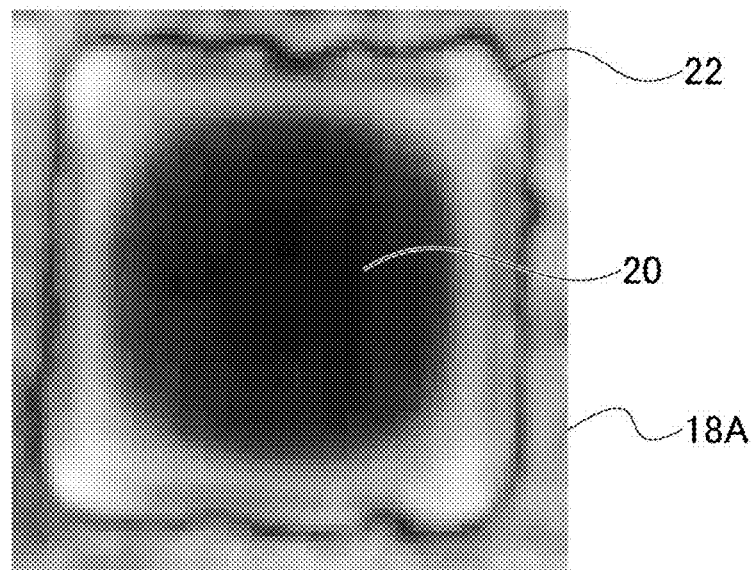
FIG. 3A shows an example of Scanning Acoustic Tomography (SAT) image for explaining degradation of an Ag fired layer, in a power semiconductor apparatus according to a comparative example.
Figure 4A:
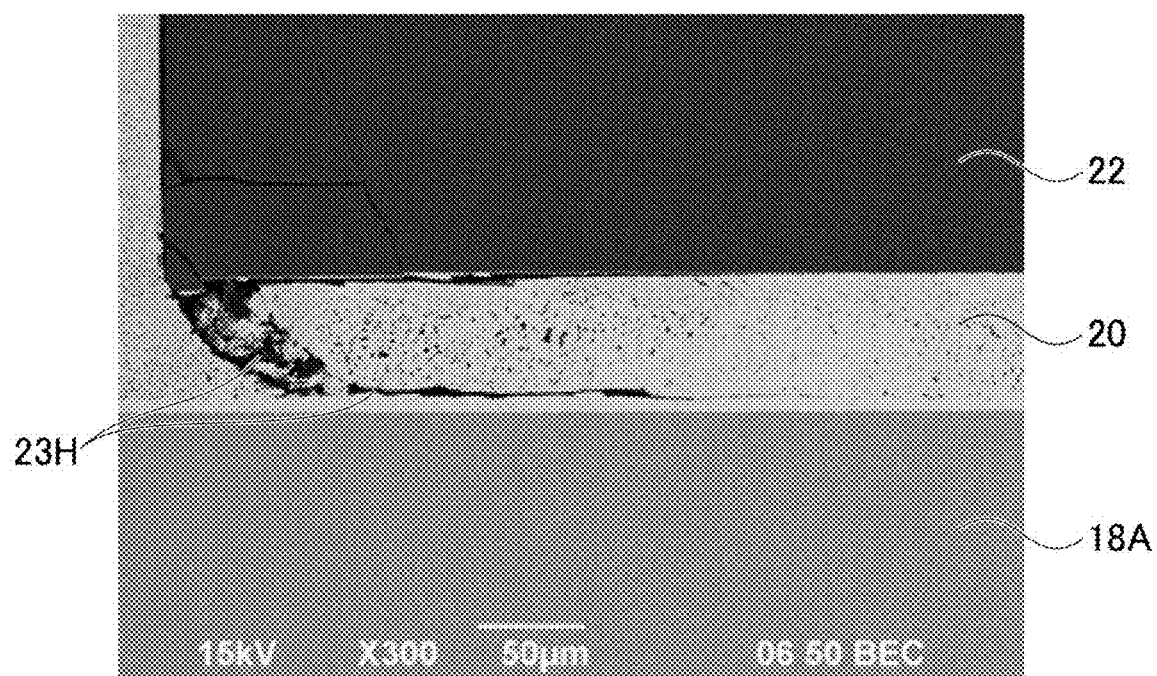
FIG. 4A shows an example of a cross section image for explaining degradation of the Ag fired layer in the power semiconductor apparatus according to the comparative example.
Figure 5A:
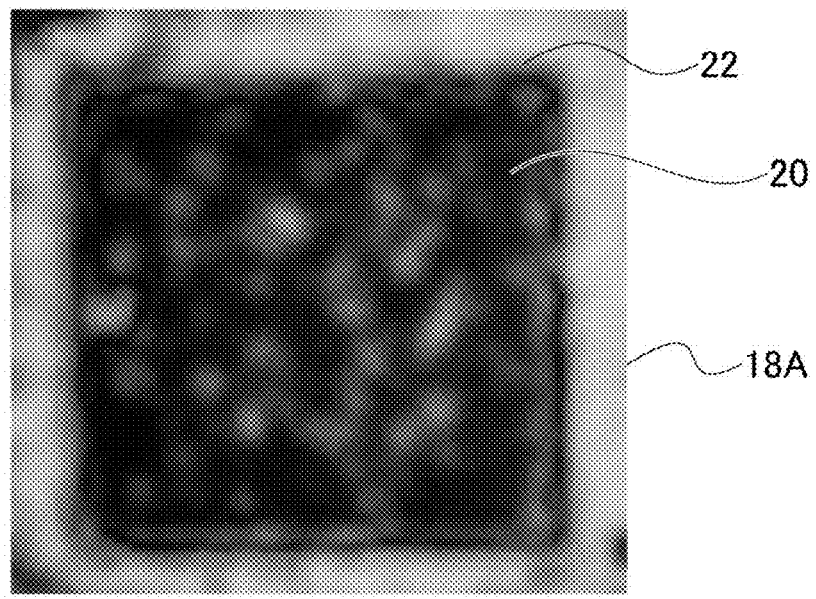
FIG. 5A shows an example of an SAT image for explaining degradation of an Ag fired layer in the power semiconductor apparatus according to one embodiment to which the present technology is applied.
Figure 6A:
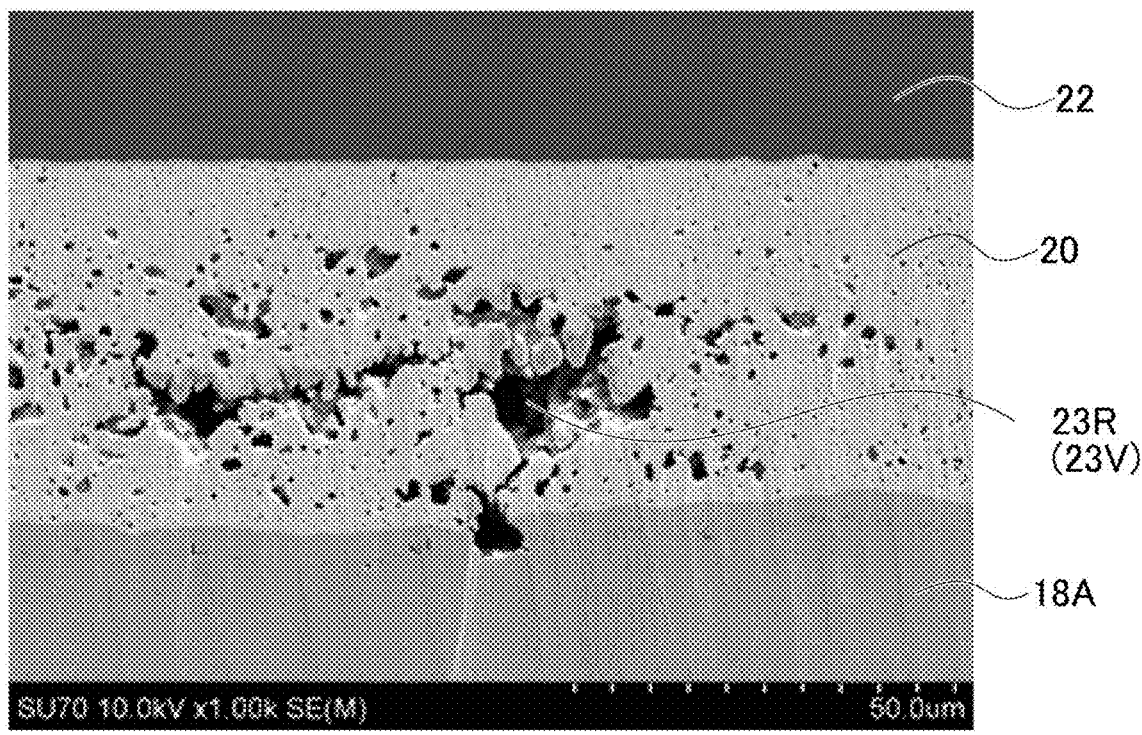
FIG. 6A shows an example of a cross section image for explaining degradation of the Ag fired layer in the power semiconductor apparatus according to an embodiment to which the present technology is applied.

The internal observation by means of a Scanning Acoustic Tomography (SAT) is implemented. An example of an image internally observed is expressed as shown in FIGS. 3A and 5A, and an example of a cross section image of the sample is expressed as shown in FIGS. 4A and 6A. FIGS. 3A and 5A show a result of scanning an ultrasonic probe and internally observing with respect to a power semiconductor apparatus including a second thick copper layer 18A and a semiconductor power device 22 formed on the second thick copper layer 18A via the Ag fired layer 20 as a bonding layer.

In the power semiconductor apparatus according to the comparative example, the thermal stress is applied to the Ag fired layer 20 due to environmental temperature or heat generated from a device as shown in FIGS. 3A and 4A, degradation portion 23H including a horizontal crack is formed in the Ag fired layer 20, and therefore the Ag fired layer 20 is easily deteriorated.

(Difference in Degradation of Ag Fired Layer with and without Annealing Process)

Figure 3B:
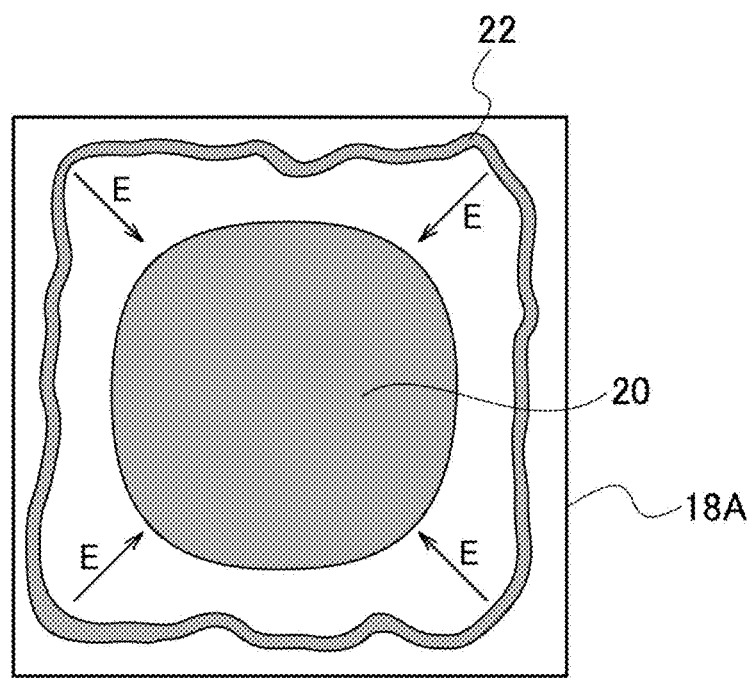
FIG. 3B is a diagram for explaining FIG. 3A.
Figure 4B:
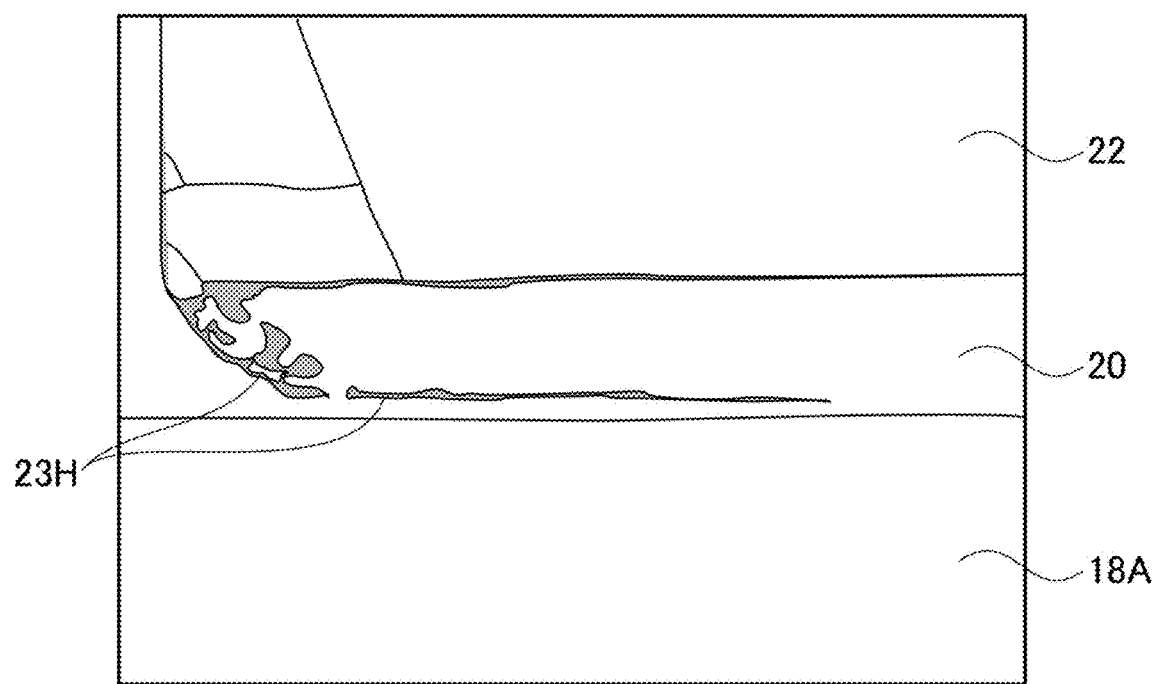
FIG. 4B is a diagram for explaining FIG. 4A.
Figure 8:
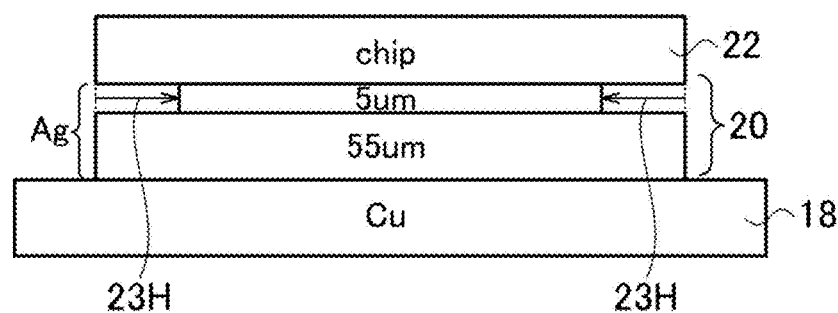
FIG. 8 is a schematic cross-sectional structure diagram applied to the thermal resistance simulation when the destruction of the Ag fired layer corresponds to a horizontal crack model, in the power semiconductor apparatus according to the comparative example.

FIGS. 3 and 4 show aspects of degradation of the Ag fired layer subjected to no annealing process such as a copper layer (Cu layer) 18 to be bonded to the semiconductor power device 22 shown in FIG. 8, as a comparative example. More specifically, in the power semiconductor apparatus according to the comparative example, FIG. 3A shows an example of an SAT image for explaining degradation of the Ag fired layer, and FIG. 3B shows a diagram for explaining FIG. 3A. Moreover, in the power semiconductor apparatus according to the comparative example, FIG. 4A shows an example of a cross section image for explaining degradation of the Ag fired layer, and FIG. 4B shows a diagram for explaining FIG. 4A.

In the case of no annealing process such as a copper layer 18 (i.e., ordinary copper plate), as shown in the arrows E of FIG. 3B, a destruction mode in which horizontal cracks progress respectively from corner portions of the Ag fired layer 20 is observed. As shown in FIG. 4A, from an example of the cross section image of the aforementioned corner portion, a degradation portion 23H in which the horizontal crack progresses is observed.

As a current trend of power semiconductor apparatuses for reducing thermal resistance of the power semiconductor apparatuses, thick copper layers have been used (thickness of approximately 1 mm to approximately 5 mm) in order to spread heat. Such thick copper layers are suitable for reducing the thermal resistance, but on the other hand, an undue stress is given to a bonded portion of an Ag fired material or Cu fired material of a bonding material. Particularly, degradation occurs from an edge portion of the Ag fired body portion, and thereby the thermal resistance is increased.

Figure 5B:
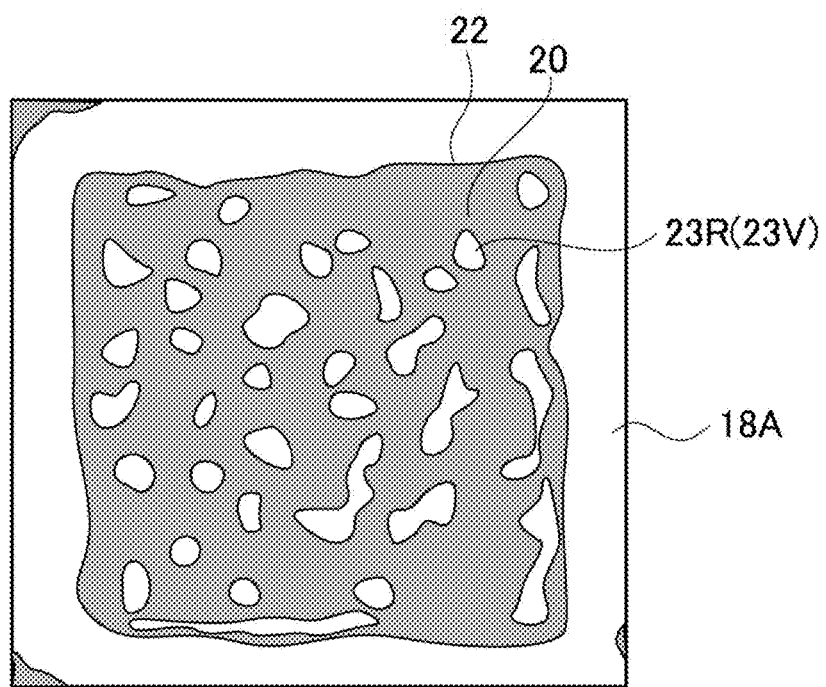
FIG. 5B is a diagram for explaining FIG. 5A.
Figure 6B:
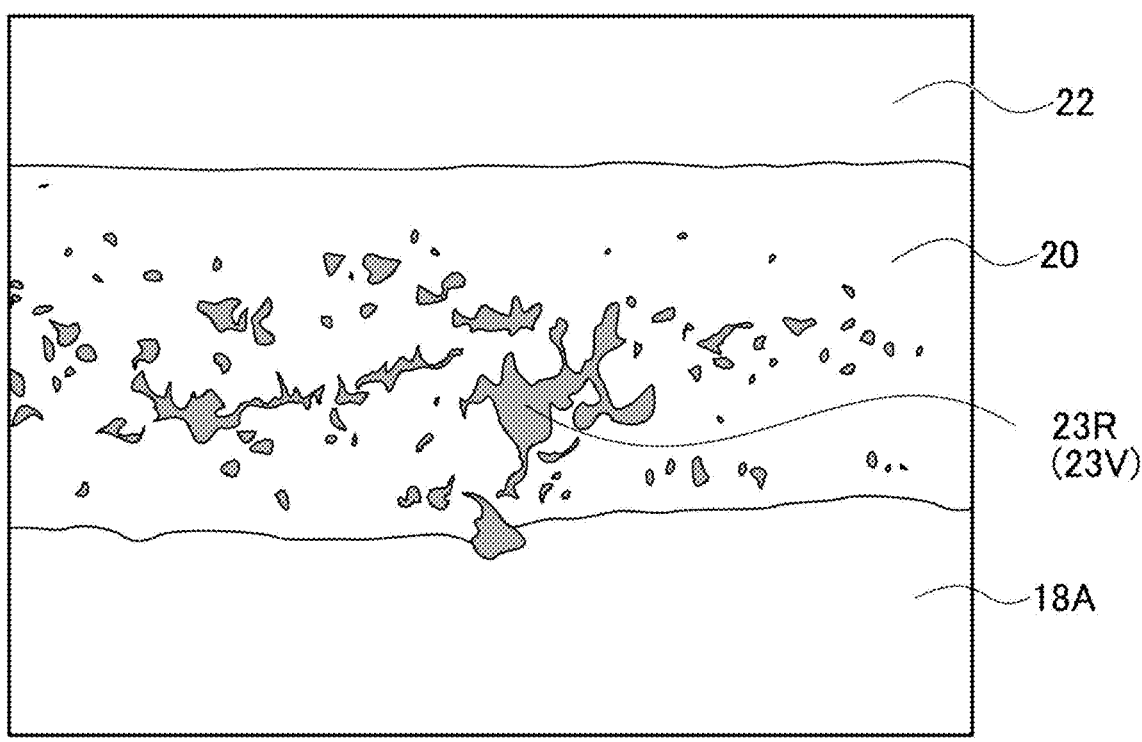
FIG. 6B is a diagram for explaining FIG. 6A.

Such as the thick copper layer 18A shown in FIG. 1, aspects of degradation of the Ag fired layer subjected to the annealing process is shown in FIGS. 5 and 6. More specifically, in power semiconductor apparatus according to one embodiment to which the present technology is applied, FIG. 5A shows an example of an SAT image for explaining degradation of the Ag fired layer, and FIG. 5B shows a diagram for explaining FIG. 5A. Moreover, in power semiconductor apparatus according to one embodiment to which the present technology is applied, FIG. 6A shows an example of a cross section image for explaining degradation of the Ag fired layer, and FIG. 6B shows a diagram for explaining FIG. 6A.

Such as the thick copper layer 18A subjected to the annealing process, as shown in FIGS. 5 and 6, a destruction mode in which random and/or vertical cracks progresses in the Ag fired layer 20 is observed. As shown in FIG. 5B and FIGS. 6A and 6B, a degradation portions 23R, 23V to which random and/or the vertical crack progresses is observed.

As in the case of the thick copper layer 18A, a mechanism of the degradation of the sample subjected to the annealing process is that the copper becomes soft and roughness of the copper surface occurs, and the degradation occurs from there as a starting point. The aspect of the copper surface roughness is expressed by an uneven shape of an interface between the Ag fired layer 20 and the second thick copper layer 18A, as shown in FIGS. 6A and 6B.

(Thermal Resistance Simulation Model Based on Difference in Destruction of Ag Fired Layer)

In the power semiconductor apparatus according to one embodiment to which the present technology is applied, the destruction mode varies depending on the difference in substrates. We examined which destruction mode affects how much the thermal resistance.

Figure 7:
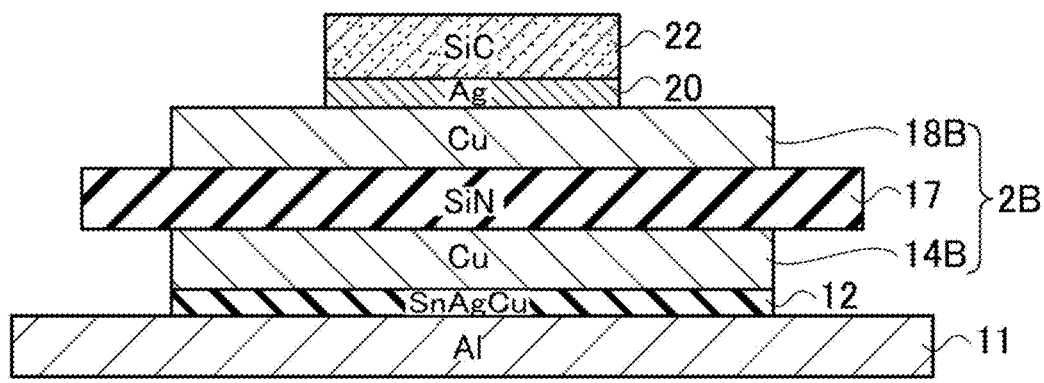
FIG. 7 is a schematic cross-sectional structure diagram applied to a thermal resistance simulation based on a difference in destruction models of the Ag fired layer.

FIG. 7 shows a schematic cross-sectional structure applied to a thermal resistance simulation based on the difference in the destruction models of the Ag fired layer 20. More specifically, as shown in FIG. 7, the schematic cross-sectional structure applied to the thermal resistance simulation includes a DBC substrate 2B, a Ag fired layer 20 disposed on the DBC substrate 2B, and a semiconductor power device 22 disposed on the Ag fired layer 20. The DBC substrate 2B has a three-laminated structure which including a copper foil layer 18B/SiN ceramics substrate 17/copper foil layer 14B, and the thicknesses are respectively 0.3 mm/0.32 mm/0.3 mm. The thickness of the Ag fired layer 20 is 0.06 mm, and the thickness of the SiC semiconductor power device 22 is 0.25 mm. Moreover, an aluminum layer 11 which assumes a cooling apparatus is disposed on a back side surface of the DBC substrate 2B via an SnAgCu soldering layer 12. The thickness of the aluminum layer 11 is 1 mm, and the thickness of the SnAgCu soldering layer 12 is 0.2 mm, and a temperature of the back side surface of the aluminum layer 11 is fixed at 65° C. In FIG. 7, the thermal resistance $R_{th}$ expresses a thermal resistance between Tj (junction temperature) of the SiC semiconductor power device 22 and the temperature of the back side surface (65° C.) of the aluminum layer 11.

Three destruction models which can be observed from a thermal resistance simulation will now be explained by reference with the three-laminated structure including the copper foil layer 18A, the Ag fired layer 20, and the semiconductor power device 22 at the front surface side of the DBC substrate 2A.

—Horizontal Crack Model—

FIG. 8 is a schematic cross-sectional structure applied to the thermal resistance simulation when the destruction of the Ag fired layer 20 corresponds to a horizontal crack model, in the power semiconductor apparatus according to the comparative example. In FIG. 8, a copper layer (Cu layer) 18 corresponds to the ordinary copper plate subjected to no annealing process. The Ag fired layer 20 has a double laminated structure (55 μm in thickness and 5 μm in thickness), and a degradation portion 23H due to horizontal crack has occurred at the layer portion of 5 μm in thickness in the Ag fired layers 20.

Figure 9A:
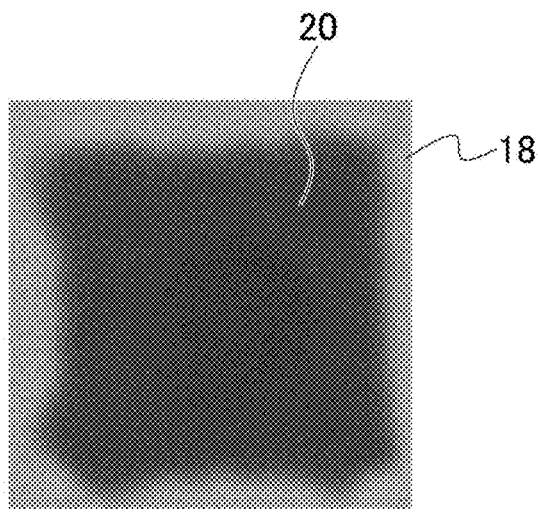
FIG. 9A shows an example of an SAT image at an interface between a Cu layer and the Ag fired layer, in FIG. 8.
Figure 9B:
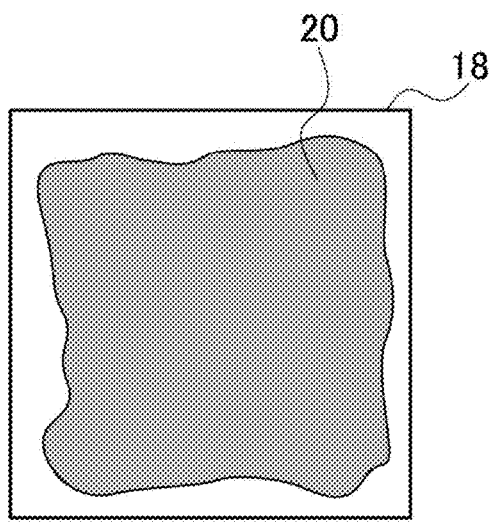
FIG. 9B is a diagram for explaining FIG. 9A.
Figure 9C:
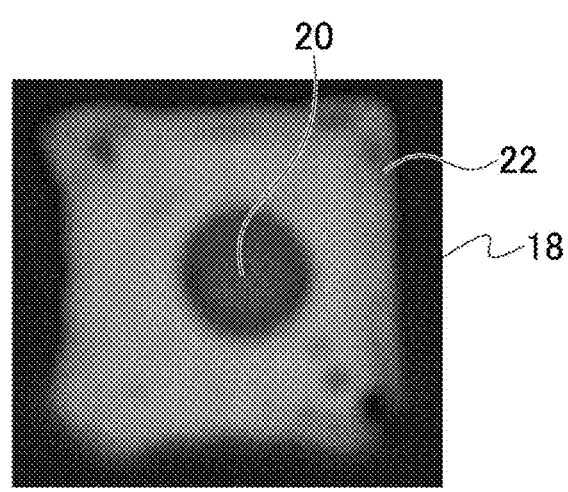
FIG. 9C shows an example of an SAT image at an interface between an SiC semiconductor power device and the Ag fired layer, in FIG. 8.
Figure 9D:
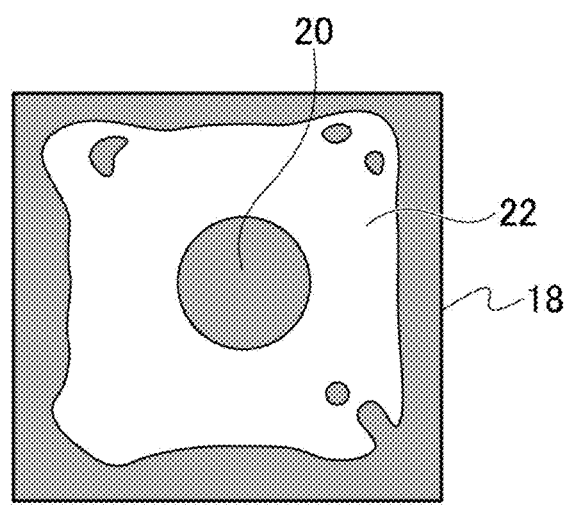
FIG. 9D is a diagram for explaining FIG. 9C.
Figure 10A:
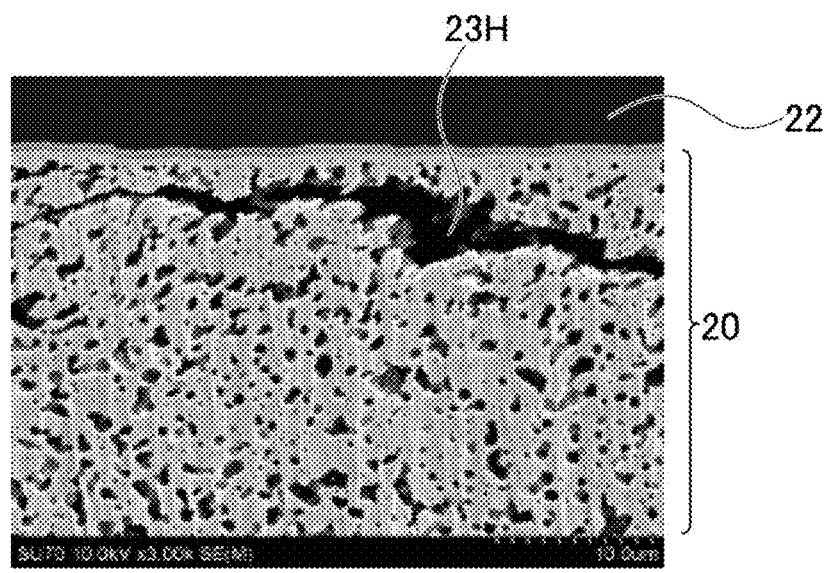
FIG. 10A shows an example of a cross section image of the Ag fired layer shown in FIG. 8.
Figure 10B:
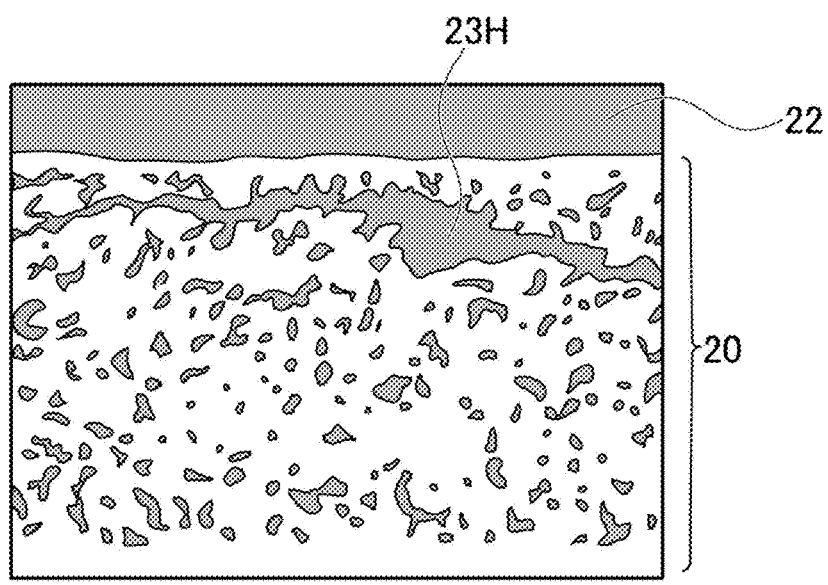
FIG. 10B is a diagram for explaining FIG. 10A.

FIG. 9A shows an example of an SAT image of an interface between the Cu layer 18 and the Ag fired layer 20 in FIG. 8, and FIG. 9B shows a diagram for explaining FIG. 9A. FIG. 9C shows an example of an SAT image of an interface between the SiC semiconductor power device 22 and the Ag fired layer 20 in FIG. 8, and FIG. 9D shows a diagram for explaining FIG. 9C. FIG. 10A shows an example of a cross section image of the Ag fired layer 20 in FIG. 8, and FIG. 10B shows a diagram for explaining FIG. 10A.

—Vertical Crack Model—

Figure 11:
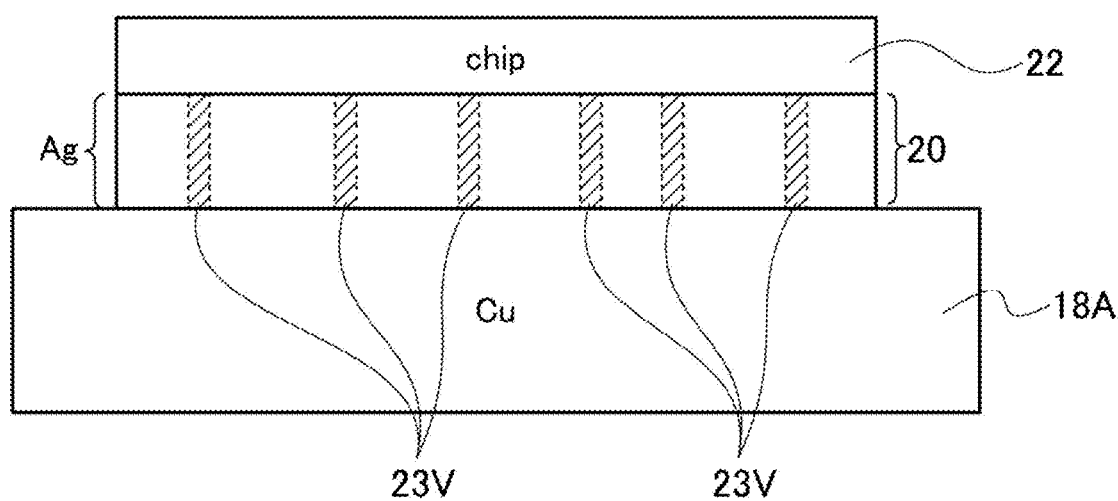
FIG. 11 is a schematic cross-sectional structure diagram applied to the thermal resistance simulation when the destruction of the Ag fired layer corresponds to a vertical crack model, in the power semiconductor apparatus according to one embodiment to which the present technology is applied.

FIG. 11 is a schematic cross-sectional structure applied to the thermal resistance simulation when the destruction of the Ag fired layer 20 corresponds to a vertical crack model, in the power semiconductor apparatus according to one embodiment to which the present technology is applied. In FIG. 11, a second thick copper layer (Cu layer) 18A corresponds to an annealed copper plate, of which the Vickers hardness is equal to or less than 50, subjected to the annealing process. Moreover a degradation portion 23V due to vertical cracks has occurred in the Ag fired layer 20.

Figure 12A:
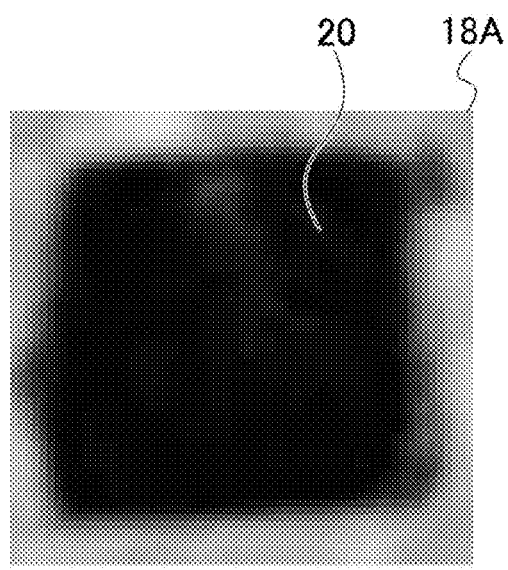
FIG. 12A shows an example of an SAT image at an interface between a Cu layer and the Ag fired layer, in FIG. 11.
Figure 12C:
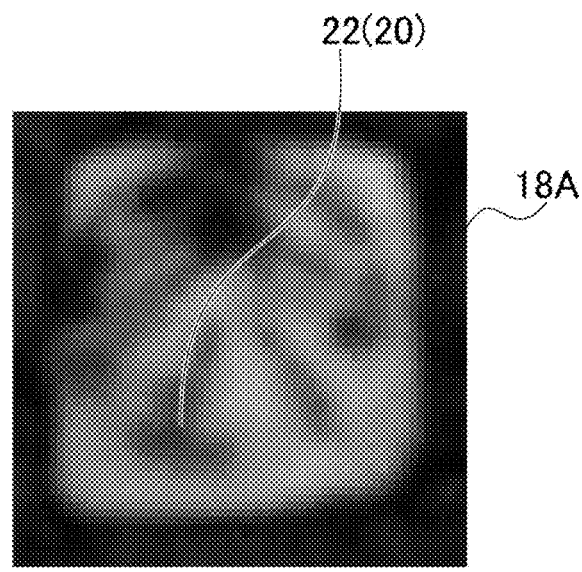
FIG. 12C shows an example of an SAT image at the interface between the SiC semiconductor power device and the Ag fired layer, in FIG. 11.
Figure 12B:
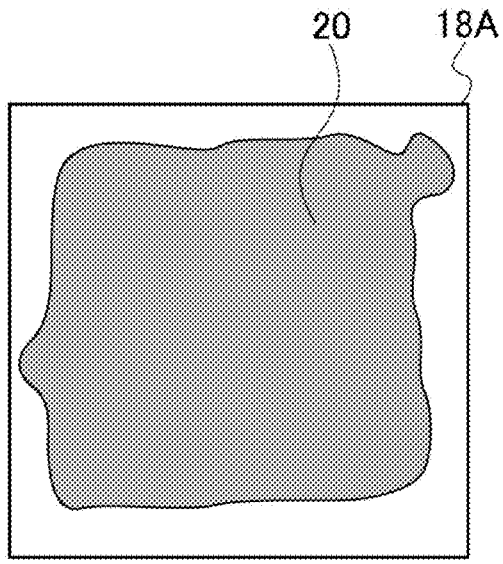
FIG. 12B is a diagram for explaining FIG. 12A.
Figure 12D:
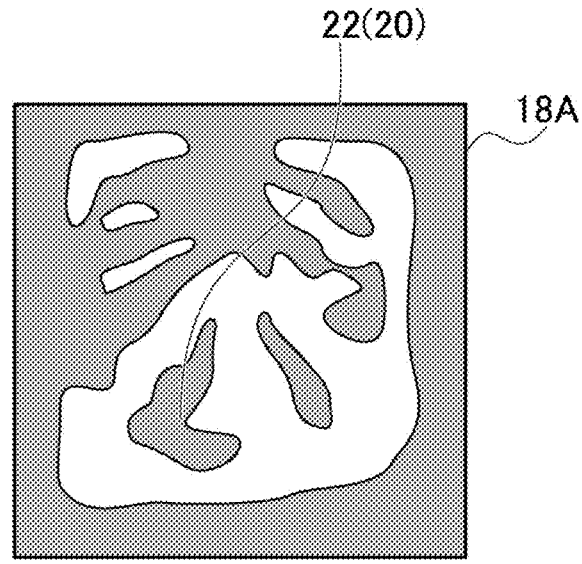
FIG. 12D is a diagram for explaining FIG. 12C.
Figure 13A:
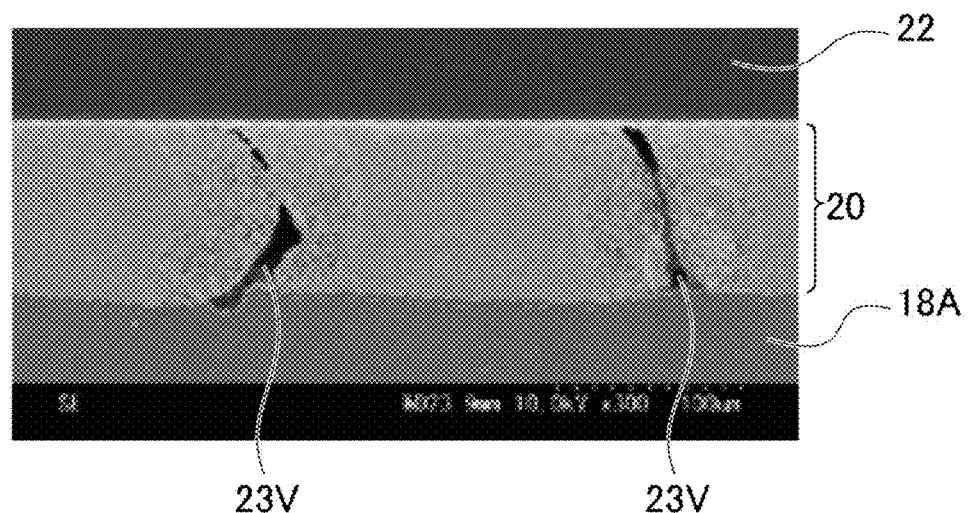
FIG. 13A shows an example of a cross section image of the Ag fired layer shown in FIG. 11.
Figure 13B:
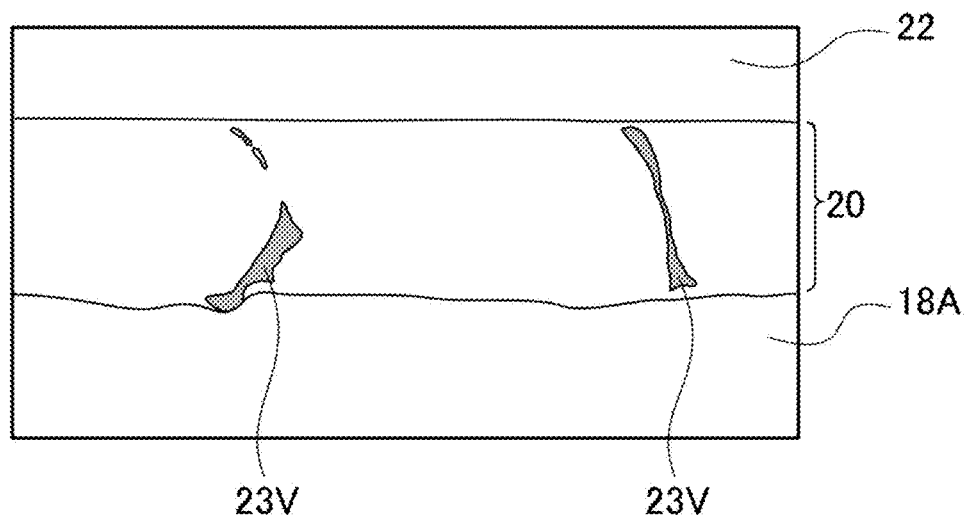
FIG. 13B is a diagram for explaining FIG. 13A.

FIG. 12A shows an example of an SAT image of an interface between the second thick copper layer (Cu layer) 18A and the Ag fired layer 20 in FIG. 11, and FIG. 12B shows a diagram for explaining FIG. 12A. FIG. 12C shows an example of an SAT image of an interface between the SiC semiconductor power device 22 and the Ag fired layer 20 in FIG. 11, and FIG. 12D shows a diagram for explaining FIG. 12C. FIG. 13A shows an example of a cross section image of the Ag fired layer 20 in FIG. 11, and FIG. 13B shows a diagram for explaining FIG. 13A.

—Random Crack Model—

Figure 14:
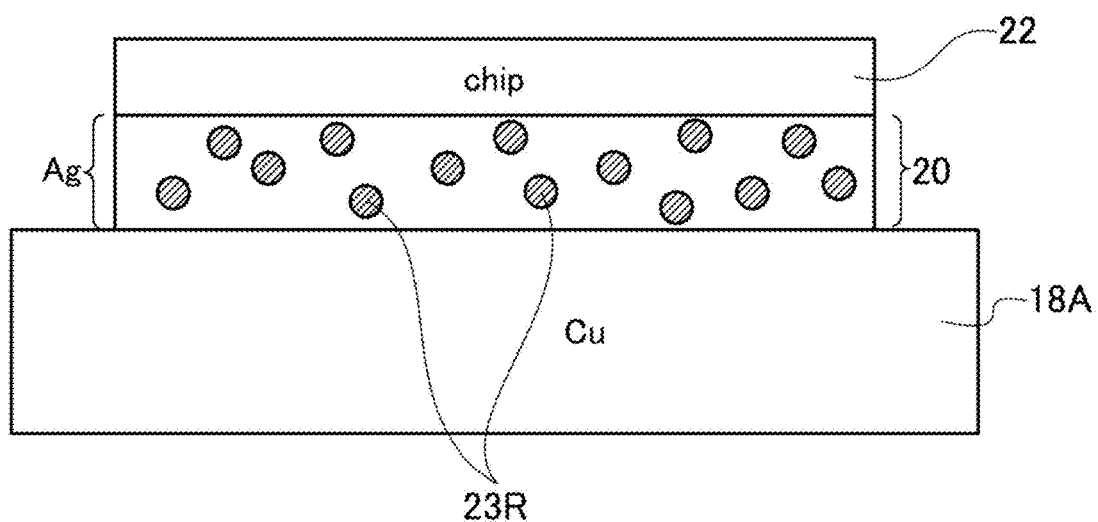
FIG. 14 is a schematic cross-sectional structure diagram applied to the thermal resistance simulation when the destruction of the Ag fired layer corresponds to a random crack model, in the power semiconductor apparatus according to one embodiment to which the present technology is applied.

FIG. 14 is a schematic cross-sectional structure applied to the thermal resistance simulation when the destruction of the Ag fired layer 20 corresponds to a random crack model, in the power semiconductor apparatus according to one embodiment to which the present technology is applied. In FIG. 14, a second thick copper layer (Cu layer) 18A corresponds to an annealed copper plate, of which the Vickers hardness is equal to or less than 50, subjected to the annealing process. Moreover a degradation portion 23R due to random cracks has occurred in the Ag fired layer 20.

Figure 15A:
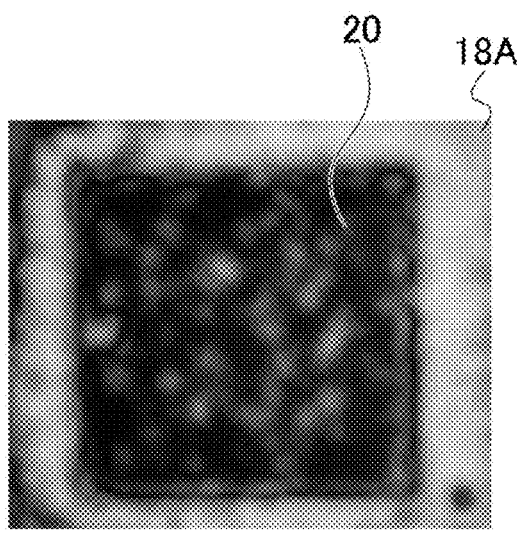
FIG. 15A shows an example of an SAT image at an interface between a Cu layer and the Ag fired layer, in FIG. 14.
Figure 15B:
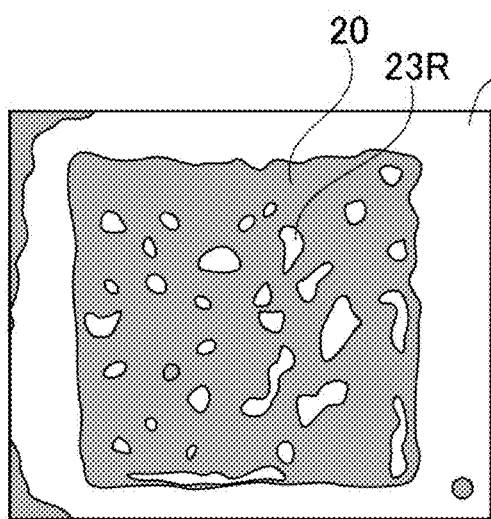
FIG. 15B is a diagram for explaining FIG. 15A.
Figure 15C:
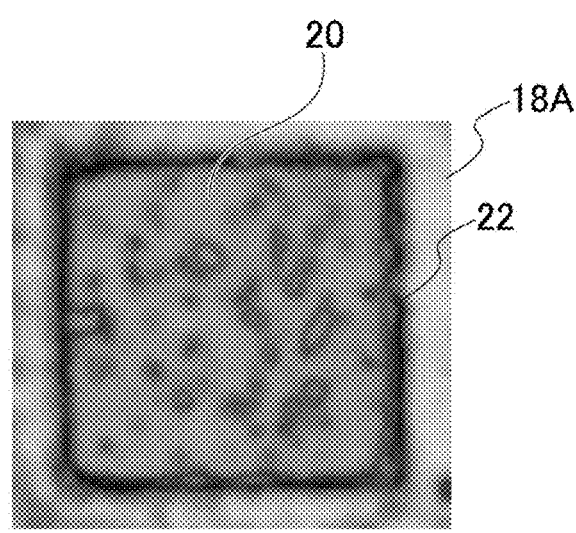
FIG. 15C shows an example of an SAT image at the interface between the SiC semiconductor power device and the Ag fired layer, in FIG. 14.
Figure 15D:
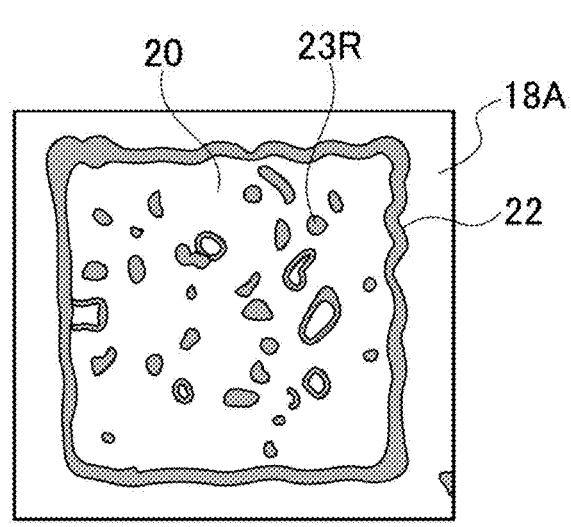
FIG. 15D is a diagram for explaining FIG. 15C.
Figure 16A:
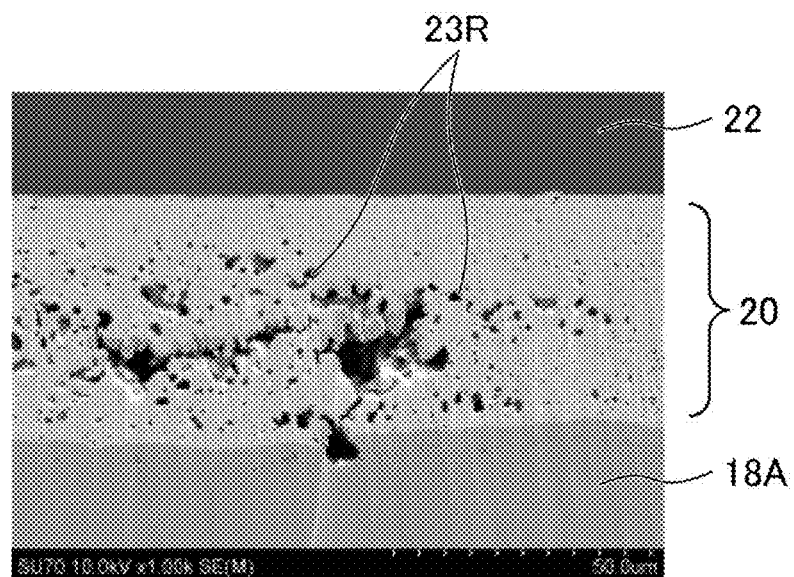
FIG. 16A shows an example of a cross section image of the Ag fired layer shown in FIG. 14.
Figure 16B:
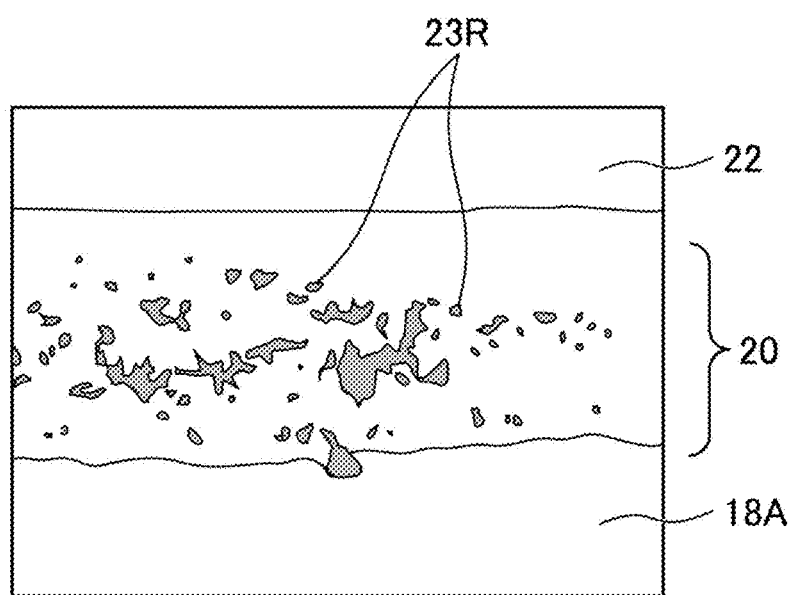
FIG. 16B is a diagram for explaining FIG. 16A.

FIG. 15A shows an example of an SAT image of an interface between the second thick copper layer (Cu layer) 18A and the Ag fired layer 20 in FIG. 14, and FIG. 15B shows a diagram for explaining FIG. 15A. FIG. 15C shows an example of an SAT image of an interface between the SiC semiconductor power device 22 and the Ag fired layer 20 in FIG. 14, and FIG. 15D shows a diagram for explaining FIG. 15C. FIG. 16A shows an example of a cross section image of the Ag fired layer 20 in FIG. 14, and FIG. 16B shows a diagram for explaining FIG. 16A. In this context, FIGS. 16A and 16B are the same as FIGS. 6A and 6B showing the aspect of the degradation of the Ag fired layer subjected to the annealing process. However, although shown as an example for explaining the destruction mode in which the random and/or vertical cracks progress to the Ag fired layer 20 in FIG. 6, FIGS. 16A and 16B show an example for explaining the degradation portion 23R including spherical-shaped random cracks.

(Thermal Simulation Results)

In the thermal simulation, a 4.4 mm square heating layer having a thickness of 0.01 mm is introduced with respect to a 5 mm square chip having a thickness of 0.25 mm.

Figure 17A:
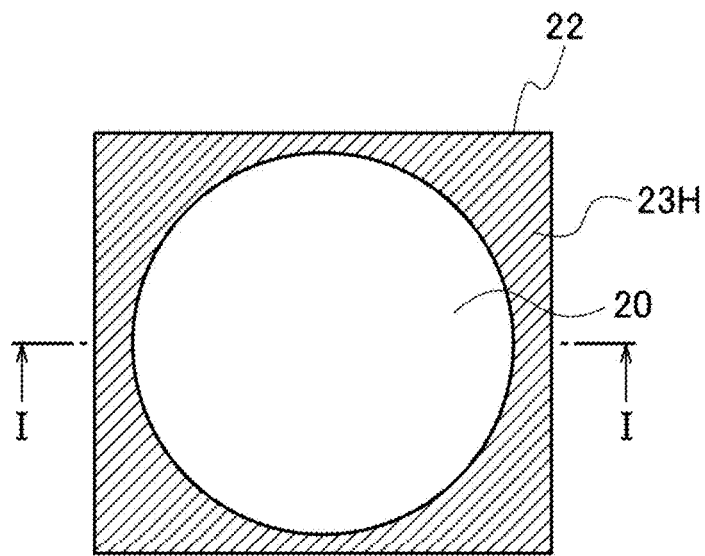
FIG. 17A is a schematic planar pattern configuration diagram showing a thermal simulation result when the destruction of the Ag fired layer corresponds to a horizontal crack (cylindrical) model, in the power semiconductor apparatus according to the comparative example.
Figure 17B:
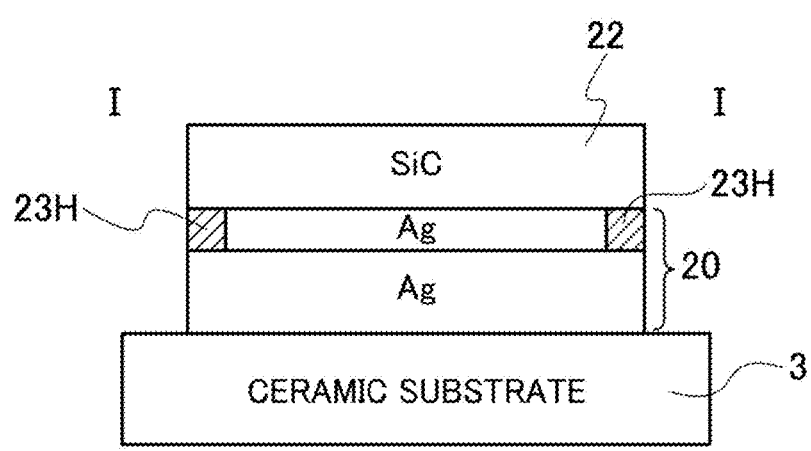
FIG. 17B is a schematic cross-sectional structure diagram taken in the line I-I of FIG. 17A.

In the power semiconductor apparatus according to the comparative example, FIG. 17A shows a schematic planar pattern configuration showing a thermal simulation when destruction of the Ag fired layer 20 corresponds to a horizontal crack (cylindrical) model, and FIG. 17B shows a schematic cross-sectional structure taken in the line I-I of FIG. 17A.

Figure 18A:
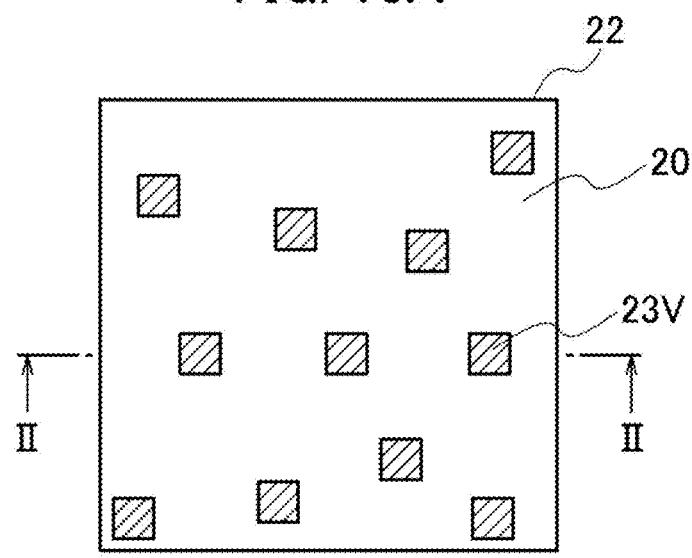
FIG. 18A is a schematic planar pattern configuration diagram showing a thermal simulation result when the destruction of the Ag fired layer corresponds to a vertical crack model, in the power semiconductor apparatus according to one embodiment to which the present technology is applied.
Figure 18B:
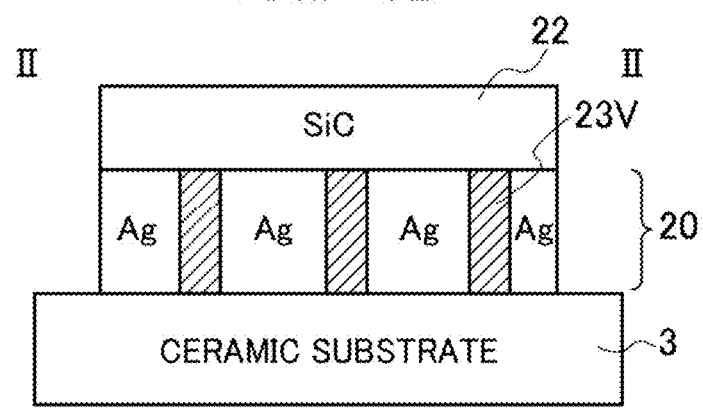
FIG. 18B is a schematic cross-sectional structure diagram taken in the line II-II of FIG. 18A.

In the power semiconductor apparatus according to one embodiment to which the present technology is applied, FIG. 18A is a schematic planar pattern configuration showing a thermal simulation result when the destruction of the Ag fired layer corresponds to a vertical crack model, and FIG. 18B shows a schematic cross-sectional structure taken in the line II-II of FIG. 18A.

Figure 19A:
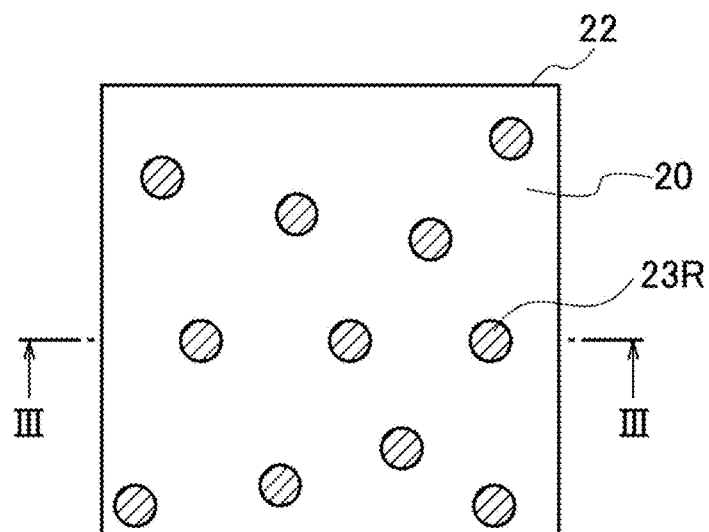
FIG. 19A is a schematic planar pattern configuration diagram showing a thermal simulation result when the destruction of the Ag fired layer corresponds to a random crack (spherical) model, in the power semiconductor apparatus according to one embodiment to which the present technology is applied.
Figure 19B:
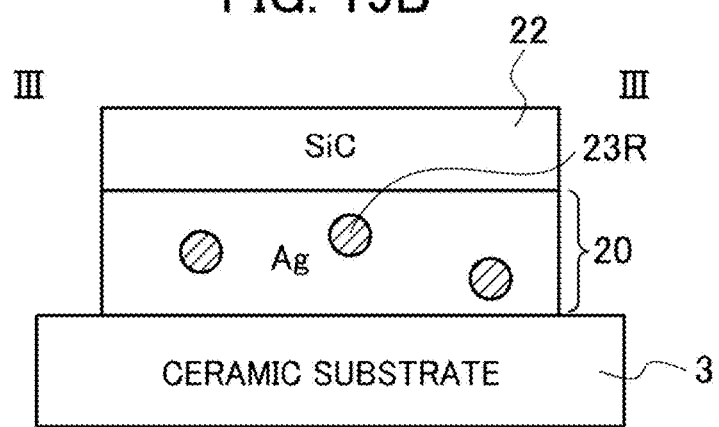
FIG. 19B is a schematic cross-sectional structure diagram taken in the line III-III of FIG. 19A.

In the power semiconductor apparatus according to one embodiment to which the present technology is applied, FIG. 19A is a schematic planar pattern configuration showing a thermal simulation result when the destruction of the Ag fired layer 20 corresponds to a random crack (spherical) model, and FIG. 19B shows a schematic cross-sectional structure taken in the line of FIG. 19A.

—Thermal Cycle Test—

Figure 20:
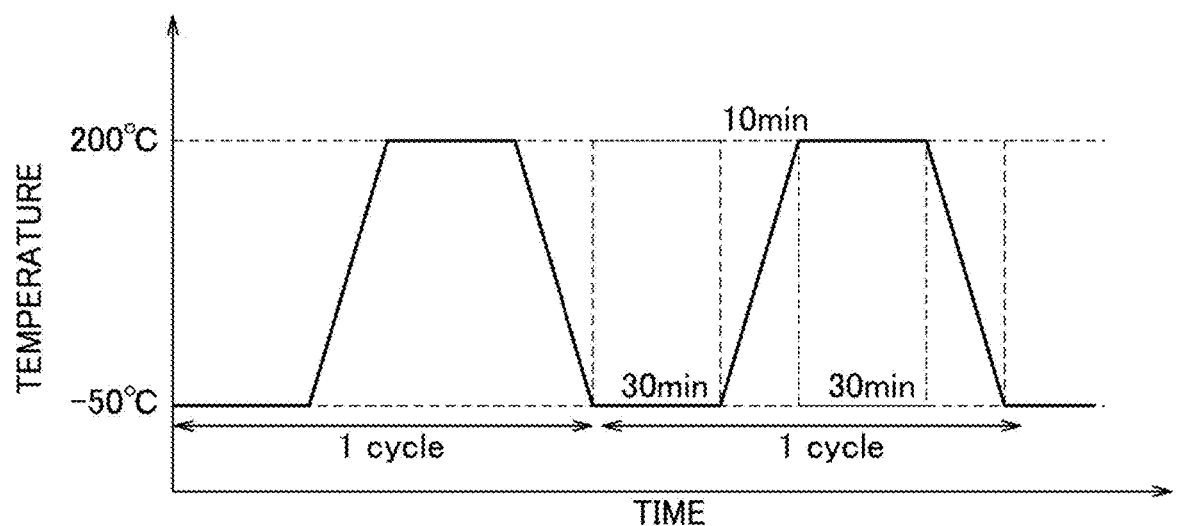
FIG. 20 shows an example of a temperature profile in the thermal cycle test, in the power semiconductor apparatus according to one embodiment to which the present technology is applied.

FIG. 20 shows an example of a temperature profile in a thermal cycle test, in the power semiconductor apparatus according to one embodiment to which the present technology is applied. More specifically, as shown in FIG. 20, the thermal cycle test is conducted within a range from −50° C. to 200° C. The period of 1 cycle of the thermal cycle is 80 minutes, and the breakdown is as follows: 30 minutes at −50° C.; 10 minutes (heating time) from −50° C. to +200° C.; 30 minutes at +200° C.; and 10 minutes (cooling time) from +200° C. to −50° C. (refer to FIG. 20).

—Relationship Between Thermal Resistance $R_{th}$ Ratio and Bonding Area Rate—

Figure 21:
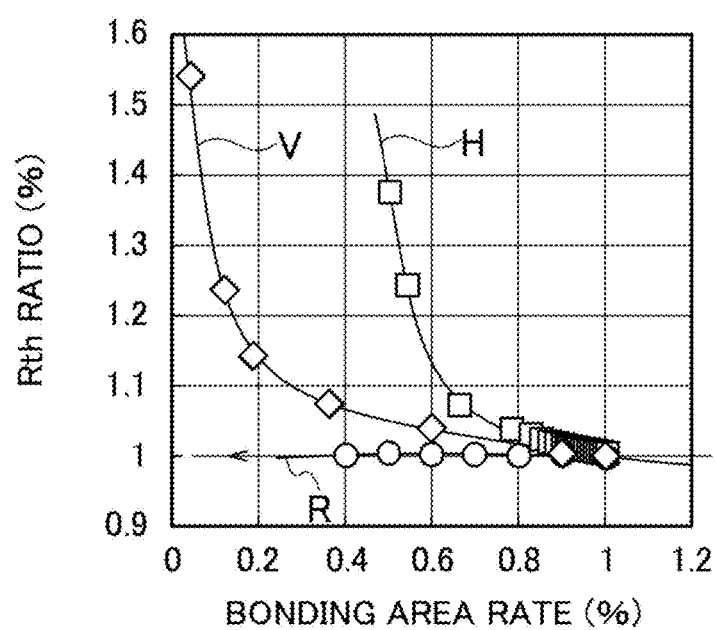
FIG. 21 shows a relationship between a thermal resistance $R_{th}$ ratio and a bonding area rate in destruction of an Ag fired layer, using as a parameter three destruction models including a horizontal crack (cylindrical) model H, a vertical crack model V, and a random crack (spherical) model R, in the power semiconductor apparatus according to one embodiment to which the present technology is applied.

In the power semiconductor apparatus according to one embodiment to which the present technology is applied, FIG. 21 shows a relationship between a thermal resistance $R_{th}$ ratio and a bonding area rate applying three destruction models including destructions of the Ag fired layer 20 being a horizontal crack (cylindrical) model H, a vertical crack model V, and a random crack (spherical) model R, as the parameter. In this case, the thermal resistance $R_{th}$ ratio used herein is a relative value which sets to 1 when no degradation portion has generated in the Ag fired layer 20. The bonding area rate used herein is a bonding area rate between the semiconductor power device 22 and Ag fired layer 20. The case where no degradation portion has generated in the Ag fired layer 20 is set to 1.

In the case where the destruction of the Ag fired layer 20 is a horizontal crack (cylindrical) model H, the bonding area rate is decreased as the degradation portion 23H is generated, and the thermal resistance $R_{th}$ ratio is simultaneously increased.

On the other hand, in the case of the vertical crack model V, the bonding area rate is decreased as the degradation portion 23V is generated, but the increase in the thermal resistance $R_{th}$ ratio is suppressed. Furthermore, in the case of the random crack (spherical) model R, the bonding area rate is decreased as the degradation portion 23R is generated, but the increase in the thermal resistance $R_{th}$ ratio is substantially suppressed. In the mode of cylindrical-shaped degradation, the thermal resistance is greatly increased, but in the case of the vertical crack/random (spherical) degradation, thermal resistance is not greatly increased even if the bonding area decreases. It is proved that the deterioration mode of the Ag fired layer may be vertical crack/random (spherical) degradation.

In the power semiconductor apparatus according to one embodiment to which the present technology is applied, it is effective to provide the bonding degradation structure including cracks which progress between the second thick copper layer and the semiconductor power device in the vertical direction away from a periphery of the semiconductor power device, or the deterioration mode in which destruction partially occurs at random; instead of a crack that progress into the bonding layer toward the center of the semiconductor power device from the edge of the periphery of the semiconductor power device when degradation occurs in the bonding layer.

(Relationship Between Vickers Hardness and Annealing Temperature)

The "Vickers hardness" is known as an evaluation method of the hardness of oxygen free copper. FIG. 22 shows a relationship between a Vickers hardness HV and an annealing temperature (° C.) using oxygen content (%) as parameter, in oxygen free copper. FIG. 22 is based on the data shown in FIG. 1 of Hajime Koto, Haruo WATANABE, and Michitomo Kato, "Studies on OFHC Copper (3rd Report). On Recrystallization Diagram and Grain Growth", Journal of the Japan Institute of Metals, Vol. 22, No. 10, October, 1958, pp. 493-497.

FIG. 22 expresses an annealing effect produced by annealing in oxygen free copper. As shown by the arrow P, the Vickers hardness HV tends to increase with the increase in a degree of a rolling process. On the other hand, as shown by the arrow Q, the Vickers hardness HV tends to decrease with the increase in the annealing temperature (° C.). At the annealing process of equal to or greater than 400° C., most of the Vickers hardness HV is equal to or less than 50. As a reference of an annealing process of an annealed copper to be applied to the power semiconductor apparatus according to one embodiment to which the present technology is applied, Vickers hardness HV which is a reference for indicating annealing by the annealing process is used, as shown in FIG. 22. The Vickers hardness HV is one of scales indicating hardness which is a kind of the difficulty of pushing-in. The rigid body made of diamond is pushed into an object to be tested, and then it is determined whether it is hard or soft by a size of an area of a depression (impression) formed at that time.

The Vickers hardness HV of ordinary oxygen free copper, such as ¼H, is approximately 44 to approximately 100. On the other hand, the Vickers hardness HV in the annealing process at equal to or greater than 400° C. is equal to or less than 50.

As shown in FIG. 2, the copper plate is a copper material in which the yield stress is produced by the annealing process. The power semiconductor apparatus according to one embodiment to which the present technology is applied has a structure of using a copper plate subjected to the annealing process, as an upper copper plate. Even if the thermal stress applied to the Ag fired layer 20 becomes large, since the copper plate is already subjected to the annealing process, the mode of degradation becomes a vertical crack/random crack mode, and thereby the thermal resistance is not increased.

EXAMPLES OF MOUNTING OF COOLING APPARATUS

Configuration Example 1

As shown in FIG. 23, a power semiconductor apparatus (configuration example 1), which can be mounted on a cooling apparatus 10, according to one embodiment to which the present technology is applied includes: a cooling apparatus 10; a first thermal compound layer 12TH or a soldering layer disposed on the cooling apparatus 10; a semiconductor power device 22; a drain terminal DT; a source terminal ST; and a resin layer 300 configured to seal at least the semiconductor power device 22. In this case, the thick copper substrate 2 is disposed on the cooling apparatus 10 via the first thermal compound layer 12TH or the soldering layer. The other configurations are the same as those of the power semiconductor apparatus according to one embodiment to which the present technology is applied shown in FIG. 1.

In addition, the drain terminal DT is electrically connected to a drain on a back side surface of the semiconductor power device 22 via the second thick copper layer (Cu layer) 18A and the bonding layer 20, and the source terminal ST is electrically connected to a source of the semiconductor power device 22 via a wire (not illustrated). Although an example of a water-cooling type which flows coolant liquids, such as a coolant water 10W or oil, in holes formed in the cooling apparatus 10 is disclosed in the configuration example 1, a air-cooling type may be adopted thereinto.

Moreover, it is also possible to implement the thermal resistance simulation by applying the structure shown in FIG. 23. Boundary conditions may have a back-side surface temperature of 65° C., and a coefficient of heat transfer of 5000 (W/m$^2$K). It is assumed that the back-side surface temperature of 65° C. is to be kept at 65° C. with respect to a lower-layer surface of a cooling apparatus 10, as the boundary conditions. Since it is a water cooled type, the coefficient of heat transfer is set as 5000 (W/m$^2$K). More specifically, as shown in FIG. 23, as coolant water 10W used in the cooling apparatus 10 made by aluminum, a temperature of the coolant water 10W is fixed to 65° C. The coefficient of heat transfer is ease of being transferred of heat which passes through a contact surface between two substances. In the case of the water-cooling type cooling apparatus 10, thermal resistance $R_{th}$ indicates a thermal resistance between Tj (junction temperature) of the SiC semiconductor power device 22 and Tw (temperature of cooling water).

As the results of the thermal resistance simulation, in the power semiconductor apparatus according to one embodiment to which the present technology is applied, the thickness t2 of the second thick copper layer 18A is preferably equal to or greater than 2 mm, and the thickness t1 of the first thick copper layer 14 has the optimum value within a range of 1 mm to 2 mm.

Configuration Example 2

Figure 24:
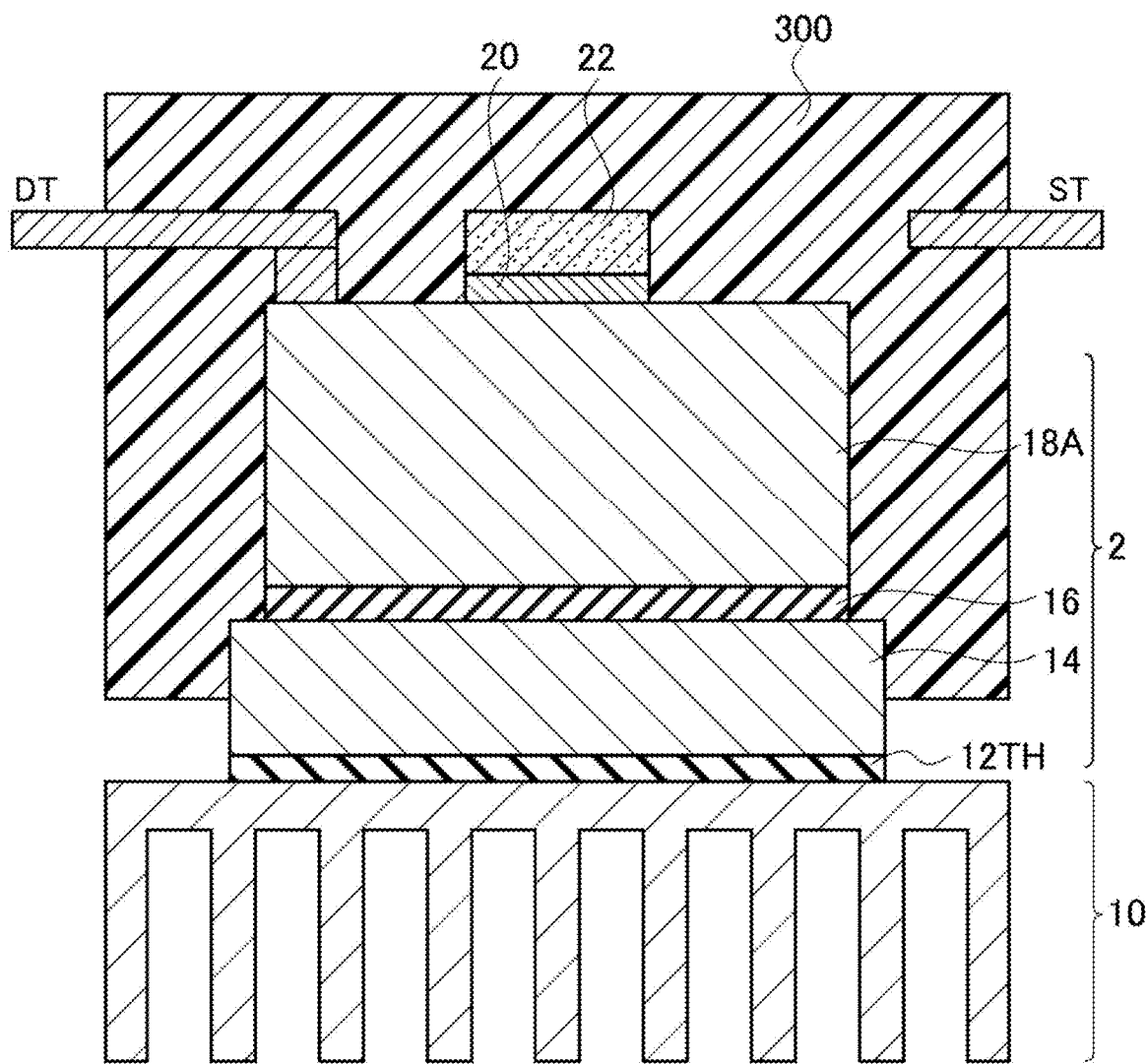
FIG. 24 is a schematic cross-sectional structure diagram (configuration example 2) of a power semiconductor apparatus according to one embodiment to which the present technology is applied, which can be mounted on a cooling apparatus.

As shown in FIG. 24, a power semiconductor apparatus (configuration example 2) according to one embodiment, in which an air cooling type cooling apparatus 10 is applied to the present technology, includes: a cooling apparatus 10; and a first thermal compound layer 12TH or a soldering layer disposed on the cooling apparatus 10. In this case, the thick copper substrate 2 is disposed on the cooling apparatus 10 via the first thermal compound layer 12TH or the soldering layer.

In the same manner as FIG. 23, the power semiconductor apparatus (configuration example 2) includes a drain terminal DT and a source terminal ST, and the whole thereof are sealed by a resin layer 300. In addition, the drain terminal DT is electrically connected to a drain of the semiconductor power device 22, and the source terminal ST is electrically connected to a source of the semiconductor power device 22. The other configurations are the same as those of the power semiconductor apparatus according to one embodiment to which the present technology is applied shown in FIG. 1. In addition, although the configuration example 2 discloses the example of the air-cooling type, a water-cooling type may be adopted thereinto.

Configuration Example 3

Figure 25:
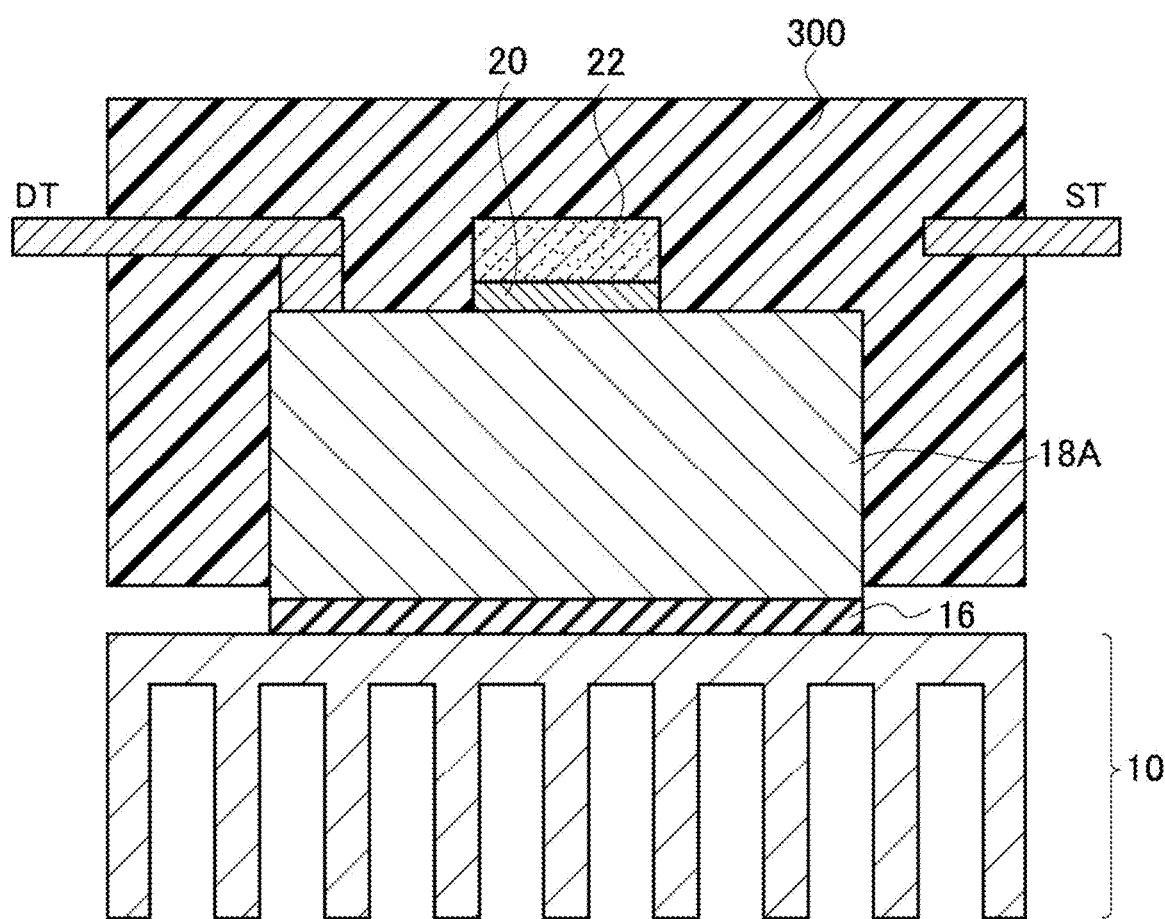
FIG. 25 is a schematic cross-sectional structure diagram (configuration example 3) of a power semiconductor apparatus according to one embodiment to which the present technology is applied, which can be mounted on a cooling apparatus.

As shown in FIG. 25, a power semiconductor apparatus (configuration example 3) according to one embodiment, in which an air cooling type cooling apparatus 10 is applied to the present technology, includes: a cooling apparatus 10; and an insulating sheet layer 16 or a first thermal compound layer disposed on the cooling apparatus 10. In this case, the thick copper substrate (second thick copper layer 18A) is disposed on the cooling apparatus 10 via the insulating sheet layer 16 or the first thermal compound layer. Moreover, the Vickers hardness of the thick copper substrate (second thick copper layer 18A) shown in FIGS. 23-32 is smaller than the Vickers hardness of the copper composing external connection terminals (the source terminal ST, the drain terminal DT) of the semiconductor power device 22, and is equal to or less than 50. The configuration example 3 corresponds to an example using the second thick copper layer 18A as the thick copper substrate 2, as shown in FIG. 25.

Furthermore, in the same manner as FIG. 23, the power semiconductor apparatus (configuration example 3) includes a drain terminal DT and a source terminal ST, and the whole thereof are sealed by a resin layer 300. In addition, the drain terminal DT is electrically connected to a drain of the semiconductor power device 22, and the source terminal ST is electrically connected to a source of the semiconductor power device 22. The other configurations are the same as those of to which the present technology is applied shown in FIG. 1. In addition, although the configuration example 3 discloses the example of the air-cooling type, a water-cooling type may be adopted thereinto.

Configuration Example 4

Figure 26:
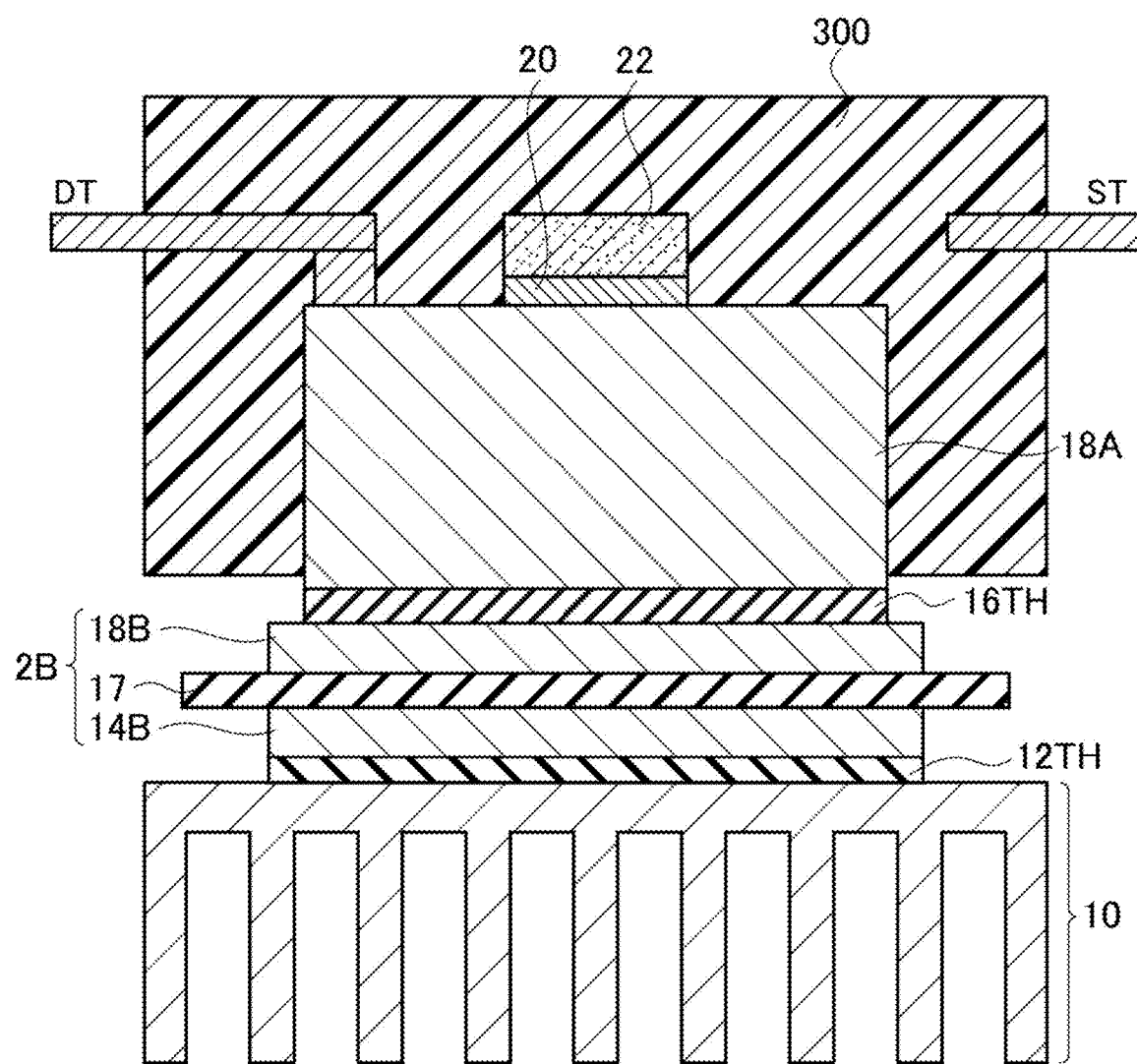
FIG. 26 is a schematic cross-sectional structure diagram (configuration example 4) of a power semiconductor apparatus according to one embodiment to which the present technology is applied, which can be mounted on a cooling apparatus.

As shown in FIG. 26, a power semiconductor apparatus (configuration example 4) according to one embodiment, in which an air cooling type cooling apparatus 10 is applied to the present technology, includes: a cooling apparatus 10; and an insulating substrate 2B disposed on the cooling apparatus 10. In this case, the insulating substrate 2B is disposed on the cooling apparatus 10 via the first thermal compound layer 12TH. In this case, the configuration example 4 corresponds to an example using the second thick copper layer 18A as a thick copper substrate, as shown in FIG. 26. Furthermore, the configuration example 4 may include a second thermal compound layer 16TH which is disposed on insulating substrate 2B and have a size equal to or greater than that of the second thick copper substrate 18A. The second thick copper layer 18A may be disposed on the second thermal compound layer 16TH. Moreover, the Vickers hardness of the thick copper substrate 18A is smaller than the Vickers hardness of the copper composing power terminals (the source terminal ST, the drain terminal DT) of the semiconductor power device 22, and is equal to or less than 50.

Furthermore, in the same manner as FIG. 23, the power semiconductor apparatus (configuration example 4) according to one embodiment, in which an air cooling type cooling apparatus 10 is applied to the present technology, includes a drain terminal DT and a source terminal ST, and the whole thereof are sealed by a resin layer 300. In addition, the drain terminal DT is electrically connected to a drain of the semiconductor power device 22, and the source terminal ST is electrically connected to a source of the semiconductor power device 22.

The insulating substrate 2B may includes a Direct Bonding Copper (DBC) substrate including: a ceramics substrate 17, a copper foil layer 18B disposed on a front side surface of the ceramics substrate 17, and a copper foil layer 14B disposed on a back side surface of the ceramics substrate 17, for example. In addition, an Active Metal Brazed, Active Metal Bond (AMB) substrate or a Direct Bonding Aluminum (DBA) substrate can be applied to the insulating substrate 2B. In addition, although the configuration example 4 discloses the example of the air-cooling type, a water-cooling type may be adopted thereinto.

In the above-mentioned configuration examples 1-4, although only one of the water-cooling type or the air cooling type is shown, both types can be adopted for the cooling apparatus 10, and can be used for devices that generate a lot of heat, such as vehicle drive units, power converters, and the like.

(Fabrication Method for Power Semiconductor Apparatus)

A fabrication method for the power semiconductor apparatus according to one embodiment to which the present technology is applied includes: forming a second thick copper layer 18A subjected to an annealing process at equal to or greater than 400° C.; forming a conductive bonding layer 20 on the second thick copper layer 18A; disposing the second thick copper layer 18A on a first thick copper layer 14 via an insulating sheet layer 16 or a first thermal compound layer; disposing a semiconductor power device 22 on the bonding layer 20 and bonding the semiconductor power device 22 to the bonding layer 20 by means of a heating and pressurizing process for heating and pressurizing the semiconductor power device 22; and connecting electrodes of the semiconductor power device 22 to external connection terminals (DT, ST).

In this case, the Vickers hardness of the second thick copper layer 18A already subjected to the annealing process is smaller than the Vickers hardness of the first thick copper layer 14 or the external connection terminals (DT, ST), and is equal to or less than 50.

The fabrication method may further include sealing the entire power semiconductor apparatus with a resin layer 300. Moreover, transfermold resins, thermosetting resins, etc. applicable to the SiC based semiconductor power device can be used as the resin layer 300. Moreover, silicone based resins, e.g. silicone gel, may partially be applied thereto, or case type power semiconductor apparatus may be adopted to be applied to the whole thereof.

Moreover, the bonding layer 20 may include an Ag fired layer, a Cu fired layer, an Au fired layer, an Ni fired layer, or the like.

A heating processing temperature of the heating and pressurizing process is within a range of 200° C. to 350° C., and an applied pressure is within a range of 10 MPa to 80 MPa.

Concrete Example of Power Semiconductor Apparatus

—1-in-1 Module—

Figure 27A:
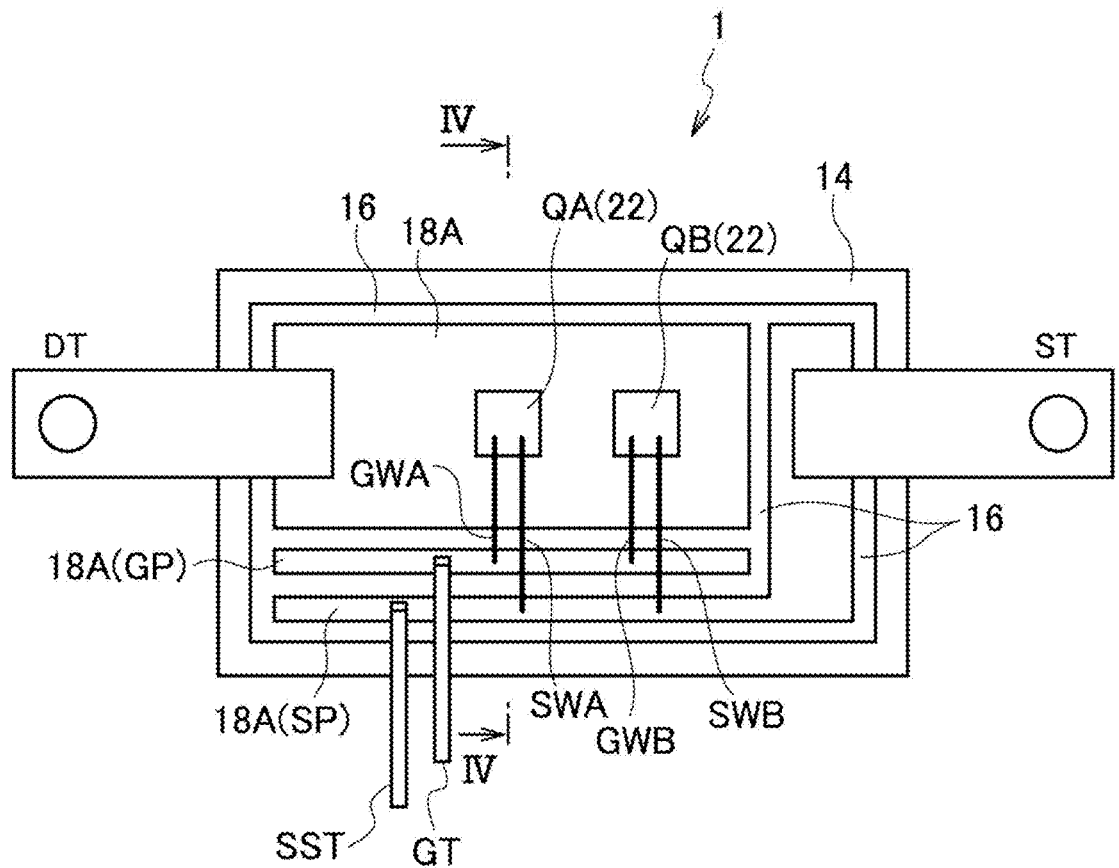
FIG. 27A is a schematic planar pattern configuration diagram showing a 1-in-1 module, in a power semiconductor apparatus according to one embodiment to which the present technology is applied.
Figure 27B:
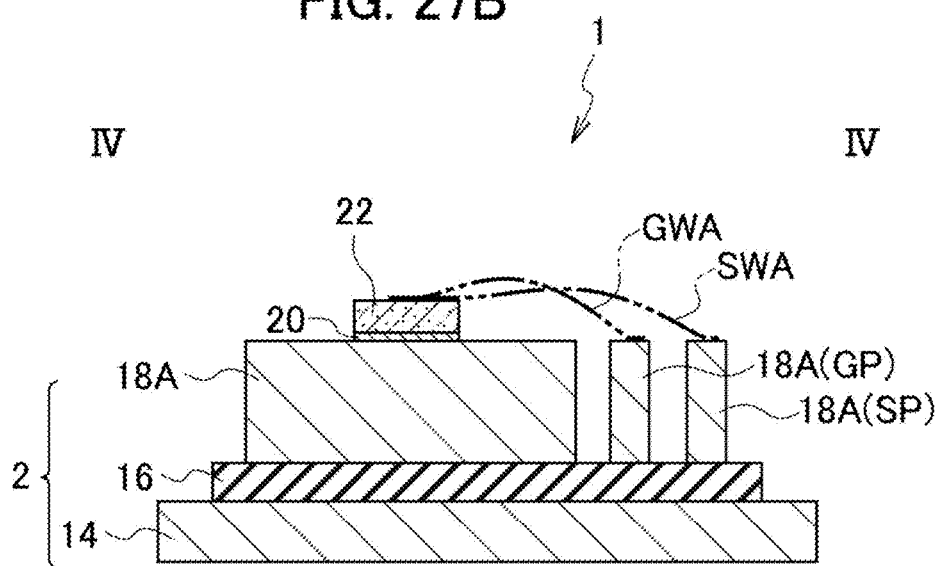
FIG. 27B is a schematic cross-sectional structure diagram taken in the line IV-IV of FIG. 27A.

FIG. 27A shows a schematic planar pattern configuration of a 1-in-1 module, which is the power semiconductor apparatus 1 according to one embodiment to which the present technology is applied, and FIG. 27B shows a schematic cross-sectional structure taken in the line IV-IV of FIG. 27A. Furthermore, FIG. 28 shows a schematic bird's-eye view configuration corresponding to FIGS. 27A and 27B.

Figure 28:
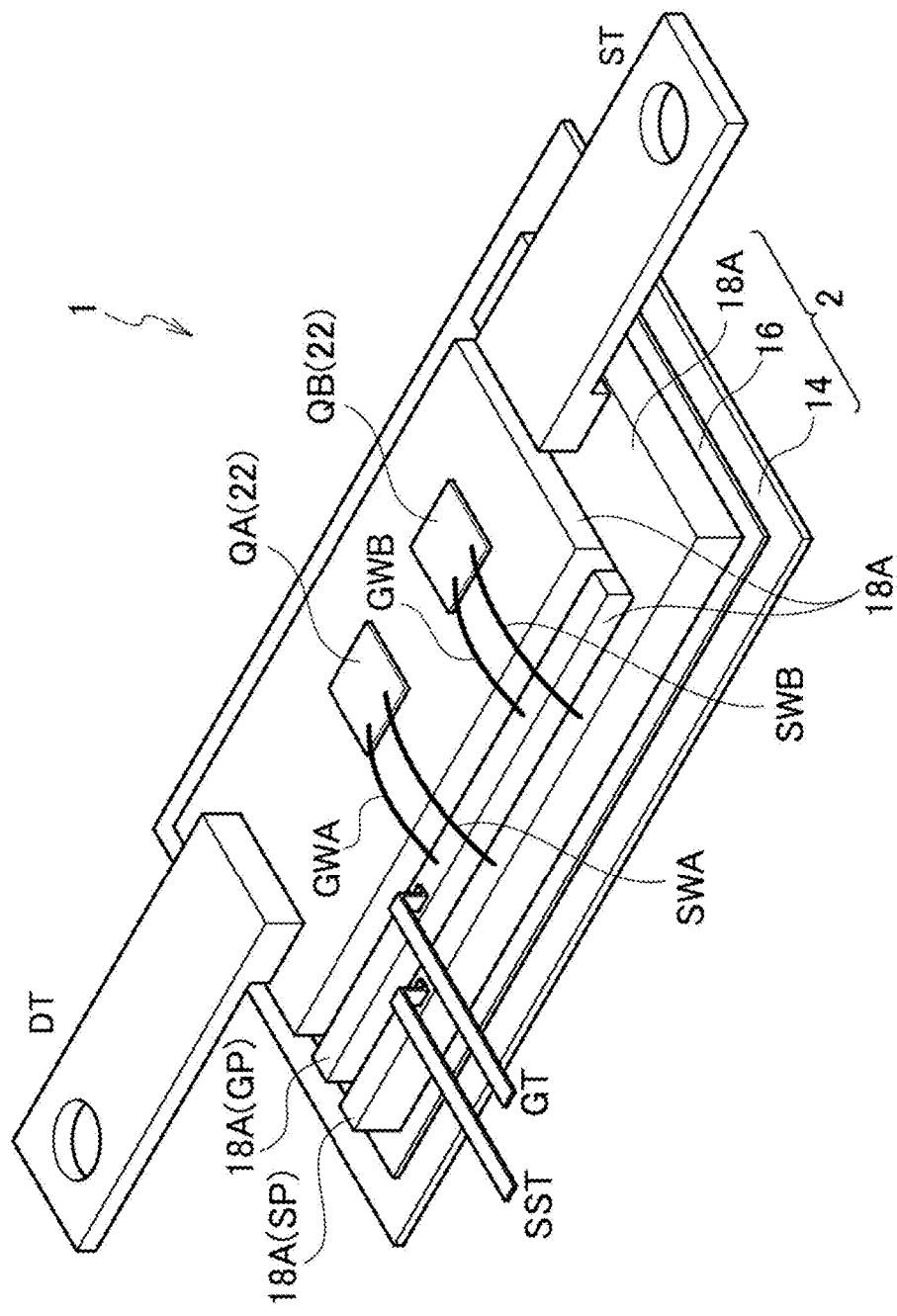
FIG. 28 is a schematic bird's-eye view showing the 1-in-1 module, in the power semiconductor apparatus according to one embodiment to which the present technology is applied.

As shown in FIGS. 27A, 27B, and 28, the power semiconductor apparatus 1 according to one embodiment to which the present technology is applied includes: a plate-shaped first thick copper layer 14; an insulating sheet layer 16 disposed on the first thick copper layer 14; a pattern-formed second thick copper layers 18A, 18A(GP), 18A(SP) disposed on the insulating sheet layer 16; a conductive bonding layer 20 disposed on the second thick copper layers 18A; semiconductor power devices QA, QB disposed on the bonding layer 20; and terminals, such as a drain terminal DT and a source terminal ST. The semiconductor power devices QA, QB bond to the bonding layer 20, and the Vickers hardness of the second thick copper layer 18A is smaller than the Vickers hardness of the first thick copper layer 14 and the Vickers hardness of the drain terminal DT and the source terminal ST, and is equal to or less than 50.

Moreover, a gate terminal GT and a source sense terminal SST are respectively connected to a gate signal wiring pattern 18A(GP) and a source signal wiring pattern 18A(SP) by soldering or the like.

Moreover, the bonding layer 20 may include an Ag fired layer, a Cu fired layer, an Au fired layer, an Ni fired layer, or the like.

Moreover, the power semiconductor apparatus 1 may have a bonding degradation structure of not a crack that progresses from an edge but a crack that progresses to vertically or a deterioration mode which is partially broken at random, when the bonding layer 20 is deteriorated.

Moreover, the semiconductor power devices QA, QB may be FET or IGBT on which a source electrode or an emitter electrode are formed on an upper surface and a gate electrode and a drain or collector electrode are formed on a lower surface; and a plurality of chips are connected in parallel. In the power semiconductor apparatus 1, the semiconductor power devices QA, QB are disposed on the insulating sheet layer 16; and the power semiconductor apparatus 1 may include a gate signal wiring pattern electrically connected to the gate electrode and a source or emitter signal wiring pattern electrically connected to the source or emitter electrode, which are pattern-formed with an identical material to the second thick copper layer 18A. Each wiring pattern has the same thickness as the second thick copper layer 18A, but may be a thin copper layer thinner than the second thick copper layer 18A.

The semiconductor power devices QA, QB may further include chips, and other devices, such as the diode, may be provided.

As shown in FIGS. 27A, 27B, and 28, the power semiconductor apparatus 1 according to one embodiment to which the present technology is applied includes a gate signal wiring pattern GP and a source signal wiring pattern SP which are disposed on the insulating sheet layer 16 and are pattern-formed with an identical material to the second thick copper layer 18A.

In the power semiconductor apparatus 1 according to one embodiment to which the present technology is applied, as shown in FIGS. 27A, 27B, and 28, the semiconductor power devices QA, QB are disposed on the second thick copper layer 18A, and the drain electrodes of the semiconductor power devices QA, QB are bonded to the bonding layer 20 by the heating and pressurizing process.

In this case, the gate signal wiring pattern GP is connected to the gate electrodes of the semiconductor power devices QA, QB via gate bonding wires GWA and GWB, and the source signal wiring pattern SP is connected to the source electrodes of the semiconductor power devices QA, QB via source bonding wires SWA and SWB. Although illustration is omitted herein, a plurality of the source bonding wires SWA and SWB may be connected in parallel, or a combination structure of plate-shaped electrodes and pillar electrodes, leadframes, etc. may be used instead of the aforementioned bonding wires.

Furthermore, the drain terminal DT is bonded with soldering or the like to the second thick copper layer 18A to which the drain electrodes of the semiconductor power devices QA, QB are connected, and the source terminal ST is connected to the source signal wiring pattern SP by soldering or the like. Moreover, the gate terminal G and the source sense terminal SST are respectively connected to the gate signal wiring pattern GP and the source signal wiring pattern SP by soldering or the like.

In this case, as the semiconductor power device 22, it may include any one of a Si based IGBT, a Si based MOSFET, a SiC based MOSFET, a SiC based IGBT, a GaN based FET, or a gallium oxide based FET, or a plurality of the above-mentioned different devices.

(Circuit Configuration)

Figure 29:
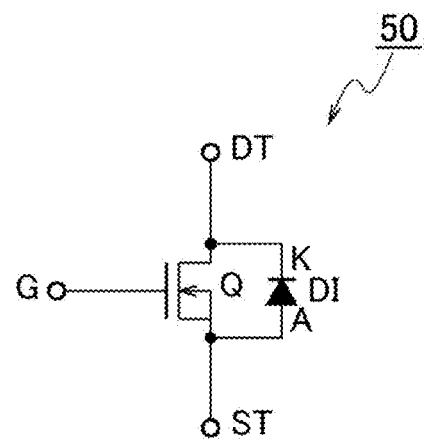
FIG. 29 is a schematic circuit representative diagram of an SiC MOSFET of the 1-in-1 module, in the power semiconductor apparatus according to one embodiment to which the present technology is applied.

FIG. 29 is a schematic circuit representative of an SiC MOSFET of the 1-in-1 module, which is the power semiconductor apparatus according to one embodiment to which the present technology is applied. A diode DI connected in reversely parallel to the MOSFET is shown in FIG. 29. A main electrode of the MOSFET is expressed with a drain terminal DT and a source terminal ST. Moreover, details circuit representation of the SiC MOSFET of the 1-in-1 module 50 is expressed as shown in FIG. 30.

In the 1-in-1 module 50, one MOSFET or a plurality of MOSFETs connected to one another in parallel is included in one module, for example. Note that it is also possible to mount a part of the plurality of the chips for the diode DI thereon.

Figure 30:
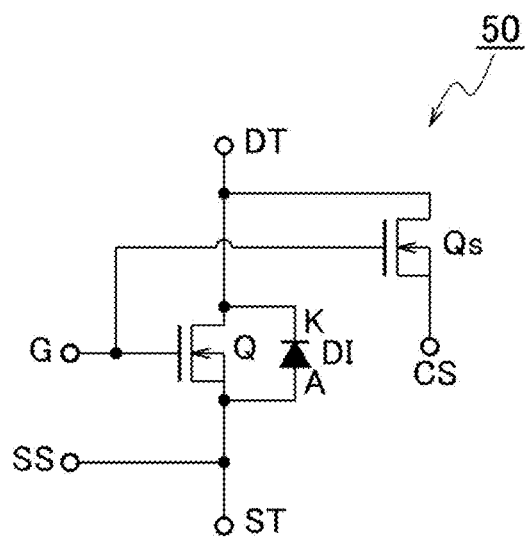
FIG. 30 is a detail circuit representative diagram of the SiC MOSFET of the 1-in-1 module, in the power semiconductor apparatus according to one embodiment to which the present technology is applied.

More particularly, as shown in FIG. 30, a sense MOSFET Qs may be connected to the MOSFET Q in parallel. The sense MOSFET Qs is formed as a minuteness transistor in the same chip as the MOSFET Q. In FIG. 30, reference sign SS denotes a source sense terminal, reference sign CS denotes a current sense terminal, and reference sign G denotes a gate signal terminal. Also in the power semiconductor apparatus according to one embodiment to which the present technology is applied, the sense MOSFET Qs may be formed as a minuteness transistor in the same chip, in the MOSFET Q.

The module may include a plurality of built-in transistor circuits composed of one chip or a plurality of chips. More specifically, although the modules include 1-in-1 module, 2-in-1 module, 4-in-1 module, 6-in-1 module, etc. For example, a module containing two pieces of transistors (circuits) on one module is called the 2-in-1 module, a module containing two pieces of 2-in-1 modules on one module is called the 4-in-1 module, and a module containing three pieces of 2-in-1 modules on one module is called the 6-in-1 module.

(2-in-1 Module)

Figure 31:
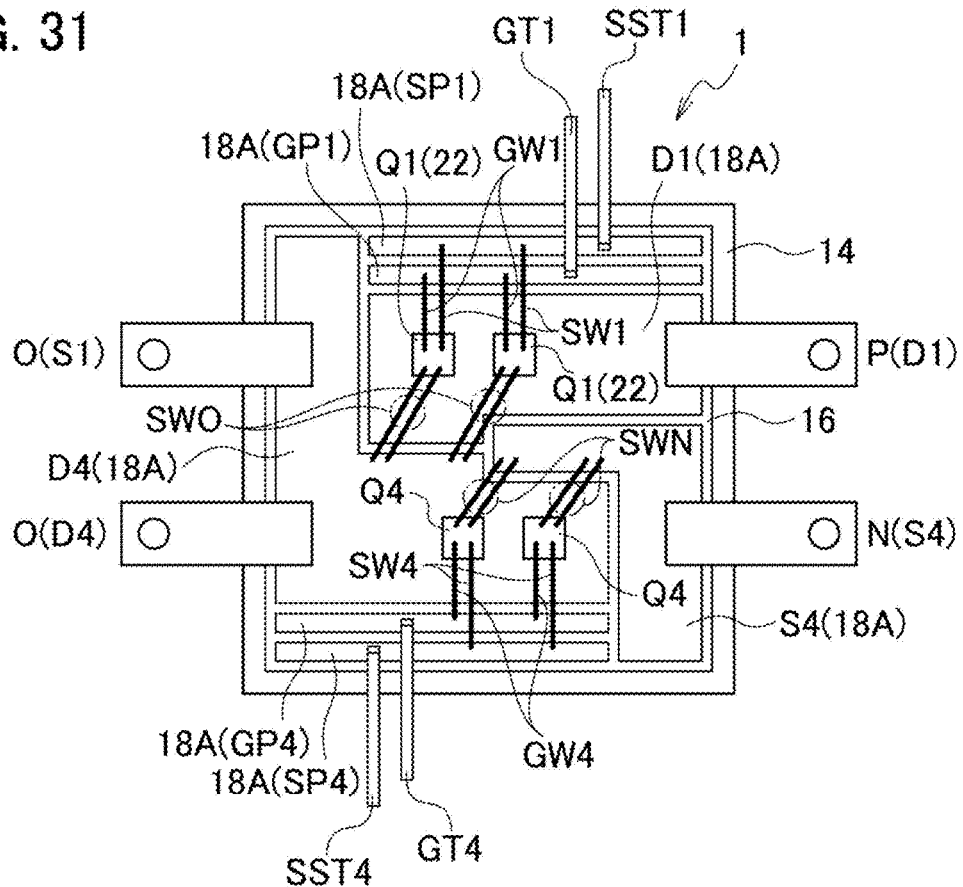
FIG. 31 is a schematic planar pattern configuration diagram showing a 2-in-1 module, in a power semiconductor apparatus according to one embodiment to which the present technology is applied.
Figure 32:
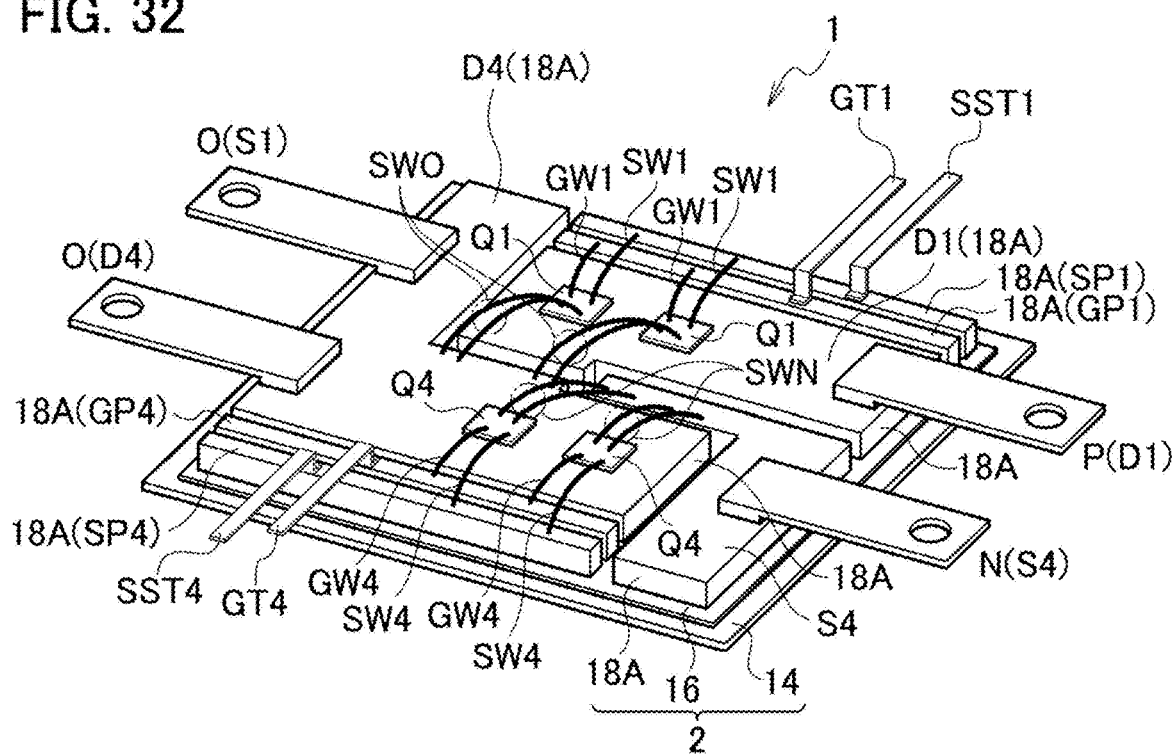
FIG. 32 is a schematic bird's-eye view showing the 2-in-1 module, in the power semiconductor apparatus according to one embodiment to which the present technology is applied.

FIG. 31 shows a schematic planar pattern configuration of a 2-in-1 module, which is the power semiconductor apparatus 1 according to one embodiment to which the present technology is applied, and FIG. 32 shows a schematic bird's-eye view configuration thereof.

FIG. 31 shows a schematic planar pattern configuration before forming a resin layer in a module with the built-in half-bridge, as the power semiconductor apparatus 1 according to one embodiment to which the present technology is applied. The power semiconductor apparatus 1 according to one embodiment to which the present technology is applied includes a configuration of a module with the built-in half-bridge, and two SiC MOSFET Q1 and Q4 are included in one module. FIG. 31 shows an example of two chips of the SiC-MOSFETs Q1 and Q4 respectively arranged in parallel.

As shown in FIGS. 31 and 32, the power semiconductor apparatus 1 according to one embodiment to which the present technology is applied includes: a positive-side power terminal P and a negative-side power terminal N disposed at a first side of the thick copper substrate 2 (18, 16, 14); a gate terminal GT1 and a source sense terminal SST1 disposed at a second side adjacent to the first side; output terminals O (D4) and O (S1) disposed at a third side opposite to the first side; and a gate terminal GT4 and a source sense terminal SST4 disposed at a fourth side opposite to the second side.

As shown in FIGS. 31 and 32, the power semiconductor apparatus 1 according to one embodiment to which the present technology is applied includes: a plate-shaped first thick copper layer 14; an insulating sheet layer 16 disposed on the first thick copper layer 14; a pattern-formed second thick copper layer 18A (D1, D4, S1, S4, SP1, SP4, GP1, GP4) disposed on the insulating sheet layer 16; a conductive bonding layer 20 (not illustrated) disposed on the second thick copper layer 18A; and semiconductor power devices Q1, Q4 disposed on the bonding layer 20. The semiconductor power devices Q1, Q4 are bonded to the bonding layer 20, and the Vickers hardness of the second thick copper layer 18A is smaller than the Vickers hardness of the first thick copper layer 14, and is equal to or less than 50.

Moreover, the bonding layer 20 may include an Ag fired layer, a Cu fired layer, an Au fired layer, an Ni fired layer, or the like.

Moreover, the power semiconductor apparatus 1 may have a bonding degradation structure of not a crack that progresses from an edge but a crack that progresses to vertically or a deterioration mode which is partially broken at random, when the bonding layer 20 is deteriorated.

Moreover, the semiconductor power devices Q1, Q4 may be FET or IGBT on which a source electrode or an emitter electrode are formed on an upper surface and a gate electrode and a drain or collector electrode are formed on a lower surface; and may include a gate signal wiring pattern electrically connected to the gate electrode and a source or emitter signal wiring pattern electrically connected to the source or emitter electrode, which are disposed on the insulating sheet layer 16 and pattern-formed with an identical material to the second thick copper layer 18A.

A protective diode which is not illustrated may be connected to the semiconductor power devices Q1, Q4 in parallel.

As shown in FIGS. 31, and 32, the power semiconductor apparatus 1 according to one embodiment to which the present technology is applied includes gate signal wiring patterns GP1, GP4 and source signal wiring patterns SP1, SP4 which are disposed on the insulating sheet layer 16 and are pattern-formed with an identical material to the second thick copper layer 18A.

In the power semiconductor apparatus 1 according to one embodiment to which the present technology is applied, as shown in FIGS. 31 and 32, the semiconductor power devices Q1, Q4 are disposed on the second thick copper layer 18A, and the drain electrodes of the semiconductor power devices Q1, Q4 are bonded to the bonding layer 20 by the heating and pressurizing process.

Moreover, the semiconductor power devices Q1, Q4 are disposed face up on the drain patterns D1, D4 composed of the second thick copper layer 18A.

In this case, the gate terminal GT1 and the source sense terminal SST1 are respectively connected to a gate signal wiring pattern GP1 and a source signal wiring pattern SP1 in the semiconductor power device Q1 by soldering or the like; and the gate terminal GT4 and the source sense terminal SST4 are respectively connected to a gate signal wiring pattern GP4 and a source signal wiring pattern SP4 in the semiconductor power device Q4 by soldering or the like.

As shown in FIGS. 31 and 32, from the SiC MOSFETs Q1 and Q4, source bonding wires SW0 and SWN are respectively connected toward the drain pattern D4 and the source pattern S4 composed of the pattern-formed second thick copper layer 18A, gate bonding wires GW1 and GW4 are respectively connected toward the gate signal wiring patterns GP1 and GP4, and source bonding wires SW1 and SW4 are respectively connected toward the source signal wiring patterns SP1 and SP4.

Moreover, gate terminals GT1 and GT4 for external extraction are respectively connected to the gate signal wiring patterns GP1 and GP4 by soldering or the like, and the source sense terminals SST1 and SST4 for external extraction are respectively connected to the source signal wiring patterns SP1 and SP4 by soldering or the like.

Moreover, the positive-side power terminal P is connected to the drain pattern D1 by soldering or the like, the negative-side power terminal N is connected to the source pattern S4 by soldering or the like, and the output terminals O (S1), O (D4) are connected to the drain pattern D4 by soldering or the like.

The positive-side power terminal P, the negative-side power terminal N, the output terminals O (S1) and O (D4), the gate terminals GT1 and GT4, and the source sense terminals SST1 and SST4 can be formed by including Cu, for example.

The source bonding wires SW0, SWN, SW1, and SW4 and the gate bonding wires GW1 and GW4 can be formed by including Al, AlCu, or the like, for example.

In this case, as the semiconductor power device 22, it may include any one of a Si based IGBT, a Si based MOSFET, a SiC based MOSFET, a SiC based IGBT, a GaN based FET, or a gallium oxide based FET, or a plurality of the above-mentioned different devices.

Moreover, it is also possible to configure an inverter circuit device or a converter circuit by connecting the semiconductor power devices in series between a first power source and a second power source, by using a plurality of switching circuits using a connecting point between the semiconductor power devices connected in series as an output, and by individually controlling each gate of the semiconductor power devices.

In addition, although it has been explained that it is possible to mainly configure the 1-in-1 module or the 2-in-1 module using the semiconductor power device, in the power semiconductor apparatus 1 according to one embodiment to which the present technology is applied, it is not limited to this example. For example, it can compose 4-in-1 module, a 6-in-1 module, a 7-in-1 module in which a snubber capacitor etc. is provided in the 6-in-1 module, an 8-in-1 module, a 12-in-1 module, a 14-in-1 module, and the like.

(Circuit Configuration)

Figure 33:
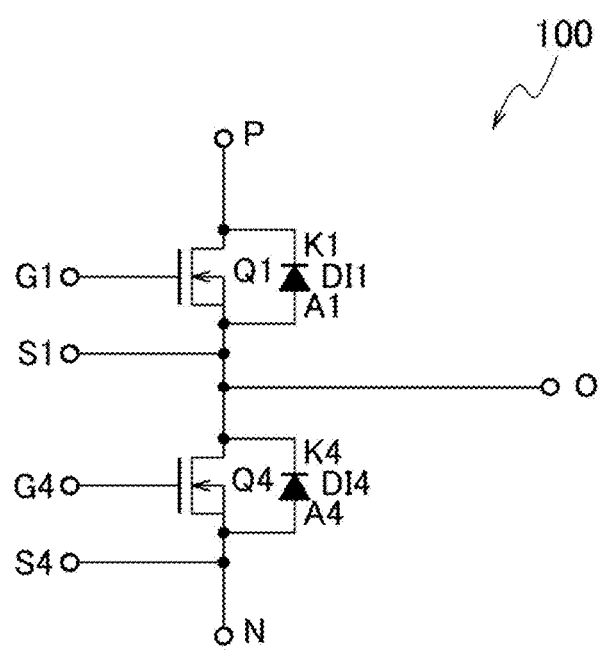
FIG. 33 is a schematic circuit representative diagram of an SiC MOSFET of the 2-in-1 module, in the power semiconductor apparatus according to one embodiment to which the present technology is applied.

FIG. 33 is a schematic circuit representative of an SiC MOSFET of the 2-in-1 module 100, which is the power semiconductor apparatus according to one embodiment to which the present technology is applied.

As shown in FIG. 33, the 2-in-1 module to which the SiC MOSFET is applied as the semiconductor power devices Q1, Q4 has a half bridge configuration, and is sealed with one mold resin.

As shown in FIG. 33, the 2-in-1 module 100 includes two SiC MOSFETs Q1 and Q4, and diodes DI1 and DI4 connected in reversely parallel to the SiC MOSFETs Q1 and Q4, as one module. In FIG. 33, reference signs GT1, GT4 are respectively gate signal terminals for of the MOSFETs Q1, Q4, and reference signs SST1, SST4 are respectively source signal terminals of the MOSFETs Q1, Q4. Reference sign P denotes a positive side power terminal, reference sign N denotes a negative side power terminal, and reference sign O denotes an output terminal electrode.

The same configuration may be applied to semiconductor power devices Q2, Q5 and semiconductor power devices Q3, Q6, mentioned below with reference to FIG. 38 or 39, applicable to the power semiconductor apparatus according to one embodiment to which the present technology is applied.

(Device Structure)

Figure 34:
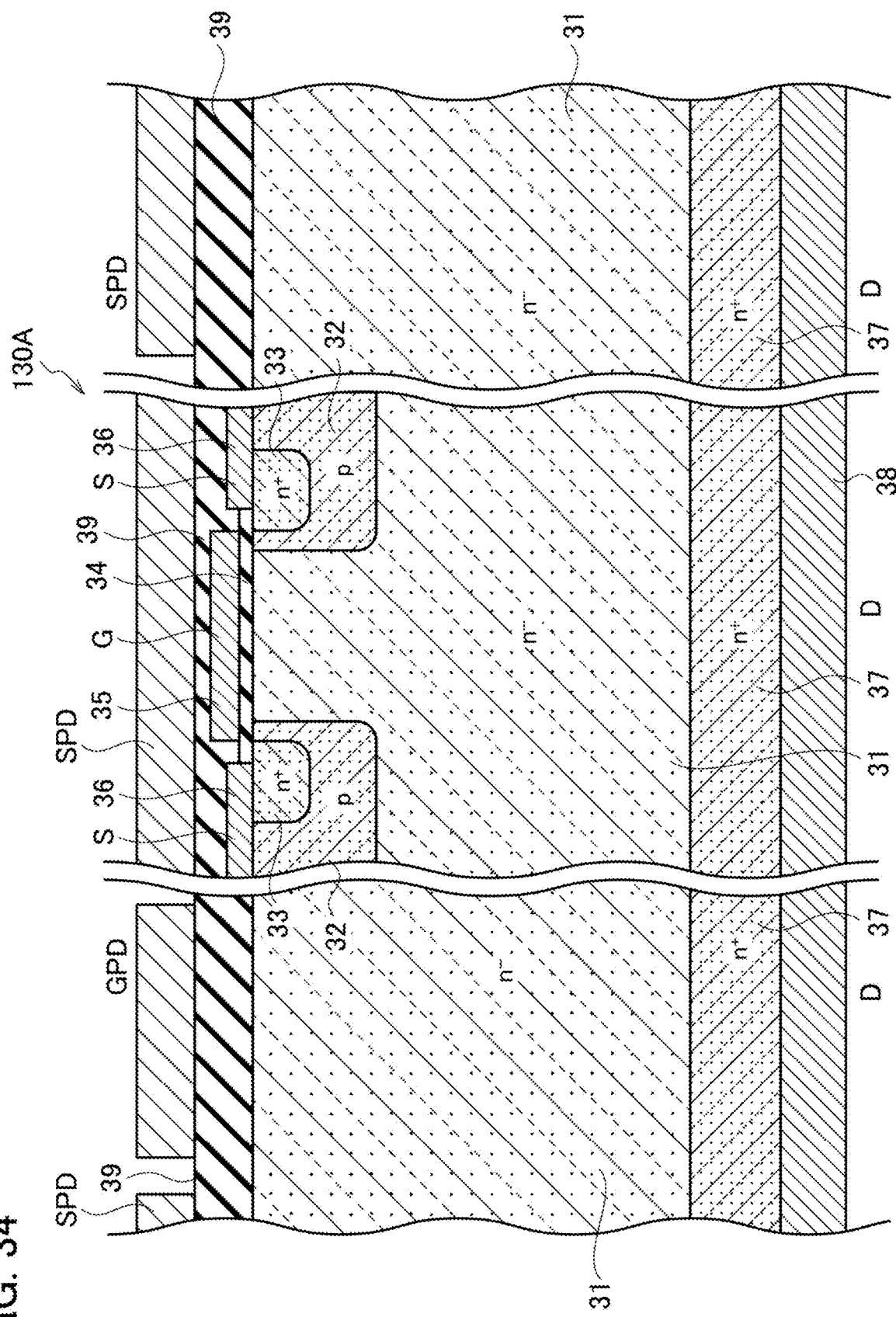
FIG. 34 is a schematic cross-sectional structure diagram showing an SiC MOSFET including a source pad electrode SPD and a gate pad electrode GPD, in an example of the semiconductor power device applicable to the power semiconductor apparatus according to one embodiment to which the present technology is applied.

FIG. 34 shows a schematic cross-sectional structure of an SiC MOSFET 130A including a source pad electrode SPD and a gate pad electrode GPD, which is an example of the semiconductor power devices Q1, Q4 applicable to the power semiconductor apparatus according to one embodiment to which the present technology is applied.

As shown in FIG. 34, the SiC MOSFET 130A includes: a semiconductor layer 31 composed by including an n⁻ type high resistivity layer; a p body region 32 formed on a front surface side of the semiconductor layer 31; a source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n⁺ drain region 37 disposed on a back side surface opposite to the surface of the semiconductor layer 31; and a drain electrode 38 connected to the n⁺ type drain area 37.

The gate pad electrode GPD is connected to the gate electrode 35 disposed on the gate insulating film 34, and the source pad electrode SPD is connected to the source electrode 36 connected to the source region 33 and the p body region 32. Moreover, as shown in FIG. 34, the gate pad electrode GPD and the source pad electrode SPD are disposed on an interlayer insulating film 39 for passivation which covers the surface of the SiC MOSFET 130A.

In addition, a microstructural transistor structure (not illustrated) may be formed in the semiconductor layer 31 below the gate pad electrode GPD and the source pad electrode SPD.

Furthermore, as shown in FIG. 34, the source pad electrode SPD may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 34, the SiC MOSFET 130A may be composed by including a trench-gate type n channel vertical SiC TMOSFET 130D, or the like, shown in FIG. 37 mentioned below.

Alternatively, a GaN-based FET, gallium oxide based FET, and the like, instead of the SiC MOSFET 130A, can also be adopted to the semiconductor power devices Q1 and Q4 which can be applied to the power semiconductor apparatus according to one embodiment to which the present technology is applied.

The same configuration may be applied to semiconductor power devices Q2, Q5 and semiconductor power devices Q3, Q6 applicable to the power semiconductor apparatus according to one embodiment to which the present technology is applied.

Furthermore, a wide-bandgap type semiconductor of which the bandgap energy is from 1.1 eV to 8 eV, for example, can be used for the semiconductor power devices Q1 to Q6 applicable to the power semiconductor apparatus according to one embodiment to which the present technology is applied.

Figure 35:
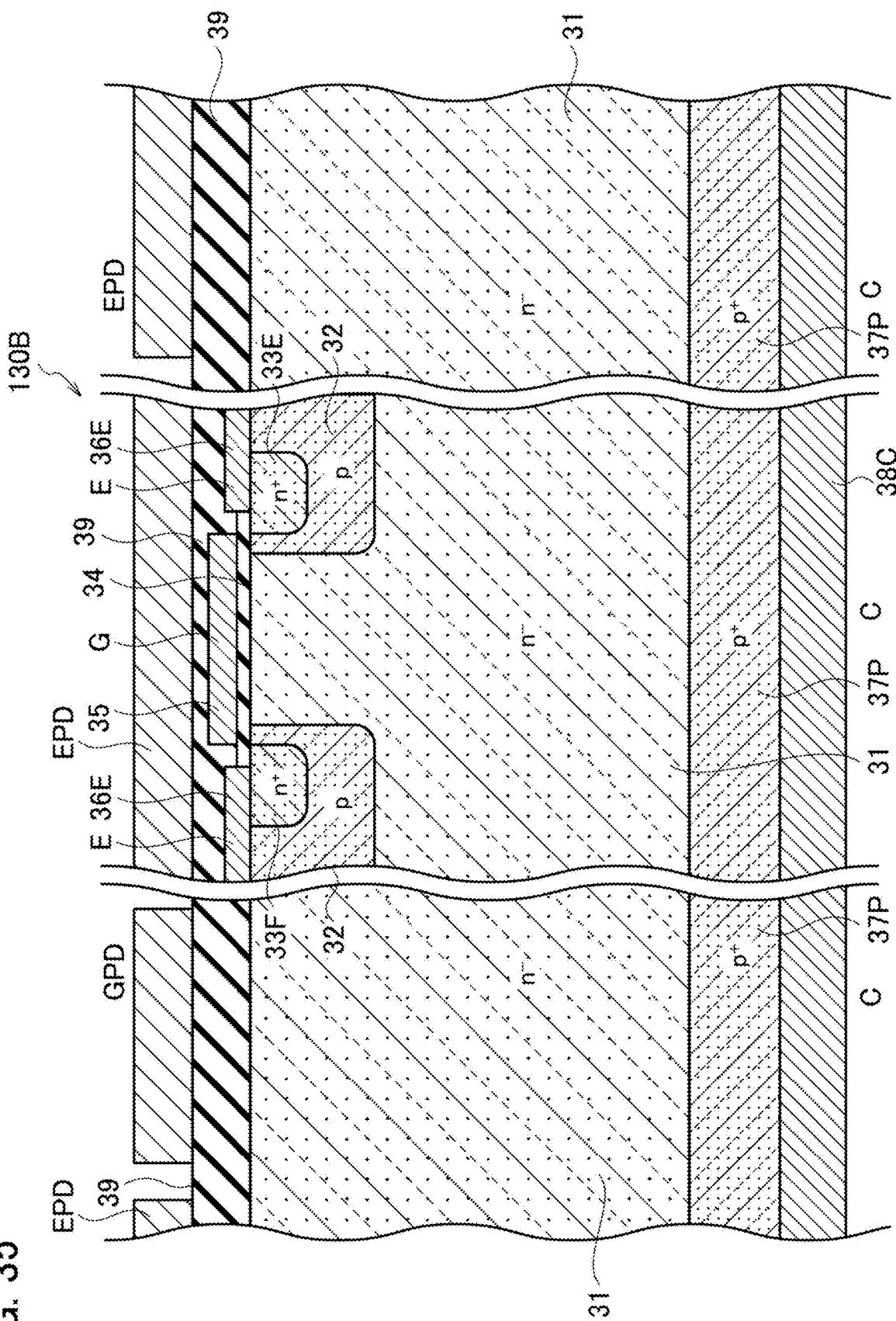
FIG. 35 is a schematic cross-sectional structure diagram of the IGBT including an emitter pad electrode EPD and a gate pad electrode GPD, in an example of the semiconductor power device applicable to the power semiconductor apparatus according to one embodiment to which the present technology is applied.

Similarly, FIG. 35 shows a schematic cross-sectional structure of an IGBT 130B including an emitter pad electrode EPD, a gate pad electrode GPD, and a collector electrode C, which is an example of the semiconductor power devices Q1, Q4 applicable to the power semiconductor apparatus according to one embodiment to which the present technology is applied.

As shown in FIG. 35, the IGBT 130B includes: a semiconductor layer 31 composed by including an n⁻ type high resistivity layer; a p body region 32 formed on a front surface side of the semiconductor layer 31; an emitter region 33E formed on a front side surface of the p body region 32; a gate insulating film 34 disposed on a front side surface of the semiconductor layer 31 between the p body regions 32; a gate electrode 35 disposed on the gate insulating film 34; an emitter electrode 36E connected to the emitter region 33E and the p body region 32; a p⁺ collector region 37P disposed on a back side surface opposite to the surface of the semiconductor layer 31; and a collector electrode 38C connected to the p⁺ collector region 37P.

The gate pad electrode GPD is connected to the gate electrode 35 disposed on the gate insulating film 34, and the emitter pad electrode EPD is connected to the emitter electrode 36E connected to the emitter region 33E and the p body region 32. Moreover, as shown in FIG. 35, the gate pad electrode GPD and the emitter pad electrode EPD are disposed on an interlayer insulating film 39 for passivation which covers the surface of IGBT 130B.

In addition, a microstructural IGBT structure (not illustrated) same as the above-mentioned transistor may be formed in the semiconductor layer 31 below the gate pad electrode GPD and the emitter pad electrode EPD.

Furthermore, as shown in FIG. 35, the emitter pad electrode EPD may be disposed to be extended onto the interlayer insulating film 39 for passivation, also in the IGBT structure of the center portion.

In FIG. 35, although the IGBT 130B is composed by including a planar-gate-type n channel vertical IGBT, the IGBT 130B may be composed by including a trench-gate-type n channel vertical IGBT, etc.

The same configuration may be applied to semiconductor power devices Q2, Q5 and semiconductor power devices Q3, Q6 applicable to the power semiconductor apparatus according to one embodiment to which the present technology is applied.

—SiC DIMOSFET—

Figure 36:
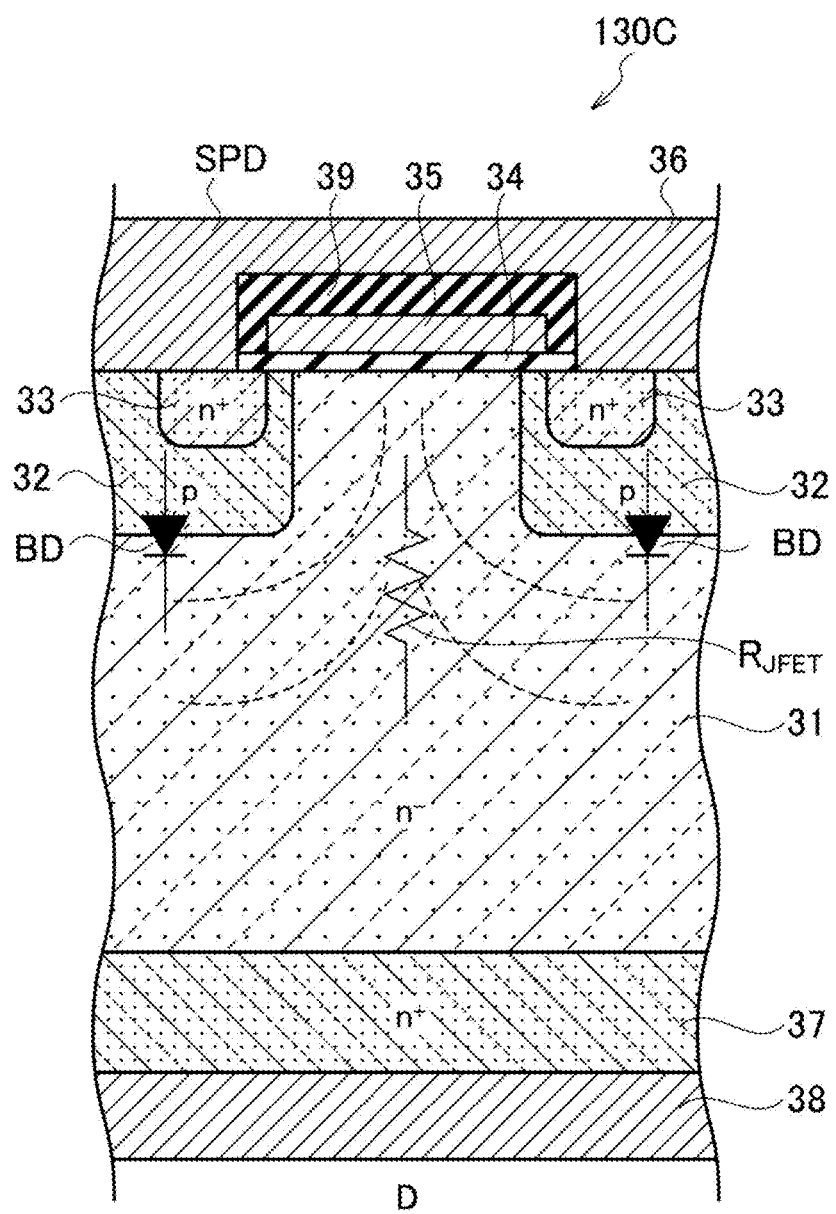
FIG. 36 is a schematic cross-sectional structure diagram of an SiC Double Implanted MOSFET (SiC DIMOSFET), in an example of a semiconductor power device which can be applied to the power semiconductor apparatus according to one embodiment to which the present technology is applied.

FIG. 36 shows a schematic cross-sectional structure of an SiC DIMOSFET 130C, which is an example of a semiconductor power device 110 which can be applied to the power semiconductor apparatus according to one embodiment to which the present technology is applied.

As shown in FIG. 36, the SiC DIMOSFET 130C includes: a semiconductor layer 31 composed by including an n⁻ type high resistivity layer; a p body region 32 formed on a front surface side of the semiconductor layer 31; an n⁺ source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n⁺ drain region 37 disposed on a back side surface opposite to the surface of the semiconductor layer 31; and a drain electrode 38 connected to the n⁺ type drain area 37.

In the SiC DIMOSFET 130C shown in FIG. 36, the p body region 32 and the n⁺ source region 33 formed on the front side surface of the p body region 32 are formed with double ion implantation (DII), and the source pad electrode SPD is connected to the source region 33 and the source electrode 36 connected to the p body region 32.

Moreover, a gate pad electrode GPD (not illustrated) is connected to the gate electrode 35 disposed on the gate insulating film 34. Moreover, as shown in FIG. 36, the gate pad electrode GPD and the source pad electrode SPD are disposed on an interlayer insulating film 39 for passivation which covers the surface of the SiC DIMOSFET 130C.

As shown in FIG. 36, in the SiC DIMOSFET 130C, since a depletion layer as shown with the dashed lines is formed in the semiconductor layer 31 composed of a n⁻ type high resistivity layer inserted into the p body regions 32, channel resistance RJFET accompanying the junction type FET (JFET) effect is formed. Moreover, as shown in FIG. 36, body diodes BD are respectively formed between the p body regions 32 and the semiconductor layers 31.

—SiC TMOSFET—

Figure 37:
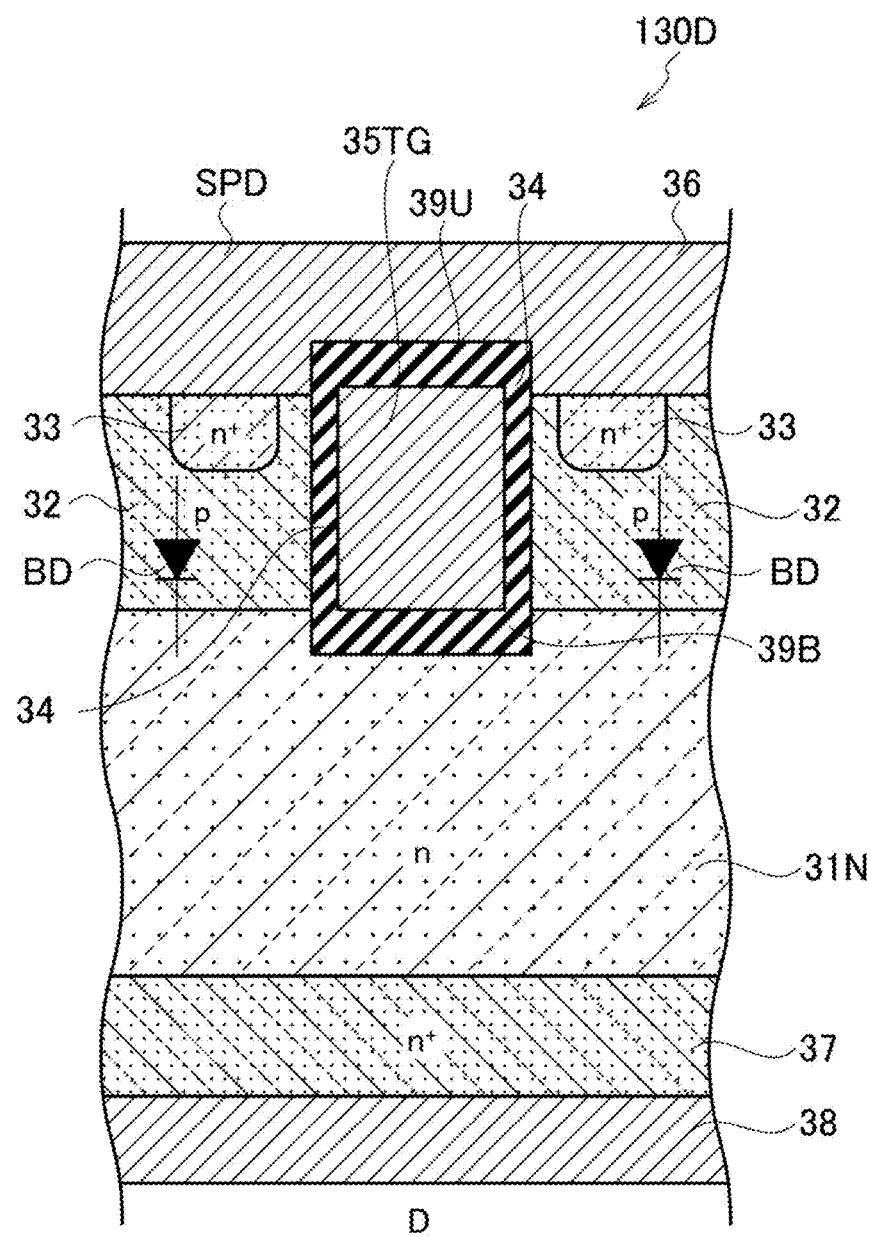
FIG. 37 is a schematic cross-sectional structure diagram of an SiC Trench MOSFET (SiC TMOSFET), in an example of a semiconductor power device which can be applied to the power semiconductor apparatus according to one embodiment to which the present technology is applied.

FIG. 37 shows a schematic cross-sectional structure of an SiC TMOSFET 130D, which is an example of a semiconductor power device 110 which can be applied to the power semiconductor apparatus according to one embodiment to which the present technology is applied.

As shown in FIG. 37, the SiC TMOSFET 130D includes: a semiconductor layer 31N composed by including an n layer; a p body region 32 formed on a front surface side of the semiconductor layer 31N; an n⁺ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n⁺ type drain region 37 disposed on a back side surface opposite to the surface of the semiconductor layer 31N; and a drain electrode 38 connected to the n⁺ type drain area 37.

In FIG. 37, in the SiC TMOSFET 130D, a trench gate electrode 35TG passing through the p body region 32 is formed in the trench formed up to the semiconductor layer 31N via the gate insulating film 34 and the interlayer insulating films 39U and 39B; and the source pad electrode SPD is connected to the source region 33 and the source electrode 36 connected to the p body region 32.

Moreover, a gate pad electrode GPD (not illustrated) is connected to the trench gate electrode 35TG disposed on the gate insulating film 34. Moreover, as shown in FIG. 37, the gate pad electrode GPD and the source pad electrode SPD are disposed on an interlayer insulating film 39U for passivation which covers the surface of the SiC TMOSFET 130D.

In the SiC TMOSFET 130D, channel resistance RJFET accompanying the JFET effect as the SiC DIMOSFET 130C is not formed. Moreover, body diodes BD are respectively formed between the p body regions 32 and the semiconductor layers 31N, in the same manner as FIG. 36.

Example of Application

Figure 38:
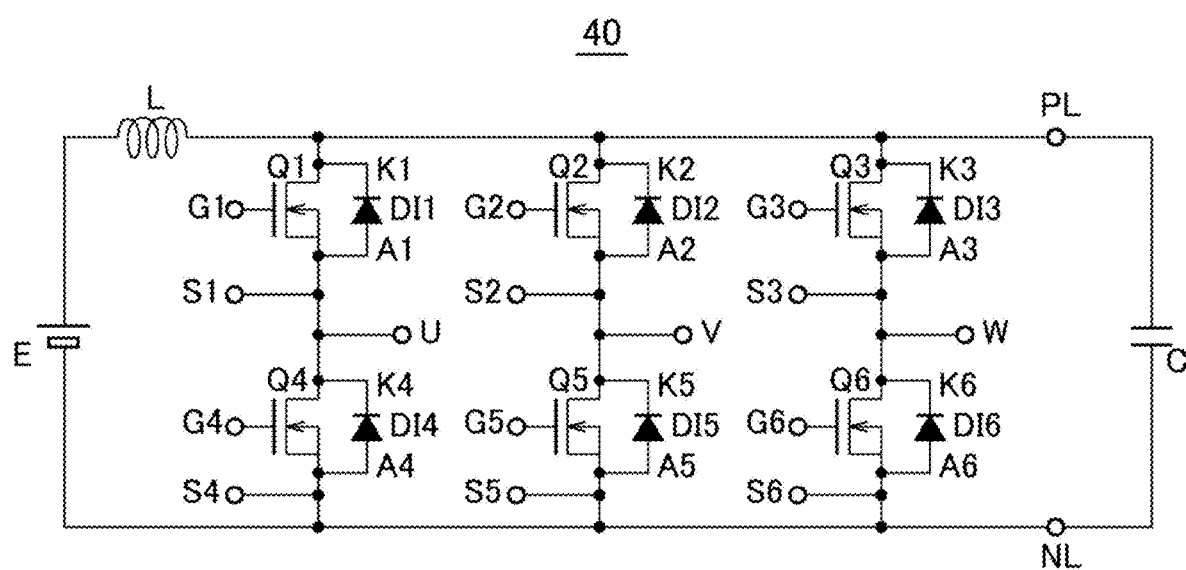
FIG. 38 shows an example of a circuit configuration in which the SiC MOSFET is applied as a semiconductor power device, and a snubber capacitor is connected between a power terminal PL and an earth terminal (ground terminal) NL, in a circuit configuration of a three-phase alternating current (AC) inverter composed using the power semiconductor apparatus according to one embodiment to which the present technology is applied.

FIG. 38 shows an example of a circuit configuration in which the SiC MOSFET is applied, and a snubber capacitor C is connected between the power terminal PL and the earth terminal (ground terminal) NL, in a circuit configuration of a three-phase AC inverter 40 composed using a plurality of the power semiconductor apparatuses according to one embodiment to which the present technology is applied shown in FIG. 33.

When both ends of each power semiconductor apparatus are connected to a power supply E to execute switching operations, large surge voltage Ldi/dt may be produced by an inductance L included in a connection line due to a high switching speed of the SiC MOSFET. For example, the surge voltage Ldi/dt is expressed as follows: $di/dt=3\times10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

Concrete Example

Figure 39:
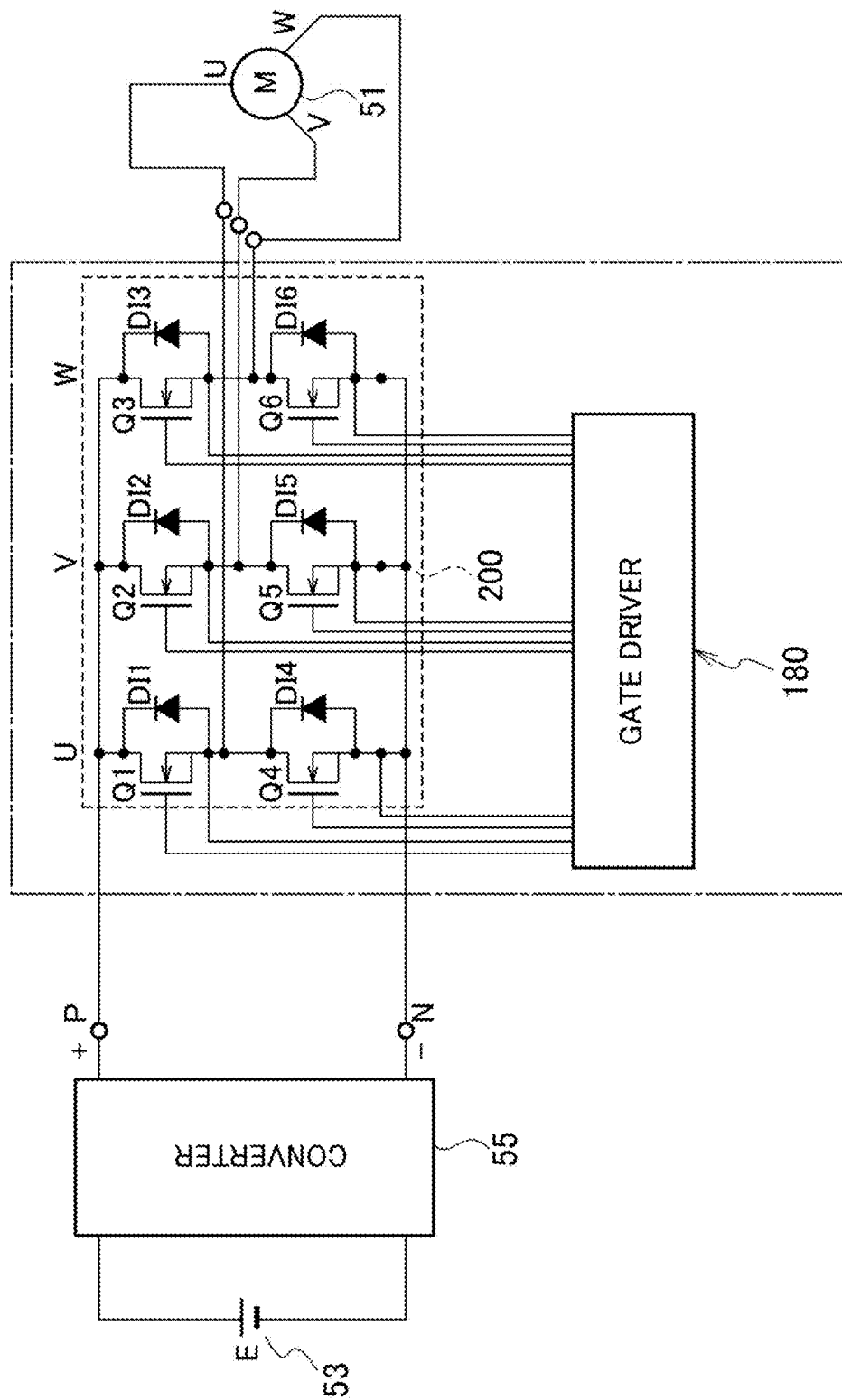
FIG. 39 shows an example of a circuit configuration in which the SiC MOSFET is applied as the semiconductor power device, in a circuit configuration of a three-phase AC inverter composed using the power semiconductor apparatus according to one embodiment to which the present technology is applied.

Next, with reference to FIG. 39, the three-phase AC inverter 42 to which SiC MOSFET is applied as a semiconductor power device is explained.

As shown in FIG. 39, the three-phase AC inverter 42 includes: a power semiconductor apparatus unit 200 connected to a gate driver (GD) 180; a three-phase AC motor unit 51; a power supply or storage battery (E) 53; and a converter 55. U-phase, V-phase, and W-phase inverters are respectively connected to the three-phase AC motor unit 51 so as to correspond to U phase, V phase, and W phase of the three-phase AC motor unit 51, in the power semiconductor apparatus unit 200.

In this embodiment, the GD 180 is each gate terminal of connected to the SiC MOSFETs Q1, Q4, SiC MOSFETs Q2, Q5, and the SiC MOSFETs Q3, Q6, and individually controls the switching operation of each MOSFET.

The power semiconductor apparatus unit 200 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

In this case, although each MOSFET composing the power semiconductor apparatus unit 200 can be considered as one large transistor, one chip or a plurality of chips may be contained therein.

In the power semiconductor apparatus according to one embodiment to which the present technology is applied, the 1-in-1 module and the 2-in-1 module have been mainly explained, but it is not limited to this example.

For example, it is applicable to 4-in-1 module, a 6-in-1 module, a 7-in-1 module in which a snubber capacitor etc. is provided in the 6-in-1 module, an 8-in-1 module, a 12-in-1 module, a 14-in-1 module, and the like.

The semiconductor power device 22 may comprise one selected from the group consist of an IGBT, a diode, an Si based MOSFET, an SiC based MOSFET and a GaNFET.

Moreover, a hybrid device between the SiC based MOSFET and the SiC based IGBT may be used.

According to one embodiment to which the present technology is applied, there can be provided the reliable power semiconductor apparatus, wherein the wiring resistance is reduced and the stress produced in the bonding layer on the chip is also reduced, and the degradation speed of the bonded portion due to the stress by the repetition of cooling and heating such as a power cycle can be delayed.

According to one embodiment to which the present technology is applied, there can be provided the power semiconductor apparatus capable of improving the power cycle capability.

According to one embodiment to which the present technology is applied, there can be provided the power semiconductor apparatus capable of improving reliability thereof by reducing the thermal stress to the bonding layer between the semiconductor power device and the metal lead positioned on the upper surface thereof, and reducing the resistance of the metal lead.

Figure 40:
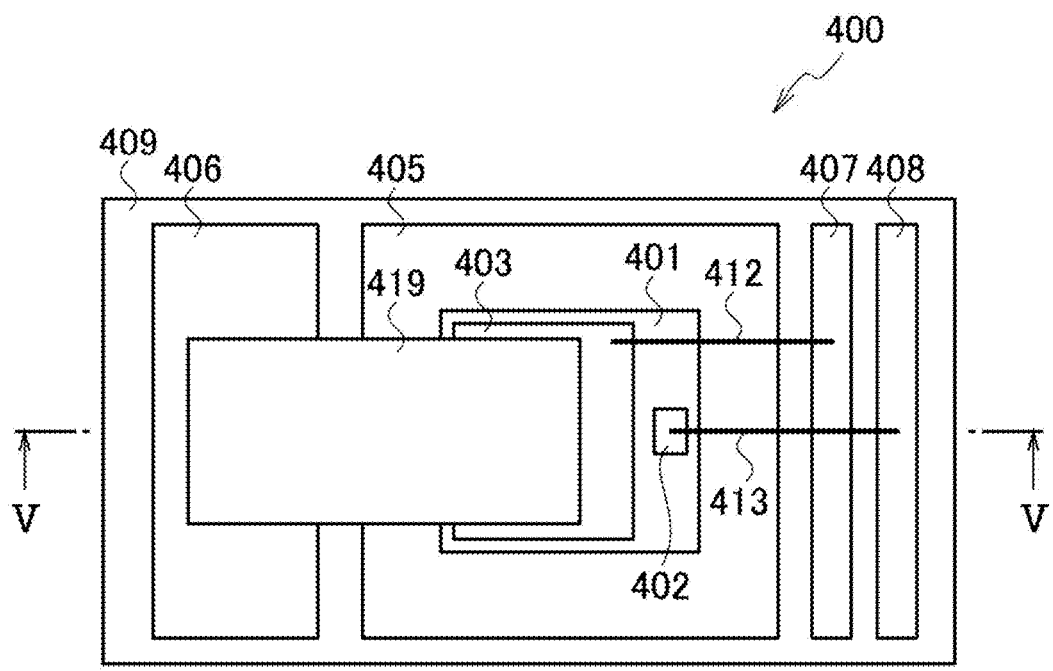
FIG. 40 is a schematic planar pattern configuration diagram showing the power semiconductor apparatus according to one embodiment to which the present technology is applied.
Figure 41:
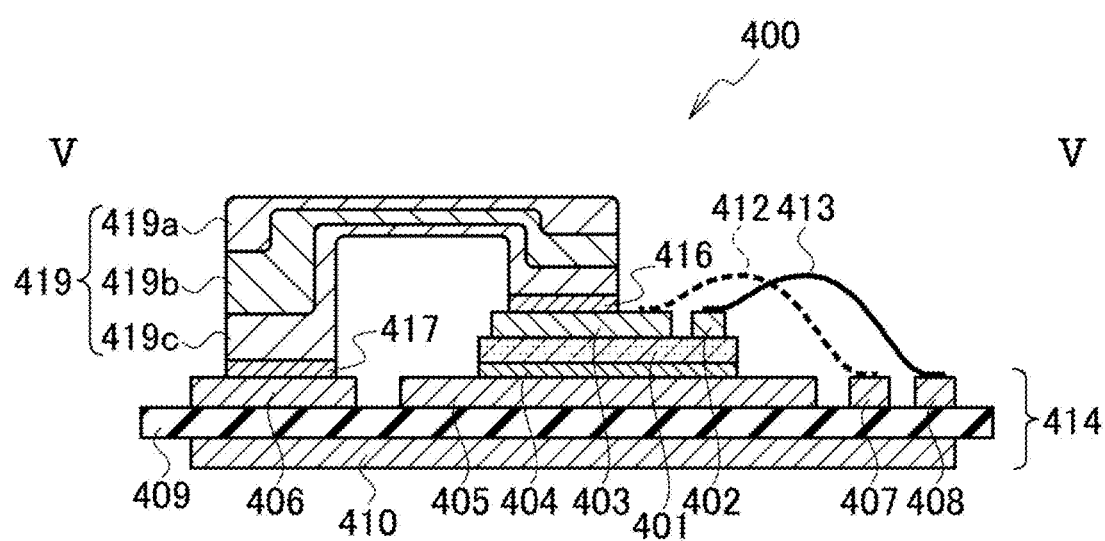
FIG. 41 is a schematic cross-sectional structure diagram taken in the line V-V of FIG. 40, in the power semiconductor apparatus according to one embodiment to which the present technology is applied.

FIG. 40 shows a schematic planar pattern configuration of a power semiconductor apparatus 400 according to one embodiment to which the present technology is applied, and FIG. 41 shows a schematic cross-sectional structure taken in the line V-V of FIG. 40.

In the power semiconductor apparatus 400 according to one embodiment to which the present technology is applied, in order to reduce a thermal stress to a bonding layer 416 on chip in a bonding layer 416 on chip between a semiconductor power device 401 and a metal lead 419 positioned on an upper surface, a laminated material having low thermal expansion coefficient is used for the metal lead 419.

In the power semiconductor apparatus 400 according to one embodiment to which the present technology is applied, as shown in FIG. 41, a three-laminated structure (a metal layer 419a, a metal layer 419b, and a metal layer 419c) is used for the material(s) of the metal lead 419 to be connected to the upper surface of the semiconductor power device 401, for example.

The metal lead 419 has a configuration in which the metal layers 419a and 419c having relatively low electric resistance are laminated on the upper and lower sides of the metal layer 419b having relatively low thermal expansion coefficient centered thereon.

As the metal layers 419a and 419c, copper or aluminum can be applied, for example. As the metal layer 419b, Fe—Ni based alloy, such as Invar or Kovar, Fe—Ni—Co based alloy, tungsten, molybdenum, or the like can be applied, for example.

The CTE of the three-laminated structure (metal layer 419a/metal layer 419b/metal layer 419c) can be adjusted by a thickness component ratio. For example, in the case of copper/Invar (Fe—Ni based alloy)/copper, the CTE in the case of the thickness ratio 1:3:1 is approximately 6 ppm/° C., and the CTE in the case of the thickness ratio 1:8:1 is approximately 3 ppm/° C. Accordingly, by reducing the difference in CTE with the semiconductor power device 401, the stress of the bonding layer 416 on chip which is generated under the repetition of cooling and heating situation can be reduced, and thereby the bonding lifetime can be lengthened.

Comparative Examples

Figure 42:
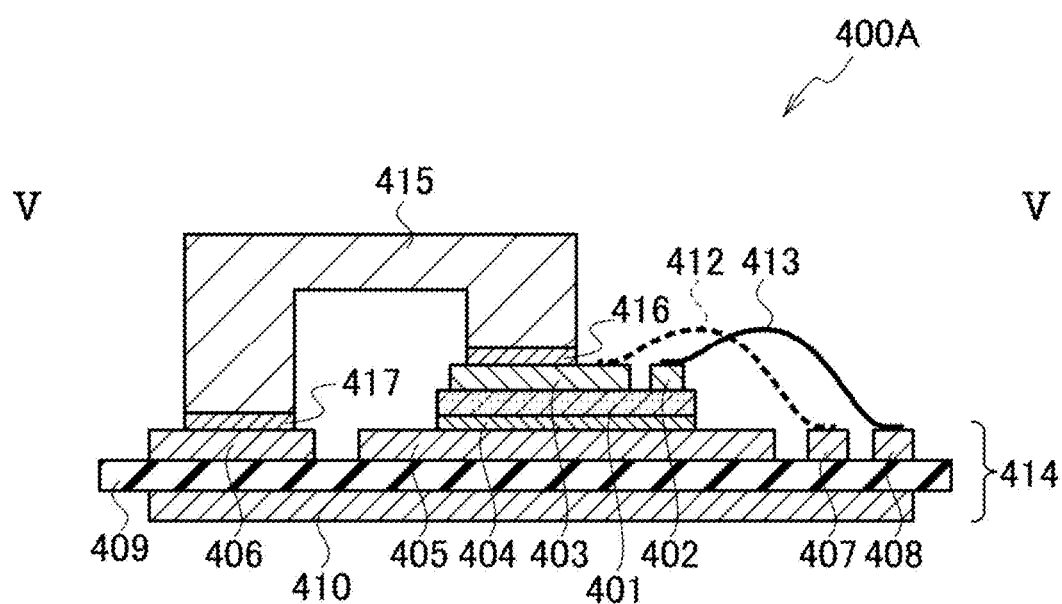
FIG. 42 is a schematic cross-sectional structure diagram taken in the line V-V of a planar pattern configuration corresponding to FIG. 40, in a power semiconductor apparatus according to the comparative example.

FIG. 42 is a schematic cross-sectional structure taken in the line V-V of a planar pattern configuration corresponding to FIG. 40, which is a power semiconductor apparatus 400A according to the comparative example 1.

Figure 44A:
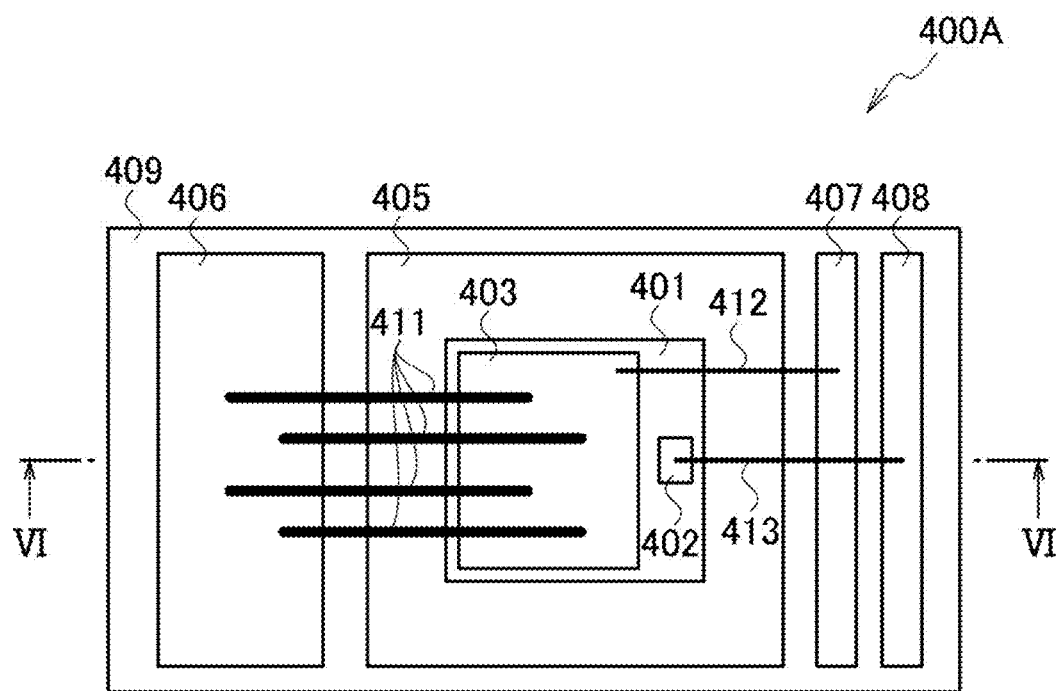
FIG. 44A is a schematic planar pattern configuration diagram showing the power semiconductor apparatus according to the comparative example.
Figure 44B:
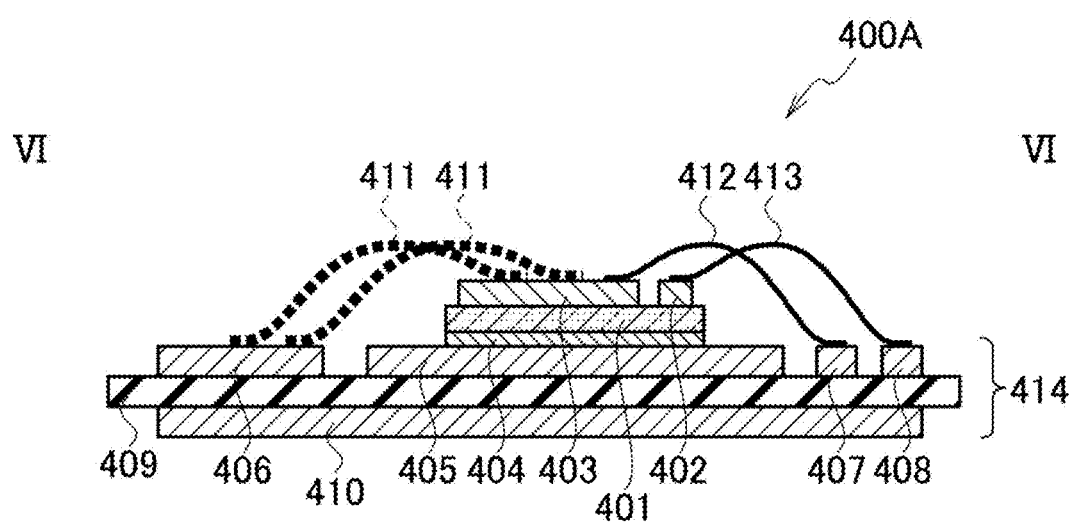
FIG. 44B is a schematic cross-sectional structure diagram taken in the line VI-VI of FIG. 44A.

FIG. 44A shows a schematic planar pattern configuration of a power semiconductor apparatus 400A according to a comparative example 2, and FIG. 44B shows a schematic cross-sectional structure taken in the line VI-VI of FIG. 44A. The power semiconductor apparatus 400A according to the comparative example 2 is used herein for explaining a wiring structure, as shown in FIGS. 44A and 44B.

In the power semiconductor apparatus 400A according to the comparative example 2, a semiconductor power device 401 is bonded on an insulating substrate 414, and a source bonding wire 411 for extracting electric current is connected to an upper surface of the semiconductor power device 401. The semiconductor power device 401 is electrically connected to an upper surface of a drain electrode pattern 405 positioned on an upper surface of the insulating substrate 414 through a bonding layer under chip 404. A source pad electrode 403 is formed on the upper surface of the semiconductor power device 401, and a source electrode pattern 406 and ae source pad electrode 403 composing the insulating substrate 414 are electrically connected through a source bonding wire 411.

Furthermore, the source pad electrode 403 formed on the upper surface of the semiconductor power device 401 and the source signal electrode pattern 407 formed on the upper surface of the insulating substrate 414 are electrically connected through a source signal bonding wire 412. Moreover, the gate pad electrode 402 formed on the upper surface of the semiconductor power device 401 and a gate signal electrode pattern 408 formed on the upper surface of the insulating substrate 414 are electrically connected through a gate signal bonding wire 413.

In the wiring structure mentioned above, when a large current is flowed, since the wiring resistance of the wire (aluminum or copper) is high, the wire is melted if it causes self-heating and exceeds a melting point of the wire material. For this reason, although the number of the source bonding wires 411 to be connected to the source pad electrode 403 formed on the upper surface the semiconductor power device 401 is increased or the diameter of the source bonding wire 411 is increased in order to reduce the wiring resistance, there is a limit.

Accordingly, bonding a metal lead on the upper surface of the semiconductor power device 401 is adopted, instead of the wire of the wiring structure shown in FIG. 44. Such bonding will now be explained using the comparative example 1 (FIG. 42).

In the power semiconductor apparatus 400A according to the comparative example 1, the semiconductor power device 401 is electrically connected to an upper surface of a drain electrode pattern 405 positioned on an upper surface of the insulating substrate 414 through a bonding layer under chip 404. The source pad electrode 403 is formed on the upper surface of the semiconductor power device 401, and the source electrode pattern 406 and the source pad electrode 403 which configure to the insulating substrate 414 are connected by the metal lead 415 via the bonding layer 416 on chip and the bonding layer 417 on source electrode pattern.

In order to reduce the electric resistance, copper or aluminum is generally used for the metal lead 415. However, the CTE of copper is approximately 17 ppm/° C., and the CTE of aluminum is approximately 24 ppm/° C., and therefore both are larger than the CTE (3 to 4 ppm/° C.) of Si or SiC of the semiconductor power device 401. Accordingly, a crack 418 of the bonding layer is generated in the bonding layer 416 on chip due to a stress caused by the CTE difference under an environment of repeating cooling and heating (refer to FIG. 43B).

In order to prevent such a crack, if a low thermal expansion metal (for example, Fe—Ni based alloy, such as Invar or Kovar, Fe—Ni—Co based alloy, tungsten, molybdenum, or the like) is used for a material of the metal lead 415, instead of copper or aluminum, the wiring resistance becomes high and therefore a desired electric current may not flow.

Figure 43A:
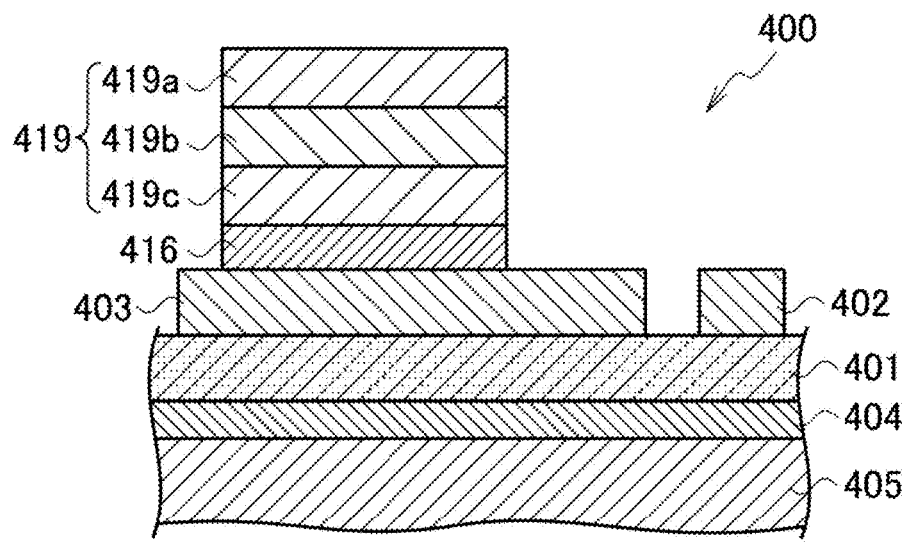
FIG. 43A is another schematic cross-sectional structure diagram showing the power semiconductor apparatus according to one embodiment to which the present technology is applied.
Figure 43B:
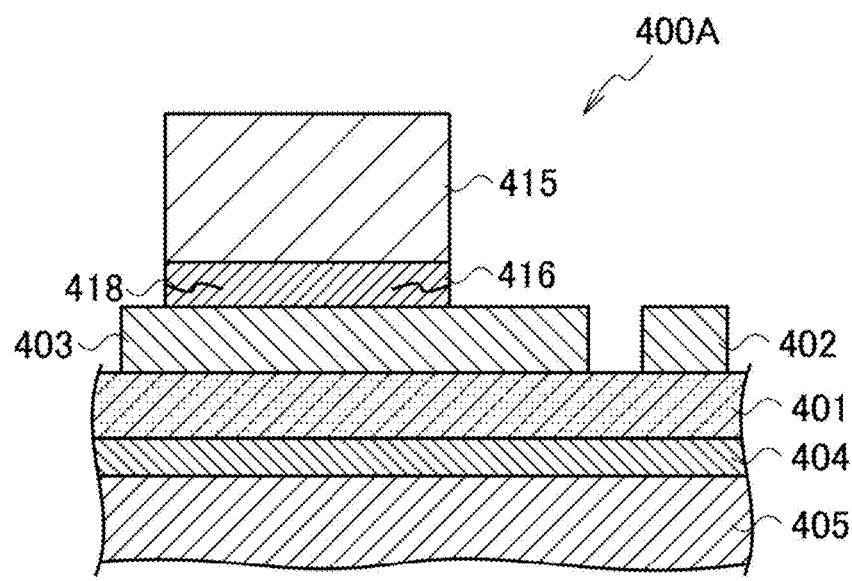
FIG. 43B is another schematic cross-sectional structure diagram showing the power semiconductor apparatus according to the comparative example.

FIG. 43A shows another schematic cross-sectional structure near the semiconductor power device 401 of the power semiconductor apparatus 400 according to one embodiment to which the present technology is applied, and FIG. 43B shows another schematic cross-sectional structure near the power semiconductor apparatus 400A according to the comparative example.

Since the power semiconductor apparatus 400A according to the comparative example uses the metal lead 415 which is composed of the metallic single substance material, as shown in FIG. 43B, a crack 418 of the bonding layer is generated in the bonding layer 416 on chip due to a stress caused by CTE difference under an environment of repeating cooling and heating, and thereby increasing the wiring resistance.

Since the power semiconductor apparatus 400 according to one embodiment to which the present technology uses the metal lead 419 having a laminated structure, as shown in FIG. 43A, it becomes difficult to generate a crack in the bonding layer 416 on chip due to a stress caused by the CTE difference also under the environment of repeating cooling and heating.

As shown in FIGS. 41 and 43A, the power semiconductor apparatus 400 according to one embodiment to which the present technology includes: a semiconductor power device 401; a bonding layer 416 on chip disposed on an upper surface of the semiconductor power device 401; and a metal lead 419 disposed on an upper surface of the semiconductor power device 401 and bonded to the bonding layer 416 on chip, wherein the metal lead 419 has a metallic laminated (stacked) structure.

Moreover, the metal lead 419 has a three-laminated structure including: a second metal layer 419b having a CTE equal to or less than $5\times10^{-6}$/° C., for example; and a first metal layer 419a and a third metal layer 419c sandwiching the second metal layer 419b and having a CTE equal to or greater than the CTE of the second metal layer 419b.

Moreover, the second metal layer 419b may include a Fe—Ni based or Fe—Ni—Co based alloy, and the first metal layer 419a and the third metal layer 419c may include copper, a copper alloy, aluminum, or an aluminum alloy.

In this case, since the second metal layer 419b has a resistance value higher than that of the first metal layer 419a and the third metal layer 419c but a current conducting area on the bonding layer 416 disposed on the upper surface of the semiconductor power device 401 is wider, the thickness thereof the current conducting direction is thin, it can be used as an conductive material.

The metal lead 419 (419a/419b/419c) may has a laminated structure of Cu/Invar/Cu, and a thickness ratio thereof may be within a range of 1:0.5:1 to 1:20:1.

The metal lead 419 (419a/419b/419c) may has a laminated structure of Cu/Invar/Cu, and a thickness ratio thereof may be preferably within a range of 1:3:1 to 1:10:1.

The metal lead 419 can be formed through a rolling process.

Moreover, as shown in FIGS. 41 and 43A, the power semiconductor apparatus 400 according to one embodiment to which the present technology includes an insulating substrate 414, and a bonding layer 404 under chip disposed on the insulating substrate 414, wherein the semiconductor power device 401 may be disposed on the insulating substrate 414 via the bonding layer 404 under chip.

In this case, the insulating substrate 414 can also be composed of an insulating substrate (circuit substrate), such as a circuit substrate which is composed of a contacted body of metal/ceramics/metal, e.g., a Direct Bonding Copper (DBC) substrate, a Direct Brazed Aluminum (DBA) substrate, or an Active Metal Brazed (Active Metal Bond) (AMB) substrate.

As a metallic material of the front-surface-side electrode and the back-surface-side electrode of the insulating substrate 414, the same material is fundamentally used. For example, a $Cu/Al_2O_3/Cu$ structure can be applied to the DBC substrate, an Al/AlN/Al structure can be applied to the DBA substrate, and a $Cu/Si_3N_4/Cu$ structure can be applied to the AMB substrate. However, a function of the front-surface-side electrode and a function of the back-surface-side electrode are slightly different from each other. The front-surface-side electrode has a function of bonding chips, electrodes, etc., a function as a positive (P) side power electrode, a negative (N) side power electrode and an output (Out) side power electrode respectively formed by cutting the pattern thereof, etc. The back-surface-side electrode has a function of conducting heat below by being bonded to a cooling apparatus or bonded to a heat spreader. Moreover, as shown in FIG. 41, the front side surface of the metal lead 419 may have a flat surface parallel to the insulating substrate 414.

The bonding layer 416 on chip may include an Ag fired layer or a Cu fired layer. The thickness of the Ag fired layer or the Cu fired layer is approximately 10 μm to approximately 100 μm, for example. The Ag fired layer or the Cu fired layer can be formed by mask printing or a dispensing method.

The bonding layer 404 under chip may include an Ag fired layer or a Cu fired layer, in the same manner as the bonding layer 416 on chip. The bonding layer 417 disposed on the source electrode pattern (copper foil) 406 may include the Ag fired layer or the Cu fired layer, in the same manner as the bonding layer 416 on chip.

The metal lead 419 is mounted on the semiconductor power device 401 and the source electrode pattern 406, the metal layer 419c and the source electrode pattern 406 are simultaneously bonded via the bonding layer 416 on chip by solid phase diffusion through a heating and pressurizing process, and thereby the metal layer 419c and the source pad electrode 403 can be bonded to each other via the bonding layer 417 on source electrode pattern by the solid phase diffusion. Simultaneously, the semiconductor power device 401 and the drain electrode pattern (copper foil) 405 can be bonded to each other via the bonding layer 404 under chip by the solid phase diffusion through the heating and pressurizing process. In this case, in the heating and pressurizing process for heating and pressurizing, a heating processing temperature is approximately 300° C. to approximately 350° C., for example, and an applied pressure is approximately 10 MPa to approximately 80 MPa, for example.

As shown in FIGS. 40 and 41, the power semiconductor apparatus 400 according to one embodiment to which the present technology includes: a substrate 409; a drain electrode pattern 405, a source electrode pattern 406, a source signal electrode pattern 407, and a gate signal electrode pattern 408 which are disposed on the substrate 409; a bonding layer 404 under chip disposed on the drain electrode pattern 405; a semiconductor power device 401 disposed on the bonding layer 404 under chip and having a source pad electrode 403 and a gate pad electrode 402 on a front surface side thereof; a bonding layer 416 on chip disposed on the source pad electrode 403; a bonding layer 417 disposed on the source electrode pattern 406; and a first metal lead 419 bonded to the bonding layer 417 on source electrode pattern and the bonding layer 416 on chip, wherein the first metal lead 419 has a metallic laminated structure.

Moreover, as shown in FIGS. 40 and 41, the power semiconductor apparatus 400 may include a source signal bonding wire 412 connected between the source pad electrode 403 and the source signal electrode pattern 407, and a gate signal bonding wire 413 connected between the gate pad electrode and the gate signal electrode pattern 408.

The source signal bonding wire 412 and the gate signal bonding wire 413 may include a copper wire, an aluminum wire, or a clad wire, and ultrasonic bonding may be subjected to one end thereof.

Moreover, the semiconductor power device 401 may has a $\Delta Tj$ power cycle which is equal to or greater than 100° C.

Figure 45:
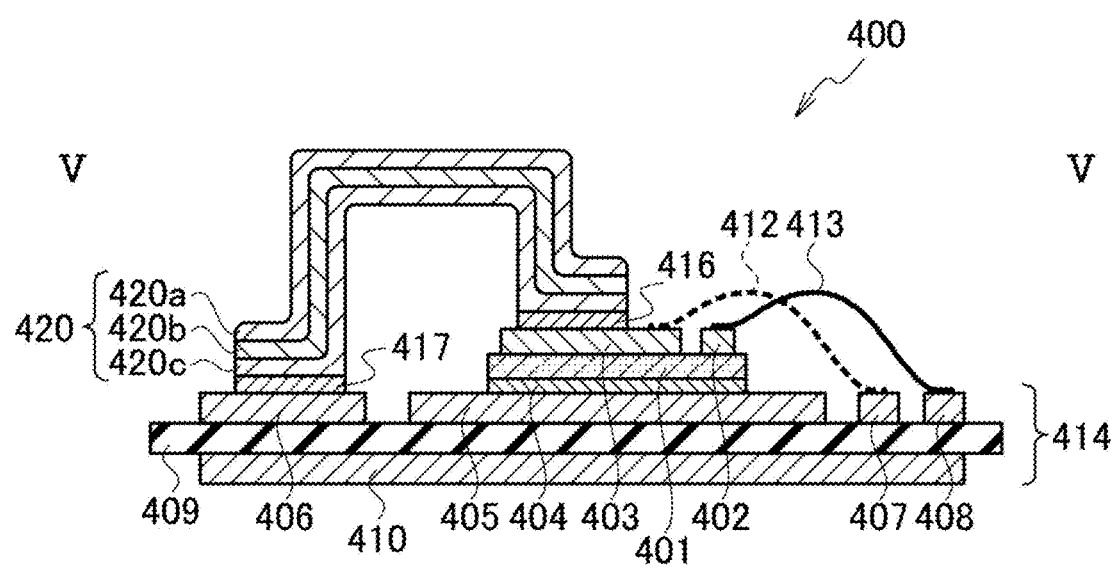
FIG. 45 is a schematic cross-sectional structure diagram taken in the line V-V of a planar pattern configuration corresponding to FIG. 40, in the power semiconductor apparatus according to one embodiment to which the present technology is applied.

FIG. 45 is a schematic cross-sectional structure taken in the line V-V of a planar pattern configuration corresponding to FIG. 40, which is the power semiconductor apparatus 400 according to one embodiment to which the present technology is applied.

As shown in FIG. 45, the power semiconductor apparatus 400 according to one embodiment to which the present technology includes: a semiconductor power device 401; a bonding layer 416 on chip disposed on an upper surface of the semiconductor power device 401; and a metal lead 420 disposed on an upper surface of the semiconductor power device 401 and bonded to the bonding layer 416 on chip, wherein the metal lead 420 has a metallic laminated (stacked) structure.

Moreover, the metal lead 420 has a three-laminated structure including: a second metal layer 420b having a CTE equal to or less than $5 \times 10^{-6}$/° C., for example; and a first metal layer 420a and a third metal layer 420c sandwiching the second metal layer 420b and having a CTE equal to or greater than the CTE of the second metal layer 420b.

Moreover, the second metal layer 420b may include a Fe—Ni based or Fe—Ni—Co based alloy, and the first metal layer 420a and the third metal layer 420c may include copper, a copper alloy, aluminum, or an aluminum alloy.

The metal lead 420 may has a laminated structure of Cu/Invar/Cu, and a thickness ratio thereof may be within a range of 1:0.5:1 to 1:20:1.

The metal lead 420 may has a laminated structure of Cu/Invar/Cu, and a thickness ratio thereof may be preferably within a range of 1:3:1 to 1:10:1.

The metal lead 420 can be formed through a bending process.

Other configurations are the same as those shown in FIGS. 40 and 41.

(Fabrication Method for Metal Lead)

FIG. 46A shows a process of preparing the metal layers 419a (420a), 419b (420b), 419c (420c), in a fabrication method for the metal leads 419, 420 applied to the power semiconductor apparatus 400 according to one embodiment to which the present technology. Furthermore, FIG. 46B shows a process of laminating the metal layers 419a (420a), 419b (420b), 419c (420c), to be pressured and rolled in the arrow direction.

Furthermore, FIG. 46C shows a process of forming a desired rectangular shape, as a result of rolling the laminated metal layers 419a (420a), 419b (420b), 419c (420c). Furthermore, FIG. 46D shows a process of forming a desired round rectangular shape, as a result of rolling the laminated metal layers 419a (420a), 419b (420b), 419c (420c).

In the power semiconductor apparatus 400 according to one embodiment to which the present technology, a front side surface of the metal layer 419a (420a) may be formed in a flat shape through the rolling process, depending on an intended use, as shown in FIGS. 46C and 46D.

Alternatively, instead of forming the metal layer in a desired shape by the rolling process after the laminating metal layer, a bending process may be subjected to the laminated layer so as to be formed in a bending process shape while the thickness of the metal leads 419, 420 are still fixed, as shown in FIG. 45.

In the power semiconductor apparatus 400 according to one embodiment to which the present technology, the reason for laminating the metal leads 419, 420 is so as to have a low electric resistance and a low CTE. In the case of using a single metal substance having low CTE, electric resistance is increased, and when electric current is applied (for example, approximately 80 A), a temperature of the metal becomes higher than a chip temperature, and therefore it becomes impossible to flow the electric current.

In the power semiconductor apparatus 400 according to one embodiment (first embodiment) to which the present technology shown in FIG. 40 and FIG. 41, the reason why the metal lead 419 has different thicknesses and ratios of the metal layers 419a, 419b, 419c on the semiconductor power device 401, the source pad electrode 403 portion, and the source electrode pattern 406 reflects the fabrication method. Since the metal layers 419a, 419b, 419c are laminated at the same ratio and then formed in a desired thickness by means of a rolling roller, the thickness is changed depending on whether or not the rolling is performed, but the lamination ratio itself is hardly changed.

On the other hand, in the power semiconductor apparatus 400 according to one embodiment (second embodiment) to which the present technology shown in FIG. 45, the reason why the metal lead 419 has same thickness and ratio of the metal layers 419a, 419b, 419c on the semiconductor power device 401, the source pad electrode 403 portion, and the source electrode pattern 406 also reflects the fabrication method. In the second embodiment, the laminated layer is formed in a desired shape through the bending process, instead of being formed in a desired shape through the rolling process as the first embodiment.

In the power semiconductor apparatus 400 according to one embodiment to which the present technology shown in FIGS. 40 and 41, although pressure can be applied from the upper surface of the metal lead 419 to simultaneously transfer the pressure to the bonding layer 416 on chip and the bonding layer 417 on source electrode pattern below the metal lead 419, it is not so flexible. In the power semiconductor apparatus 400 according to one embodiment to which the present technology shown in FIG. 45, although it is necessary to individually pressurize the bonding layer 416 on chip and the bonding layer 417 on source electrode pattern since the pressure cannot be simultaneously transferred to the bonding layer 416 on chip and the bonding layer 417 on source electrode pattern. However, since it is formed by bending and can be thinned as a whole, there is an advantage that flexibility can be maintained. Furthermore, if the metal lead 420 is applied, the cost is reduced.

(ΔTj Power Cycle Test)

A current is flowed through the semiconductor power device, and when a predetermined chip temperature is reached, the current is interrupted to cool the semiconductor power device. Such a repetition is called a Power Cycle Test (PCT). The PCT life is the number of PCTs until a predetermined change rate is exceeded due to an increase in the on-resistance of the semiconductor power device, an increase in the chip temperature, a decrease in the bonding area, an increase in the wiring resistance, etc., after implementing such PCT.

Figure 47A:
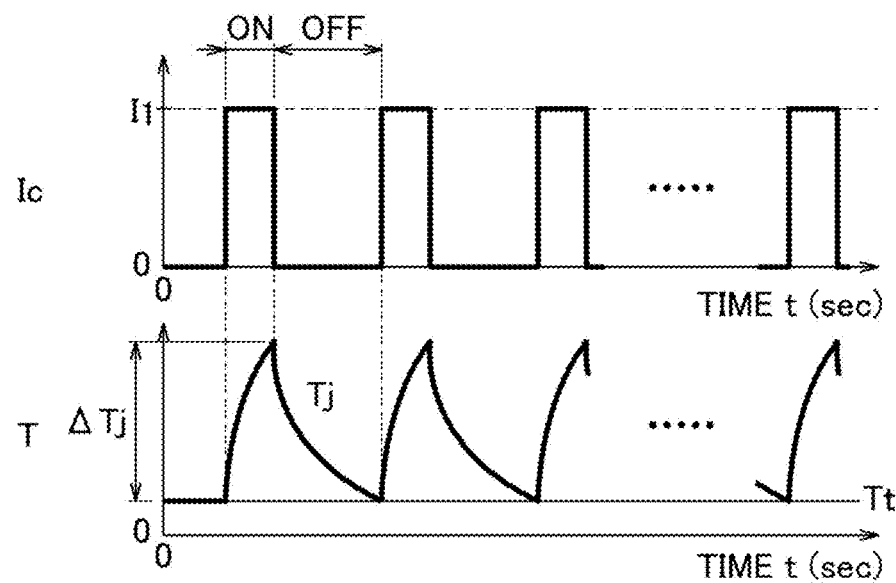
FIG. 47A is a schematic diagram of change of an electric current and a temperature, in a ΔTj power cycle test of the power semiconductor apparatus according to one embodiment to which the present technology is applied.

FIG. 47A shows a schematic diagram of change of an electric current $I_c$ and a temperature T, in the ΔTj power cycle test of the power semiconductor apparatus according to one embodiment to which the present technology is applied.

As shown in FIG. 47A, the ΔTj power cycle test is a test to which a junction temperature is relatively risen and dropped at a short-time period, for example, and thereby a lifetime of a wire bonded portion etc. can be evaluated.

The power cycle test repeats electrical connection (ON) and disconnection (OFF) of the power semiconductor apparatus so that the chip is heated, as shown in FIG. 47A. The ΔTj power cycle test of the power semiconductor apparatus according to one embodiment to which the present technology is applied is repeatedly performed, for example, for 2 seconds at Tj=150° C., and until the cooling temperature is reached (e.g., Tj=50° C., off Time=18 seconds) by being turned off.

(Thermal Cycle Test)

Figure 47B:
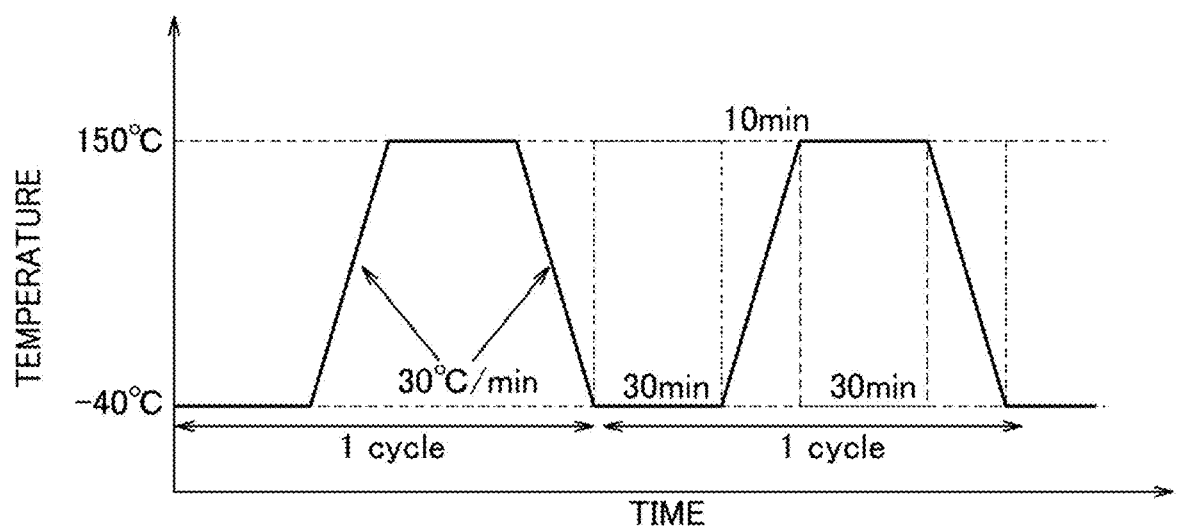
FIG. 47B shows an example of a temperature profile in the thermal cycle test of the power semiconductor apparatus according to one embodiment to which the present technology is applied.

FIG. 47B shows an example of a temperature profile in a thermal cycle test, in the power semiconductor apparatus according to one embodiment to which the present technology is applied. The thermal cycle test is conducted in the atmospheric air, and is implemented under a range from minus 40° C. to plus 150° C. The period of 1 cycle of the thermal cycle is 80 minutes, and the breakdown is as follows: 30 minutes at −40° C.; 10 minutes (cooling time) from +150° C. to −40° C.; 30 minutes at +150° C.; and 10 minutes (heating time) from +150° C. to −40° C. No characteristic degradation is observed, as a result of measuring forward voltage drop Vf and reverse breakdown voltage Vr for every 100 cycles.

Normally, also in the thermal cycle test or the power cycle test, if degradation of the bonded portion starts, a resistance is increased and the forward voltage Vf is also changed in the test of flowing a high forward electric current etc. Even if degradation including characteristic degradation occurs, it can be estimated that the power cycle capability is high if progress of the degradation is slow.

As proved from the results of the above-mentioned ΔTj power cycle test and thermal cycle test, the bonding strength between the metal leads 419, 420 and the bonding layer 416 on chip of the power semiconductor apparatus is sufficiently ensured.

(Relationship Between Maximum Principal Stress and CTE)

Figure 48:
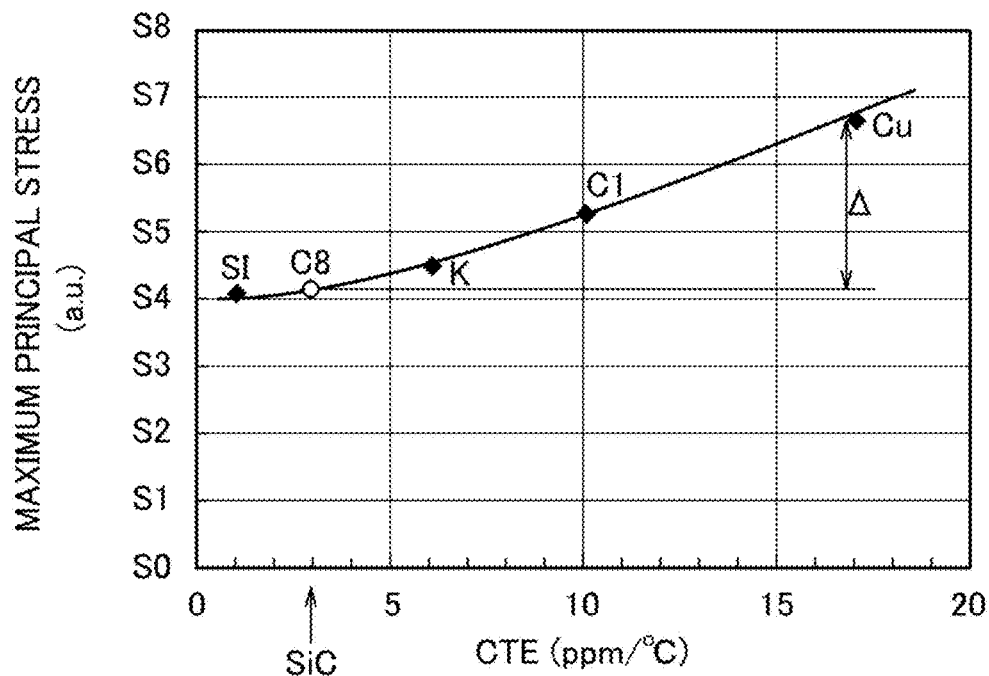
FIG. 48 shows a relationship between a maximum principal stress (Pa) and a Coefficient of Thermal Expansion (CTE) (ppm/° C.) using a lead member as a parameter, in the power semiconductor apparatus according to one embodiment to which the present technology is applied.

FIG. 48 shows a relationship between a maximum principal stress (Pa) and a Coefficient of Thermal Expansion (CTE) (ppm/° C.) using a lead member as a parameter, in the power semiconductor apparatus according to one embodiment to which the present technology is applied. As a lead member, Cu, Cl, K, C8, and SI are applied. Cu used herein is a metal lead of copper simple substance. K is a metal lead of Kovar (Fe-29Ni-17Co alloy, CTE is 5 ppm/° C.). Cl is a laminated metal lead of Cu/Invar/Cu having a laminating ratio 1:1:1. C8 is a laminated metal lead of Cu/Invar/Cu having a laminating ratio 1:8:1. SI is a metal lead of Super Invar (Fe-32Ni-5Co alloy, CTE is equal to or less than 1 ppm/° C.). The CTE of Invar (Fe-36Ni alloy) is approximately 2 ppm/° C. As shown in FIG. 48, the maximum principal stress (Pa) is reduced as the lead member is changed to Cu, C1, K, C8, SI, the maximum principal stress (Pa) is reduced by approximately 38% in C8 (laminated metal lead of Cu/Invar/Cu) having a laminating ratio 1:8:1, as compared with Cu. When the thickness ratio is 1:8:1, the CTE is approximately 3 ppm/° C., and it is the same degree as the value of SiC. On the other hand, Kovar and Super Invar are not suitable for use as lead materials because of their high resistance.

The maximum principal stress generated in the Ag-fired bonding layer is defined as the maximum stress which acts on the principal plane of stress at a certain angle θ. For example, it is calculated by a simulation using a finite element method.

In the case of Cu having a large CTE being used for the metal lead, the CTE difference between the semiconductor power device (approximately 3 ppm/(° C.) in SiC) and the Cu (approximately 17 ppm/(° C.)) is 14 ppm/° C., distortion occurs in the bonding layer of the between due to the temperature change, and thereby a stress is generated. FIG. 48 is a diagram of plotting the results obtained by simulating the maximum principal stress generated in the Ag fired material when lead materials having various CTEs are bonded to the upper surface of SiC chip with the Ag fired material. As a range of the laminating ratio of Cu/Invar/Cu, it is not limited to 1:1:1 or 1:8:1, but can be applied to within a range of 1:0.5:1 to 1:20:1, for example. It may preferably be within a range of 1:3:1 to 1.10:1.

(PCT Lifetime of Ag-Fired Bonding Layer Depending on Lead Materials)

Figure 49:
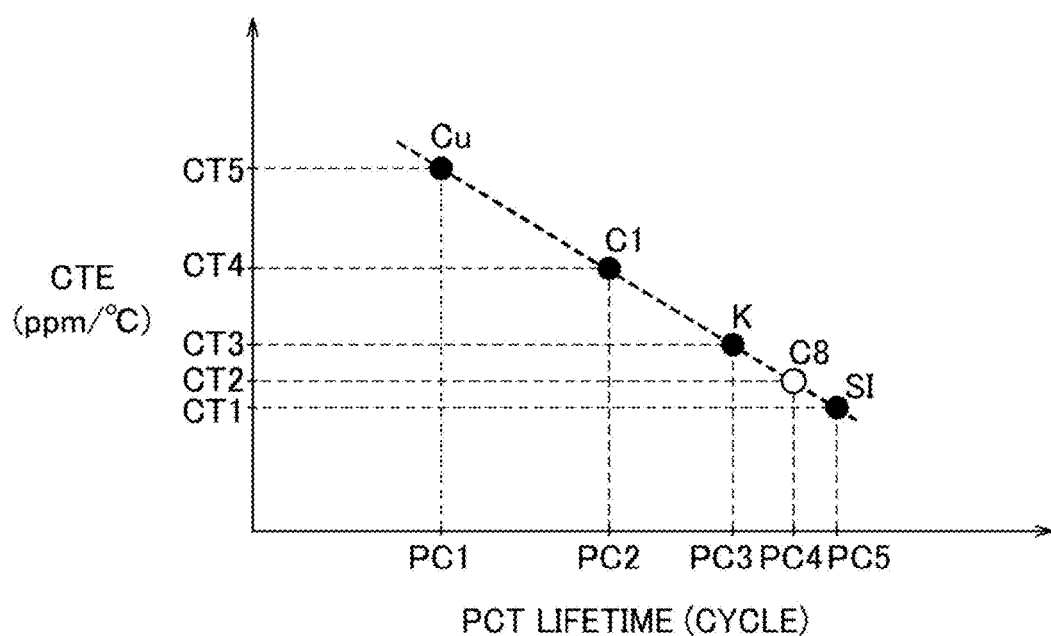
FIG. 49 shows a relationship between the CTE (ppm/° C.) and a power cycle test (PCT) lifetime using the lead member as the parameter, in the power semiconductor apparatus according to one embodiment to which the present technology is applied.

FIG. 49 shows a relationship between the CTE (ppm/° C.) and a power cycle test (PCT) lifetime using the lead member as a parameter, in the power semiconductor apparatus according to one embodiment to which the present technology is applied. As the lead member is changed to Cu, C1, K, C8, SI, CTE (ppm/° C.)) is decreased and therefore a power cycle test (PCT) life becomes longer. However, as mentioned above, Kovar and Super Invar are not suitable for use as lead materials because of their high resistance.

If the CTE of the lead material is large, the stress generated in the bonding layer is increased, and therefore the PCT lifetime is shortened. Conversely, if the CTE is reduced due to the metal lead applied to the power semiconductor apparatus according to one embodiment to which the present technology is applied, the stress generated in the bonding layer is decreased, and therefore the PCT lifetime becomes long.

(Low-Stress Wiring Structure by Using Layered Metal Lead)

Since a single metal having low CTE has the large amount of self-heating, it is not suitable for use as the lead material of the power semiconductor apparatus. As the lead material of the power semiconductor apparatus, a lead material having low CTE including a highly-conductive layer is preferable. Accordingly, the lead material of the laminated structure is applied in the power semiconductor apparatus according to one embodiment to which the present technology is applied.

Figure 50:
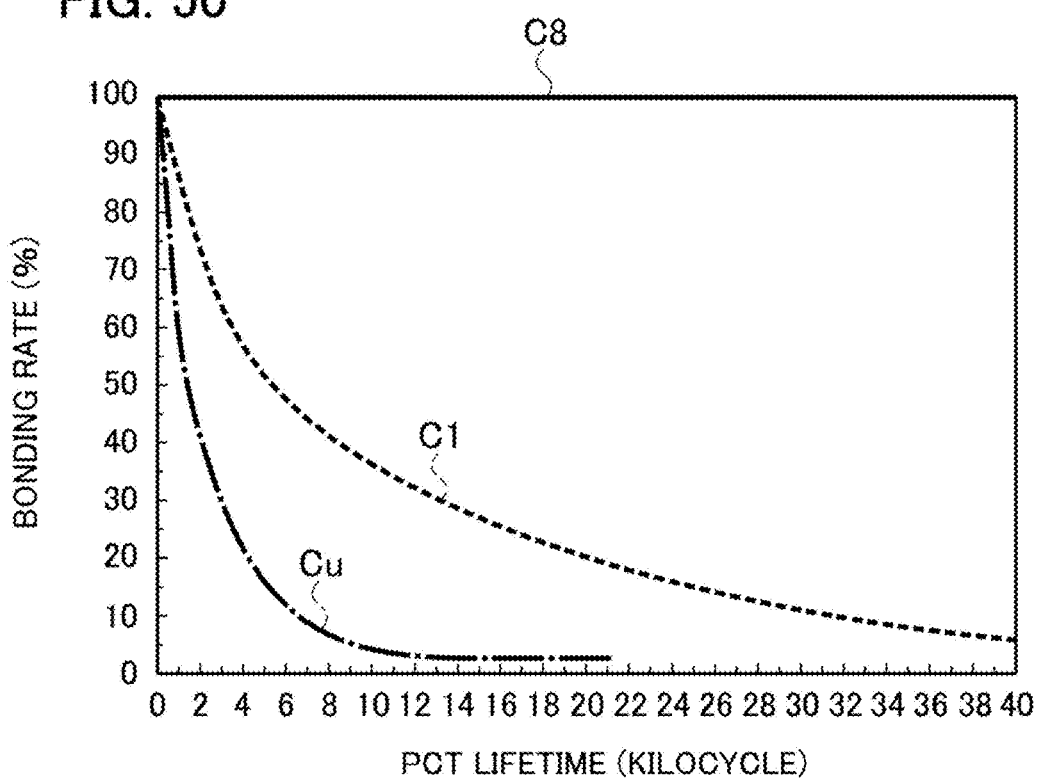
FIG. 50 shows a relationship between a bonding rate of fired Ag on chip (%) and the power cycle number (kilocycle) using the lead member as the parameter, in the power semiconductor apparatus according to one embodiment to which the present technology is applied.

FIG. 50 shows a relationship between a bonding rate of fired Ag on chip (%) and the power cycle number (kilocycle) using the lead member as the parameter, in the power semiconductor apparatus according to one embodiment to which the present technology is applied. As the lead member, Cu, C1, and C8 are applied. The bonding rate of fired Ag on chip is a bonding rate of the bonding layer on chip (Ag fired material) 416 for bonding between the source pad electrode 403 of the upper surface of the semiconductor power device 401 and the metal lead 419 (420).

Figure 51A:
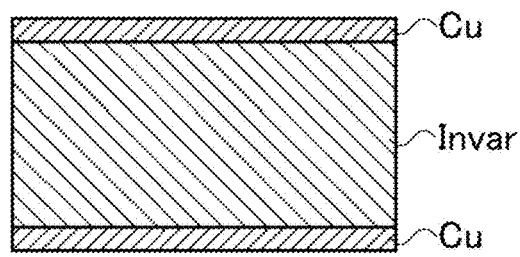
FIG. 51A shows an example where the ratio of the thickness of a Cu/Invar/Cu structure is 1:8:1, in a configuration example of the lead layer in the power semiconductor apparatus according to one embodiment to which the present technology is applied.
Figure 51B:
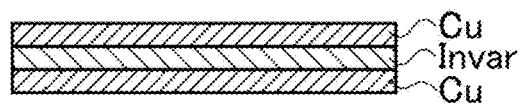
FIG. 51B shows an example where the ratio of the thickness of the Cu/Invar/Cu structure is 1:1:1, in a configuration example of the lead layer in the power semiconductor apparatus according to one embodiment to which the present technology is applied.
Figure 51C:
FIG. 51C an example of a single Cu layer, in a configuration example of the lead layer in the power semiconductor apparatus according to one embodiment to which the present technology is applied.

In a configuration example of the lead layer in the power semiconductor apparatus according to one embodiment, to which the present technology is applied, FIG. 51A shows an example (C8) where the ratio of the thickness of the Cu/invar/Cu structure is 1:8:1, FIG. 51B shows an example (C1) where the ratio of the thickness of the Cu/invar/Cu structure is 1:1:1, and FIG. 51C shows an example of a single Cu layer. The layer thickness of each lead layer is as follows: In C8, Cu: 0.084 mm/Invar: 0.672 mm/Cu: 0.084 mm; in C1, Cu: 0.084 mm/Invar: 0.084 mm/Cu: 0.084 mm; and in Cu, Cu: 0.25 mm. The synthetic CTE of C8 is 3 ppm/° C., the synthetic CTE of C1 is 10 ppm/° C., and the synthetic CTE of Cu is 17 ppm/° C.

Figure 52:
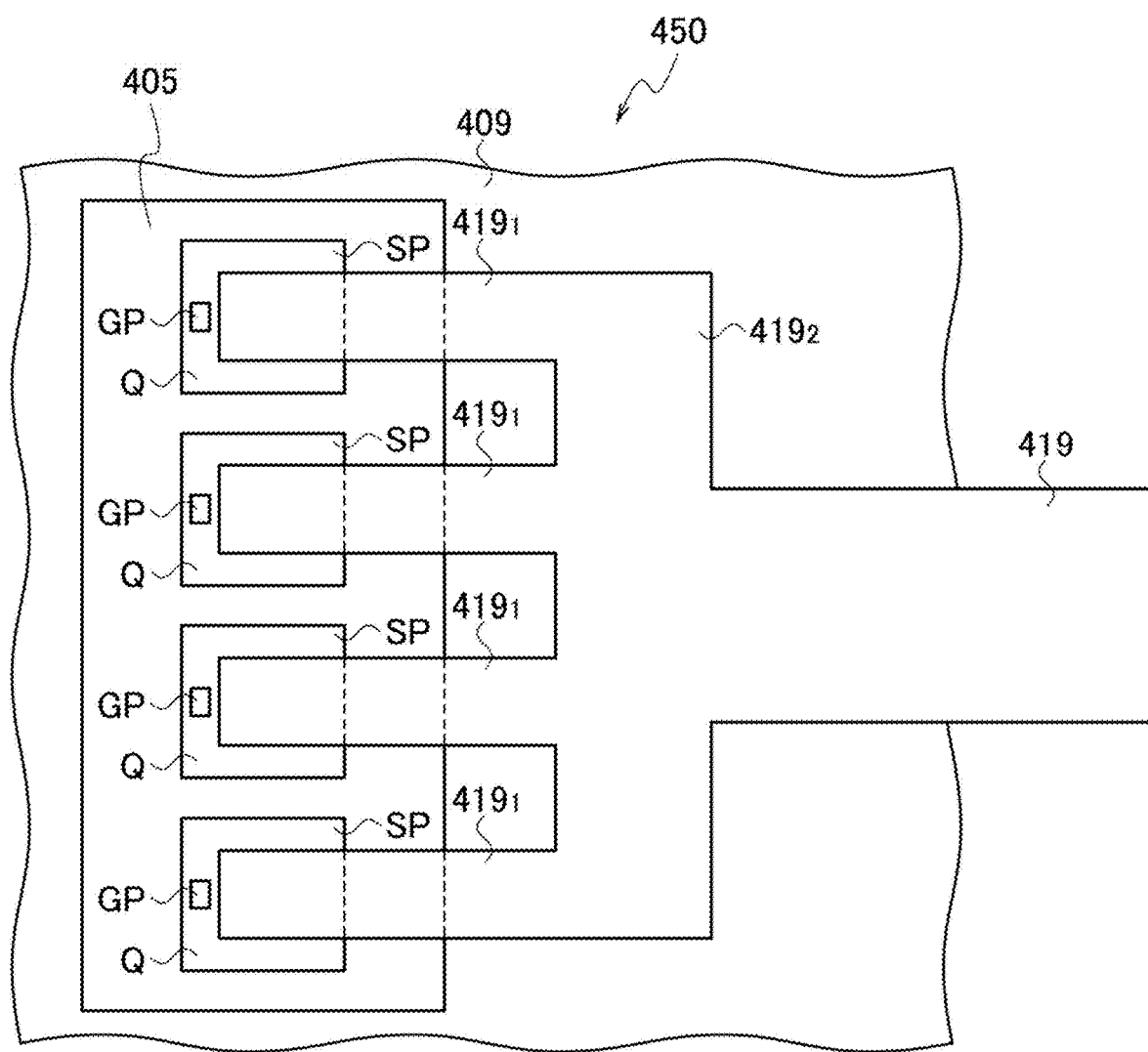
FIG. 52 shows an example of a schematic planar pattern configuration of SiC MOSFET of the 1-in-1 module including an interdigital metal lead, in the power semiconductor apparatus according to one embodiment to which the present technology is applied.

FIG. 52 shows an example of a schematic planar pattern configuration of SiC MOSFET of the 1-in-1 module including an interdigital metal lead, in the power semiconductor apparatus 450 according to one embodiment to which the present technology is applied.

In the power semiconductor apparatus 450 according to one embodiment to which the present technology is applied, as shown in FIG. 52, a plurality of chips (semiconductor power devices Q) are disposed on the ceramics substrate 409, and a metal lead 419 is disposed in an interdigital shape on source pad electrodes SP on the upper surface of the plurality of chips (semiconductor power devices Q) in planar view. Although illustration is omitted, the gate pad electrodes GP on the upper surface of the plurality of chips (semiconductor power devices Q) are electrically connected to the gate signal electrode pattern formed on the upper surface of the ceramics substrate 409 with the gate signal bonding wire. The 4 chips of SiC MOSFETs are mounted thereon, in the example of FIG. 52.

The metal lead 419 includes: a plurality of metal leads $419_1$ disposed on the upper surface of the plurality of chips (semiconductor power devices Q) in planar view; and a metal lead $419_2$ configured to bind the plurality of metal leads $419_1$.

The metal lead 419 ($419_1$, $419_2$) has a laminated structure similar to the laminated structure shown in FIGS. 40 and 41.

Moreover, the front side surface of the metal lead 419 ($419_1$, $419_2$) may have a flat surface parallel to the ceramics substrate 409. Alternatively, the metal lead 419 ($419_1$, $419_2$) may be formed in a bending process shape. Other configurations are the same as those shown in FIGS. 40 and 41.

Figure 53:
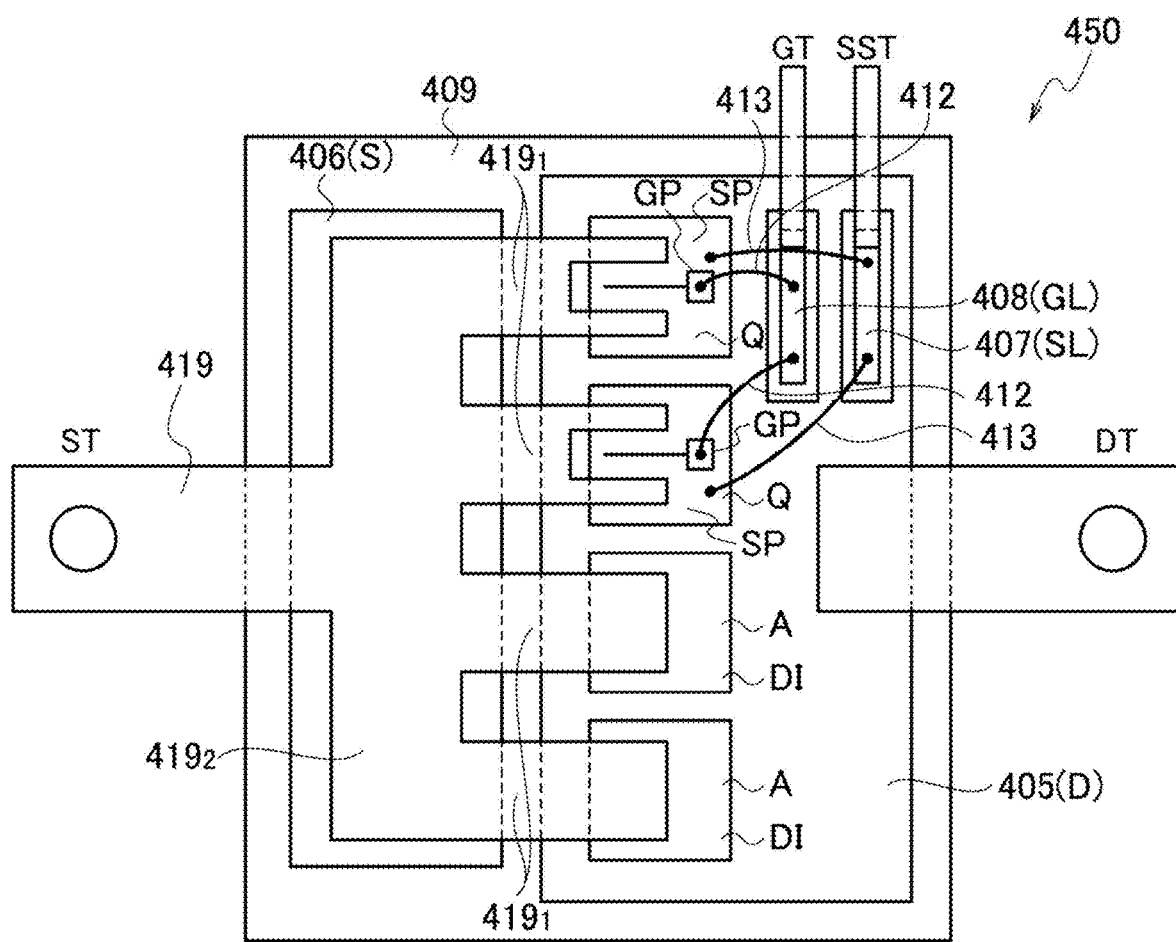
FIG. 53 shows another example of a schematic planar pattern configuration of SiC MOSFET of the 1-in-1 module including an interdigital metal lead, in the power semiconductor apparatus according to one embodiment to which the present technology is applied.

FIG. 53 shows another example of a schematic planar pattern configuration of SiC MOSFET of the 1-in-1 module including an interdigital metal lead, in the power semiconductor apparatus 450 according to one embodiment to which the present technology is applied.

As shown in FIG. 53, the power semiconductor apparatus 450 according to one embodiment to which the present technology is applied includes: a substrate 409; a drain electrode pattern 405 (D), a source electrode pattern 406 (S), a source signal electrode pattern 407 (SL), and a gate signal electrode pattern 408 (GL) which are disposed on the substrate 409; a bonding layer (404) under chip disposed on the drain electrode pattern 405 (D); a plurality of semiconductor power devices Q which are disposed on the bonding layer (404) under chip, and includes a source pad electrode SP and a gate pad electrode GP at a front surface side thereof; a bonding layer (416) on chip disposed on the source pad electrode SP; a bonding layer (417) on source electrode pattern disposed on the source electrode pattern 406 (S); and a metal lead 419 ($419_1$, $419_2$) bonded to the bonding layer (417) on source electrode pattern and the bonding layer (416) on chip, wherein the metal lead 419 ($419_1$, $419_2$) has a metallic laminated structure.

Moreover, as shown in FIG. 53, the power semiconductor apparatus 450 includes: a bonding layer (404: not illustrated) under chip disposed on the drain electrode pattern 405 (D); and a plurality of diode DI which is disposed on the bonding layer (404) under chip, and has a cathode electrode K on the back surface side thereof and has an anode electrode A at the front surface side thereof.

Moreover, as shown in FIG. 53, the power semiconductor apparatus 450 includes: a source signal bonding wire 412 connected between the source pad electrode SP and the source signal electrode pattern 407 (SL); and a gate signal bonding wire 413 connected between the gate pad electrode GP and the gate signal electrode pattern 408 (GL).

In the power semiconductor apparatus 450 according to one embodiment to which the present technology is applied, as shown in FIG. 53, a plurality of semiconductor power devices Q (chips) and a plurality of diodes DI (chips) are disposed on the ceramics substrate 409, and the metal lead 419 is disposed in an interdigital shape on source pad electrodes SP on the upper surface of the plurality of semiconductor power devices Q (chips) and the plurality of diodes DI (chips) in planar view.

The metal lead 419 includes: a plurality of metal leads $419_1$ disposed on the upper surface of the plurality of semiconductor power devices Q (chips) and the plurality of diodes DI (chips) in planar view; and a metal lead $419_2$ configured to bind the plurality of metal leads $419_1$. The metal lead $419_1$ disposed on the upper surface of the semiconductor power device Q has a shape separated into two forks with respect to the source electrode pad SP.

The metal lead 419 ($419_1$, $419_2$) has a laminated structure similar to the laminated structure shown in FIGS. 40 and 41.

Moreover, the front side surface of the metal lead 419 ($419_1$, $419_2$) may have a flat surface parallel to the ceramics substrate 409. Alternatively, the metal lead 419 ($419_1$, $419_2$) may be formed in a bending process shape. Other configurations are the same as those shown in FIGS. 40 and 41.

Figure 54:
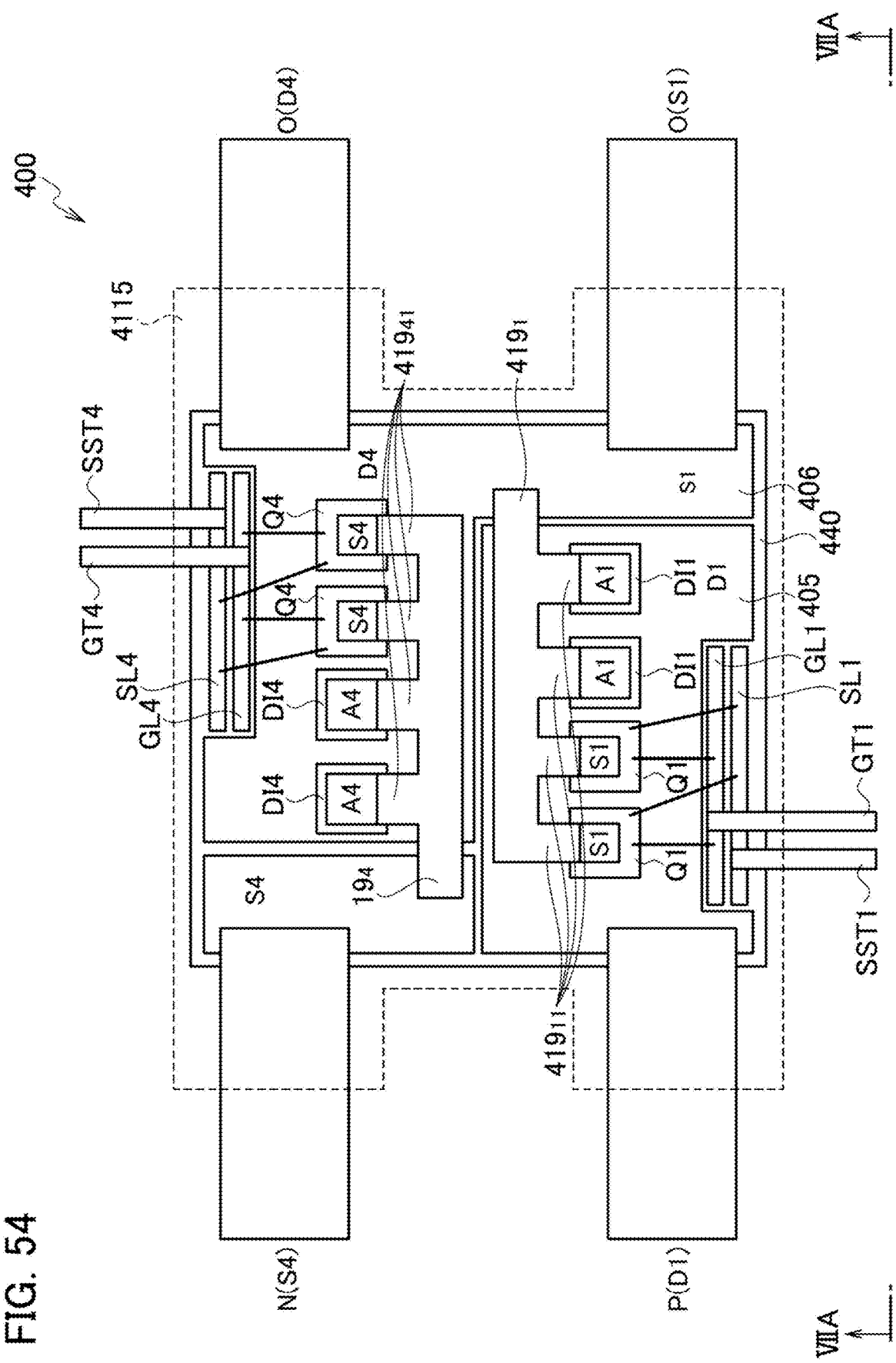
FIG. 54 is a schematic planar pattern configuration diagram before forming a mold resin layer in a 2-in-1 module, in the power semiconductor apparatus according to one embodiment to which the present technology is applied.
Figure 55:
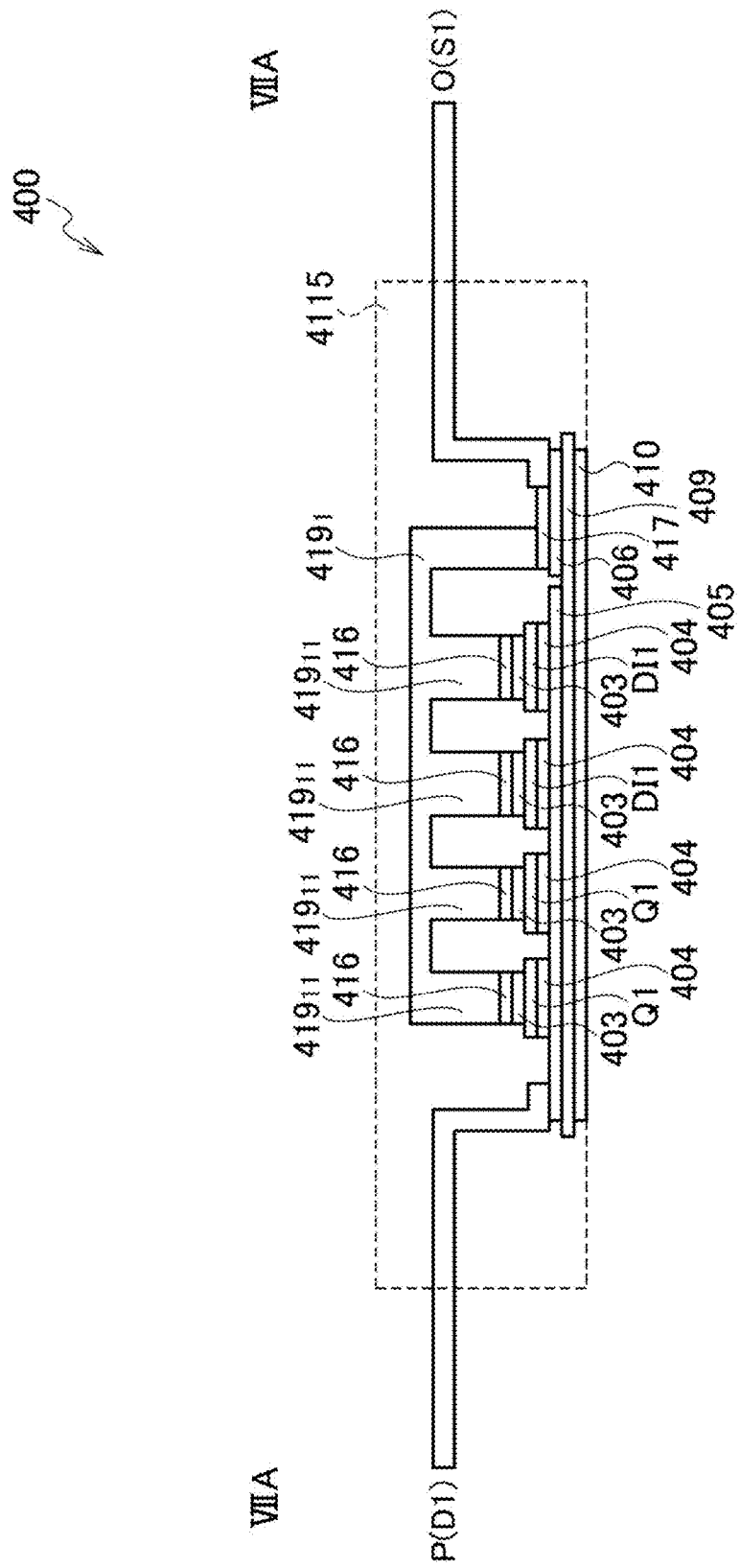
FIG. 55 is a side view diagram observed from the direction VIIA-VIIA in FIG. 54.
Figure 56:
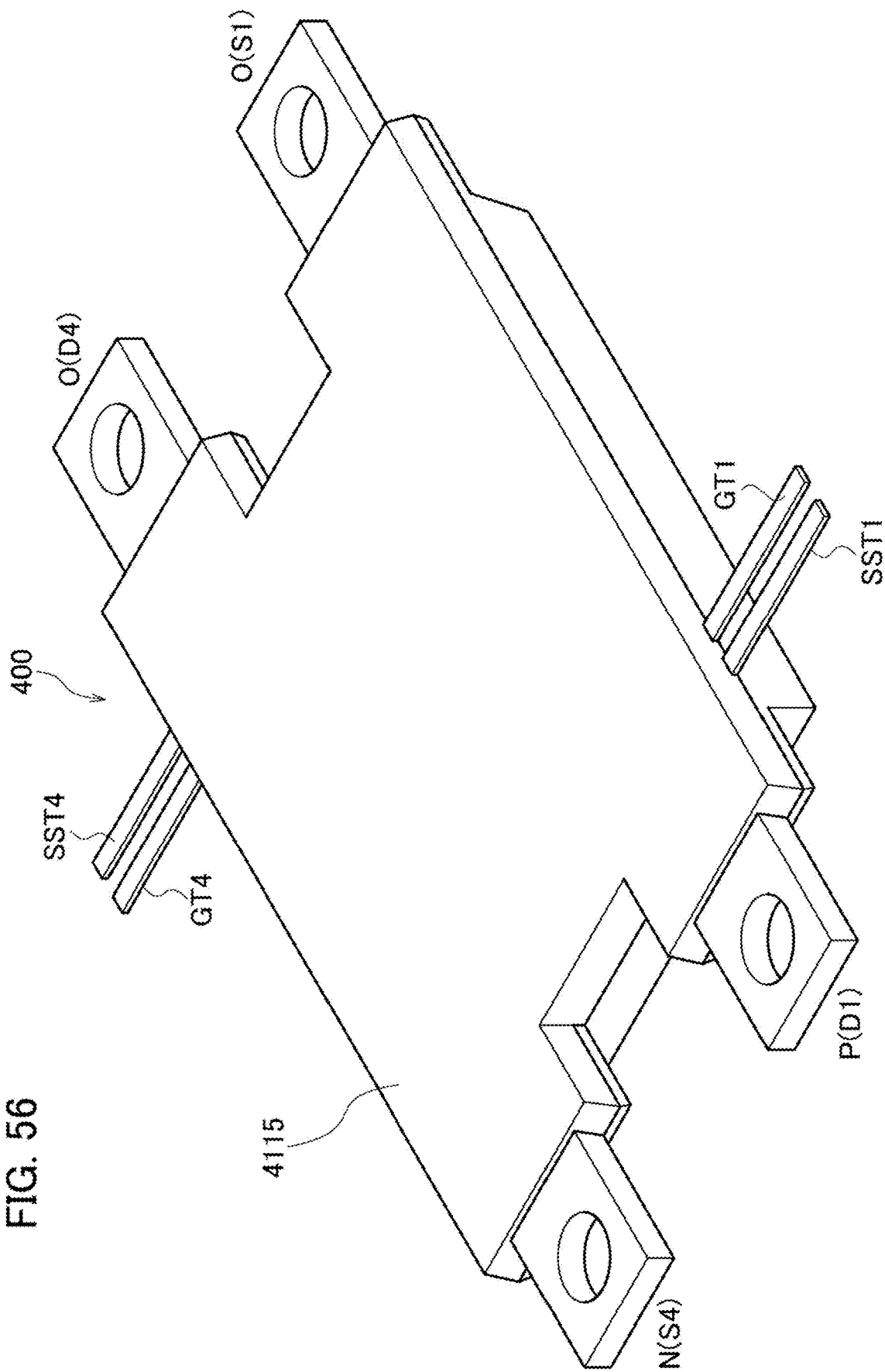
FIG. 56 is a schematic bird's-eye view configuration diagram after forming the mold resin layer, in the power semiconductor apparatus according to one embodiment to which the present technology is applied.

In the power semiconductor apparatus 400 according to one embodiment to which the present technology, FIG. 54 shows a schematic planar pattern configuration before forming a mold resin layer 4115, and FIG. 56 shows a schematic bird's-eye view configuration after forming the mold resin layer 4115. The power semiconductor apparatus may be transfer-molded with the mold resin layer 4115. Moreover, FIG. 55 shows a side view diagram near the chip, observed from the direction VIIA-VIIA in FIG. 54.

As shown in FIG. 54, 2 chips of the MOSFETs Q1, Q4 respectively are disposed in parallel, and 2 chips of diodes DI1, DI4 respectively are also disposed in parallel. The diodes DI1, DI4 are respectively connected reversely in parallel between D1 and S1 and between D4 and S4 of the MOSFETs Q1, Q4. In addition, the diodes DI1, DI4 may be alternately disposed with respect to each other so as to be near the MOSFETs Q1, Q4.

As shown in FIGS. 54 and 56, the power semiconductor apparatus 500 according to one embodiment to which the present technology is applied includes: a positive-side power terminal P and a negative-side power terminal N disposed at a first side of the ceramic substrate 409 covered with the mold resin layer 4115; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In the present embodiment, as shown in FIG. 54, the gate terminal GT1 and the source sense terminal SST1 are connected to the signal wiring pattern GL1 for gate and the signal wiring pattern SL1 for source in the MOSFET Q1; and the gate terminal GT4 and the source sense terminal SST4 are connected to the signal wiring pattern GL4 for gate and the signal wiring pattern SL4 for source in the MOSFET Q4.

A gate signal bonding wire and a source signal bonding wire are respectively connected toward the gate signal electrode patterns GL1, GL4 and the source signal electrode patterns SL1, SL4 from MOSFETs Q1, Q4. Moreover, gate terminals GT1 and GT4 and source sense terminals SST1 and SST4 for external extraction are connected to the gate signal electrode patterns GL1 and GL4 and the source sense signal electrode patterns SL1 and SL4 by soldering etc.

The positive-side power terminal P and the negative-side power terminal N, and the gate terminals GT1, GT4 and the source sense terminals SST1, SST4 for external extraction can be formed of Cu, for example.

The ceramic substrate 409 may be formed of $Al_2O_3$, AlN, SiN, AlSiC, or SiC of which at least the surface is insulation, for example.

As shown in FIG. 45, the power semiconductor apparatus 400 according to one embodiment to which the present technology includes: a drain electrode pattern 405 (D1); a semiconductor power devices Q1, DI1 disposed on the drain electrode pattern 405 (D1); a plurality of metal leads $419_{11}$ electrically connected to the semiconductor power devices Q1, DI1; and a metal lead $419_1$ configured to bind the plurality of metal leads $419_{11}$. The metal leads $419_{11}$, $419_1$ disclosed herein have an interdigital shape in planar view. Moreover, as shown in FIG. 54, the power semiconductor apparatus 400 includes a drain electrode pattern D4, semiconductor power devices Q4, D14 disposed on the drain electrode pattern D4, a plurality of metal leads $419_{41}$ respectively electrically connected to the semiconductor power devices Q4, D14, and a metal lead $419_4$ configured to bind the plurality of metal leads $419_{41}$. The metal leads $419_{41}$, $419_4$ disclosed herein have an interdigital shape in planar view. The drain electrode pattern D4 is electrically common with the source electrode pattern 406 (S1).

The metal leads $419_{11}$, $419_1$, $419_{41}$, $419_4$ has a laminated lead structure. A structure where an upper surface thereof is planarized may be provided as the laminated lead structure. Alternatively, it may be subjected to a bending process, as usage.

Figure 57:
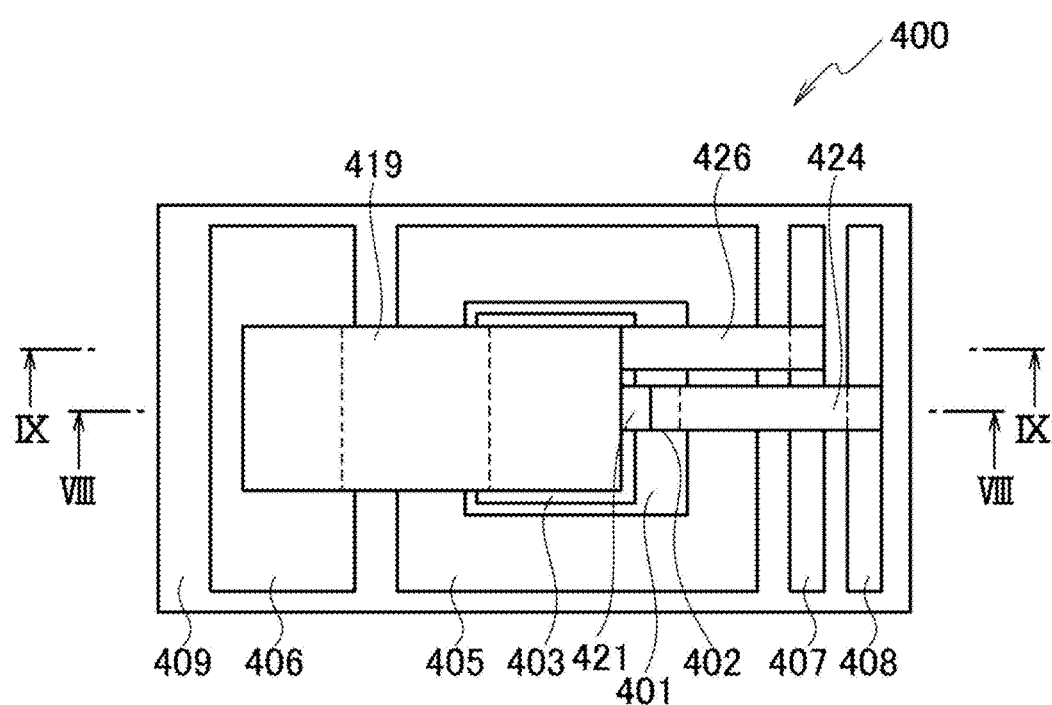
FIG. 57 is a schematic planar pattern configuration diagram showing a principal portion of the power semiconductor apparatus according to one embodiment to which the present technology is applied.

FIG. 57 is a schematic planar pattern configuration of a principal portion of the power semiconductor apparatus 400 according to one embodiment to which the present technology is applied. Moreover, FIG. 58 shows a schematic cross-sectional structure taken in the line VIII-VIII of FIG. 57, and FIG. 59 shows a schematic cross-sectional structure taken in the line IX-IX of FIG. 57.

Figure 58:
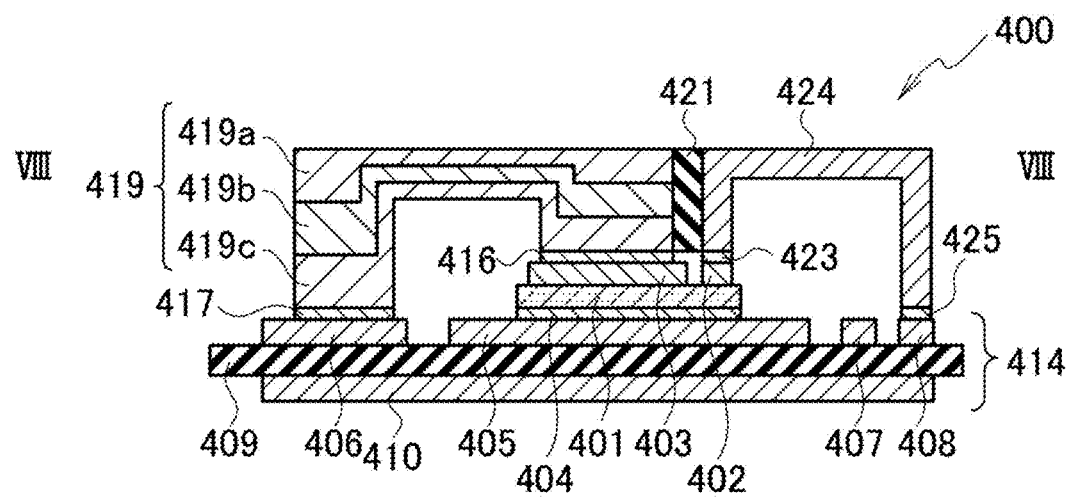
FIG. 58 is a schematic cross-sectional structure diagram taken in the line VIII-VIII of FIG. 57.
Figure 59:
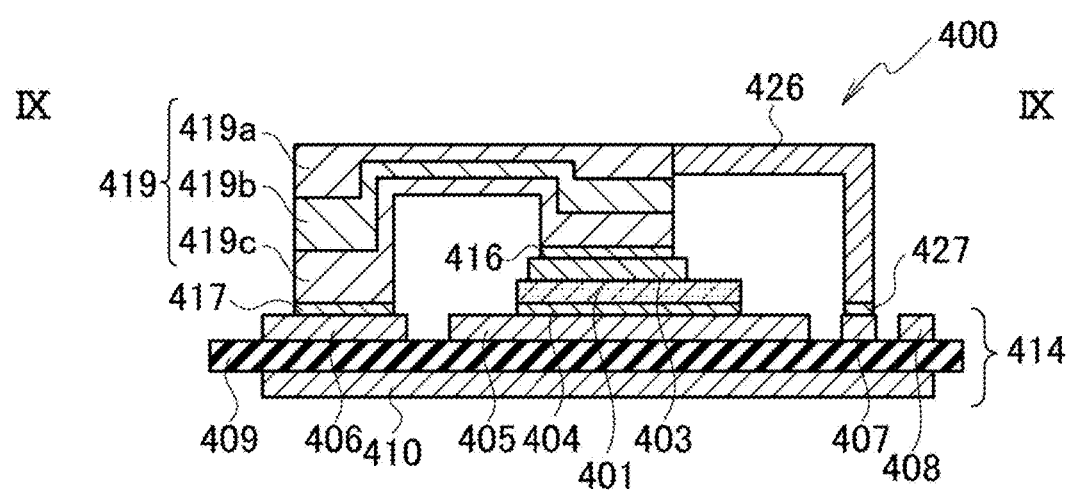
FIG. 59 is a schematic cross-sectional structure diagram taken in the line IX-IX of FIG. 57.

As shown in FIGS. 57 to 59, the power semiconductor apparatus 400 according to one embodiment to which the present technology includes: a source signal metal lead (third metal lead) 426 which is electrically connected to the metal lead 419 and is disposed on the source signal electrode pattern 407; and a gate metal lead (second metal lead) 424 which is electrically connected to the gate pad electrode 402 and is disposed on the gate signal electrode pattern 408.

The gate metal lead 424 is bonded to the gate signal electrode pattern 408 via a soldering layer 425 under gate metal lead. The source signal metal lead 426 is bonded to the source signal electrode pattern 407 via a soldering layer 427 under source signal metal lead.

An assembling connection between the metal lead 419 and the gate metal lead 424 may be performed via the insulating portion 421. In this case, the insulating portion 421 includes an epoxy based resin or a silicone based resin.

Moreover, the gate metal lead (second metal lead) 424 and the source signal metal lead (third metal lead) 426 may include any one of Cu, Al, or CuMo.

In addition, the source signal metal lead 426 may include the same material as that of the metal lead 419. Other configurations and materials are the same as those shown in FIGS. 40 and 41.

In the power semiconductor apparatus 400 according to one embodiment to which the present technology is applied, the source signal bonding wire and the gate signal bonding wire can be eliminated by adopting such a metal lead structure (420, 424, 426).

Figure 60:
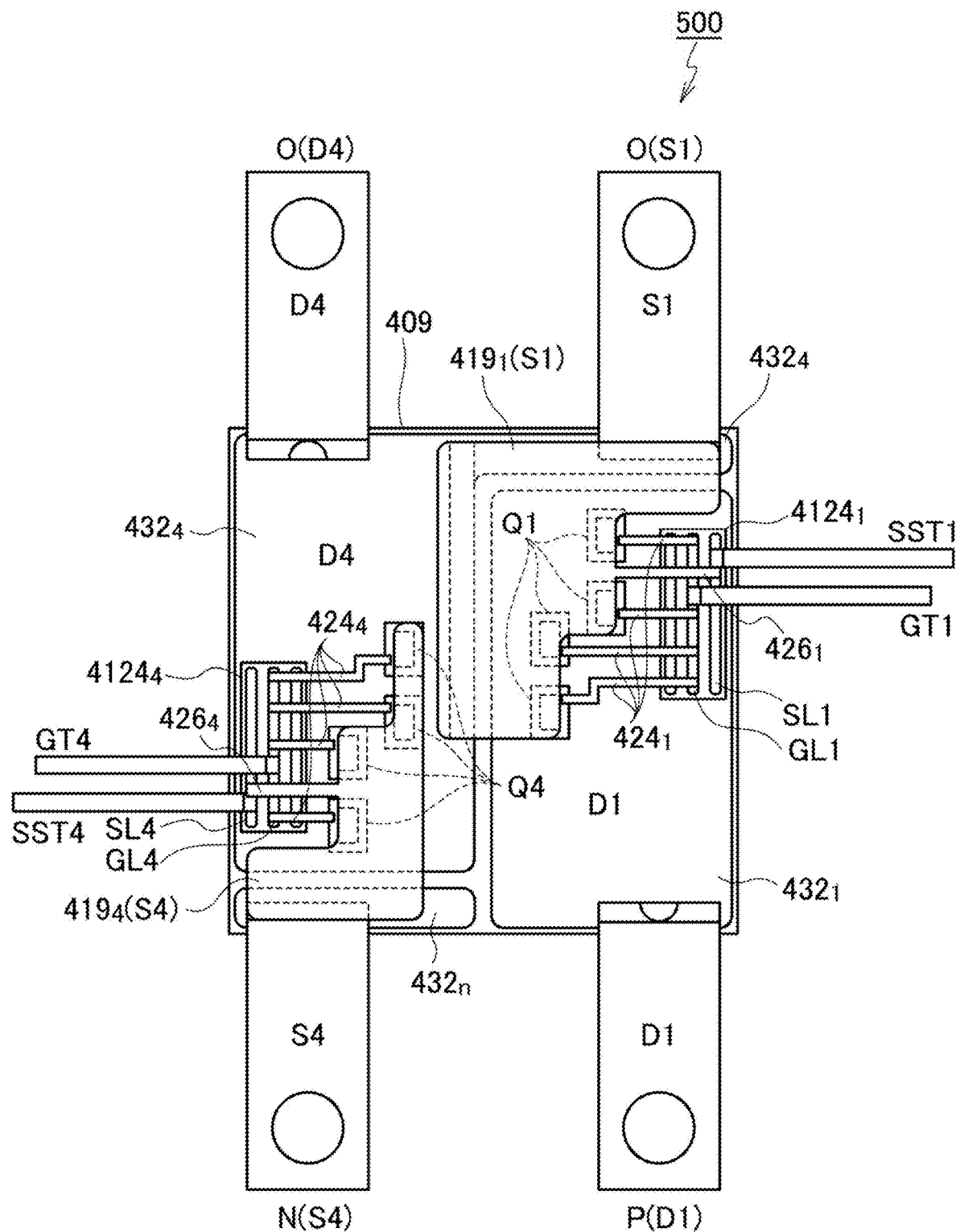
FIG. 60 is a schematic planar pattern configuration diagram before forming a resin layer in a 2-in-1 module, in the power semiconductor apparatus according to one embodiment to which the present technology is applied.

FIG. 60 shows a schematic planar pattern configuration before forming a resin layer 4115 in a 2-in-1 module, which is the power semiconductor apparatus 500 according to one embodiment to which the present technology is applied. Moreover, a schematic bird's-eye view configuration after forming the resin layer 4115 is similarly shown as FIG. 56, if disposition of the gate terminal GT1 and the source sense terminal SST1, and the gate terminal GT4 and the source sense terminal SST4 is changed. Moreover, in the power semiconductor apparatus according to one embodiment to which the present technology is applied, a circuit configuration of the 2-in-1 module corresponding to FIG. 60 to which an SiC MOSFET is applied as a semiconductor power device is similarly shown as the configuration of FIG. 33. However, the diodes DI1 and DI4 are omitted in FIG. 60.

The power semiconductor apparatus 500 according to one embodiment to which the present technology is applied includes a configuration of a module with the built-in half-bridge in which two MOSFETs Q1, Q4 are built in one module.

FIG. 60 shows an example of 4-chip MOSFETs Q1 and 4-chip MOSFETs Q4 respectively disposed in parallel to one another.

Similar to FIG. 56, the power semiconductor apparatus 500 according to one embodiment to which the present technology is applied includes: a positive-side power terminal P and a negative-side power terminal N disposed at a first side of the ceramic substrate 409 covered with the resin layer 4115; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In this embodiment, as shown in FIG. 60, the gate terminal GT1 and the source sense terminal SST1 are connected to the gate signal electrode pattern GL1 and the source signal electrode pattern SL1 in the MOSFET Q1; and the gate terminal GT4 and the source sense terminal SST4 are connected to the gate signal electrode pattern GL4 and the source signal electrode pattern SL4 in the MOSFET Q4.

As shown in FIG. 60, from MOSFETs Q1, Q4, the gate metal leads $424_1$, $424_4$ and the source signal metal leads $426_1$, $426_4$ are respectively connected toward the gate signal electrode patterns GL1, GL4 and the source sense signal electrode patterns SL1, SL4 which are respectively disposed on the signal substrate $4124_1$, $4124_4$. Moreover, gate terminals GT1, GT4 and SST1, SST4 for external extraction are connected to the gate signal electrode patterns GL1, GL4 and the source sense signal electrode patterns SL1, SL4 by soldering etc.

As shown in FIG. 60, the signal substrates $4124_1$, $4124_4$ are connected by soldering etc. on the ceramics substrate 409.

In the example shown in FIG. 60, the sources S1, S4 in 4 chips of the MOSFETs Q1, Q4 disposed in parallel are respectively commonly connected to the source metal leads $419_1$ (S1), $419_4$ (S4).

The positive-side power terminal P and the negative-side power terminal N, and the gate terminals GT1, GT4 and SST1, SST4 for external extraction can be formed of Cu, for example.

The signal substrates $4124_1$ and $4124_4$ can be formed by including a ceramics substrate. The ceramic substrate may be formed by including $Al_2O_3$, AlN, SiN, AlSiC, or SiC of which at least the surface is insulation, for example.

Main wiring conductors (electrode patterns) $432_1$, $432_4$, $432_n$ can be formed by including Cu, Al, etc., for example. The source metal leads $419_1$ (S1), $419_4$ (S4) respectively connected to the sources S1, S4 of MOSFETs Q1, Q4 has a laminated structure including the metal layers $419a$, $419b$, $419c$, in the same manner as the configuration of FIGS. 40 and 41.

The gate metal leads $424_1$, $424_4$ and the source signal metal leads $426_1$, $426_4$ can be formed by including Al, AlCu, etc., for example.

In the semiconductor apparatus 500 according to one embodiment to which the present technology is applied, 4 chips of the MOSFETs Q1 are disposed on the main wiring conductor (electrode pattern) $432_1$ via the bonding layer 404 under chip. Similarly, 4 chips of the MOSFETs Q4 are disposed on the main wiring conductor (electrode pattern) $432_4$ via the bonding layer 404 under chip.

More particularly, as shown in FIG. 60, a principal portion of the semiconductor apparatus 500 according to one embodiment to which the present technology is applied includes: a ceramics substrate 409; a source electrode pattern $432_n$, drain electrode patterns $432_1$, $432_4$, source signal electrode patterns SL1, SL4, and gate signal electrode patterns GL1, GL4 respectively disposed on the ceramics substrate 409; semiconductor devices Q1, Q4 respectively disposed on the drain electrode patterns $432_1$, $432_4$, the semiconductor devices Q1, Q4 respectively including a source pad electrode (403) and a gate pad electrode (402) at a front surface side; source metal leads $419_1$ (S1), $419_4$ (S4) respectively bonded to the source electrode pattern $432_n$, the drain electrode pattern $432_4$, and the source pad electrode (403); and gate metal leads $424_1$, $424_4$ bonded to the gate pad electrode (402). Since the drain electrode pattern $432_4$ serves also as a source electrode of the semiconductor power device Q1 while the drain electrode pattern $432_4$ is a drain electrode of the semiconductor power device Q4, the drain electrode pattern $432_4$ is connected to the source metal leads $419_1$ (S1).

As shown in FIG. 60, the semiconductor apparatus 500 according to one embodiment to which the present technology is applied includes: source signal metal leads $426_1$, $426_4$ which are electrically connected to the source metal leads $419_1$ (Si), $419_4$ (S4) and are disposed on the source signal electrode patterns SL1, SL4; and gate metal leads $424_1$, $424_4$ which are electrically connected to the gate pad electrode and are disposed on the gate signal electrode patterns GL1, GL4. An assembling connection between the gate metal leads $424_1$, $424_4$ and the source metal leads $419_1$ (S1), $419_4$ (S4) is performed via the insulating portion (421). In this drawing, the insulating portion (421) is not illustrated.

The gate metal leads $424_1$, $424_4$ are respectively bonded to the gate signal electrode patterns GL1, GL4 via the soldering layer (425) under gate metal lead.

The source signal metal leads $426_1$, $426_4$ are respectively bonded to the source signal electrode patterns SL1, SL4 via the soldering layer (427) under source signal metal lead.

In addition, the source signal metal leads $426_1$, $426_4$ may include the same material as the source metal leads $419_1$ (S1), $419_4$ (S4). Other configurations and materials are the same as those shown in FIGS. 40 and 41.

In the power semiconductor apparatus 500 according to one embodiment to which the present technology is applied, the source signal bonding wire and the gate signal bonding wire can be eliminated by adopting such a metal lead structure (($419_1$, $419_4$), ($424_1$, $424_4$), ($426_1$, $426_4$)).

According to one embodiment to which the present technology is applied, there can be provided the reliable power semiconductor apparatus, wherein the wiring resistance is reduced and the stress produced in the bonding layer on the chip is also reduced, and the degradation speed of the bonded portion due to the stress by the repetition of cooling and heating such as a power cycle can be delayed.

According to one embodiment to which the present technology is applied, there can be provided the power semiconductor apparatus capable of improving the power cycle capability.

According to one embodiment to which the present technology is applied, there can be provided the power semiconductor apparatus capable of improving reliability thereof by reducing the thermal stress to the bonding layer between the semiconductor power device and the metal lead positioned on the upper surface thereof, and reducing the resistance of the metal lead.

Figure 61A:
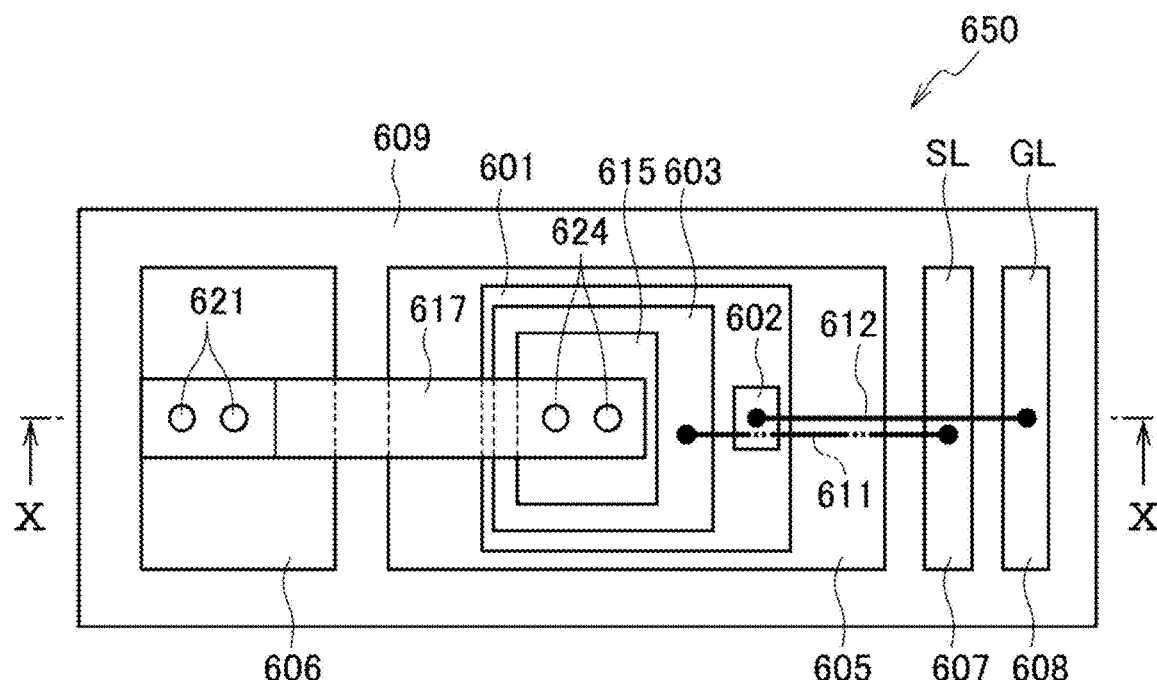
FIG. 61A is a schematic planar pattern configuration diagram before sealing the power semiconductor apparatus according to one embodiment to which the present technology is applied.
Figure 61B:
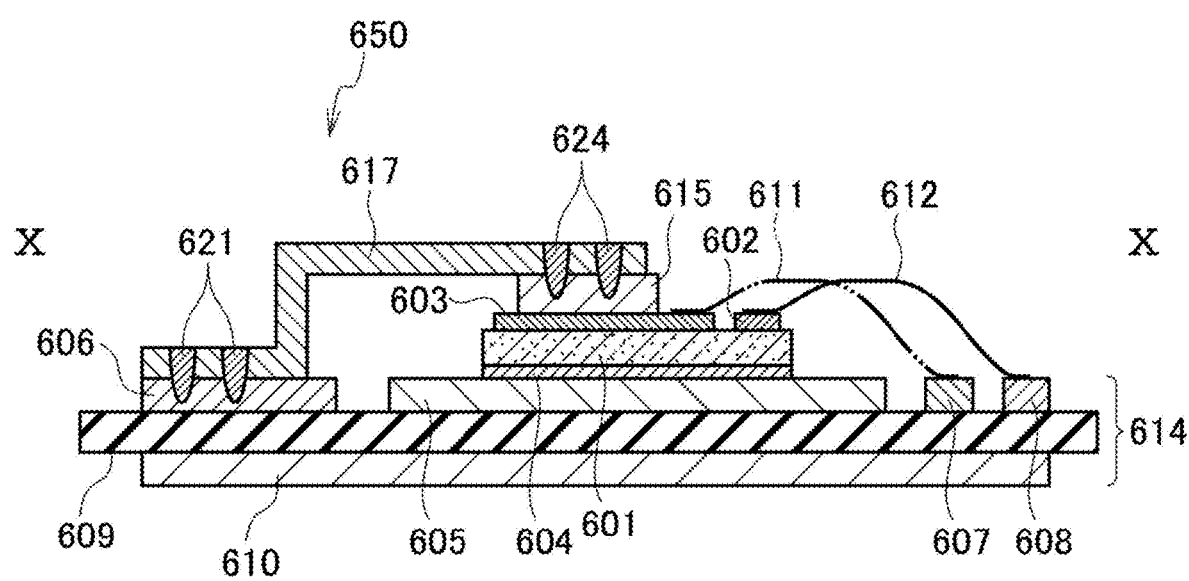
FIG. 61B is a schematic cross-sectional structure diagram taken in the line X-X of FIG. 61A.

FIG. 61 is a schematic planar pattern configuration of a principal portion of the power semiconductor apparatus 650 according to one embodiment to which the present technology is applied, and FIG. 61B shows a schematic cross-sectional structure taken in the line X-X of FIG. 61A. The power semiconductor apparatus 650 according to one embodiment to which the present technology is applied corresponds to a schematic configuration example before sealing the 1-in-1 module on which SiC MOSFET is mounted. In FIGS. 61 to 71, the illustration of a resin layer and metal leads exposed from the resin layer is omitted.

As shown in FIGS. 61A and 61B, the power semiconductor apparatus 650 according to one embodiment to which the present technology is applied includes: a semiconductor power device 1; and a bonding layer 615 on chip which is disposed on the source pad electrode 3 on an upper surface of the semiconductor power device 1 and connects a source pad electrode 3 and a (inside) metal lead 617 mentioned below. The bonding layer 615 on chip functions also as a conductive protective layer (615) on chip for protecting the source pad electrode 3 from a laser light. A metal lead 617 to be bonded to the bonding layer 615 on chip on an upper surface of the bonding layer 615 on chip. Welding by a laser light bonds between the metal lead 617 and the bonding layer 615 on chip. The laser light welding may be spot welding.

Between the metal lead 617 and the bonding layer 615 on chip, a melted resolidified portion 624 formed by resolidifying a metal cooled obtained by which a metal of the metal lead 617 and the metal of the bonding layer 615 on chip are melted to be mixed by welding of the laser light is provided, and the metal lead 617 is electrically connected to the source pad electrode 3 via the melted resolidified portion 624.

Since the metal lead 617 is irradiated with the laser light from the top surface direction of the semiconductor power device 1 in planar view, as a cross-sectional shape of the bonding layer 615 on chip, a plan view area of a melted portion is the maximum in the metal lead 617 and is gradually reduced so as to disappears at an intermediate depth of the bonding layer 615 on chip.

The metal lead 617 may include any one of copper, a copper alloy, aluminum, an aluminum alloy, a Fe—Ni based alloy, or a Fe—Ni—Co based alloy. In the melted resolidified portion 624, an alloy between a metal of the metal lead 617 and a metal of the bonding layer 615 on chip may be partly formed. A planar view center portion of the melted resolidified portion 624 may not be flush with the upper surface of the metal lead 617, as a result of the melted resolidifying.

As shown in FIGS. 61A and 61B, the power semiconductor apparatus 650 according to one embodiment to which the present technology is applied includes an insulating substrate 614, and a bonding layer 604 under chip disposed on the insulating substrate 614, wherein the semiconductor power device 1 may be disposed on the insulating substrate 614 via the bonding layer 604 under chip.

In this case, the insulating substrate 614 can also be composed of an insulating substrate (circuit substrate), such as a circuit substrate which is composed of a contacted body of metal/ceramics/metal, e.g., a Direct Bonding Copper (DBC) substrate, a Direct Brazed Aluminum (DBA) substrate, or an Active Metal Brazed (Active Metal Bond) (AMB) substrate. The metallic materials of the back electrode pattern 610 are fundamentally the same as the metallic materials of the surface electrode pattern (605, 606, 607, 608) of the insulating substrate 614. For example, a $Cu/Al_2O_3/Cu$ structure can be applied to the DBC substrate, an Al/AlN/Al structure can be applied to the DBA substrate, and a $Cu/Si_3N_4/Cu$ structure can be applied to the AMB substrate. However, a function of the surface electrode pattern and a function of the back electrode pattern are slightly different from each other. The surface electrode pattern has a function of bonding chips, electrodes, etc., a function as a positive (P) side power electrode, a negative (N) side power electrode and an output (Out) side power electrode respectively formed by cutting the pattern thereof, etc. The back electrode pattern has a function of conducting heat below by being bonded to a cooling apparatus or bonded to a heat spreader.

As shown in FIGS. 61A and 61B, the power semiconductor apparatus 650 according to one embodiment to which the present technology is applied includes: a substrate 609; a drain electrode pattern 605, a source electrode pattern 606, a source signal electrode pattern 607, and a gate signal electrode pattern 608 which are disposed on the substrate 609; a bonding layer 604 under chip disposed on the drain electrode pattern 605; a semiconductor power device 601 disposed on the bonding layer 604 under chip and having a source pad electrode 603 and a gate pad electrode 602 on a front surface side thereof; a conductive bonding layer 615 on chip which is disposed on the source pad electrode 603 and protects the source pad electrode 603; and a metal lead 617 bonded to the source electrode pattern 606 and the bonding layer 615 on chip. Welding by a laser light bonds between the metal lead 617 and the bonding layer 615 on chip and between the metal lead 617 and the source electrode pattern 606.

Moreover, the power semiconductor apparatus 650 may include a source signal bonding wire 611 connected between the source pad electrode 603 and the source signal electrode pattern 607, and a gate signal bonding wire 612 connected between the gate pad electrode 602 and the gate signal electrode pattern 608 (GL).

Between the metal lead 617 and the bonding layer 615 on chip, a melted resolidified portion 624 formed by welding of a laser light is provided, and the metal lead 617 is electrically connected to the source pad electrode 603 via the melted resolidified portion 624. Moreover, between the metal lead 617 and the source electrode pattern 606, a melted resolidified portion 621 formed by welding of a laser light is provided, and the metal lead 617 is electrically connected to the source electrode pattern 606 via the second melted resolidified portion 621.

Moreover, the bonding layer 615 on chip and the bonding layer 604 under chip include a metallic particle bonding layer, for example. In this case, the metallic particle bonding layer is formed by annealing a paste layer containing conductive particles, or sheet-shaped fired material. The conductive particles of the paste layer is metallic fine particles, and the paste for forming the paste layer is formed by dispersing metallic fine particles in a predetermined solvent at a required concentration. On the other hand, the perimeter of Ag or Cu particles are covered with an oxide film, and the sheet-shaped fired material is sintered by pressure firing while reducing. The metallic fine particle may be any one of a silver particle, a copper particle, a gold particle, a nickel particle, or the like. Accordingly, the bonding layer 615 on chip and the bonding layer 604 under chip include any one of an Ag fired layer, a Cu fired layer, an Au fired layer, a Ni fired layers, or a mixture thereof.

The predetermined solvent may be any one of terpineol, tetradecane, terpineol, kerosene, or a composition mixture thereof. Moreover, as the composition mixture, a combination of at least terpineol, tetradecane, terpineol, or kerosene can be applied. Moreover, a mixture of α-terpineol, β-terpineol, or γ-terpineol may be applied as terpineol.

For example, an Ag particulate paste as a kind of the paste containing the conductive particles is obtained by diffusing Ag particulates having a particle diameter of approximately 1 μm to approximately 50 μm into a predetermined solvent. As such a solvent, a polar solvents, such as terpineol, a hydrocarbon-based solvent, such as tetradecane, an aqueous solvent, a ketone-based solvent, or the like is applied, for example.

The Ag particulate has the configuration which covered the front side surface of the Ag particulate as a core by the shell (organic shell) which composes the organic compound or the like. Consequently, the dispersibility in the solvent can be improved and oxidization of the Ag particulate can be prevented. Moreover, the density of the Ag particulates can be increased and the densification of the metallic particle bonding layer as a sintered body can be improved by pressurizing or heating the paste layer comprised of the Ag particulate paste and breaking the shell, in a previous process before performing the annealing treatment.

The thickness of the bonding layer 615 on chip is preferably as thick as possible. However, since if it is thick, cracks are likely to occur when firing the fired metal, and a resistance component is increased, preferable, the thickness is preferably approximately 100 μm to approximately 500

μm, but it is not limited to this range. Even if the metal lead 617 is melted by a laser light (not illustrated) and the laser light reaches the bonding layer 615 on chip below, the thickness of the bonding layer 615 on chip is not several μm as the source pad electrode 3, but is sufficiently thick, and thereby it is easy to control the melting depth by the laser light.

Moreover, between the metal lead 617 and the source electrode pattern 606, since the thickness of the source electrode pattern 606 is sufficient as thick as about several 100 μm, it is easy to control the melting depth by the laser light.

In the power semiconductor apparatus 650 according to one embodiment to which the present technology is applied, the power semiconductor apparatus is directly irradiated with the laser light in a vertical direction. In addition, the laser welding in the vertical direction is implemented directly above the chip.

The laser applicable as a fabricating technology of the power semiconductor apparatus 650 according to one embodiment to which the present technology is applied is any one of YAG laser or second harmonics of YAG laser, YLF (YLiF$_4$: Yttrium Lithium Fluoride) laser, YVO$_4$ (YVO$_4$: Yttrium Vanadium Oxide) laser, KrF laser, CO$_2$ laser, or CO laser, for example. The wavelength range of the laser light may be, for example, a wavelength range of 0.2 μm to 20 μm, and preferably approximately 0.33 μm to approximately 10.6 μm. It is effective to use a second harmonics of YAG laser having a wavelength of 1064 nm or YAG laser having a wavelength of 532 nm.

In the experiment, welding was performed at several kW×several msec with the fundamental wave and the second harmonic of the YAG laser. The irradiation diameter is approximately 0.6 mm, for example, and when irradiation is performed at 5 kW, the power density is approximately 118 kW/mm$^2$. The irradiation method is a single pulse, but a plurality of pulses may be emitted by adjusting a power level.

The power semiconductor apparatus 650 according to one embodiment to which the present technology is applied has a structure of connecting the metal lead to the chip upper surface to be bonded by the laser welding. The sintered metal layer is previously formed on the upper surface of the chip, and the laser light is emitted to the metal lead disposed on the sintered metal layer. Consequently, it is easy to control the metal melting depth due to the laser light.

(Fabrication Method for Power Semiconductor Apparatus According to One Embodiment to which Present Technology is Applied)

Figure 67A:
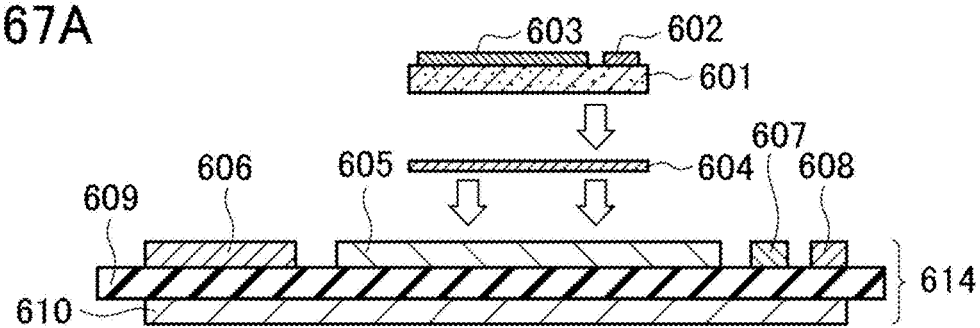
FIG. 67A is a schematic cross-sectional structure diagram for explaining a process of a fabrication method of the power semiconductor apparatus according to one embodiment to which the present technology is applied (Process 1).
Figure 67B:
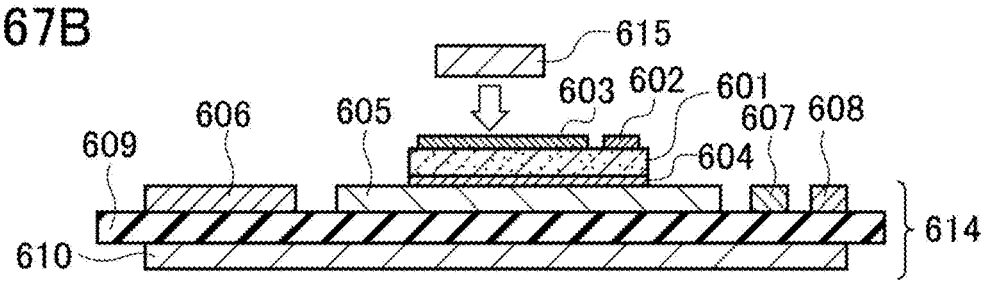
FIG. 67B is a schematic cross-sectional structure diagram for explaining a process of the fabrication method of to which the present technology is applied (Process 2).
Figure 67C:
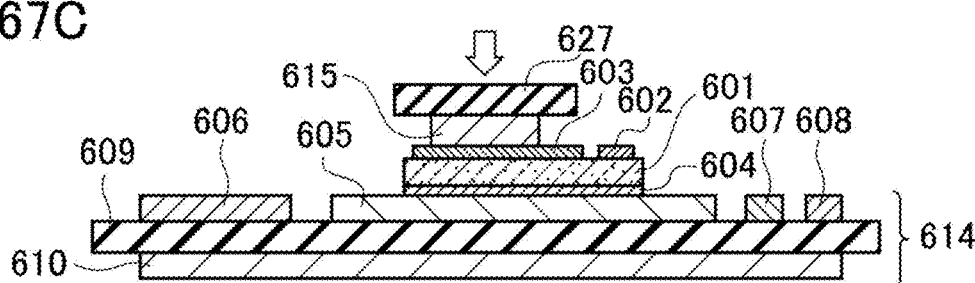
FIG. 67C is a schematic cross-sectional structure diagram for explaining a process of the fabrication method of the power semiconductor apparatus according to one embodiment to which the present technology is applied (Process 3).
Figure 67D:
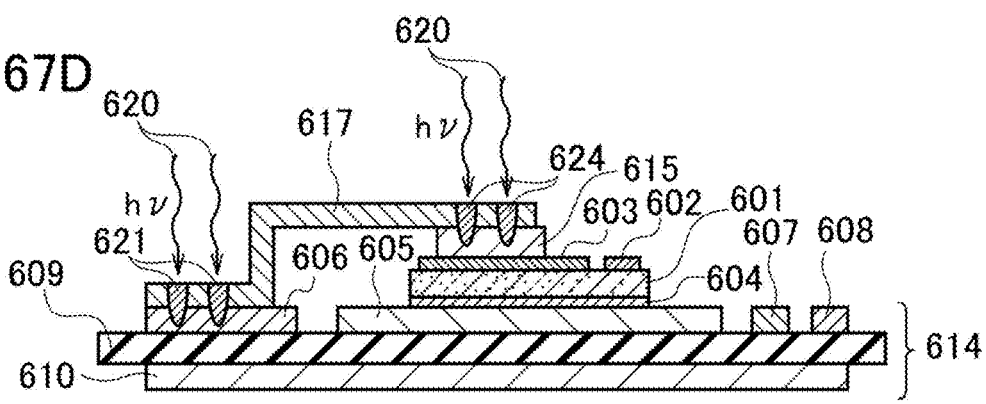
FIG. 67D is a schematic cross-sectional structure diagram for explaining a process of the fabrication method of the power semiconductor apparatus according to one embodiment to which the present technology is applied (Process 4).
Figure 67E:
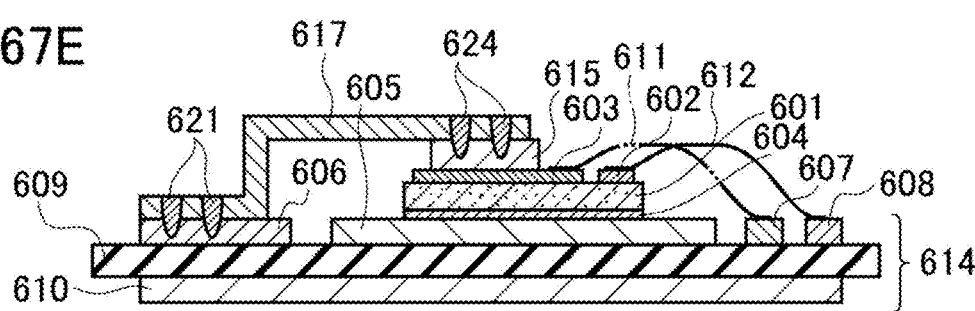
FIG. 67E is a schematic cross-sectional structure diagram for explaining a process of the fabrication method of the power semiconductor apparatus according to one embodiment to which the present technology is applied (Process 5).

FIG. 67 shows a schematic cross-sectional structure for explaining the one process of the fabrication method for the power semiconductor apparatus according to one embodiment to which the present technology is applied, including the process 1 shown in FIG. 67A to the process 5 shown in FIG. 67E. As shown in FIG. 67A, the fabrication method for the power semiconductor apparatus according to one embodiment to which the present technology is applied includes forming a bonding layer 604 under chip on a drain electrode pattern 605 of the insulating substrate 614, mounting a semiconductor power device 601 on the bonding layer 604 under chip, and bonding the semiconductor power device 601 to the bonding layer 604 under chip through a heating and pressurizing process for pressurizing and heating. A heating processing temperature of the heating and pressurizing process is within a range of 200° C. to 350° C., and an applied pressure is within a range of 10 MPa to 80 MPa.

Furthermore, as shown in FIGS. 67B to 67C, the fabrication method includes forming a bonding layer 615 on chip on a source pad electrode 603 of the semiconductor power device 601, mounting a pressing plate 627 on the bonding layer 615 on chip, and bonding the source pad electrode 603 to the bonding layer 615 on chip through the heating and pressurizing process for pressurizing and heating. The Pressurizing may be applied through a heat-resistant flexible material, and Teflon (registered trademark) may be used as the pressing plate 627, for example. A heating processing temperature of the heating and pressurizing process is within a range of 200° C. to 350° C., and an applied pressure is within a range of 10 MPa to 80 MPa.

Furthermore, as shown in FIG. 67D, the fabrication method includes disposing a metal lead 617 on the bonding layer 615 on chip and the source electrode pattern 606 of the insulating substrate 614, and bonding between the metal lead 617 and the bonding layer 615 on chip and between the metal lead 617 and the source electrode pattern 606 by welding with the laser light (hv) 620. As a result, a melted resolidified portion 624 is formed between the metal lead 617 and the bonding layer 615 on chip, and a melted resolidified portion 621 is formed between the metal lead 617 and the source electrode pattern 606.

Furthermore, as shown in FIG. 67E, the fabrication method includes: connecting between the source pad electrode 603 and the source signal electrode patterns 607 of the insulating substrate 614 with a source signal bonding wire 611; and connecting between the gate pad electrode 602 of the semiconductor power device 601 and the gate signal electrode patterns 608 of the insulating substrate 614 with a gate signal bonding wire 612.

The bonding layer 615 on chip may include an Ag fired layer or a Cu fired layer. The Ag fired layer or the Cu fired layer can be formed by mask printing or a dispensing method. The thickness of the bonding layer 615 on chip is preferably as thick as possible in order to prevent an influence of thermal stress due to the laser light to the semiconductor power device 601. However, since if it is thick, cracks are likely to occur when firing the fired metal, and a resistance component is increased, preferable, the thickness is preferably approximately 100 μm to approximately 500 μm, but it is not limited to this range. Even if the metal lead 617 is melted by a laser light (hv) 620 and the laser light reaches the bonding layer 615 on chip below, the thickness of the bonding layer 615 on chip is not several μm as the source pad electrode 603, but is sufficiently thick, and thereby it is easy to control the melting depth by the laser light (hv) 620.

The bonding layer 604 under chip may include an Ag fired layer or a Cu fired layer, in the same manner as the bonding layer 615 on chip. The bonding layer 616 disposed on the source electrode pattern (copper foil) 606 may include the Ag fired layer or the Cu fired layer, in the same manner as the bonding layer 615 on chip.

According to one embodiment to which the present technology is applied, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

Figure 62A:
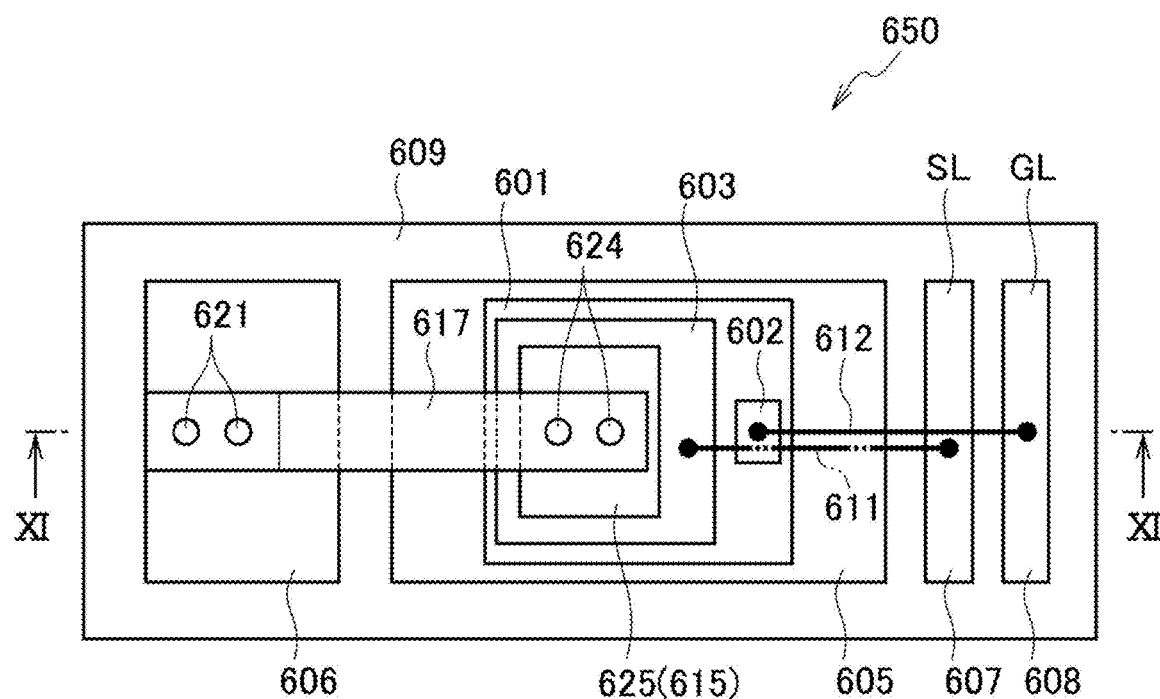
FIG. 62A is a schematic planar pattern configuration diagram before sealing the power semiconductor apparatus according to one embodiment to which the present technology is applied.
Figure 62B:
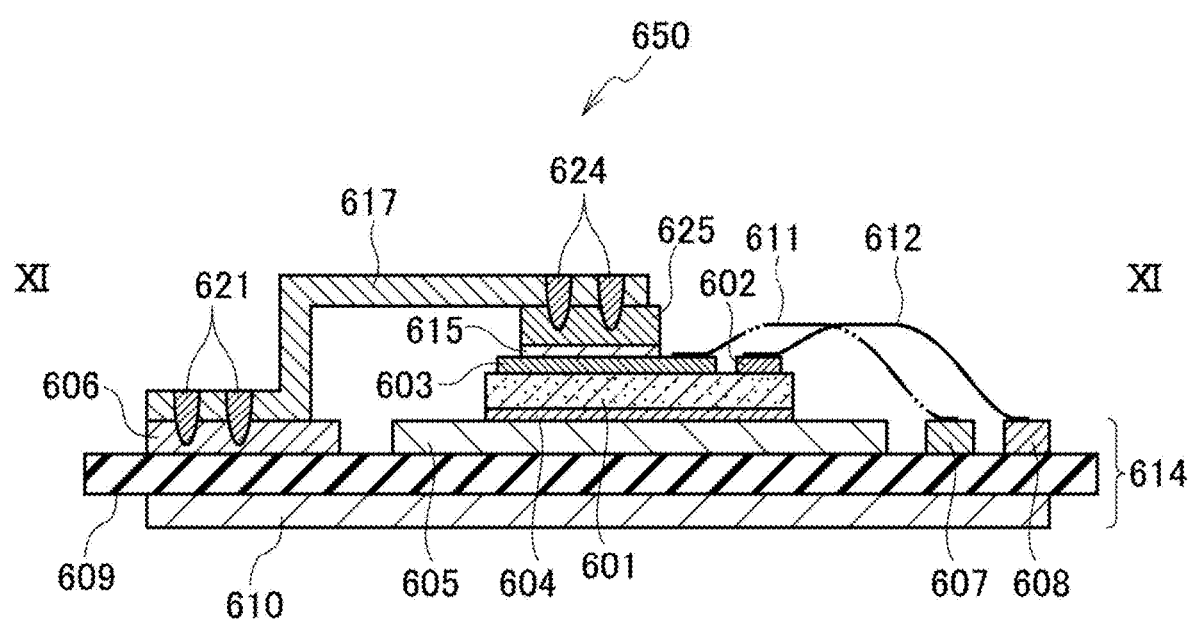
FIG. 62B is a schematic cross-sectional structure diagram taken in the line XI-XI of FIG. 62A.

FIG. 62 is a schematic planar pattern configuration of a principal portion of the power semiconductor apparatus 650 according to one embodiment to which the present technology is applied, and FIG. 62B shows a schematic cross-sectional structure taken in the line XI-XI of FIG. 62A.

The power semiconductor apparatus 650 shown in FIG. 62 also corresponds to a schematic configuration example before sealing the 1-in-1 module on which SiC MOSFET is mounted.

In the power semiconductor apparatus 650 according to one embodiment to which the present technology is applied, the protective layer on chip includes a bonding layer 615 on chip and a metallic plate 625 disposed on the bonding layer 615 on chip.

The metallic plate 625 includes any one of copper, a copper alloy, aluminum, an aluminum alloy, stainless steel, ferrum, or an iron alloy.

In the power semiconductor apparatus 650 according to one embodiment to which the present technology is applied, the bonding layer 615 on chip needs to thicken since the laser light is directly applied thereto, the thickness of the bonding layer 615 on chip is approximately 100 μm to approximately 500 μm. However, in the power semiconductor device 650 shown in FIG. 62, since the metallic plate 625 is interposed thereto, the thickness of the bonding layer 615 on chip does not need to be increased, and may be, for example, approximately 10 μm to approximately 500 μm. Usually, the thickness thereof is not specifically increased but is approximately 50 μm. The other configurations are the same as the configuration of FIG. 61.

(Fabrication Method for Power Semiconductor Apparatus According to One Embodiment to which Present Technology is Applied)

Figure 68A:
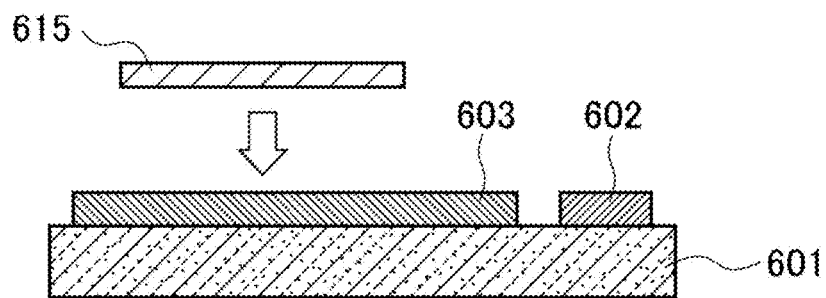
FIG. 68A is a schematic cross-sectional structure diagram for explaining a part of the fabricating process of the fabrication method of the power semiconductor apparatus according to one embodiment to which the present technology is applied (Process 1).
Figure 68B:
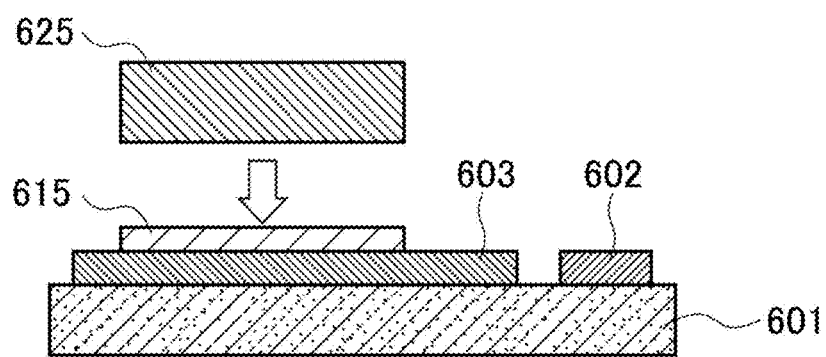
FIG. 68B is a schematic cross-sectional structure diagram for explaining a part of the fabricating process of the fabrication method of the power semiconductor apparatus according to one embodiment to which the present technology is applied (Process 2).
Figure 68C:
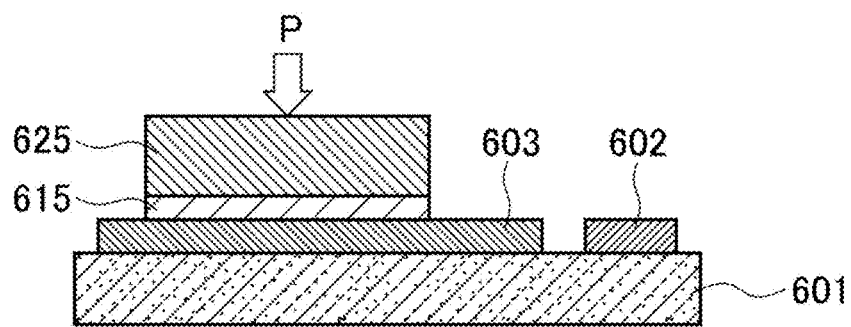
FIG. 68C is a schematic cross-sectional structure diagram for explaining a part of the fabricating process of the fabrication method of the power semiconductor apparatus according to one embodiment to which the present technology is applied (Process 3).

FIGS. 68A to 68C show schematic cross-sectional structures for explaining a portion of fabricating processes of the fabrication method for the power semiconductor apparatus according to one embodiment to which the present technology is applied, and FIGS. 69A to 69D show schematic cross-sectional structures for explaining the entire fabricating process.

As shown in FIGS. 68A to 68C, the fabrication method for the power semiconductor apparatus according to one embodiment to which the present technology is applied includes forming a bonding layer 615 on chip on a source pad electrode 603 of the semiconductor power device 601, mounting a metallic plate 625 on the bonding layer 615 on chip, and bonding the metallic plate 625 to the source pad electrode 603 through the heating and pressurizing process for pressurizing and heating. A heating processing temperature of the heating and pressurizing process is within a range of 200° C. to 350° C., and an applied pressure is within a range of 10 MPa to 80 MPa.

Figure 69A:
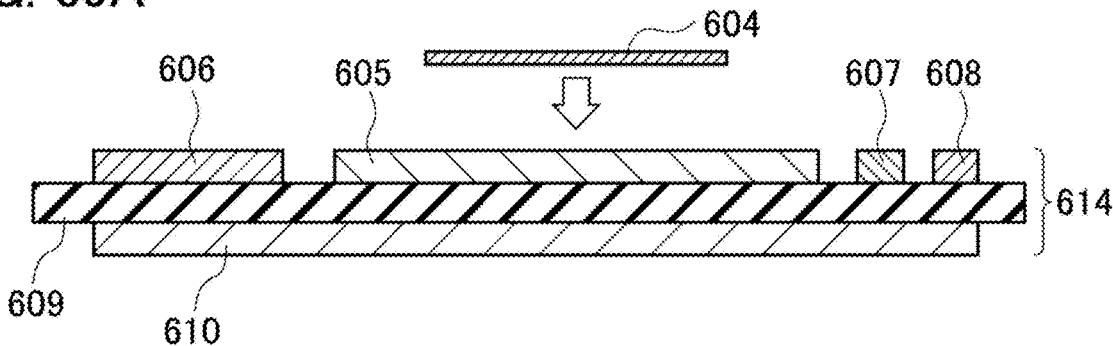
FIG. 69A is a schematic cross-sectional structure diagram for explaining an entire fabricating process of the fabrication method of the power semiconductor apparatus according to one embodiment to which the present technology is applied (Process 4).
Figure 69B:
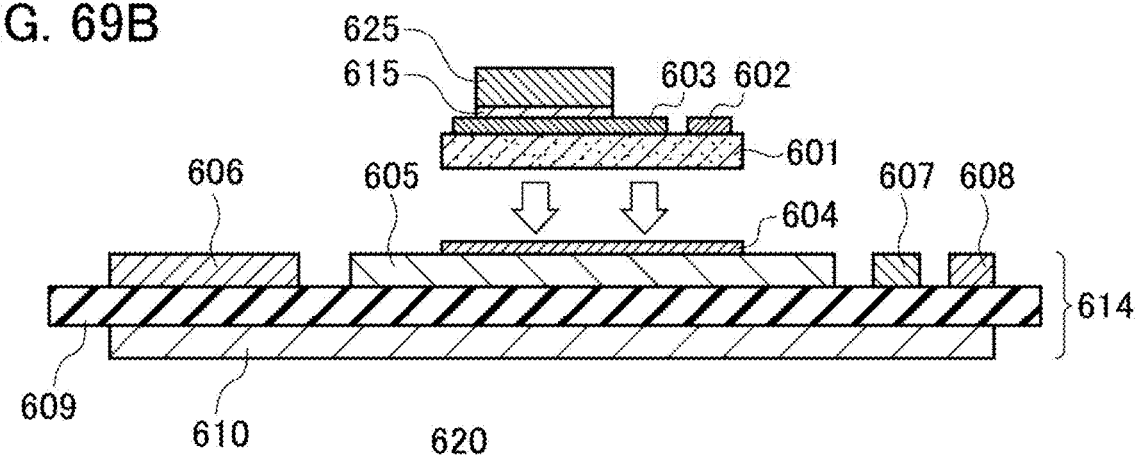
FIG. 69B is a schematic cross-sectional structure diagram for explaining an entire fabricating process of the fabrication method of the power semiconductor apparatus according to one embodiment to which the present technology is applied (Process 5).

Furthermore, as shown in FIGS. 69A to 69B, the fabrication method for the power semiconductor apparatus according to one embodiment to which the present technology is applied includes forming a bonding layer 604 under chip on a drain electrode pattern 605 of the insulating substrate 614, mounting a semiconductor power device 601 on the bonding layer 604 under chip, and bonding the semiconductor power device 601 to the bonding layer 604 under chip through a heating and pressurizing process for pressurizing and heating. A heating processing temperature of the heating and pressurizing process is within a range of 200° C. to 350° C., and an applied pressure is within a range of 10 MPa to 80 MPa.

Figure 69C:
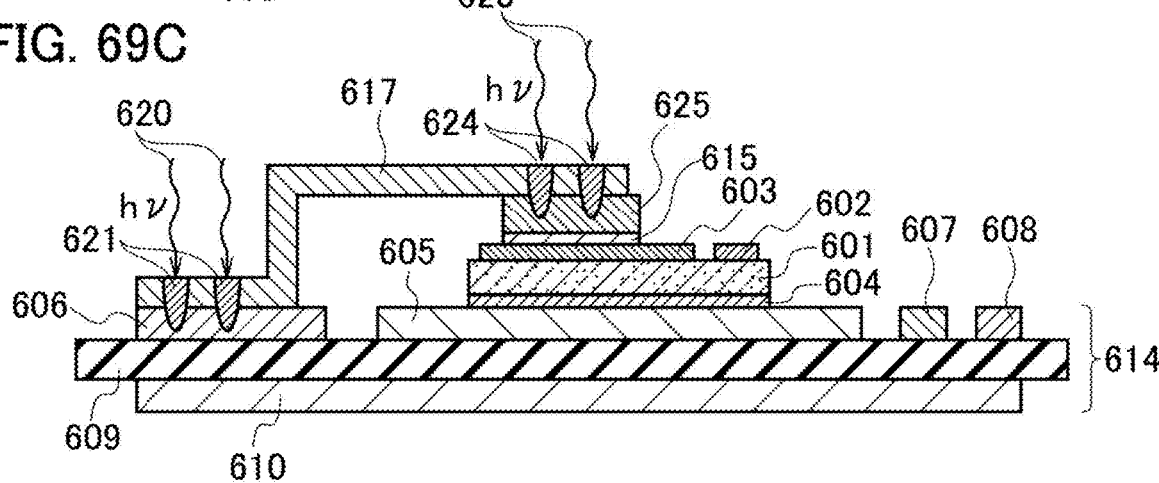
FIG. 69C is a schematic cross-sectional structure diagram for explaining an entire fabricating process of the fabrication method of the power semiconductor apparatus according to one embodiment to which the present technology is applied (Process 6).

Furthermore, as shown in FIG. 69C, the fabrication method for the power semiconductor apparatus according to one embodiment to which the present technology is applied includes disposing a metal lead 617 on the metallic plate 625 and the source electrode pattern 606 of the insulating substrate 614, and bonding between the metal lead 617 and the metallic plate 625 and between the metal lead 617 and the source electrode pattern 606 by welding with the laser light (hv) 620. As a result, a melted resolidified portion 624 is formed between the metal lead 617 and the metallic plate 625, and a melted resolidified portion 621 is formed between the metal lead 617 and the source electrode pattern 606.

Figure 69D:
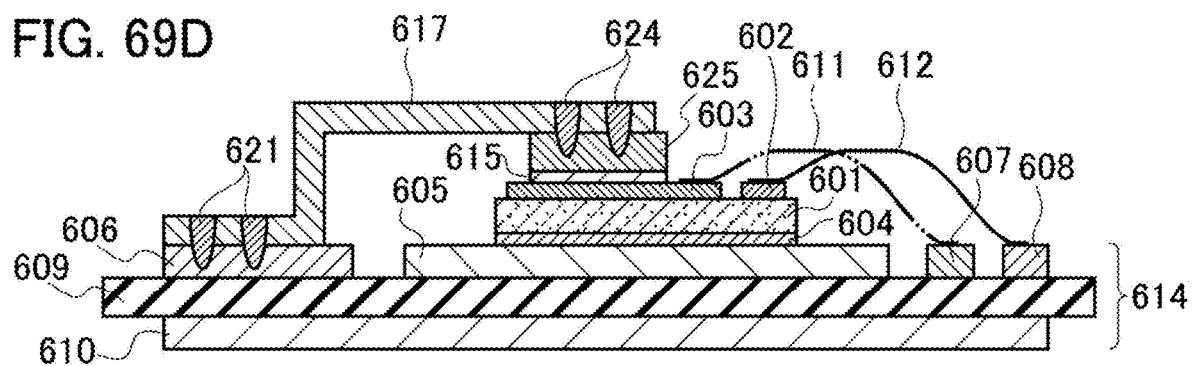
FIG. 69D is a schematic cross-sectional structure diagram for explaining an entire fabricating process of the fabrication method of the power semiconductor apparatus according to one embodiment to which the present technology is applied (Process 7).

Furthermore, as shown in FIG. 69D, the fabrication method for the power semiconductor apparatus according to one embodiment to which the present technology is applied includes: connecting between the source pad electrode 603 and the source signal electrode patterns 607 of the insulating substrate 614 with a source signal bonding wire 611; and connecting between the gate pad electrode 602 of the semiconductor power device 601 and the gate signal electrode patterns 608 of the insulating substrate 614 with a gate signal bonding wire 612.

In the fabrication method for the power semiconductor apparatus according to one embodiment to which the present technology is applied, after bonding the metallic plate 625 to the upper surface of the source pad electrode 3 with the bonding layer 615 on chip, the metal lead 617 is disposed on the surface of the metallic plate 625; and the metal lead 617 is melted by emitting the laser light, and is continuously irradiated with the laser light until the laser light reaches the metallic plate 625 below, thereby forming the melted resolidified portion 624. As the bonding layer 615 on chip, a fired metal, such as an Ag fired material or a Cu fired material, is used. Moreover, as a material of the metallic plate 625, copper, a copper alloy, aluminum, an aluminum alloy, ferrum, an iron alloy, or the like can be used.

According to one embodiment to which the present technology is applied, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

Figure 63A:
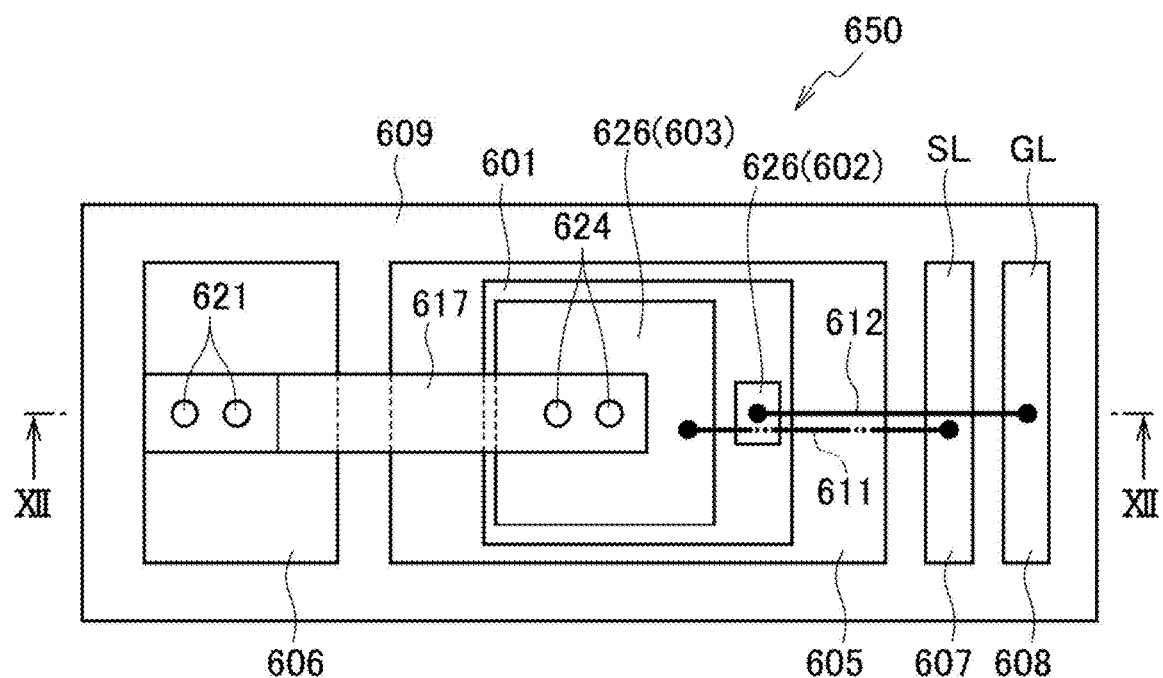
FIG. 63A is a schematic planar pattern configuration diagram before sealing the power semiconductor apparatus according to one embodiment to which the present technology is applied.
Figure 63B:
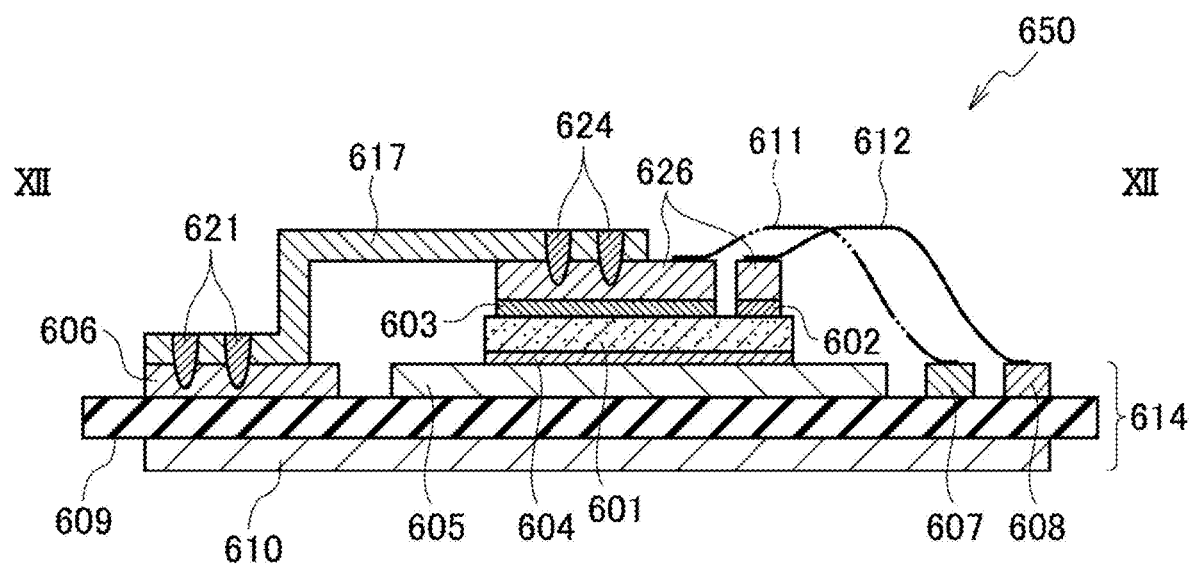
FIG. 63B is a schematic cross-sectional structure diagram taken in the line XII-XII of FIG. 63A.

FIG. 63A, shows a schematic planar pattern configuration of the power semiconductor apparatus 650 according to one embodiment to which the present technology is applied, and FIG. 63B shows a schematic cross-sectional structure taken in the line XII-XII of FIG. 63A. The power semiconductor apparatus 650 shown in FIG. 63 also corresponds to a schematic configuration example before sealing the 1-in-1 module on which SiC MOSFET is mounted.

The protective layer (615) on chip includes a plated layer 626, in the power semiconductor apparatus 650 according to one embodiment to which the present technology is applied. In the power semiconductor apparatus 650 shown in FIG. 63, the plated layer 626 is disposed on the source pad electrode 3 and the gate pad electrode 602 of the semiconductor power device 1.

The plated layer 626 includes any one of copper, nickel, chromium, silver, zinc, or tin.

The other configurations are the same as the configuration of FIG. 61.

(Fabrication Method for Power Semiconductor Apparatus According to One Embodiment to which Present Technology is Applied)

Figure 70A:
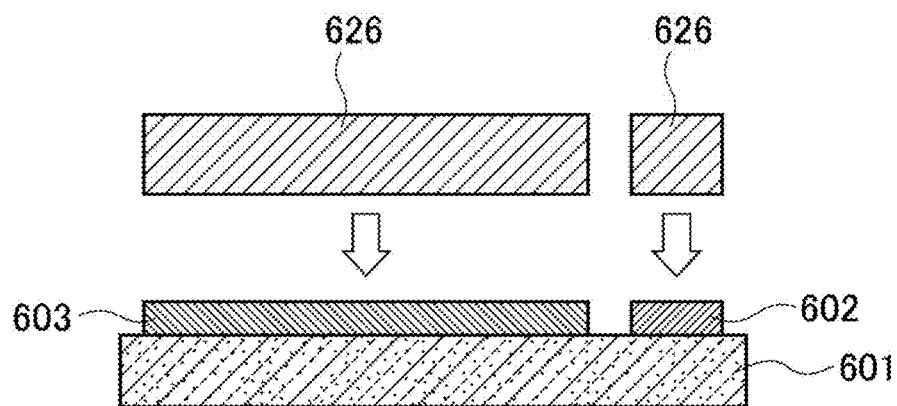
FIG. 70A is a schematic cross-sectional structure diagram for explaining a part of the fabricating process of the fabrication method of the power semiconductor apparatus according to one embodiment to which the present technology is applied (Process 1).
Figure 70B:
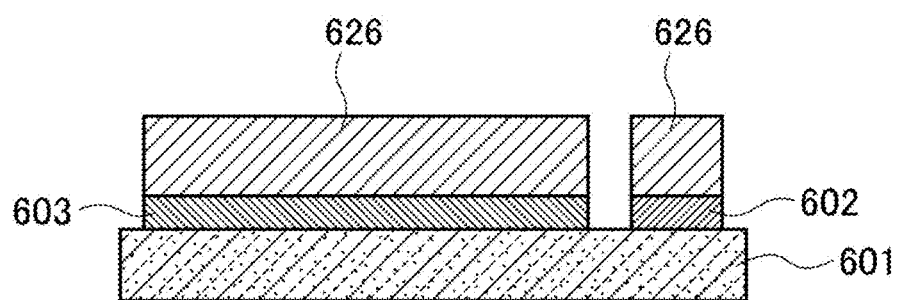
FIG. 70B is a schematic cross-sectional structure diagram for explaining a part of the fabricating process of the fabrication method of the power semiconductor apparatus according to one embodiment to which the present technology is applied (Process 2).

FIGS. 70A to 70B show schematic cross-sectional structures for explaining a portion of fabricating processes of the fabrication method for the power semiconductor apparatus according to one embodiment to which the present technology is applied, and FIGS. 71A to 71D show schematic cross-sectional structures for explaining the entire fabricating process.

As shown in FIGS. 70A to 70B, the fabrication method for the power semiconductor apparatus according to one embodiment to which the present technology is applied includes forming a plating layer 626 on a source pad electrode 603 and a gate pad electrode 602 of the semiconductor power device 601.

Figure 71A:
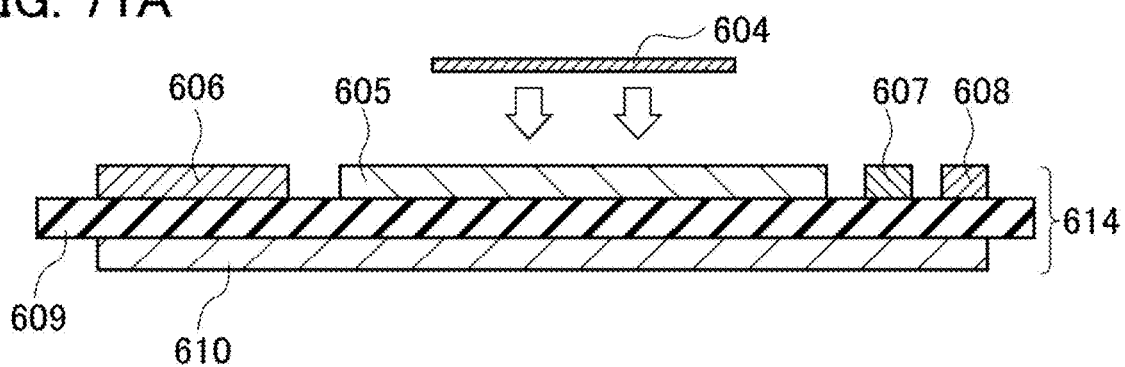
FIG. 71A is a schematic cross-sectional structure diagram for explaining an entire fabricating process of the fabrication method of the power semiconductor apparatus according to one embodiment to which the present technology is applied (Process 3).
Figure 71B:
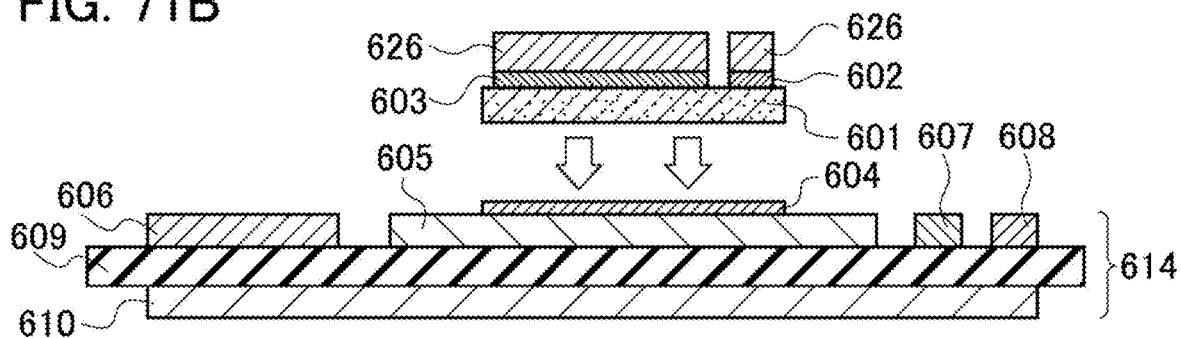
FIG. 71B is a schematic cross-sectional structure diagram for explaining an entire fabricating process of the fabrication method of the power semiconductor apparatus according to one embodiment to which the present technology is applied (Process 4).

Furthermore, as shown in FIGS. 71A to 71B, the fabrication method for the power semiconductor apparatus according to one embodiment to which the present technology is applied includes forming a bonding layer 604 under chip on a drain electrode pattern 605 of the insulating substrate 614, mounting the semiconductor power device 601 passing through the above-mentioned process of forming the plating layer 626 on the bonding layer 604 under chip, and bonding the semiconductor power device 601 to the bonding layer 604 under chip through a heating and pressurizing process for pressurizing and heating. A heating processing temperature of the heating and pressurizing process is within a range of 200° C. to 350° C., and an applied pressure is within a range of 10 MPa to 80 MPa.

Figure 71C:
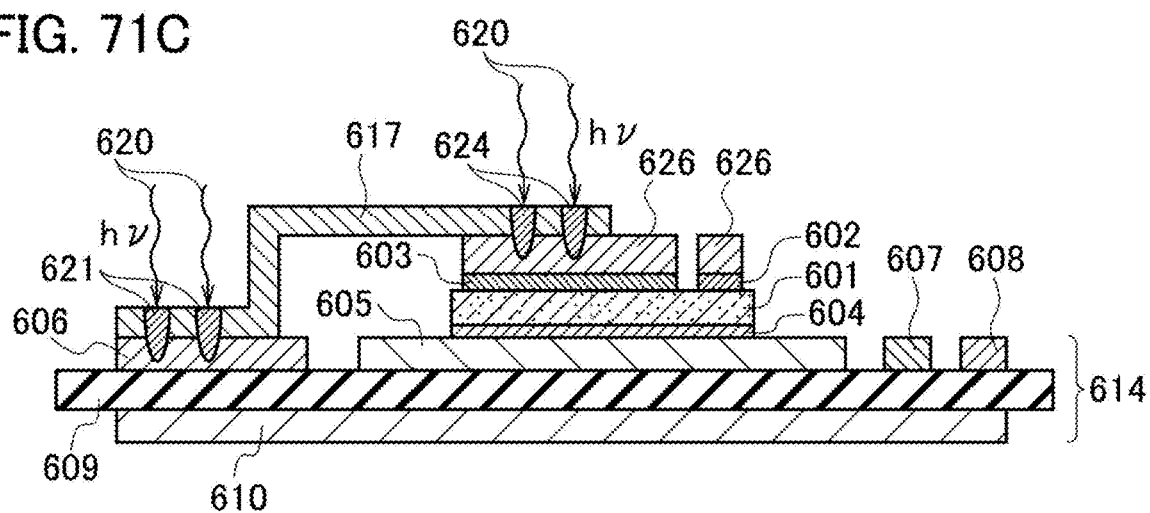
FIG. 71C is a schematic cross-sectional structure diagram for explaining an entire fabricating process of the fabrication method of the power semiconductor apparatus according to one embodiment to which the present technology is applied (Process 5).

Furthermore, as shown in FIG. 71C, the fabrication method for the power semiconductor apparatus according to one embodiment to which the present technology is applied includes disposing a metal lead 617 on the plating layer 626 on the source pad electrode 603 and the source electrode pattern 606 of the insulating substrate 614, and bonding between the metal lead 617 and the plating layer 626 on the source pad electrode 603 and between the metal lead 617 and the source electrode pattern 606 by welding with the laser light (hv) 620. As a result, a melted resolidified portion 624 is formed between the metal lead 617 and the plating layer 626, and a melted resolidified portion 621 is formed between the metal lead 617 and the source electrode pattern 606.

Figure 71D:
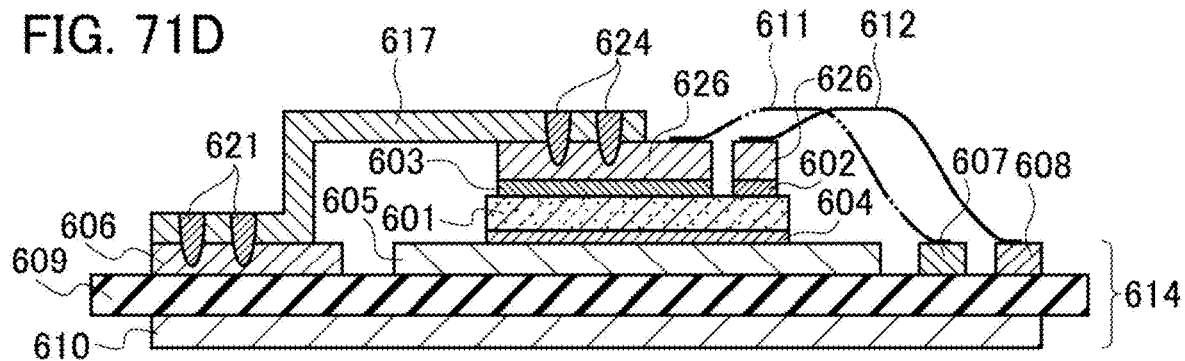
FIG. 71D is a schematic cross-sectional structure diagram for explaining an entire fabricating process of the fabrication method of the power semiconductor apparatus according to one embodiment to which the present technology is applied (Process 6).

Furthermore, as shown in FIG. 71D, the fabrication method for the power semiconductor apparatus according to one embodiment to which the present technology is applied includes: connecting between the plating layer 626 on the source pad electrode 603 and the source signal electrode patterns 607 of the insulating substrate 614 with a source signal bonding wire 611; and connecting between the plating layer 626 on the gate pad electrode 602 and the gate signal electrode patterns 608 of the insulating substrate 614 with a gate signal bonding wire 611.

According to one embodiment to which the present technology is applied, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

Comparative Example: Bonding Method of Lead Wiring

Figure 64:
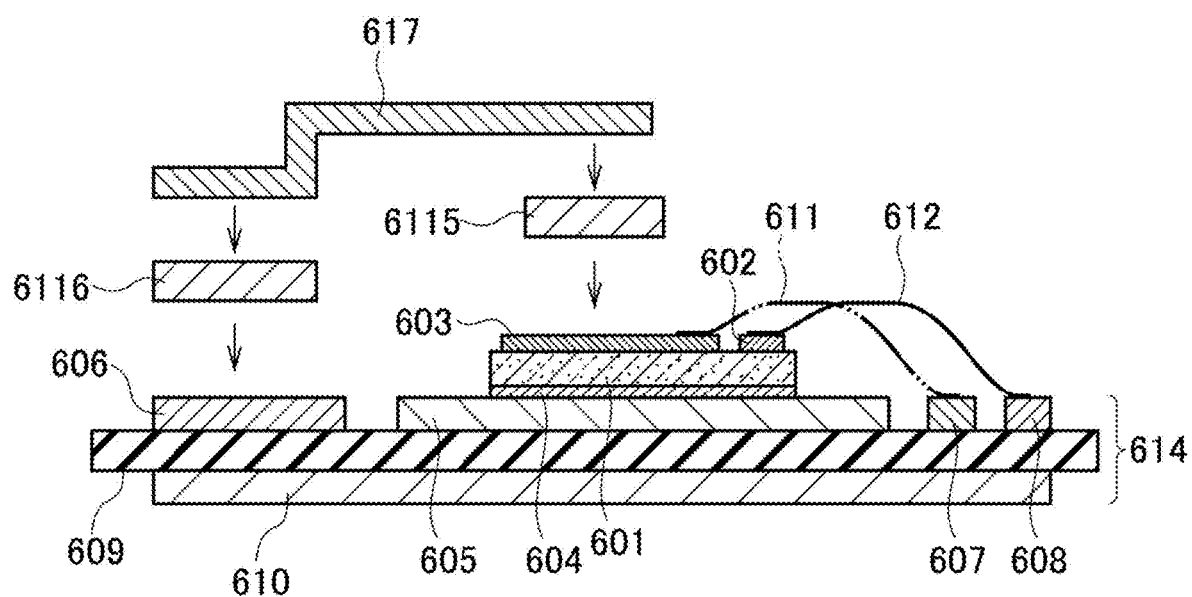
FIG. 64 is a schematic cross-sectional structure diagram for explaining a bonding method of a lead wiring in a power semiconductor apparatus according to a comparative example (Process 1).
Figure 65A:
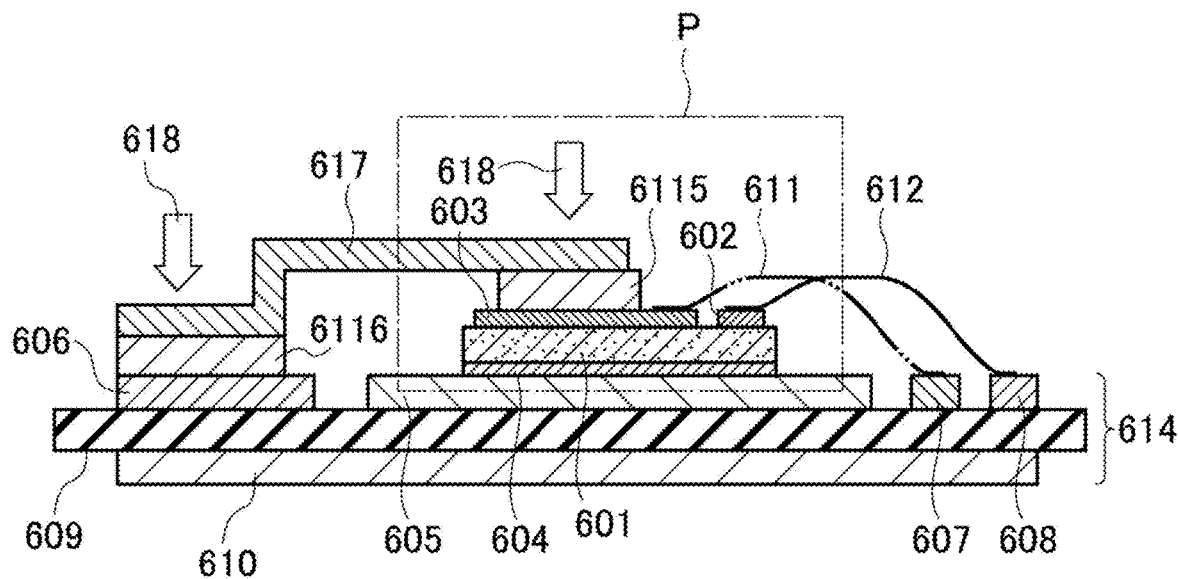
FIG. 65A is a schematic cross-sectional structure diagram for explaining the bonding method of the lead wiring in the power semiconductor apparatus according to the comparative example (Process 2).
Figure 65B:
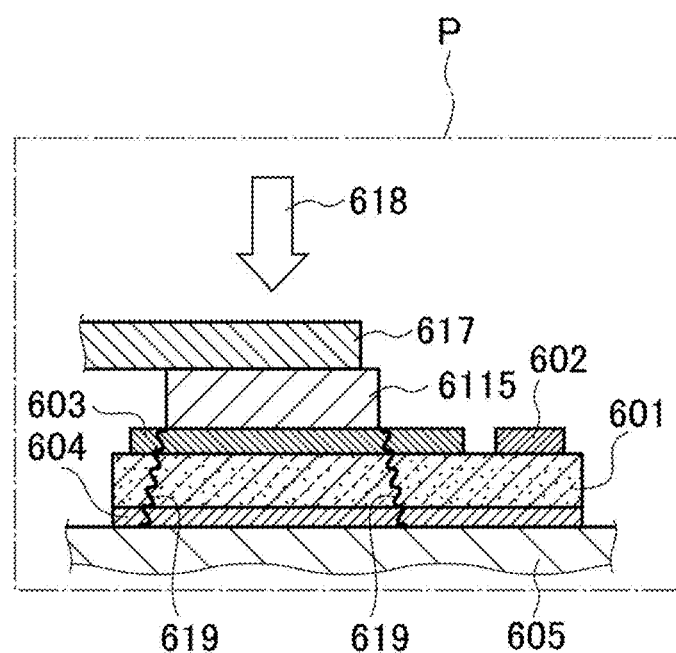
FIG. 65B is an enlarged view of the portion P shown in FIG. 65A.
Figure 66A:
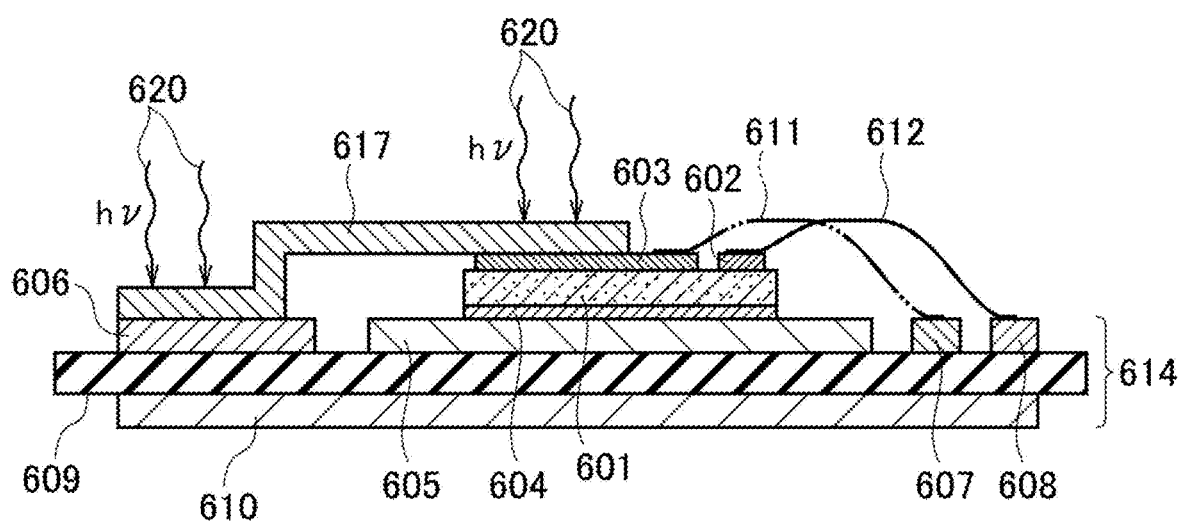
FIG. 66A is a schematic cross-sectional structure diagram for explaining the bonding method of the lead wiring in the power semiconductor apparatus according to the comparative example (Process 3).
Figure 66B:
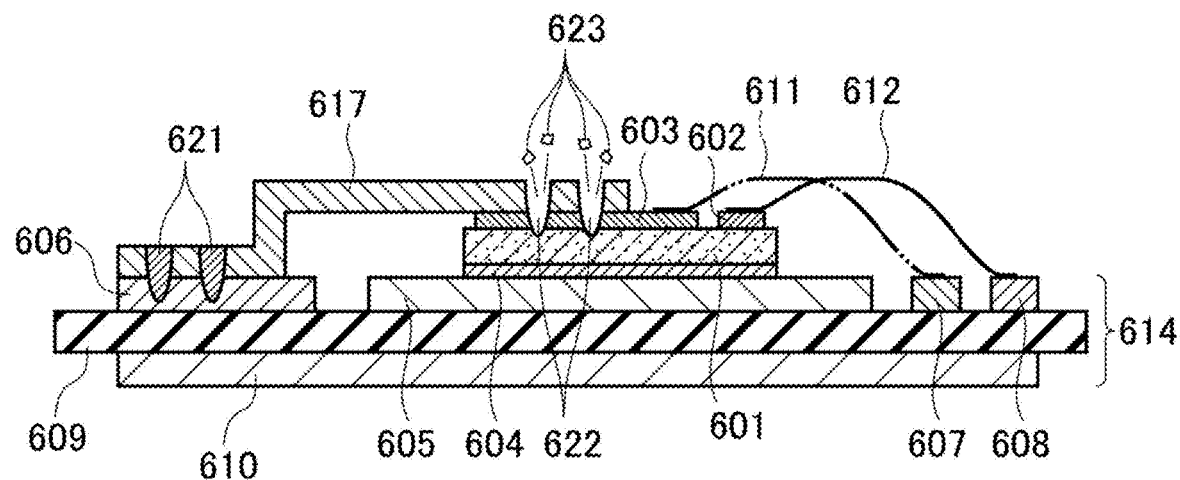
FIG. 66B is a schematic cross-sectional structure diagram for explaining the bonding method of the lead wiring in the power semiconductor apparatus according to the comparative example (Process 4).

FIG. 64 shows a schematic cross-sectional structure for explaining a bonding method of a lead wiring in a power semiconductor apparatus according to a comparative example (Process 1). FIG. 65A shows a schematic cross-sectional structure for explaining the bonding method of the lead wiring in the power semiconductor apparatus according to the comparative example (Process 2). The enlarged view of P portion in FIG. 65A is expressed, as shown in FIG. 65B. Furthermore, FIG. 66A shows a schematic cross-sectional structure for explaining the bonding method of the lead wiring in the power semiconductor apparatus according to the comparative example (Process 3), and FIG. 66B shows a schematic cross-sectional structure for explaining the bonding method of the lead wiring in the power semiconductor apparatus according to the comparative example (Process 4).

In the power semiconductor apparatus according to the comparative example, the bonding method of the lead wiring will now be explained with reference to FIGS. 64 to 66.

In the power semiconductor apparatus according to the comparative example, a semiconductor power device 601 is bonded on an upper surface of a drain electrode pattern 605 of the insulating substrate 614 via a bonding layer 604 under chip. A soldering material or a fired metal material is used as the bonding layer 604 under chip. The insulating substrate 614 is composed of: a substrate (ceramics substrate) 609 composed of an insulation layer; a drain electrode pattern 605, a source electrode pattern 606, a source signal electrode pattern 607, and a gate signal electrode pattern 608 which are disposed on the ceramics substrate 609; and a back electrode pattern 610 disposed on a back side surface of the ceramics substrate 609.

A gate pad electrode 602 and a source pad electrode 603 are disposed on an upper surface of the semiconductor power device 601, and the gate pad electrode 602 and the gate signal electrode pattern 608 are electrically connected to each other with a gate signal bonding wire 612. Moreover, the source pad electrode 603 and the source electrode pattern 606 are electrically connected to each other with a source signal bonding wire 611. An aluminum wire of approximately 100 μm to approximately 500 μm in diameter is used for the source signal bonding wire 611 and the gate signal bonding wire 612.

In order to extract an electric current from the semiconductor power device 601, between the source pad electrode 603 and the source electrode pattern 606 is wired with a metal lead 617. The bonding between the metal lead 617 and the source pad electrode 603 is electrically connected with a bonding layer on chip 6115, and the bonding between the metal lead 617 and the source electrode pattern 606 is electrically connected with a bonding layer on source electrode 6116. A soldering material or fired metal material is used for the bonding layer on chip 6115 and the bonding layer on source electrode 6116, in the same manner as the bonding layer 604 under chip.

Only by using the fired metal material to the bonding layer on chip 6115 and the bonding layer on source electrode 6116 to be annealed, the reliability lifetime of the bonding layer in the environment of repeating cooling and heating is easily reduced. Accordingly, in the case of improving the lifetime by bonding the fired metal in the bonding layer on chip 6115, as shown in FIG. 65, it is necessary to fire by annealing at 200° C. to 350° C. from an upper surface of the metal lead 617 in a state of applying pressure 618. At that time, as shown in FIG. 65B, a crack 619 may occur in the semiconductor power device 601 due to the applied pressure 618, and the semiconductor power device 601 may be destroyed. This is because a range in which the metal lead 617 can be pressed from the upper surface is small compared with the surface area of the semiconductor power device 6011, and the applied pressure 618 is locally applied. For this reason, it is conceivable to reduce the applied pressure 618. In that case, however, the bonding strength to the fired metal used for the bonding layer 6115 on chip is also decreased, and therefore the reliability life may not be ensured. Compared with the surface area of the semiconductor power device 601, the range in which the metal lead 617 can be pressurized from the surface is as follows. That is, as an example, with respect to a 4.8 mm square chip (23.04 mm$^2$), the pressurizable range is approximately 5 mm$^2$ which is merely approximately 20 to approximately 30%.

In FIG. 65B, although the applied pressure 618 for generating the crack 619 in the semiconductor power device 1 is dependent on the thickness of the semiconductor power device 601, the crack 619 does not occur in 50 MPa, in the case of approximately 350 μm-thickness SiC, but if the applied pressure 618 is increased to 80 MPa, it becomes easy to generate the crack 619, for example.

Then, as shown in FIG. 66, the metal lead 617 is laminated on the upper surface of the source pad electrode 603 of the semiconductor power device 601, and is irradiates with the laser light (hv) 620 from the upper surface of the metal lead 617, and the metal lead 617 and the source pad electrode 603 formed on the upper surface of the semiconductor power device 601 are welded; and thereby ho pressurization is required. However, the source pad electrode 603 is composed of approximately several μm-thickness aluminum, if melting the metal lead 617 and the source pad electrode 603 to be bonded by emitting the laser light (hv) 620, since the thickness of the source pad electrode 603 is thin, the laser light (hv) 620 easily reaches the semiconductor power device 601 below the source pad electrode 603, it becomes easy to be fire-dilapidated of the semiconductor power device 601 with the metal sputter 623, in the melted resolidified portion (defective portion) 622. Although there is no solidification in the melted resolidified portion (defective portion) 622 in FIG. 66B, this is because the resolidified portion hardly exists since it is scattered as the metal spatter 623.

Even if adjusting the irradiation power and the irradiation time of the laser light (hv) 620, it is difficult to prevent the laser light (hv) 620 from reaching the semiconductor power device 601. In FIG. 66B, since the thickness of the source electrode pattern 606 is as thick as several 100 μm in welding between not the chip upper surface but the source electrode pattern 606 and the metal lead 617, the welding by the laser light (hv) 620 is possible.

Figure 72:
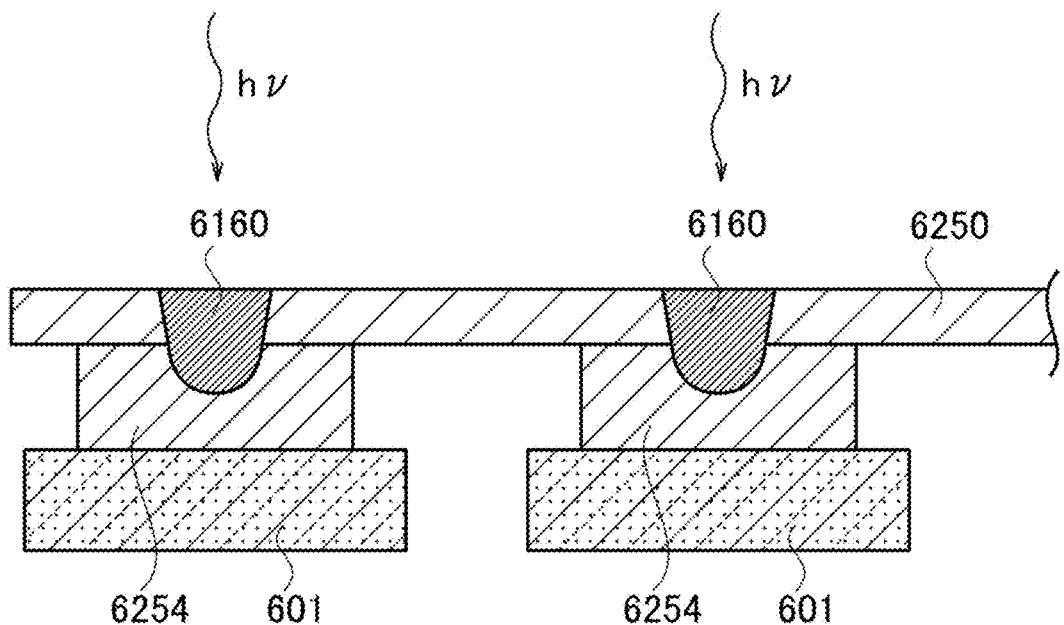
FIG. 72 is a schematic explanatory diagram of laser light irradiation, in a power semiconductor apparatus according to a comparative example.

Accordingly, in the power semiconductor apparatus according to the comparative example, in order to prevent the laser light 620 from reaching to the semiconductor power device 601, it is conceivable that a stress buffering layer (CuMo electrode) 6254 is disposed on the semiconductor power device 601 and the stress buffering layer 6254 and the leadframe (Cu) 6250 are irradiated with the laser light hv to form the laser welding portion 6160. A schematic cross-sectional structure for explaining such an aspect is expressed as shown in FIG. 72.

As the stress buffering layer, a Cu/CuMo cladding or Cu/CuW cladding are applicable. CuMo and CuW are sintered body of Cu and Mo, or Cu and W, and therefore are expensive. It is necessary to form a cladding layer structure in which Cu is cladded on at least one side of such materials, and therefore it becomes a still more expensive materials.

Figure 73:
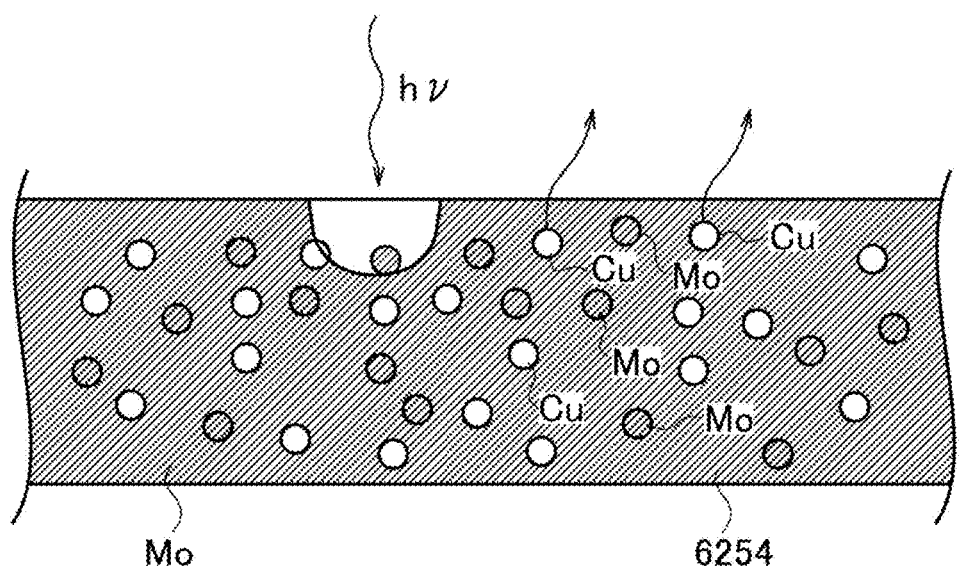
FIG. 73 is a schematic explanatory diagram in the case of irradiating CuMo with the laser light, in the power semiconductor apparatus according to the comparative example.

In the power semiconductor apparatus according to the comparative example, an aspect that the stress buffering layer (CuMo electrode) 6254 impregnated in Cu melted to porous Mo is irradiated with the laser light hv is expressed, as shown in FIG. 73.

Although CuMo and CuW are effective as the stress buffering layer 6254, when these are welded to the lead frame (Cu) 6250 using, for example, a YAG laser, there arises a disadvantage of sputtering of Cu. More specifically, the melting point of Cu is 1083° C. when the stress buffering layer (CuMo electrode) 6254 is irradiated with laser light hv as schematically shown in FIG. 73. However, since the melting point of Mo is 2620° C., CuMo is necessary to be heated up to at least 2620° C., if CuMo is fused with the YAG laser light. However, since the boiling point of Cu is 2570° C., the boiling point of Cu is exceeded at the time when melting Mo in CuMo. Consequently, such a melted portion by the laser light will be sputtered. Also in the case of CuW, since the melting point of W is 3400° C., the same result will be brought. In order to avoid such a problem, it is possible to use a Cu/CuMo cladding in which Cu is laminated on an upper surface of the CuMo materials. In the case of CuW, it is possible to use a Cu/CuW cladding.

Figure 74:
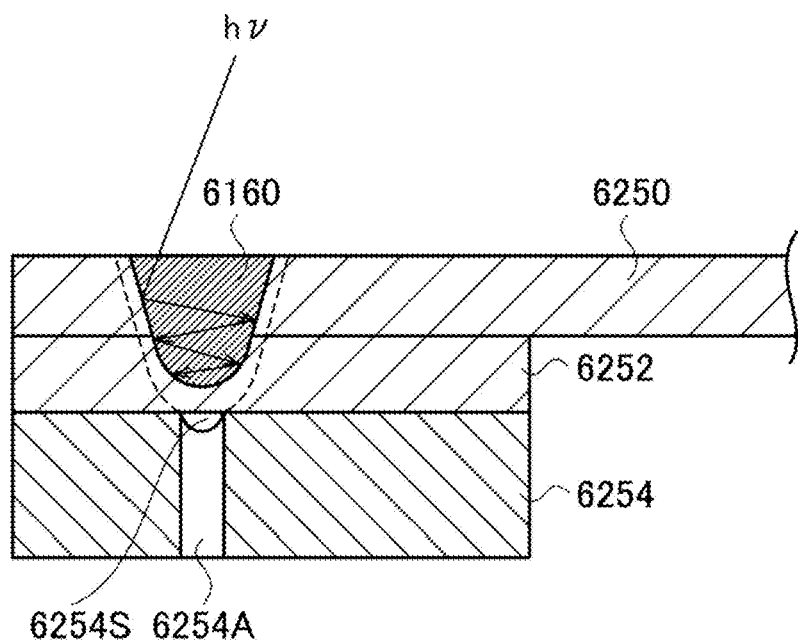

In the power semiconductor apparatus according to the comparative example, FIG. 74 shows an aspect that the leadframe 6250 and the Cu cladding layer 6252 are laser-welded by being irradiated with the laser light hv via the leadframe 6250, in a structure of disposing the leadframe 6250 on the Cu cladding layer/the CuMo stress buffering layer 6254. As shown in FIG. 74, while the laser light hv is scattered in a welded portion 6160, melting of the welded portion 6160 advances. When the melting of the welded portion 6160 advances up to the bottom of the Cu cladding layer 6252 and then reaches to the surface 6254S of the CuMo stress buffering layer 6254, a cavity portion 6254A will be easily formed in the CuMo stress buffering layer 6254. Moreover, if such clad structure is used as the stress buffering layer 6254, the leadframe 6250 is laminated directly above the semiconductor power device 601 to be welded by being irradiated with the YAG laser light hv thereon, the laser light may reach to the plane of the semiconductor power device 601 due to welding variation. Thus, it is difficult to achieve enough effect merely by providing the stress relaxation layer.

Figure 75:
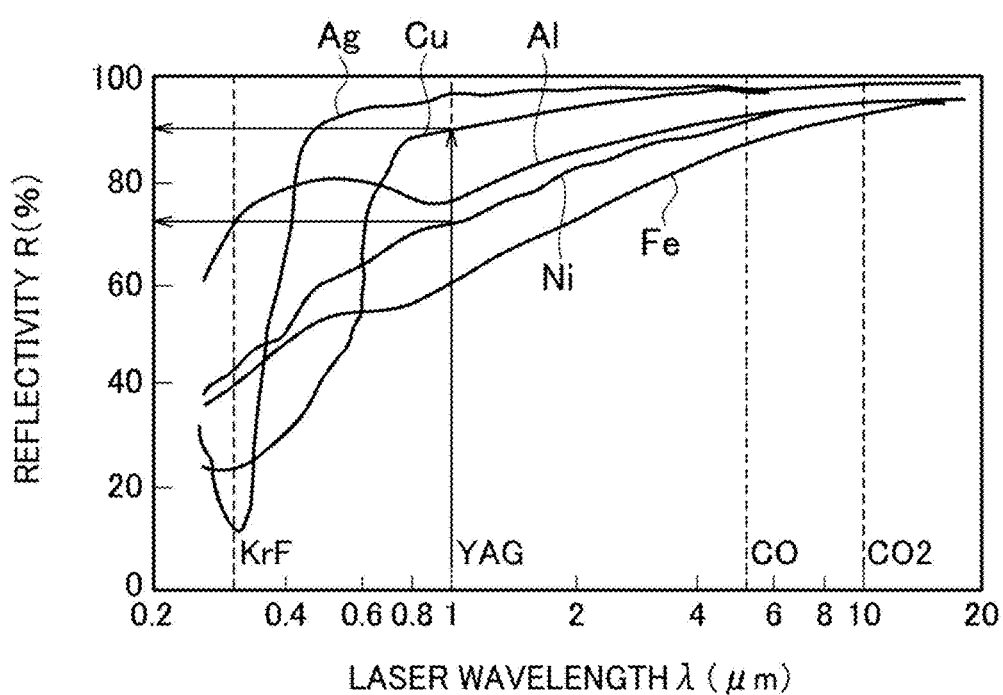

FIG. 75 shows a relationship between reflectance of the laser light R (%) and wavelength of laser light λ (μm) with respect to metallic materials (Ag, Cu, Al, Ni, Fe).

According to the power semiconductor apparatus according to one embodiment to which the present technology is applied, the conductive protective layer on chip for protecting the pad electrode from the laser light and the metal lead bonded to the protective layer on chip are provided on the pad electrode of the upper surface of the semiconductor power device, welding by the laser light bonds between the metal lead and the protective layer on chip. Accordingly, the bonding reliability between the semiconductor power device and the metal lead positioned on an upper surface thereof can be improved with respect to a stress due to an environment of repeating cooling and heating, and it is easy to control the melting depth made by the laser light.

(ΔTj Power Cycle Test)

As shown in FIG. 47, the ΔTj power cycle test is a test to which a junction temperature is relatively risen and dropped at a short-time period, for example, and thereby a lifetime of a wire bonded portion etc. can be evaluated.

The power cycle test repeats electrical connection (ON) and disconnection (OFF) of the power semiconductor apparatus so that the chip is heated. The ΔTj power cycle test of the power semiconductor apparatus according to one embodiment to which the present technology is applied is repeatedly performed, for example, for 2 seconds at Tj=150° C., and until the cooling temperature is reached (e.g., Tj=50° C., off Time=18 seconds) by being turned off.

(Thermal Cycle Test)

In the power semiconductor apparatus according to one embodiment to which the present technology is applied, the thermal cycle test is conducted in the atmospheric air, and is implemented under a range from minus 40° C. to plus 150° C. The period of 1 cycle of the thermal cycle is 80 minutes, and the breakdown is as follows: 30 minutes at −40° C.; 10 minutes (cooling time) from +150° C. to −40° C.; 30 minutes at +150° C.; and 10 minutes (heating time) from +150° C. to −40° C. The forward voltage drop Vf and the reverse breakdown voltage Vr are measured every 100 cycles.

Normally, also in the thermal cycle test or the power cycle test, if degradation of the bonded portion starts, a resistance is increased and the forward voltage Vf is also changed in the test of flowing a high forward electric current etc. Even if degradation including characteristic degradation occurs, it can be estimated that the power cycle capability is high if progress of the degradation is slow.

As a result of the above-mentioned ΔTj power cycle test and the thermal cycle test, the bonding strength between the metal lead and the protective layer on chip of the power semiconductor apparatus according to one embodiment to which the present technology is applied is sufficiently ensured, and no characteristic degradation is observed.

Figure 76:
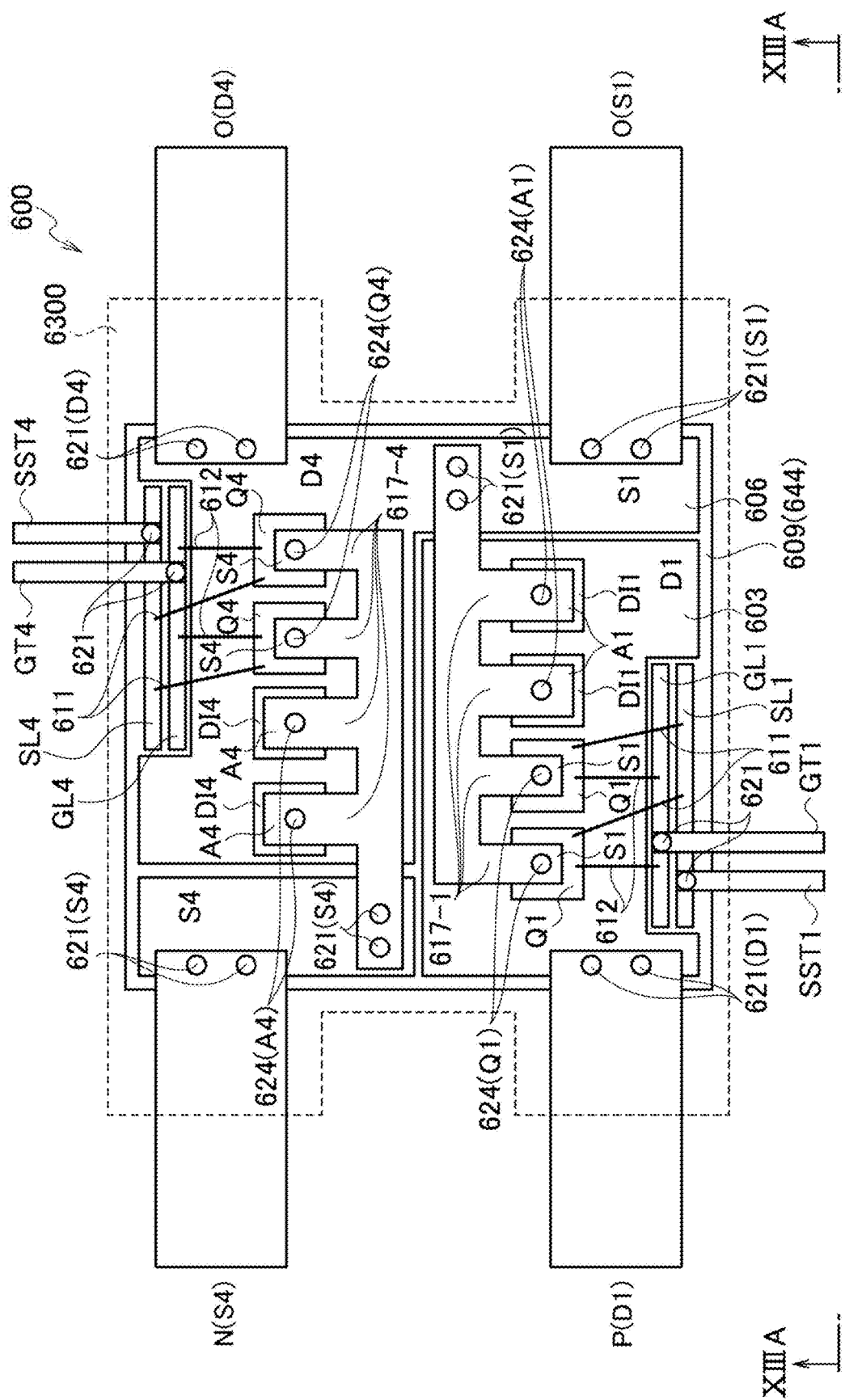

FIG. 76 is a schematic planar pattern configuration before forming a mold resin layer in a 2-in-1 module (module with a built-in half-bridge), in the power semiconductor apparatus 600 according to one embodiment to which the present technology is applied. In the present embodiment in FIG. 76, a substrate 609 corresponds to a ceramics substrate, and a substrate 644 corresponds to the insulation layer substrate (FIG. 78) as the modified example.

Figure 77:
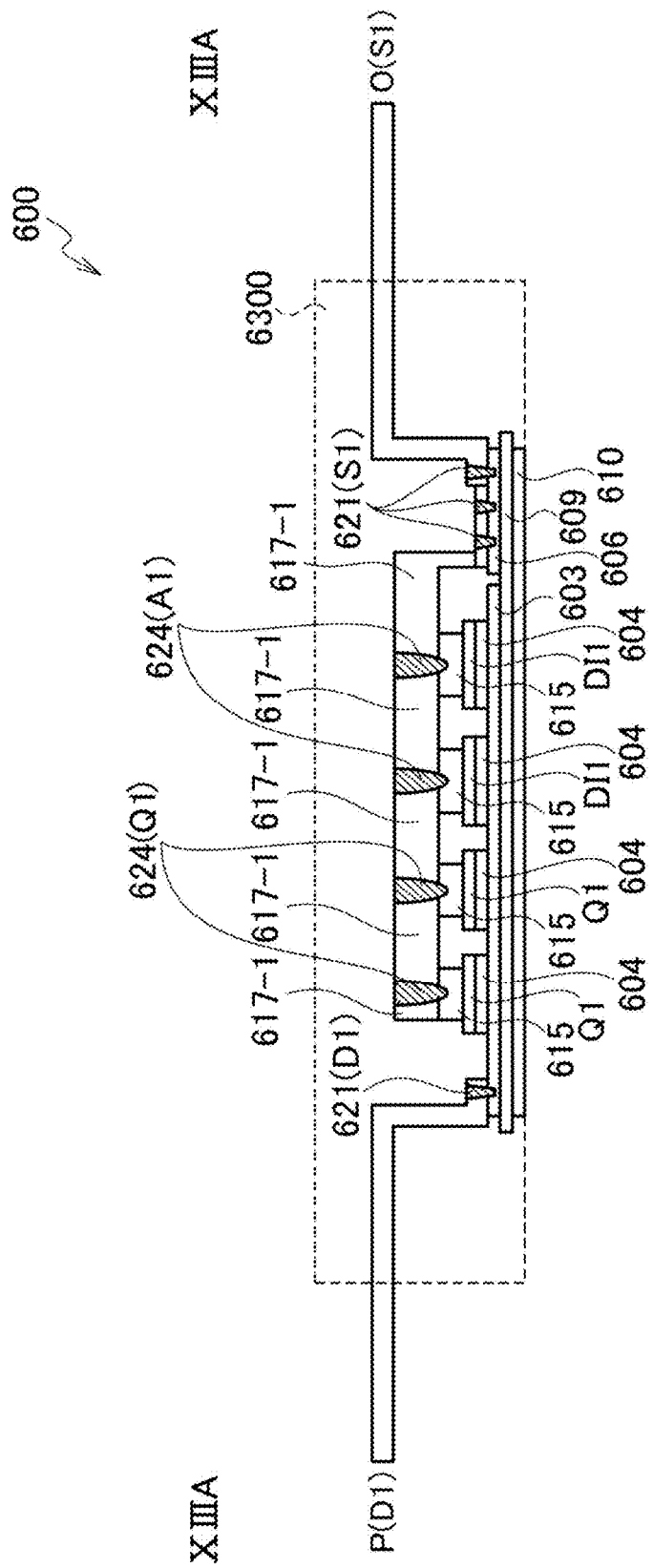

Moreover, in the power semiconductor apparatus according to one embodiment to which the present technology is applied, a circuit configuration of the 2-in-1 module (module with a built-in half-bridge) corresponding to FIG. 76 to which an SiC MOSFET is applied as a semiconductor power device is similarly shown as the configuration of FIG. 33. FIG. 77 shows a side view diagram observed from the direction XIIIA-XIIIA in FIG. 76.

Moreover, a schematic planar pattern configuration after forming a resin layer 6300 in a module with the built-in half-bridge, which is power semiconductor apparatus 600 according to one embodiment to which the present technology is applied is similarly shown as FIG. 56. The power semiconductor apparatus 600 according to one embodiment to which the present technology is applied includes the resin layer 6300, and the power semiconductor apparatus may be transfer-molded with the mold resin layer 6300.

The power semiconductor apparatus 600 according to one embodiment to which the present technology is applied includes a configuration of a module with the built-in half-bridge in which two MOSFETs Q1, Q4 are built in one module. As shown in FIG. 76, 2 chips of the MOSFETs Q1, Q4 respectively are disposed in parallel, and 2 chips of diodes DI1, DI4 respectively are also disposed in parallel. The diodes DI1, DI4 are respectively connected reversely in parallel between D1 and S1 and between D4 and S4 of the MOSFETs Q1, Q4.

As shown in FIG. 76, the power semiconductor apparatus 600 according to one embodiment to which the present technology is applied includes: a positive-side power terminal P and a negative-side power terminal N disposed at a first side of a substrate 609 (644) covered with the resin layer 6300; a gate terminal GT1 and a source sense terminal SST1 disposed at a second side adjacent to the first side; output terminals O (D4) and O (S1) disposed at a third side opposite to the first side; and a gate terminal GT4 and a source sense terminal SST4 disposed at a fourth side opposite to the second side. In this embodiment, as shown in FIG. 76, the gate terminal GT1 and the source sense terminal SST1 are connected to the gate signal electrode pattern GL1 and the source signal electrode pattern SL1 in the MOSFET Q1; and the gate terminal GT4 and the source sense terminal SST4 are connected to the gate signal electrode pattern GL4 and the source signal electrode pattern SL4 in the MOSFET Q4.

A gate signal bonding wire 612 and a source signal bonding wire 611 are respectively connected toward the gate signal electrode patterns GL1, GL4 and the source signal electrode patterns SL1, SL4 from MOSFETs Q1, Q4. Moreover, gate terminals GT1 and GT4 and source sense terminals SST1 and SST4 for external extraction are connected to the gate signal electrode patterns GL1 and GL4 and the source sense signal electrode patterns SL1 and SL4 by laser welding etc. in the welded portion 621. These may be connected by soldering instead of the laser welding.

The positive-side power terminal P and the negative-side power terminal N, and the gate terminals GT1, GT4 and the source sense terminals SST1, SST4 for external extraction can be formed of Cu, for example.

The ceramic substrate 609 may be formed of $Al_2O_3$, AlN, SiN, AlSiC, or SiC of which at least the surface is insulation, for example.

The drain electrode pattern (D, D4) and the source electrode pattern (S1, S4) can be formed of Cu, Al, or the like, for example. The gate signal bonding wire 612 and the source signal bonding wire 611 can be formed of Al, AlCu, or the like, for example.

SiC based power devices, e.g. SiC DIMOSFET and SiC TMOSFET, or GaN based power devices, e.g. GaN based High Electron Mobility Transistor (HEMT), are applicable as the MOSFETs Q1, Q4. In some instances, power devices, e.g. Si based MOSFETs and IGBT, are also applicable thereto.

An SiC Schottky Barrier Diode (SBD) can be applied to the diodes D1, D4, for example.

As shown in FIGS. 76 and 77, the power semiconductor apparatus 600 according to one embodiment to which the present technology is applied includes: a drain electrode pattern D1; semiconductor power devices Q1, DI1 disposed on the drain electrode pattern D1 via the bonding layer 604 under chip; a conductive bonding layer 615 on chip which is disposed on a pad electrode on an upper surface of the semiconductor power devices Q1, DI1 and protects the pad electrode from the laser light; and a metal lead 617-1 which is disposed on the upper surface of the semiconductor power device and is bonded to the bonding layer 615 on chip. Between the metal lead 617-1 and the protective layer on chip is bonded by welding with the laser light in the welded portions 624 (Q1), 624 (A1). The laser light welding may be spot welding. In FIG. 55, the gate terminal GT1 and the source sense terminal SST1 are not illustrated.

Similarly, as shown in FIGS. 76 and 77, the power semiconductor apparatus 600 according to one embodiment to which the present technology is applied includes: a drain electrode pattern D4; semiconductor power devices Q4, DI4 disposed on the drain electrode pattern D4; a conductive protective layer on chip which is disposed on the pad electrode of the upper surface of semiconductor power devices Q4, DI4 and protects the pad electrode from the laser light; and a metal lead 617-4 which is disposed on the upper surface of semiconductor power devices Q4, DI4 and is bonded to the protective layer on chip, wherein between the metal lead 617-4 and the protective layer on chip is bonded by welding with the laser light in the welded portions 624 (Q4), 624 (A4). The laser light welding may be spot welding.

The conductive protective layer on chip may include a bonding layer on chip. The bonding layer on chip includes any one of an Ag fired layer, a Cu fired layer, an Au fired layer, a Ni fired layers, or a mixture thereof, for example. Moreover, it may include a configuration in which a metallic plate is disposed on the bonding layers on chip, such as the Ag fired layer or the Cu fired layer. Moreover, it may include a configuration in which a plating layer is disposed on the source pad electrode and the anode pad electrode.

In the power semiconductor apparatus 600 according to one embodiment to which the present technology is applied, as shown in FIG. 76, a plurality of chips (semiconductor power devices Q1, DI1) are disposed on the substrate 609, and the metal lead 617-1 is disposed in an interdigital shape on the upper surface of the plurality of chips (semiconductor power devices) in planar view. Similarly, a plurality of chips (semiconductor power devices Q4, DI4) are disposed on the substrate 609, and the metal lead 617-4 is disposed in an interdigital shape on the upper surface of the plurality of chips (semiconductor power devices) in planar view.

In the power semiconductor apparatus 600 according to one embodiment to which the present technology is applied, the positive-side power terminal P (D1), the negative-side power terminal N (S4), and the output terminals O (D4), O (S1) are bonded by laser welding, in the welded portions 621 (D1), 621 (S4), 621 (D4), 621 (S1), as shown in FIG. 76. Moreover, the stress buffering layer 14 and the leadframe 15 may be bonded with spot welding.

In the power semiconductor apparatus 600 according to one embodiment to which the present technology is applied, the metal lead 617-1 at the side of the upper arm and the metal lead 617-4 at the side of the lower arm are disposed to be opposite to each other, and the opposed distance is brought as close as possible to ensure the insulating breakdown voltage. Thereby a parasitic inductance of wiring can be reduced, and a surge voltage occurring at the time of switching can be reduced. The other configurations are the same as the configurations of the power semiconductor apparatus shown in FIGS. 61 to 63.

Moreover, the fabrication method for the power semiconductor apparatus shown in FIGS. 76 and 77 is the same as the fabrication method of the power semiconductor apparatus shown in FIGS. 61 to 63.

Modified Examples

Figure 78:
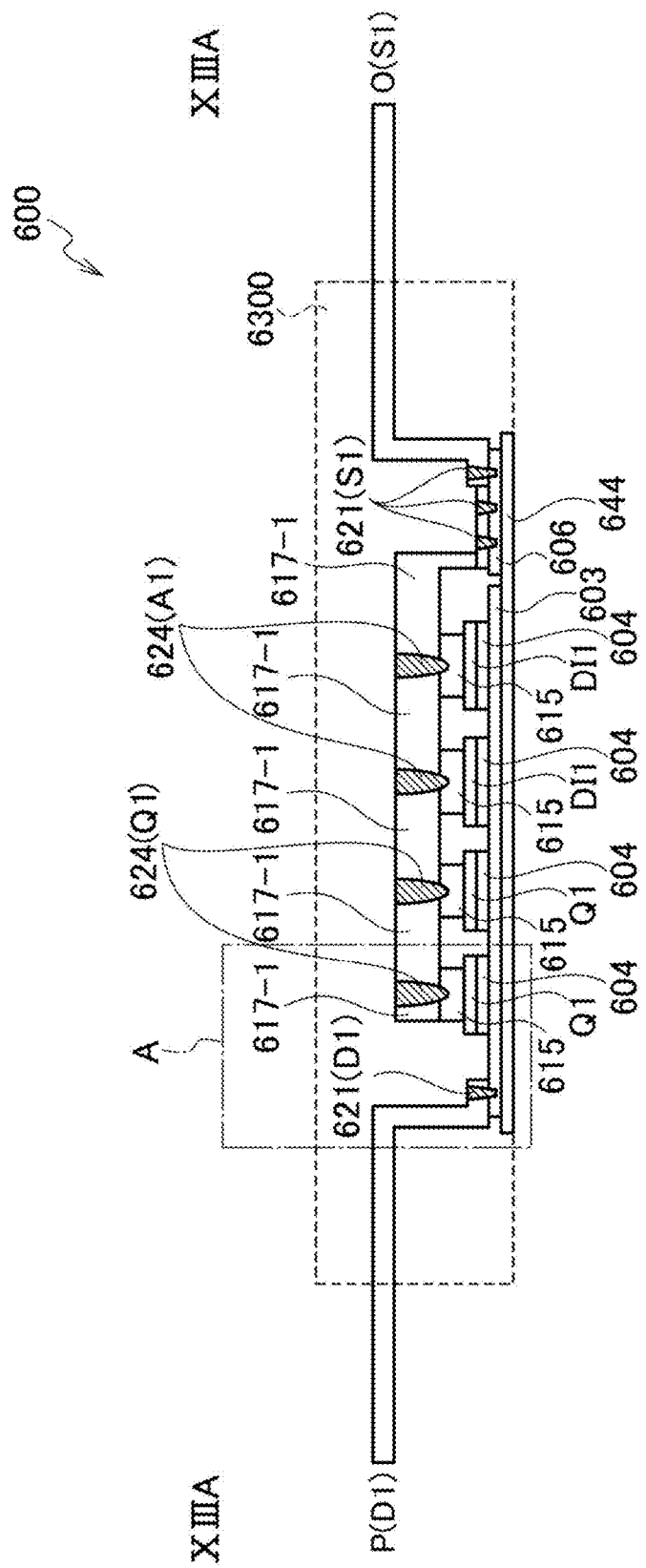
Figure 79:
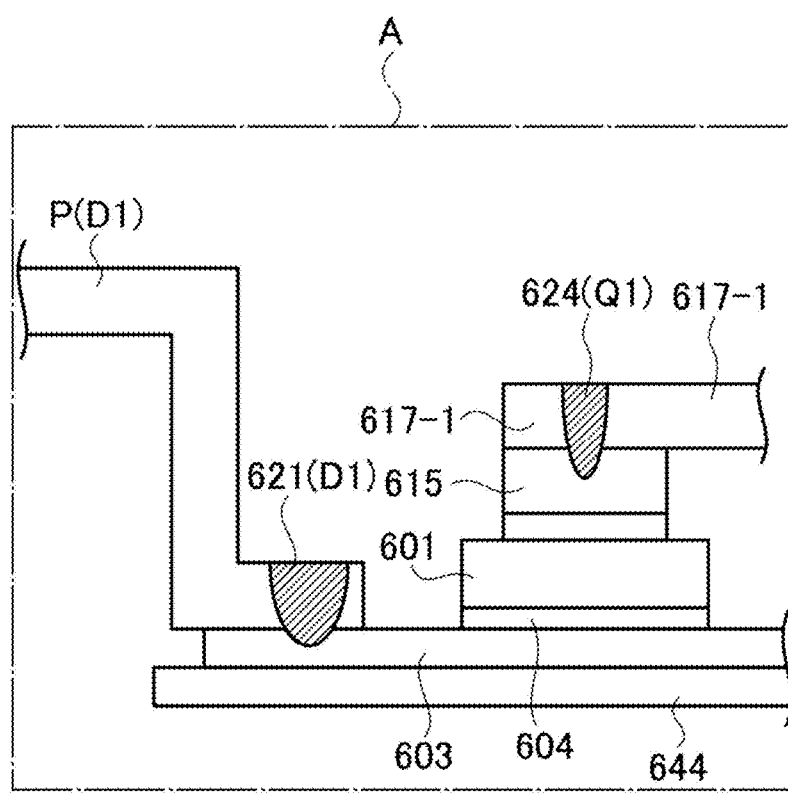

In a power semiconductor apparatus 600 according to a modified example of one embodiment to which the present technology is applied, a side view diagram observed from the direction XIIIA-XIIIA in the case of applying an insulation layer substrate 644 instead of the ceramics substrate 609 in FIG. 76 is expressed, as shown in FIG. 78. Moreover, an enlarged view of the portion A of FIG. 78A is expressed as shown in FIG. 79. Moreover, a schematic bird's-eye view configuration after forming the resin layer 6300 is similarly shown as FIG. 56. Also in FIG. 78, the gate terminal GT1 and the source sense terminal SST1 are not illustrated.

In the power semiconductor apparatus 600 according to the modified example of one embodiment to which the present technology is applied, since the insulation layer substrate 644 is applied instead of the ceramics substrate 609, the cost can be reduced and the thin-layered structure can be realized. The insulation layer substrate 644 can be formed of an organic insulating resin substrate etc., for example.

Moreover, as shown in FIGS. 76 and 78, the power semiconductor apparatus 600 according to the modified example of one embodiment to which the present technology is applied includes the insulation layer substrate 644, and the drain electrode patterns D1, D4 are disposed on the insulation layer substrate 644. Moreover, the source electrode patterns SI, S4 are disposed on the insulation layer substrate 644, in the same manner as the drain electrode patterns D1, D4. Other configurations are the same as the configurations of the power semiconductor apparatus shown in FIGS. 76 and 77. Moreover, the fabrication method for the power semiconductor apparatus shown in FIG. 78 is the same as the fabrication method of the power semiconductor apparatus shown in FIGS. 61 to 63.

According to the one embodiment to which the present technology is applied and the modified example thereof, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

Figure 80:
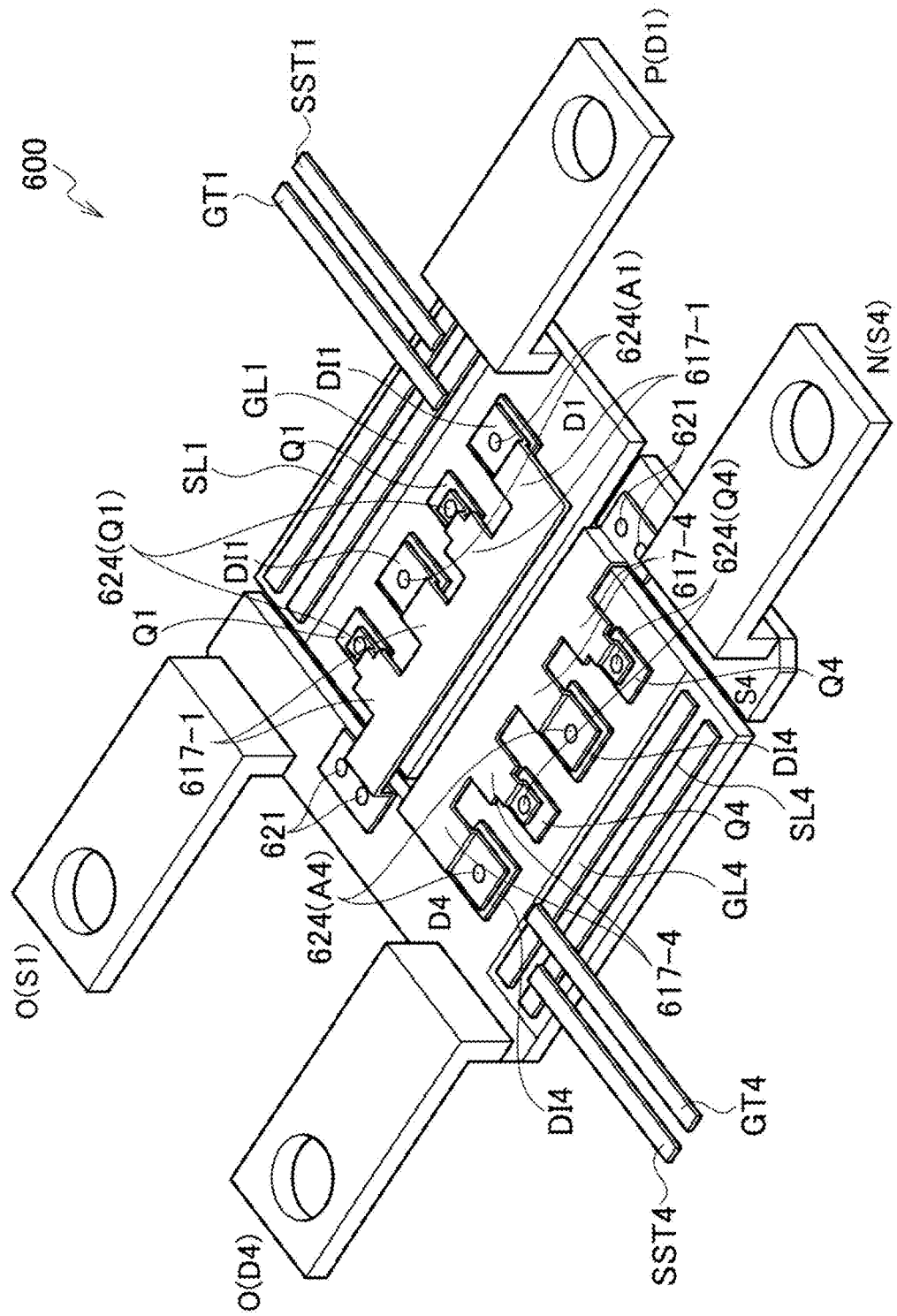

FIG. 80 is a schematic bird's-eye view configuration diagram before forming the resin layer 6300 in the 2-in-1 module (module with a built-in half-bridge), in the power semiconductor apparatus 600 according to one embodiment to which the present technology is applied. Moreover, a schematic bird's-eye view configuration after forming the resin layer 6300 is similarly shown as FIG. 56. The power semiconductor apparatus may be transfer-molded with the resin layer 6300.

As shown in FIG. 80, the insulating circuit substrate is not used but a metallic foil or a metallic plate (metallic frame) corresponding to the drain electrode pattern D1, the drain electrode pattern D4, the source electrode pattern S4, etc. is utilized. The source electrode pattern S1 is electrically common to the drain electrode pattern D1. The drain electrode pattern D1, the drain electrode pattern D4, and the source electrode pattern S4 are disposed in a rectangular shape, as shown in FIG. 80.

As shown in FIG. 80, 2 chips of the MOSFETs Q1, Q4 respectively are disposed in parallel, and 2 chips of diodes DI1, DI4 respectively are also disposed in parallel. The diodes DI1, DI4 are respectively connected reversely in parallel between D1 and S1 and between D4 and S4 of the MOSFETs Q1, Q4. In addition, the diodes DI1, DI4 are alternately disposed with respect to each other so as to be near the MOSFETs Q1, Q4.

As shown in FIGS. 80 and 78, the power semiconductor apparatus 600 according to one embodiment to which the present technology is applied includes: a positive-side power terminal P and a negative-side power terminal N disposed at a first side of a metallic plate (metallic frame) corresponding to the drain electrode pattern D4 covered with the resin layer 6300; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In this embodiment, as shown in FIG. 80, the gate terminal GT1 and the source sense terminal SST1 are connected to the gate signal electrode pattern GL1 and the source signal electrode pattern SL1 in the MOSFET Q1; and the gate terminal GT4 and the source sense terminal SST4 are connected to the gate signal electrode pattern GL4 and the source signal electrode pattern SL4 in the MOSFET Q4.

Moreover, as shown in FIG. 80, gate terminals GT1, GT4 and SST1, SST4 for external extraction are connected to the gate signal electrode patterns GL1, GL4 and the source sense signal electrode patterns SL1, SL4 by soldering etc. These may be laser-welded instead of the soldering.

The gate signal bonding wire and the source signal bonding wire to be connected toward the gate signal electrode patterns GL1, GL4 and the source signal electrode patterns SL1, SL4 from the MOSFETs Q1, Q4 are not illustrated.

The positive-side power terminal P and the negative-side power terminal N, the output terminal O, and the gate terminals GT1, GT4 and the source sense terminals SST1, SST4 for external extraction can be formed of Cu, for example.

As shown in FIG. 80, the power semiconductor apparatus 600 according to one embodiment to which the present technology is applied includes: a drain electrode pattern D1; semiconductor power devices Q1, DI1 disposed on the drain electrode pattern D1; and a metal lead 617-1 electrically connected to the semiconductor power devices Q1, DI1. The metal lead 617-1 disclosed herein have an interdigital shape in planar view. Moreover, as shown in FIG. 80, the power semiconductor apparatus 600 includes: a drain electrode pattern D4; semiconductor power devices Q4, DI4 disposed on the drain electrode pattern D4; and a metal lead 617-4 electrically connected to semiconductor power devices Q4, DI4. The metal lead 617-4 disclosed herein have an interdigital shape in planar view. The drain electrode pattern D4 is electrically common with the source electrode pattern SI. The power semiconductor apparatus 600 according to one embodiment to which the present technology is applied includes a conductive protective layer on chip (not illustrated) for protecting the source pad electrode and the anode pad electrode from the laser light, on the source pad electrode and the anode pad electrode of the upper surface of the semiconductor power devices Q1, DI1. The metal lead 617-1 is disposed on the upper surface of the semiconductor power devices Q1, DI1, and between the metal lead 617-1 and the protective layer on chip is bonded by welding with the laser light in the welded portions (melted resolidified portions) 624 (Q1), 624 (A1). The laser light welding may be spot welding.

Similarly, the power semiconductor apparatus 600 according to one embodiment to which the present technology is applied includes a conductive protective layer on chip (not illustrated) for protecting the source pad electrode and the anode pad electrode from the laser light, on the source pad electrode and the anode pad electrode of the upper surface of the semiconductor power devices Q4, DI4. The metal lead 617-4 is disposed on the upper surface of the semiconductor power devices Q4, DI4, and between the metal lead 617-4 and the protective layer on chip is bonded by welding with the laser light in the welded portions (melted resolidified portions) 624 (Q4), 624 (A4). The laser light welding may be spot welding. The conductive protective layer on chip may includes a bonding layers on chip, such as an Ag fired layer or a Cu fired layer. Moreover, it may include a configuration in which a metallic plate is disposed on the bonding layers on chip, such as the Ag fired layer or the Cu fired layer. Moreover, it may include a configuration in which a plating layer is disposed on the source pad electrode and the anode pad electrode.

The power semiconductor apparatus 600 according to one embodiment to which the present technology is applied can improve the reliability in the case of configuring a power semiconductor apparatus of 1200V/150 A class, for example. The semiconductor power devices Q1, Q4 are composed of SiC TMOSFET, for example, and the semiconductor power devices DI1, DI4 are composed of SBD, for example. Two semiconductor power devices Q1 and two semiconductor power devices Q4 are disposed respectively in parallel to one another. Two semiconductor power devices DI1 and two semiconductor power devices DI4 are also respectively disposed in parallel to one another. The chip size of one SiC TMOSFET is approximately 3.1 mm×approximately 4.4 mm, for example, and the chip size of one SBD is approximately 5.14 mm×approximately 5.14 mm, for example.

The metallic frame corresponding to the metal leads 617-1, 617-4, the drain electrode patterns D1, D4, the source electrode patterns S1, S4, and the like is formed of pure copper (C1020), for example.

In the power semiconductor apparatus 600 according to one embodiment to which the present technology is applied, positive-side power terminal P (D1), the negative-side power terminal N (S4), and the output terminals O (D4), O (S1) may be connected to the metallic frame with pillar electrode structure etc., as shown in FIG. 80.

In the power semiconductor apparatus 600 according to one embodiment to which the present technology is applied, the metal lead 617-1 at the side of the upper arm and the metal lead 617-4 at the side of the lower arm are disposed to be opposite to each other, and the opposed distance is brought as close as possible to ensure the insulating breakdown voltage. Thereby a parasitic inductance of wiring can be reduced, and a surge voltage occurring at the time of switching can be reduced. The other configurations are the same as the configurations of the power semiconductor apparatus shown in FIGS. 61 to 63 and 76 to 77. Moreover, the fabrication method for the power semiconductor apparatus shown in FIG. 80 is the same as the fabrication method of the power semiconductor apparatus shown in FIGS. 67 to 71.

Modified Examples

Figure 81:
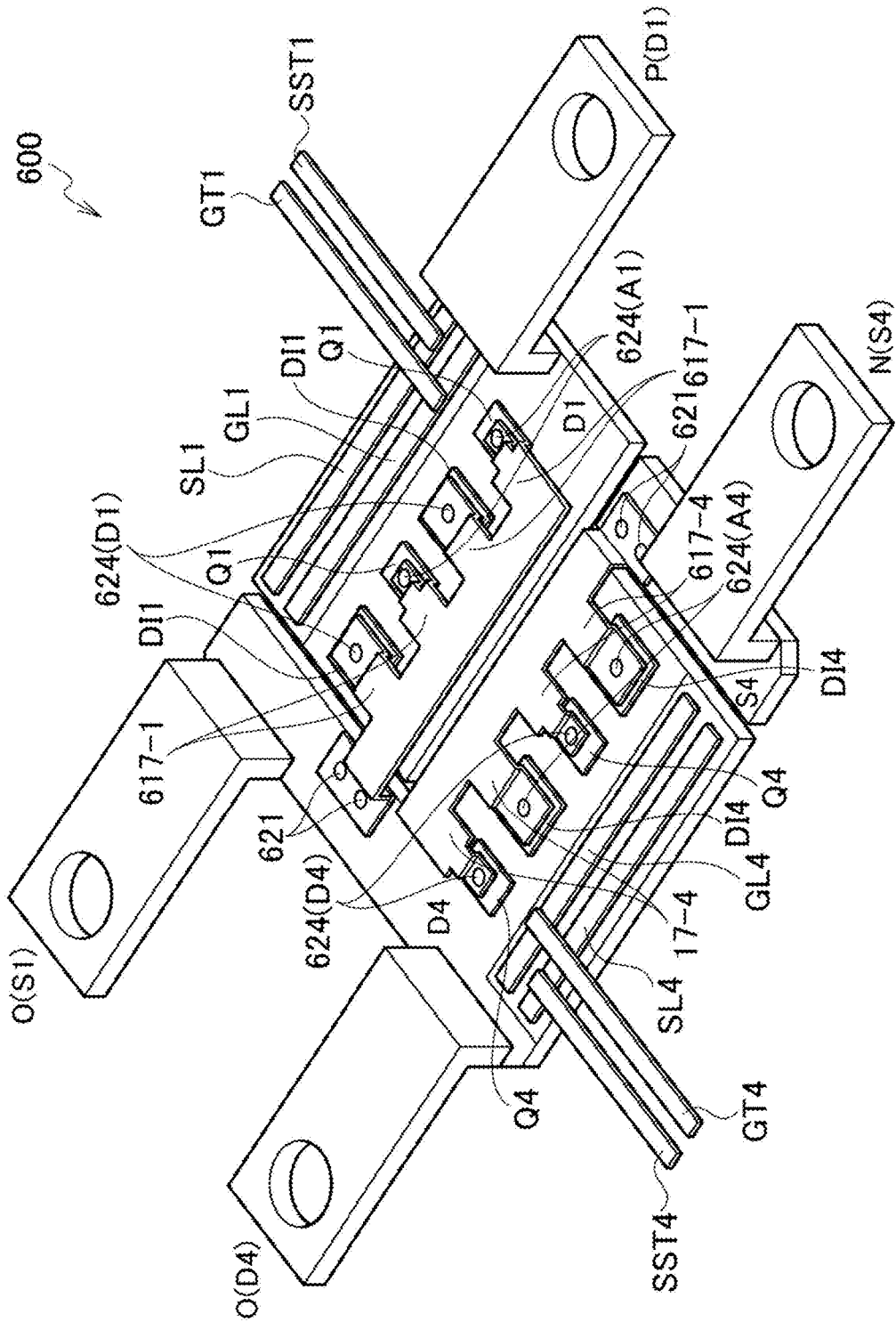

FIG. 81 is a schematic bird's-eye view configuration diagram before forming the resin layer 6300 in the 2-in-1 module (module with a built-in half-bridge), in the power semiconductor apparatus 600 according to a modified example of one embodiment to which the present technology is applied. In the power semiconductor apparatus 600 according to the modified example of one embodiment to which the present technology is applied, a disposition configuration of the semiconductor power devices Q1, DI1, Q4, DI4 is changed as compared with the power semiconductor apparatus 600 according to one embodiment to which the present technology is applied.

Also in the power semiconductor apparatus 600 according to the modified example of one embodiment to which the present technology is applied, as shown in FIG. 81, the insulating circuit substrate is not used but a metallic foil or a metallic plate (metallic frame) corresponding to the drain electrode patterns D1, D4, the source electrode pattern S4, and the like is utilized. The source electrode pattern SI is electrically common to the drain electrode pattern D1. The drain electrode patterns D1, D4, and the source electrode pattern S4 are disposed in a rectangular shape, as shown in FIG. 81.

As shown in FIG. 81, 2 chips of the MOSFETs Q1, Q4 respectively are disposed in parallel, and 2 chips of diodes DI1, DI4 respectively are also disposed in parallel. The diodes DI1, DI4 are respectively connected reversely in parallel between D1 and SI and between D4 and S4 of the MOSFETs Q1, Q4. In addition, the diodes DI1, DI4 are alternately disposed with respect to each other so as to be near the MOSFETs Q1, Q4. Other configurations are the same as those shown in FIG. 80. Moreover, the fabrication method for the power semiconductor apparatus shown in FIG. 81 is the same as the fabrication method of the power semiconductor apparatus shown in FIGS. 67 to 71.

According to the one embodiment to which the present technology is applied and the modified example thereof, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

In the power semiconductor apparatus according to the embodiments, it is also possible to configure an inverter circuit device or a converter circuit by connecting the semiconductor power devices in series between a first power source and a second power source, by using a plurality of switching circuits using a connecting point between the semiconductor power devices connected in series as an output, and by individually controlling each gate of the semiconductor power devices.

According to the embodiments, there can be provided: the power semiconductor apparatus capable of improving bonding reliability between the semiconductor power device and the metal lead positioned on the upper surface thereof with respect to the stress due to the environment of repeating cooling and heating, and easily controlling the melting depth made by the laser light; and the fabrication method for such a power semiconductor apparatus.

OTHER EMBODIMENTS

As explained above, the embodiments have been described, as a disclosure including associated description and drawings to be construed as illustrative, not restrictive. This disclosure makes clear a variety of alternative embodiments, working examples, and operational techniques for those skilled in the art.

For example, an Si based MOSFET may be used instead of the SiC MOSFET, or an emitter, a collector, and a gate of an IGBT may be connected instead of the source, the drain, and the gate of the SiC MOSFET, in the application circuit shown in FIGS. 38 and 39. Moreover, a hybrid device between the SiC based MOSFET and the SiC based IGBT may be used. Each flywheel diode DI may be disposed in external or may be omitted by using a parasitic element of each MOSFET.

The thick copper as in the embodiment shown in FIG. 1 may be used for the wiring pattern for die bonding of each embodiments shown in FIGS. 41 to 45, FIGS. 61 to 64. Moreover, a metal lead having a laminated structure may be used between the electrode and the wiring pattern of each embodiments shown in FIGS. 1 to 28, or the bonding protective layer on chip may be formed on the upper surface of the electrode to perform the laser welding between the bonding protective layer on chip and the metal lead, and the bonding reliability can be further improved by such a configuration.

Moreover, the metal lead may be formed by the rolling process or the bending process.

Such being the case, the embodiments cover a variety of embodiments, whether described or not.

INDUSTRIAL APPLICABILITY

The power semiconductor apparatus according to the embodiments can be used for semiconductor module techniques, e.g. IGBT modules, diode modules, MOS modules (Si, SiC, GaN, Gallium oxide), etc., and can be applied for wide applicable fields, e.g. inverters for Hybrid Electric Vehicles (HEVs)/Electric Vehicles (EVs), industrial inverters or converters.

What is claimed is:

1. A semiconductor device comprising:
    an insulating substrate including a substrate surface and a substrate back surface;
    a plurality of wiring patterns formed on the substrate surface;
    a semiconductor power device disposed on a first wiring pattern of the plurality of wiring patterns and comprising a first pad electrode and a second pad electrode on a surface thereof;
    at least one of a metallic plate and a metal layer disposed on the first pad electrode; and
    a metal lead having a first end disposed on an upper surface of the at least one of the metallic plate and the metal layer and the other end connected to a second wiring pattern of the plurality of wiring patterns, wherein
    a first melted portion is formed between the metal lead and the at least one of the metallic plate and the metal layer so as to reach an intermediate depth of the at least one of the metallic plate and the metal layer.

2. The semiconductor device according to claim 1, wherein
    the first melted portion including the metal lead and/or the at least one of the metallic plate and the metal layer has been resolidified.

3. The semiconductor device according to claim 1, further comprising
    a first bonding wire connected to the first pad electrode, wherein
    the at least one of the metallic plate and the metal layer is not disposed above a portion to which the first bonding wire is connected.

4. The semiconductor device according to claim 1, further comprising
    a second bonding wire connected to the second pad electrode, wherein
    the metallic plate is not disposed above a portion to which the second bonding wire is connected.

5. The semiconductor device according to claim 1, further comprising
    a second bonding layer disposed between the first pad electrode and the metallic plate.

6. The semiconductor device according to claim 5, wherein
    the second bonding layer comprises an Ag fired layer or a Cu fired layer.

7. The semiconductor device according to claim 1, further comprising
    a gate metal lead connected to the second pad electrode.

8. The semiconductor device according to claim 1, wherein
the metallic plate or the metal layer is also disposed on the second pad electrode.

9. The semiconductor device according to claim 1, wherein
a plurality of the semiconductor power devices are disposed on the substrate to be connected to one another in parallel.

10. The semiconductor device according to claim 1, wherein
the semiconductor power device is a SiC based MOSFET, the first pad electrode is a source pad electrode, the second pad electrode is a gate pad electrode, and a drain electrode is formed on a back surface of the semiconductor power device.

11. The semiconductor device according to claim 1, wherein
the metal lead includes one selected from the group consisting of copper, a copper alloy, aluminum, an aluminum alloy, a Fe—Ni based alloy, and a Fe—Ni—Co based alloy.

12. The semiconductor device according to claim 1, further comprising
a third bonding layer disposed on the substrate surface, wherein
the semiconductor power device is disposed via the third bonding layer on the substrate surface.

13. The semiconductor device according to claim 1, wherein
the substrate is one selected from the group consisting of a DBC substrate, a DBA substrate, and an AMB substrate.

14. The semiconductor device according to claim 1, wherein
the substrate is an organic insulating resin layer.

15. The semiconductor device according to claim 1, further comprising
a second melted portion disposed between the metal lead and the second wiring patterns.

16. The semiconductor device according to claim 15, wherein
a length of the second melted portion in a depth direction is shorter than a sum of a thickness of the metal lead and a thickness of the second wiring pattern.

17. The semiconductor device according to claim 15, wherein
a plurality of the second melted portions are formed.

18. The semiconductor device according to claim 1, wherein
the metallic plate includes one selected from the group consisting of copper, a copper alloy, aluminum, an aluminum alloy, stainless steel, ferrum, and an iron alloy.

19. The semiconductor device according to claim 1, wherein
one selected from the group consisting of a 1-in-1 module, a 2-in-1 module, a 4-in-1 module, a 6-in-1 module, a 7-in-1 module, an 8-in-1 module, a 12-in-1 module, and a 14-in-1 module is composed by using the semiconductor power devices.

20. The semiconductor device according to claim 1, wherein
an inverter circuit device or a converter circuit is configured by connecting the semiconductor power devices in series between a first power source and a second power source, by using a plurality of switching circuits using a connecting point between the semiconductor power devices connected in series as an output, and by individually controlling each gate of the semiconductor power devices.

21. The semiconductor device according to claim 1, wherein
a length of the first melted portion in a depth direction is shorter than a sum of a thickness of the metal lead and a thickness of the at least one of the metal plate and the metal layer.

22. The semiconductor device according to claim 1, wherein
the first melted portion is formed so as to pass through the metal lead and extend in a vertical direction toward the semiconductor power device.

23. The semiconductor device according to claim 1, wherein
a plurality of the first melted portions are formed.

24. A semiconductor device comprising:
an insulating substrate including a substrate surface and a substrate back surface;
a plurality of wiring patterns formed on the substrate surface;
a semiconductor power device disposed on a first wiring pattern of the plurality of wiring patterns and comprising a first pad electrode and a second pad electrode on a surface thereof;
a first bonding layer disposed on the first pad electrode; and
a metal lead having a first end disposed on an upper surface of the first bonding layer and the other end connected to a second wiring pattern of the plurality of wiring patterns, wherein
a first melted portion is formed between the metal lead and the first bonding layer so as to reach an intermediate depth of the first bonding layer.

25. The semiconductor device according to claim 24, wherein
the first melted portion including the metal lead and/or the first bonding layer has been resolidified.

26. The semiconductor device according to claim 24, further comprising
a first bonding wire connected to the first pad electrode, wherein
the first bonding layer is not disposed above a portion to which the first bonding wire is connected.

27. The semiconductor device according to claim 24, further comprising
a second bonding wire connected to the second pad electrode, wherein
the first bonding layer is not disposed above a portion to which the second bonding wire is connected.

28. The semiconductor device according to claim 24, further comprising
a gate metal lead connected to the second pad electrode.

29. The semiconductor device according to claim 24, wherein
the first bonding layer comprises an Ag fired layer or a Cu fired layer.

* * * * *